US012704780B2

(12) United States Patent
Hatakeyama

(10) Patent No.: US 12,704,780 B2
(45) **Date of Patent: *Aug. 11, 2026**

(54) RESIST MATERIAL AND PATTERNING PROCESS

(71) Applicant: SHIN-ETSU CHEMICAL CO., LTD., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 514 days.

This patent is subject to a terminal disclaimer.

(21) Appl. No.: 17/835,398

(22) Filed: Jun. 8, 2022

(65) Prior Publication Data

US 2023/0050585 A1 Feb. 16, 2023

(30) Foreign Application Priority Data

Jun. 25, 2021 (JP) ................................ 2021-105311

(51) Int. Cl.

| | |
|---|---|
| ***G03F 7/004*** | (2006.01) |
| ***C08F 212/14*** | (2006.01) |
| ***C08F 220/18*** | (2006.01) |
| ***C08F 220/22*** | (2006.01) |
| ***G03F 7/038*** | (2006.01) |
| ***G03F 7/039*** | (2006.01) |

(52) U.S. Cl.

CPC .......... *G03F 7/0045* (2013.01); *C08F 212/24* (2020.02); *C08F 220/1806* (2020.02); *C08F 220/22* (2013.01); *G03F 7/038* (2013.01); *G03F 7/039* (2013.01)

(58) Field of Classification Search

CPC .................................................... G03F 7/0045

See application file for complete search history.

(56) References Cited

U.S. PATENT DOCUMENTS

| | | | | |
|---|---|---|---|---|
| 8,900,796 | B2 * | 12/2014 | Ohashi | G03F 7/2041 560/45 |
| 11,994,799 | B2 * | 5/2024 | Hatakeyama | G03F 7/0392 |
| 2007/0231708 | A1 | 10/2007 | Matsumaru et al. | |
| 2007/0231738 | A1 | 10/2007 | Kaneko et al. | |
| 2008/0044738 | A1 | 2/2008 | Harada et al. | |
| 2008/0090172 | A1 | 4/2008 | Hatakeyama et al. | |
| 2008/0118860 | A1 | 5/2008 | Harada et al. | |
| 2008/0153030 | A1 | 6/2008 | Kobayashi et al. | |
| 2008/0241736 | A1 | 10/2008 | Kobayashi et al. | |
| 2009/0068594 | A1 * | 3/2009 | Shimbori | G03F 7/0392 430/326 |
| 2011/0159433 | A1 * | 6/2011 | Takahashi | C08F 212/20 526/287 |
| 2012/0148955 | A1 * | 6/2012 | Utsumi | G03F 7/0046 546/281.1 |
| 2013/0084529 | A1 | 4/2013 | Hatakeyama et al. | |
| 2013/0089820 | A1 | 4/2013 | Hatakeyama et al. | |
| 2015/0301449 | A1 | 10/2015 | Ohashi et al. | |
| 2017/0369616 | A1 * | 12/2017 | Hatakeyama | C08F 220/22 |

FOREIGN PATENT DOCUMENTS

| | | | | |
|---|---|---|---|---|
| JP | 2005-084365 | A | 3/2005 | |
| JP | 2006-045311 | A | 2/2006 | |
| JP | 3790649 | B2 | 6/2006 | |
| JP | 2006-178317 | A | 7/2006 | |
| JP | 2007-297590 | A | 11/2007 | |
| JP | 2008-013551 | A | 1/2008 | |
| JP | 2008-111103 | A | 5/2008 | |
| JP | 2008-122932 | A | 5/2008 | |
| JP | 2008-158339 | A | 7/2008 | |
| JP | 2008-239918 | A | 10/2008 | |
| JP | 2013007892 | A * | 1/2013 | |
| JP | 2013-080033 | A | 5/2013 | |
| JP | 2013-083821 | A | 5/2013 | |
| JP | 2015063470 | A * | 4/2015 | |
| JP | 2015-206932 | A | 11/2015 | |
| JP | 2018-005224 | A | 1/2018 | |
| JP | 2018-025789 | A | 2/2018 | |
| WO | 2011/048919 | A1 | 4/2011 | |
| WO | WO-2016194517 | A1 * | 12/2016 | C08F 12/30 |

OTHER PUBLICATIONS

English translation of JP2013007892. (Year: 2013).*
English translation of WO2016194517. (Year: 2016).*
English translation of JP2015063470. (Year: 2015).*
Okazaki, Eiichi, "Analysis of UV curing behavior of maleimide compounds using Raman spectroscopy", Toagosei Kenkyu Nenpo (Toagosei Annual Report) Trend, (2002), No. 5, pp. 11-15.
Kishikawa, Yasuhiro et al., "Assessment of trade-off between resist resolution and sensitivity for optimization of hyper-NA immersion lithography", Proc. of SPIE, (2007), vol. 6520, pp. 65203L-1 to 65203L-9.

* cited by examiner

*Primary Examiner* — Mark F. Huff
*Assistant Examiner* — Anna Malloy
(74) *Attorney, Agent, or Firm* — Oliff PLC

(57) ABSTRACT

A resist material for use in a patterning process includes a base polymer and an acid generator, where the resist material contains, as the acid generator, a sulfonium salt or iodonium salt of a sulfonic acid bonded to a maleimide group. In a chemically amplified resist material in which an acid is used as a catalyst, it is desired to develop an acid generator that makes it possible to reduce LWR of line patterns and critical dimension uniformity (CDU) of hole patterns, and to improve sensitivity. For this purpose, it is necessary to reduce image blurs due to acid diffusion considerably. The resist material has high sensitivity and low CDU in both a positive resist material and a negative resist material.

14 Claims, No Drawings

RESIST MATERIAL AND PATTERNING PROCESS

TECHNICAL FIELD

The present invention relates to: a resist material; and a patterning process.

BACKGROUND ART

As LSIs advance toward higher integration and higher processing speed, miniaturization of pattern rule is progressing rapidly. This is because the spread of high-speed communication of 5 G and artificial intelligence (A) has progressed, and high-performance devices for processing these are needed. As a cutting-edge technology for miniaturization, 5-nm node devices have been mass-produced by extreme ultraviolet ray (EUV) lithography at a wavelength of 13.5 nm. Furthermore, studies are also in progress on employing EUV lithography in next-generation 3-nm node and the following-generation 2-nm node devices.

As the miniaturization progresses, image blurs due to acid diffusion become a problem. To ensure resolution for fine patterns with dimensional sizes of 45 nm and smaller, there is a proposal that it is important to not only improve dissolution contrast as previously reported, but also control acid diffusion (Non Patent Document 1). Nevertheless, since chemically amplified resist materials enhance the sensitivity and contrast through acid diffusion, an attempt to minimize acid diffusion by reducing the temperature and/or time of post-exposure bake (PEB) results in significant reductions of sensitivity and contrast.

A triangular tradeoff relationship among sensitivity, resolution, and edge roughness has been pointed out. Specifically, resolution improvement requires suppression of acid diffusion, whereas shortening acid diffusion distance lowers sensitivity.

The addition of an acid generator capable of generating a bulky acid is effective in suppressing acid diffusion. Hence, it has been proposed to incorporate in a polymer a repeating unit derived from an onium salt having a polymerizable unsaturated bond. In this case, the polymer also functions as an acid generator (polymer-bound acid generator). Patent Document 1 proposes a sulfonium and iodonium salt having a polymerizable unsaturated bond that generates a particular sulfonic acid. Patent Document 2 proposes a sulfonium salt having a sulfonate acid moiety directly bonded to the main chain.

In an acid-labile group used for a (met-h)acrylate polymer for an ArF resist material, a deprotection reaction progresses by the use of a photo-acid generator that generates a sulfonic acid having fluorine substituted at a position. However, a deprotection reaction does not progress when using an acid generator that generates a sulfonic acid not having fluorine substituted at a position or generates carboxylic acid. When a sulfonium salt or iodonium salt that generates a sulfonic acid having fluorine substituted at a position is mixed with a sulfonium salt or iodonium salt that generates a sulfonic acid not having fluorine substituted at a position, the sulfonium salt or iodonium salt that generates the sulfonic acid not having fluorine substituted at a position undergoes ion exchange with the sulfonic acid having fluorine substituted at α position. A sulfonic acid having fluorine substituted at a position generated by light returns to being a sulfonium salt or iodonium salt by ion exchange. Therefore, a sulfonium salt or iodonium salt of a sulfonic acid not having fluorine substituted at α position or of carboxylic acid functions as a quencher. A resist composition in which a sulfonium salt or iodonium salt that generates carboxylic acid is used as a quencher is proposed (Patent Document 3).

An acid generator of a bissulfonium salt, having two sulfonium salts in one molecule, is proposed (Patent Documents 3 to 5). An acid that is generated from a bissulfonium salt has a short diffusion, and is favorable. However, bissulfonium salt has poor solubility to resist solvents, and therefore, easily coheres. Thus, bissulfonium salt potentially has a fault that pattern defects and edge roughness (LWR) become large.

Photoreaction of a maleimide compound is reported (Non Patent Document 2). Here, it is shown that α compound having a substituent on a double bond of a maleimide group undergoes a dimerization reaction and a maleimide compound not having a substituent undergoes polymerization as well as a dimerization reaction. In addition, the generation of radicals from maleimide and the polymerization of an acrylate thereby is described.

CITATION LIST

Patent Literature

Patent Document 1: JP 2006-045311 A
Patent Document 2: JP 2006-178317 A
Patent Document 3: JP 2015-206932 A
Patent Document 4: JP 2008-013551 A
Patent Document 5: WO 2011/048919

Non Patent Literature

Non Patent Document 1: SPIE Vol. 6520 65203L-1 (2007)
Non Patent Document 2: Toagosel Kenkyu Nenpo (Toagosei Annual. Report) TREND, 2002, issue 5, p, 11

SUMMARY OF INVENTION

Technical Problem

In a chemically amplified resist material in which an acid is used as a catalyst, it is desired to develop an acid generator that makes it possible to reduce LWR of line patterns and critical dimension uniformity (CDU) of hole patterns, and to improve sensitivity. For this purpose, it is necessary to reduce image blurs due to acid diffusion considerably.

The present invention has been made in view of the above circumstances, and an object thereof is to provide: a resist material having high sensitivity and low CDU in both a positive resist material and a negative resist material; and a patterning process using the same.

Solution to Problem

To achieve the object, the present invention provides a resist material comprising a base polymer and an acid generator, wherein the resist material contains, as the acid generator, a sulfonium salt or iodonium salt of a sulfonic acid bonded to a maleimide group.

When such an acid generator is contained, LWR of line patterns and CDU of hole patterns can be reduced, and in addition, sensitivity can also be enhanced.

The sulfonium salt or iodonium salt of the sulfinic acid bonded to the maleimide group is preferably represented by the following general formula (A-1) or (A-2), (A-1)

(A-2)

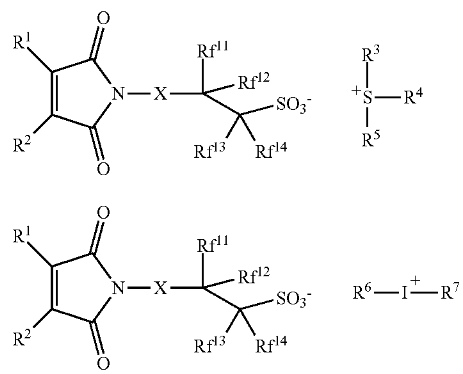

wherein $R^1$ and $R^2$ each represent a hydrogen atom or a linear, branched, or cyclic alkyl group having 1 to 10 carbon atoms, $R^1$ and $R^2$ optionally being bonded to each other to form a ring; X represents a divalent linking group having 1 to 20 carbon atoms, the linking group optionally containing an oxygen atom, a sulfur atom, a nitrogen atom, or a halogen atom; $Rf^{11}$ to $Rf^{14}$ each independently represent a hydrogen at om, a fluorine atom, an oxygen atom, a methyl group, or a trifluoromethyl group, provided that at least one of $Rf^{11}$ to $Rf^{14}$ is a fluorine atom or a trifluoromethyl group, and that when $Rf^{11}$ and $R^{12}$ are respectively an oxygen atom, $Rf^{11}$ and $Rf^{12}$ are a single oxygen atom bonded to a single carbon atom to form a carbonyl group; $R^3$, $R^4$, $R^5$, $R^6$, and $R^7$ each independently represent a fluorine atom, a chlorine atom, a bromine atom, an iodine atom, or a hydrocarbyl group having 1 to 25 carbon atoms and optionally containing a heteroatom, wherein the hydrocarbyl group is saturated or unsaturated and is linear, branched, or cyclic, some or all hydrogen atoms of these groups are optionally substituted with a hydroxy group, a carboxy group, a halogen atom, a cyano group, a nitro group, a mercapto group, a sultone group, a sulfonic group, or a sulfonium salt-containing group, and some carbon atoms of these groups are optionally substituted with an ether bond, an ester bond, a carbonyl group, an amide bond, a carbonate group, or a sulfonic acid ester group; and $R^3$ and $R^4$ are optionally bonded with each other to form a ring with a sulfur atom that is bonded thereto.

When an acid generator having such a structure is used, LWR of line patterns and CDU of hole patterns can be reduced more certainly, and moreover, sensitivity can also be improved.

The resist material preferably further comprises one or more selected from an organic solvent and a surfactant.

Such a resist material is more excellent.

The base polymer preferably further contains at least one repeating unit selected from repeating units represented by the following general formulae (f1) to (f1)

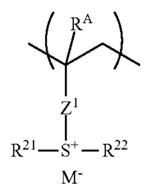

-continued (f2)

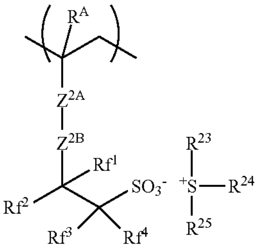

(f3)

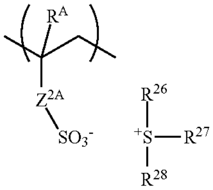

wherein each $R^A$ independently represents a hydrogen atom or a methyl group; $Z^1$ represents a single bond, a phenylene group, a naphthylene group, —$Z^{11}$—, —O—$Z^{13}$—, —C(═C)—O—$Z^{11}$—, or —C(═O)—NH—$Z^{11}$—; $Z^{11}$ represents an alkanediyl group having 1 to 6 carbon atoms, an alkenediyl group having 2 to 6 carbon atoms, or a hydrocarbon group having 1 to 20 carbon atoms and optionally containing a phenylene group and optionally contains a carbonyl group, an ester bond, an ether bond, or a hydroxy group; $Z^{1A}$ represents a single bond or an ester bond; $Z^{2B}$ represents a single bond or a divalent group having 1 to 18 carbon atoms and optionally contains an ester bond, an ether bond, a lactone ring, a bromine atom, or an iodine atom; $Z^3$ represents a single bond, a methylene group, an ethylene group, a phenylene group, a fluorinated phenylene group, a phenylene group substituted with a trifluoromethyl group, —O—$Z^{31}$, —C(═O)—O—$Z^{31}$—, or —C(═O)—NH—$Z^{31}$—; $Z^{31}$ represents an alkanediyl group having 1 to 15 carbon atoms, an alkenediyl group having 2 to 15 carbon atoms, or a group containing a phenylene group and optionally contains a carbonyl group, an ester bond, an ether bond, a hydroxy group, or a halogen atom; $Rf^1$ to $Rf^4$ each independently represent a hydrogen atom, a fluorine atom, an oxygen atom, or a trifluoromethyl group, provided that at least one is a fluorine atom, and that when $Rf^1$ and $Rf^2$ are respectively an oxygen atom, $Rf^1$ and $Rf^2$ are a single oxygen atom bonded to a single carbon atom to form a carbonyl group; $R^2$ to $R^{24}$ each independently represent a monovalent hydrocarbon group having 1 to 25 carbon atoms and optionally containing a heteroatom; any two of $R^{23}$, $R^{24}$, and $R^{25}$ or any two of $R^{26}$, $R^{27}$, and $R^{28}$ are optionally bonded with each other to form a r ng with a sulfur atom that is bonded thereto; and $M^-$ represents a non-nucleophilic counter ion.

When the base polymer contains such a repeating unit, the repeating unit can function as an acid generator.

The base polymer preferably contains a repeating unit represented by the following general formula (a1) or a repeating unit represented by the following general formula (a2)

(a1)

(a2)

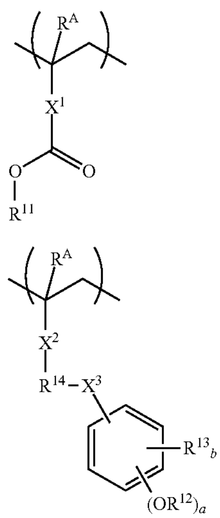

wherein each $R^A$ independently represents a hydrogen atom or a methyl group; $X^1$ represents a single bond or a linking group having 1 to 12 carbon atoms containing a henylene group, a naphthylene group, an ester bond, an ether bond, or a lactone ring; $X^2$ represents a single bond or an ester bond; $X^3$ represents a single bond, an ether bond, or an ester bond; $R^{11}$ and $R^{12}$ each represent an acid-labile group; $R^{13}$ represents a fluorine atom, a trifluoromethyl group, a cyano group, a saturated hydrocarbyl group having 1 to 6 carbon atoms, a saturated hydrocarbyloxy group having 1 to 6 carbon atoms, a saturated hydrocarbylcarbonyl group having 2 to 7 carbon atoms, a saturated hydrocarbylcarbonyloxy group having 2 to 7 carbon atoms, or a saturated hydrocarbyloxycarbonyl group having 2 to 7 carbon atoms; $R^{14}$ represents a single bond or an alkanediyl group having 1 to 6 carbon atoms, and some of the carbon atoms are optionally substituted with an ether bond or an ester bond; and "a" represents 1 or 2 and "b" represents an integer of 0 to 4, provided that $1 \leq a+b \leq 5$.

When the base polymer contains a repeating unit having an acid-labile group, the resist material preferably further comprises a dissolution inhibitor.

When the base polymer contains a repeating unit having an acid-labile group, the resist material is preferably a chemically amplified positive resist material.

When the base polymer contains a repeating unit having an acid-labile group, and if necessary, a dissolution inhibitor, as described, the resist material functions excellently as a positive resist material.

The base polymer preferably does not contain an acid-labile group.

When the base polymer does not contain a repeating unit having an acid-labile group, the resist material preferably further comprises a cross linking agent.

When the base polymer does not contain a repeating unit having an acid-labile group, the resist material is preferably a chemically amplified negative resist material.

When the base polymer does not contain a repeating unit having an acid-labile group as described, the resist material functions excellently as a negative resist material when a crosslinking agent is contained as necessary.

In addition, the present invention provides a patterning process comprising the steps of:

(1) forming a resist film on a substrate by using the above-described resist material;

(2) exposing the resist film to a high-energy beam; and (3) developing the exposed resist film by using a developer.

According to such a patterning process, the target pattern can be formed excellently.

After the step (1) and before the step (2), (1') an entire surface of the resist film is preferably exposed to light having a wavelength at which the sulfonium salt or iodonium salt of the sulfonic acid bonded to the maleimide group does not decompose.

The wavelength at which the sulfonium salt or iodonium salt does not decompose is preferably longer than a wavelength of 300 nm.

When the entire surface of the resist film is exposed to such light, the diffusion of acid can be further prevented by the maleimide group undergoing polymerization and/or coupling.

The high-energy beam is preferably a KrF excimer laser beam, an ArF excimer laser beam, an electron beam, or an extreme ultraviolet ray having a wavelength of 3 to 15 nm.

When such a high-energy beam is used, the target pattern can be formed excellently.

Advantageous Effects of Invention

The sulfonium salt or iodonium salt of the sulfonic acid bonded to the maleimide group not only generates acid by exposure to light, but the molecular weight of the acid increases by the coupling of the maleimide group, so that the acid is provided with the characteristic of having low diffusion. When the molecules of the acid generator exist near one another, the coupling reaction of maleimide groups progresses readily. When the acid generator coheres, the molecular weight of the acid increases owing to the coupling reaction, and acid diffusion distance becomes shorter. When there are no acid generator molecules in close proximity, coupling hardly occurs. Acid has low diffusion where the acid coheres, and has normal diffusion where the acid is sparse, so that the distribution of the reaction is made uniform. This makes it possible to construct a resist material having low LWR and low CDU.

DESCRIPTION OF EMBODIMENTS

It has been desired to develop an acid generator that makes it possible to reduce IWR in line patterns and critical dimension uniformity (CDU) in hole patterns and to enhance sensitivity in a chemically amplified resist material in which an acid is a catalyst.

To achieve the object, the present inventor has earnestly studied and found out that a resist material in which a sulfonium salt or iodonium salt of a sulfonic acid bonded to a maleimide group is contained is an acid generator having a small range of acid diffusion, and that an increase in molecular weight owing to a coupling reaction caused by light-irradiation of the maleimide group has a high effect of suppressing acid diffusion. The present inventor has thus found out that low acid diffusion makes it possible to obtain a resist material having little LWR, little CDU, excellent resolution, and a wide process margin. Thus, the present invention has been completed.

That is, the present invention is a resist material comprising a base polymer and an acid generator, wherein the resist material contains, as the acid generator, a sulfonium salt or iodonium salt of a sulfonic acid bonded to a maleimide group.

Hereinafter, the present invention will be described, but the present invention is not limited thereto.

[Resist Material]

The inventive resist material contains a base polymer and an acid generator, and contains an acid generator which is a sulfonium salt: or iodonium salt of a sulfonic acid bonded to a malaridine group.

[Sulfonium Salt or Iodonium Salt of Sulfonic Acid Bonded to Maleimide Group]

The sulfonium salt or iodonium salt of the sulfonic acid bonded to the maleimide group is preferably represented by the following general formula (A-1) or (A-2).

(A-1)

(A-2)

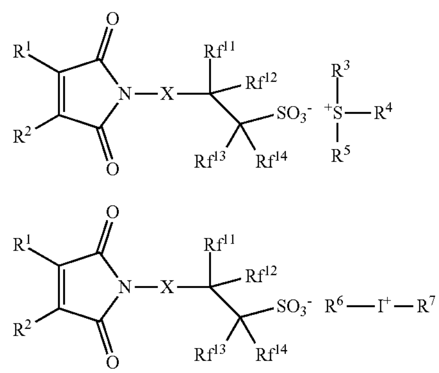

In the formulae, $R^1$ and $R^2$ each represent a hydrogen atom or a linear, branched, or cyclic alkyl group having 1 to 10 carbon atoms, $R^1$ and $R^2$ optionally being bonded to each other to form a ring. X represents a divalent linking group having 1 to 20 carbon atoms, the linking group optionally containing an oxygen atom, a sulfur atom, a nitrogen atom, or a halogen atom. $Rf^{11}$ to $Rf^{14}$ each independently represent a hydrogen atom, a fluorine atom, an oxygen atom, a methyl group, or a trifluoromethyl group, provided that at least one of $Rf^{11}$ to $Rf^{14}$ is a fluorine atom or a trifluoromethyl group, and that when $Rf^{11}$ and $Rf^{12}$ are respectively an oxygen atom, $Rf^{11}$ and $Rf^{12}$ are a single oxygen atom bonded to a single carbon atom to form a carbonyl group. $R^3$, $R^4$, $R^5$, $R^6$, and $R^7$ each independently represent a fluorine atom, a chlorine atom, a bromine atom, an iodine atom, or a hydrocarbyl group having 1 to 25 carbon atoms and optionally containing a heteroatom, wherein the hydrocarbyl group is saturated or unsaturated and is linear, branched, or cyclic, some or all hydrogen atoms of these groups are optionally substituted with a hydroxy group, a carboxy group, a halogen atom, a cyano group, a nitro group, a mercapto group, a sultone group, a sulfonic group, or a sulfonium salt-containing group, and some carbon atoms of these groups are optionally substituted with an ether bond, an ester bond, a carbonyl group, an amide bond, a carbonate group, or a sulfonic acid ester group. $R^3$ and $R^4$ are optionally bonded with each other to form a ring with a sulfur atom that is bonded thereto.

Examples of the sulfonic acid anion bonded to the maleimide group shown in the general formula (A-1) or (A-2) include those given below, but are not limited thereto.

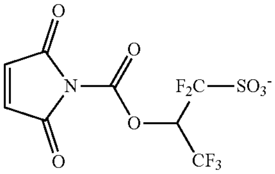

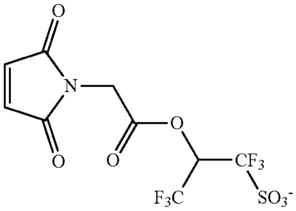

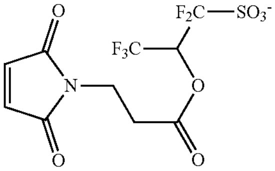

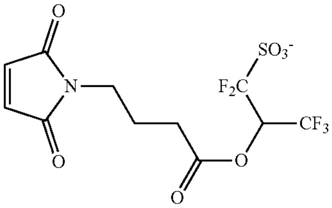

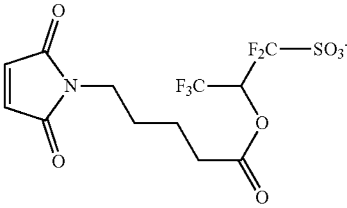

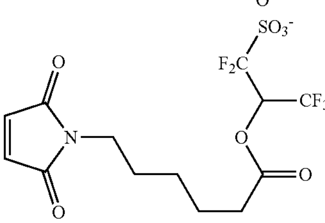

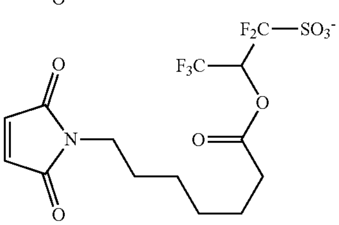

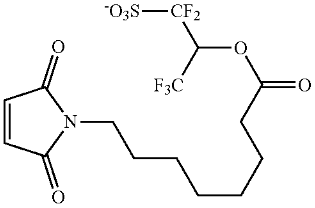

-continued
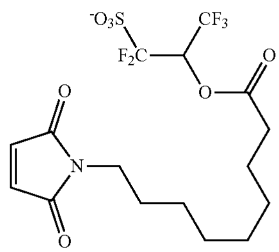
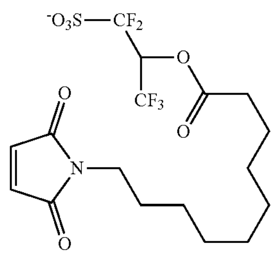
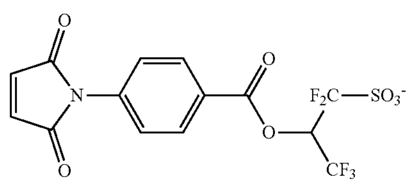
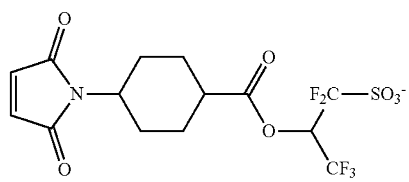
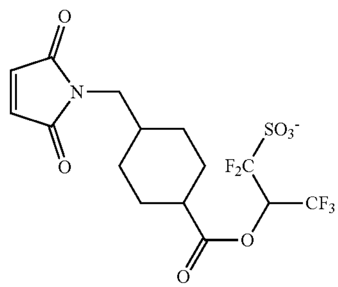
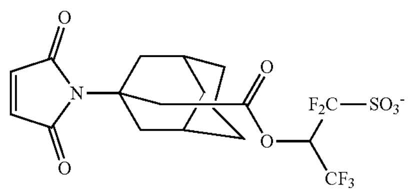
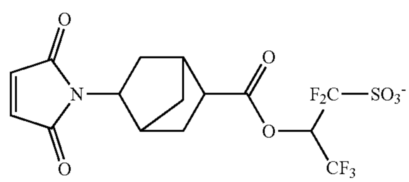
-continued
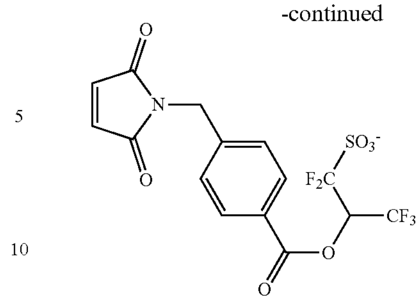
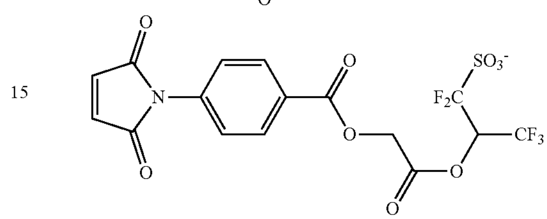
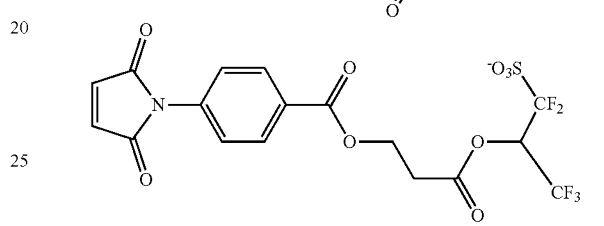
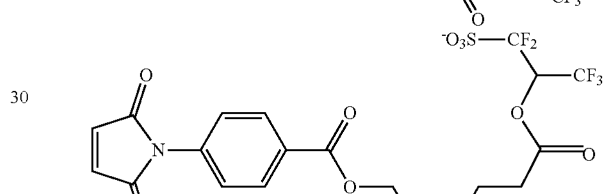
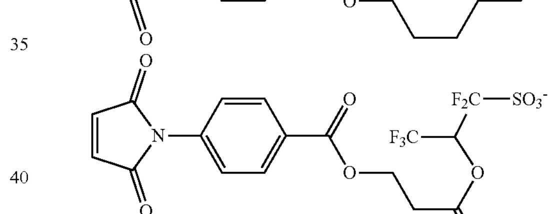
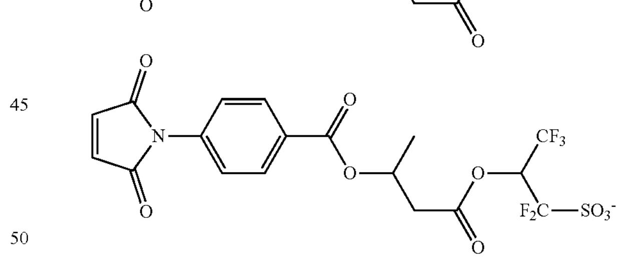
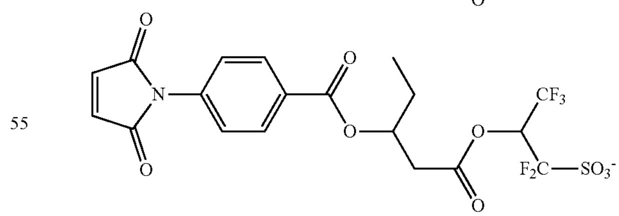
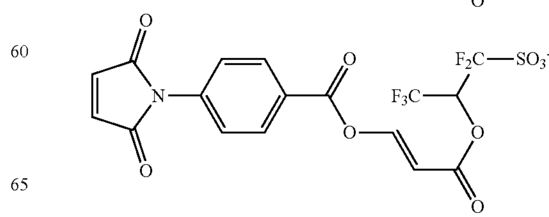

-continued
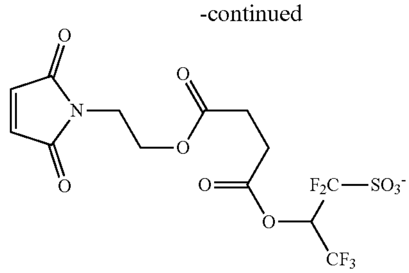
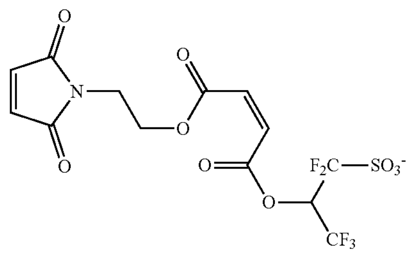
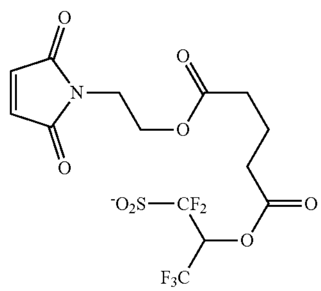
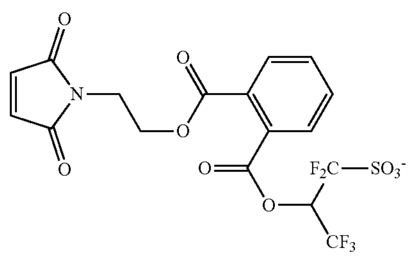
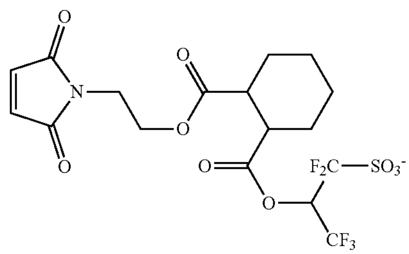
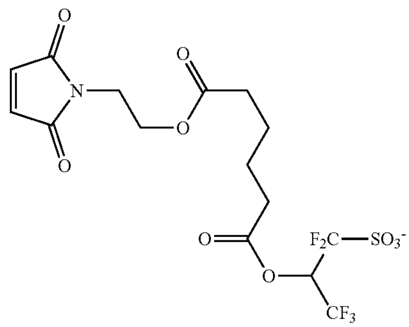
-continued
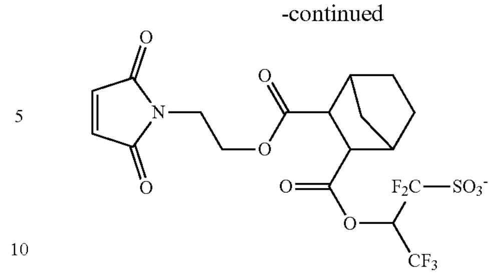
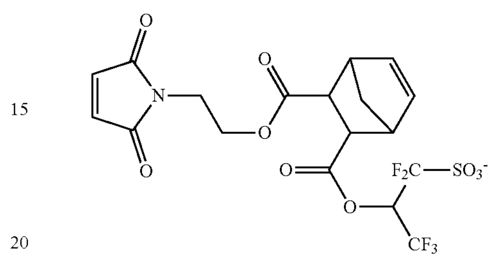
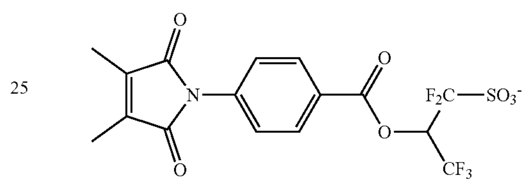
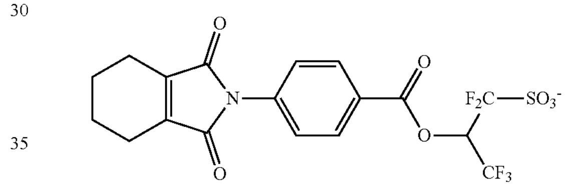
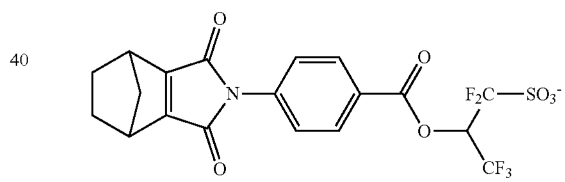
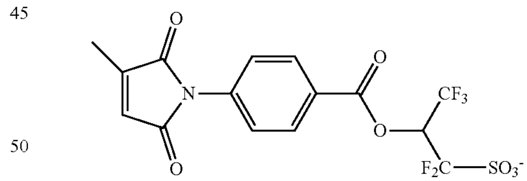
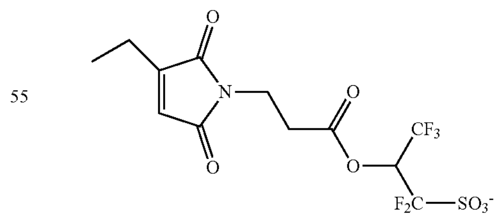
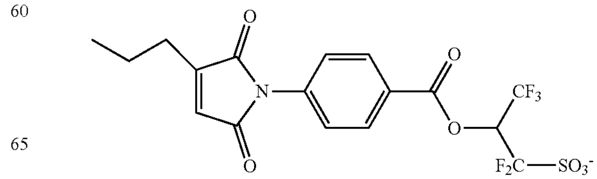

-continued
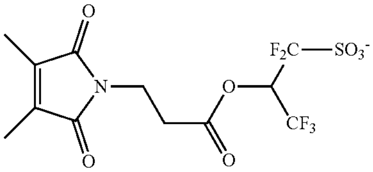
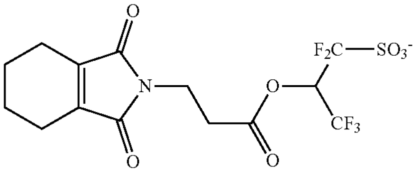
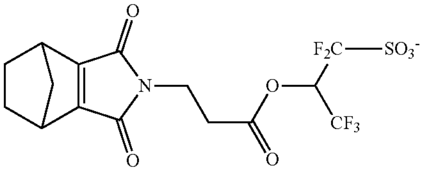
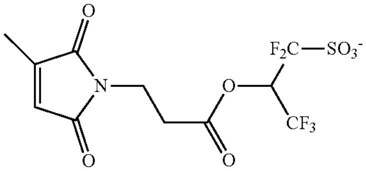
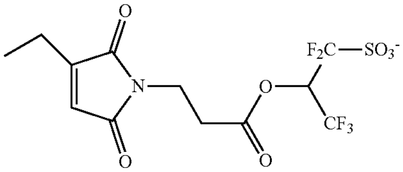
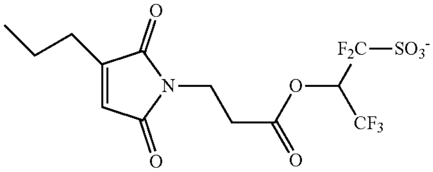
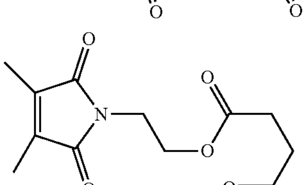
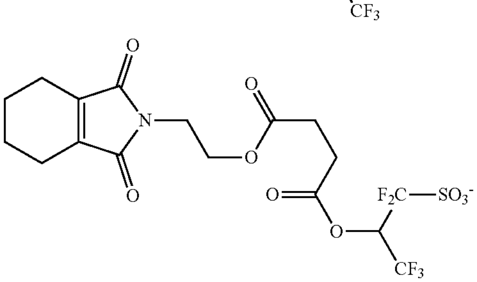
-continued
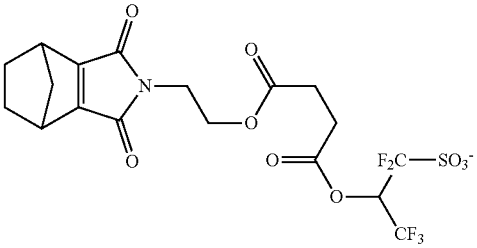
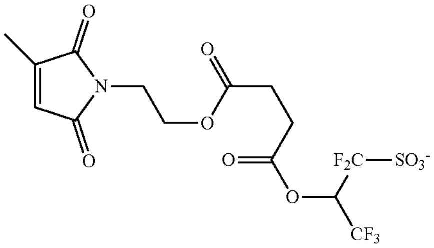
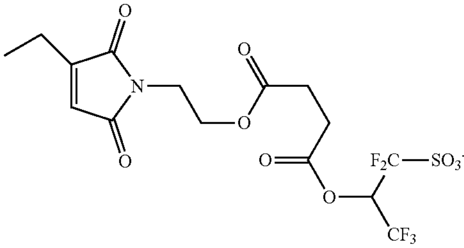
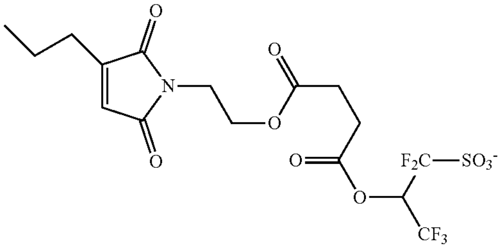
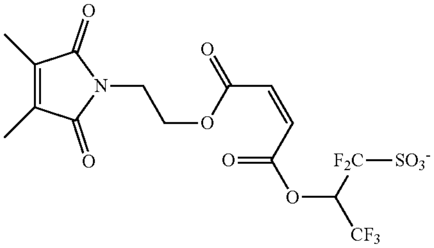
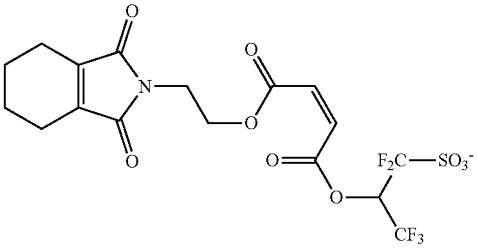

-continued
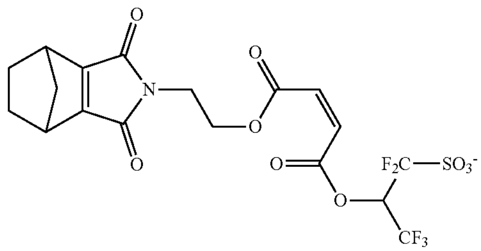
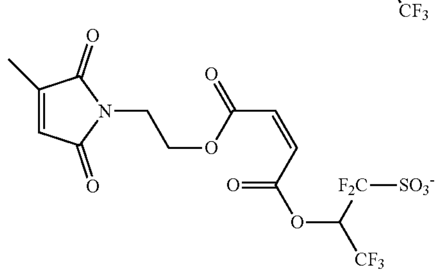
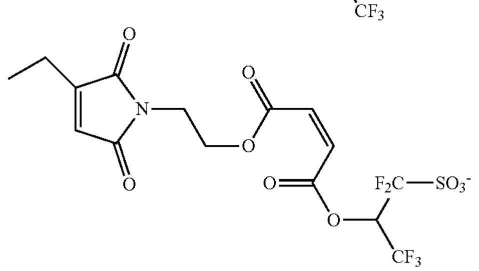
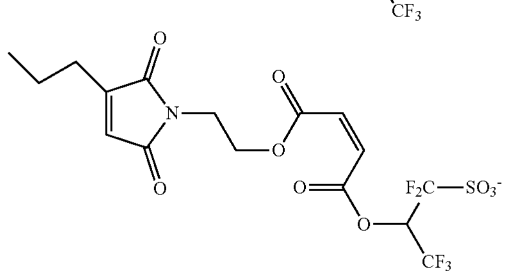
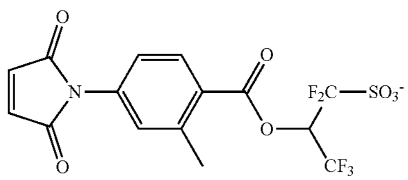
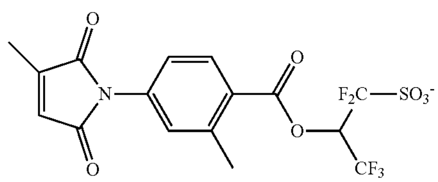
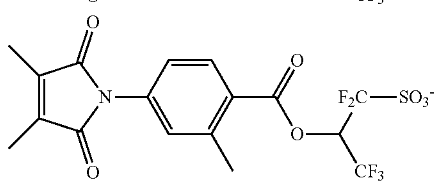
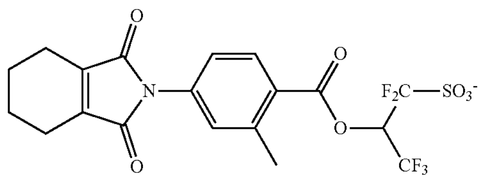
-continued
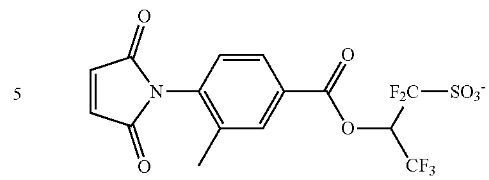
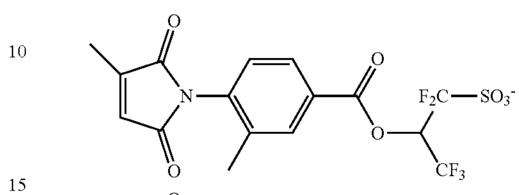
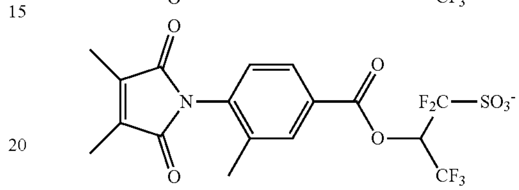
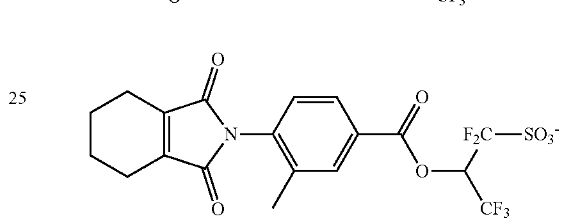
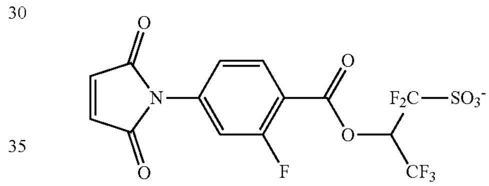
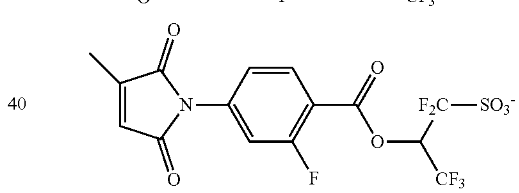
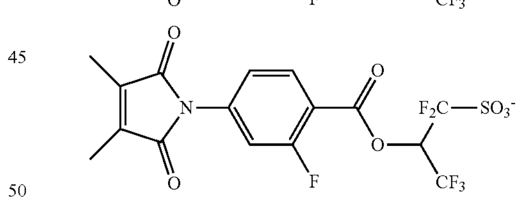
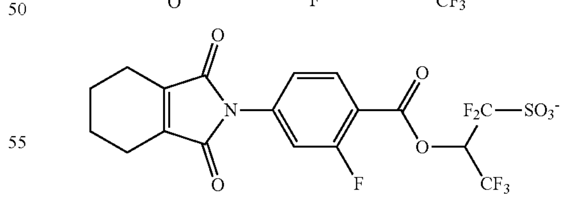
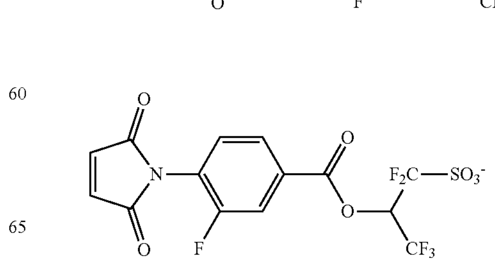

-continued
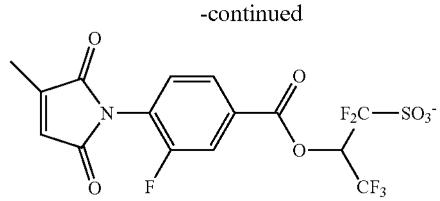
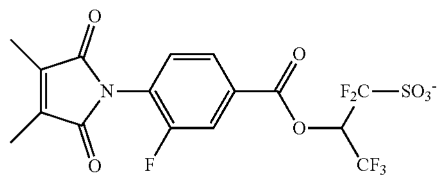
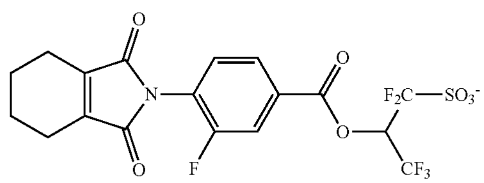
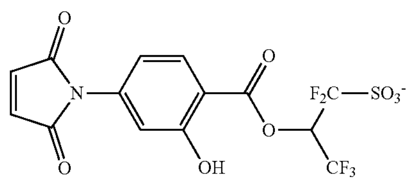
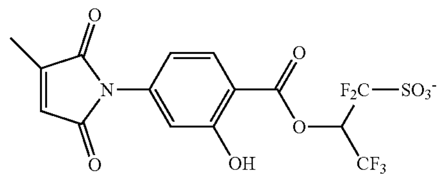
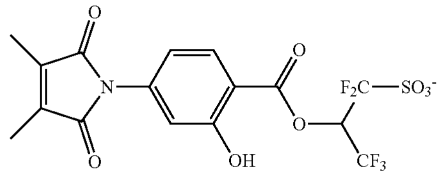
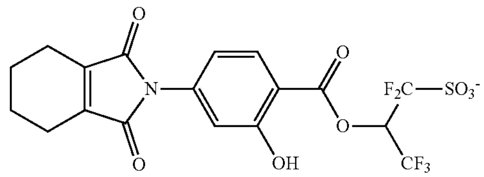
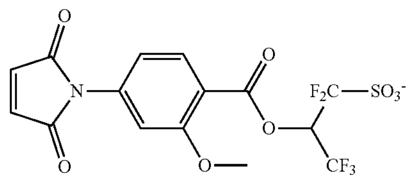
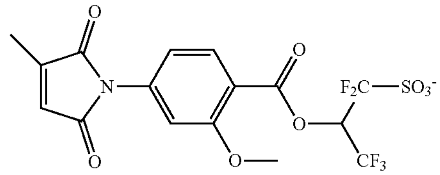
-continued
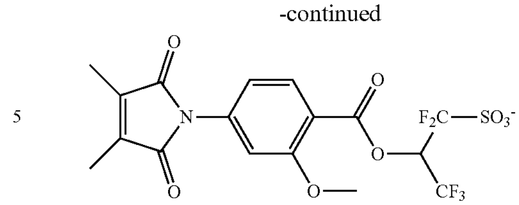
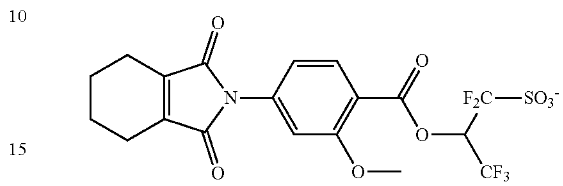
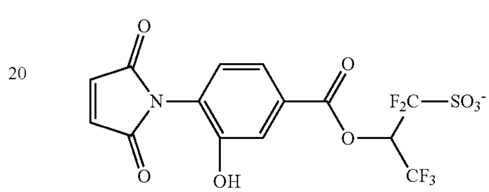
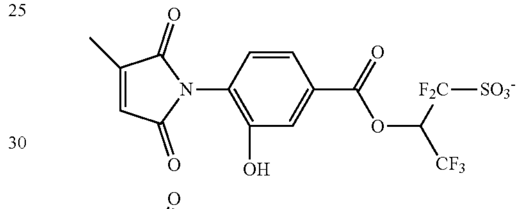
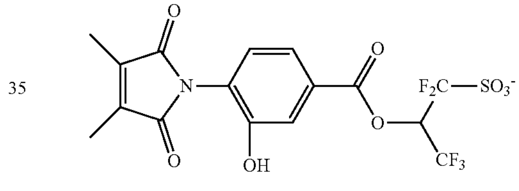
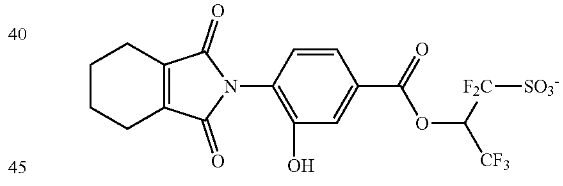
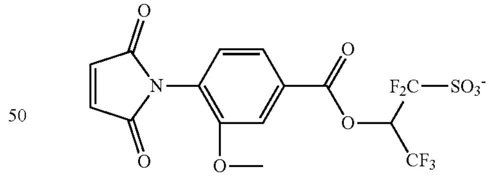
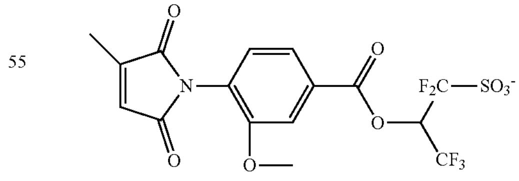
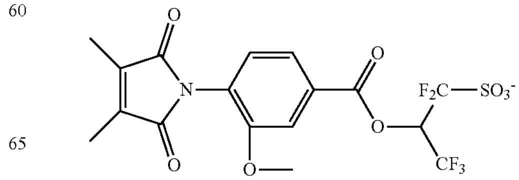

-continued
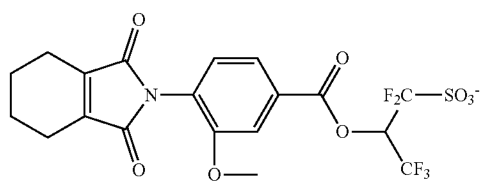
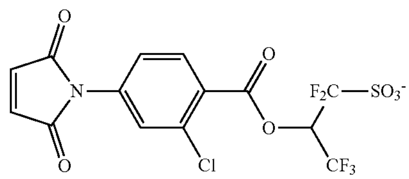
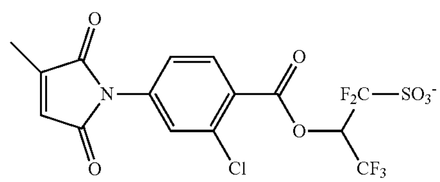
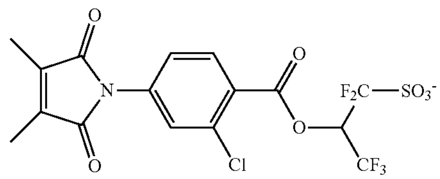
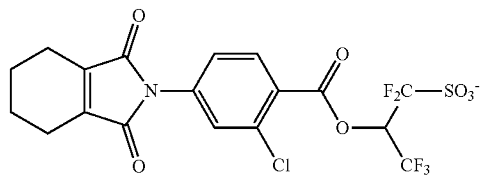
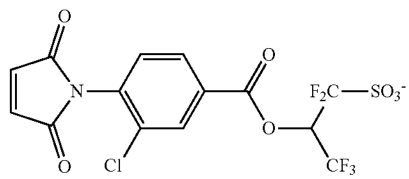
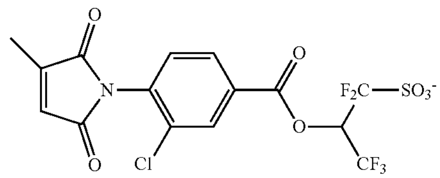
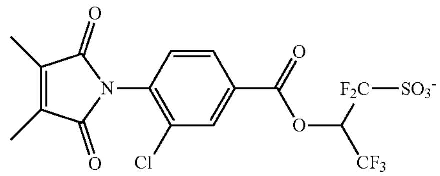
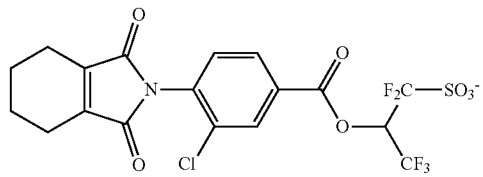
-continued
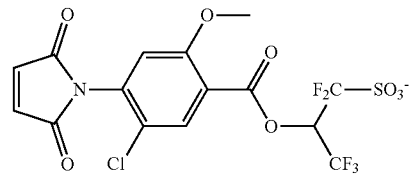
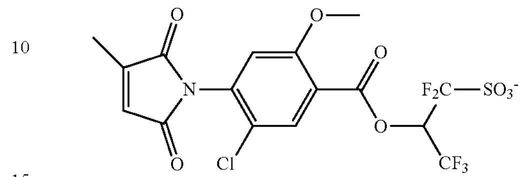
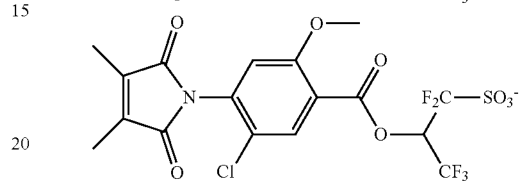
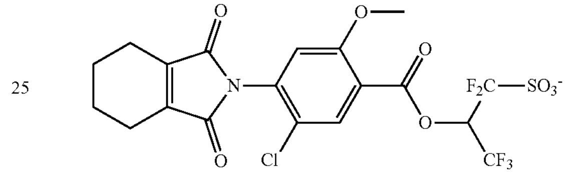
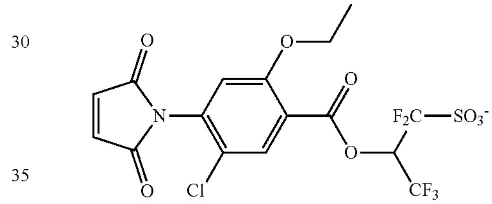
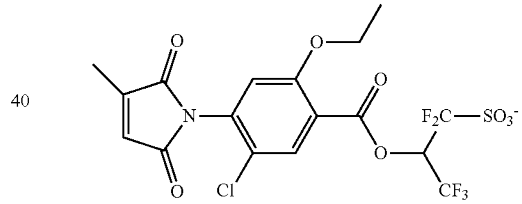
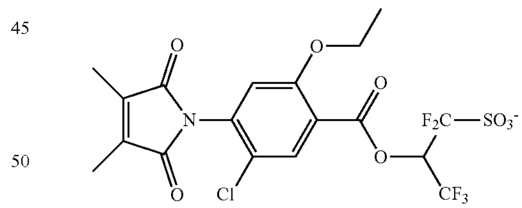
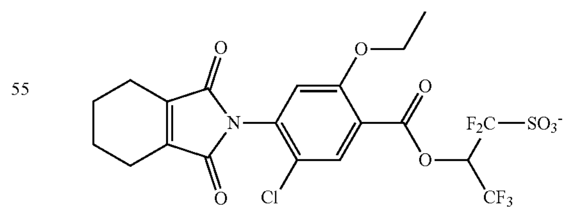
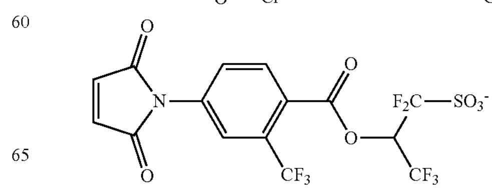

-continued
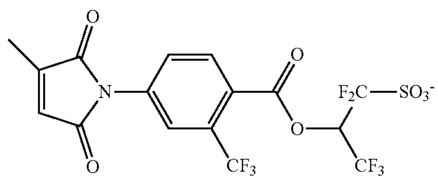
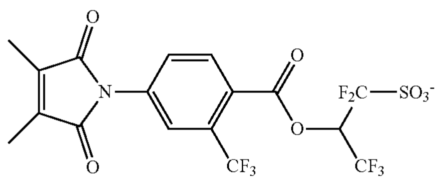
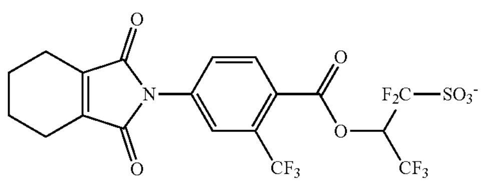
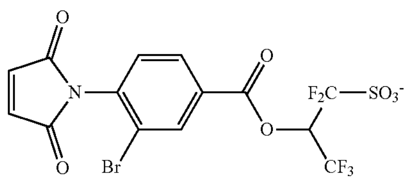
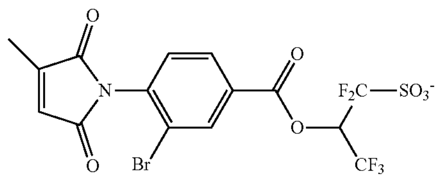
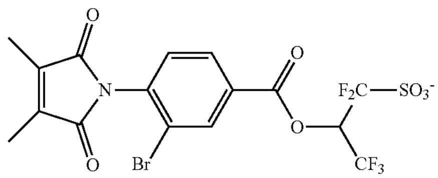
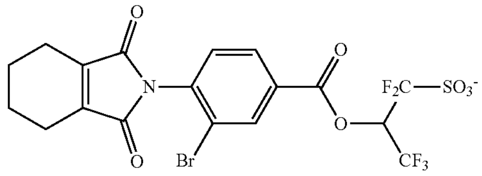
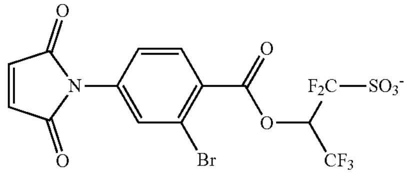
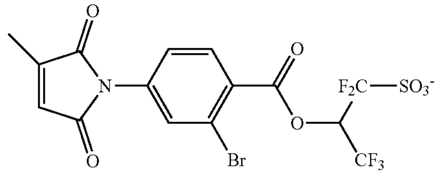
-continued
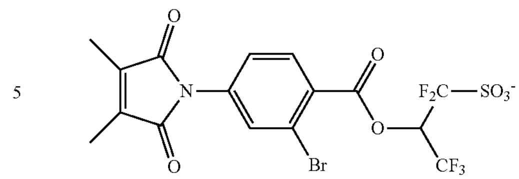
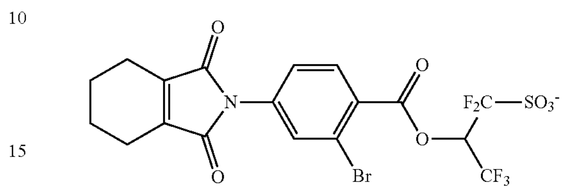
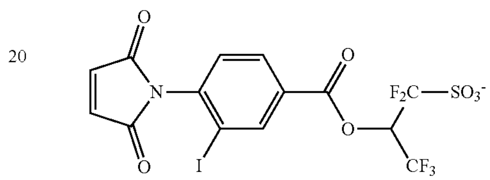
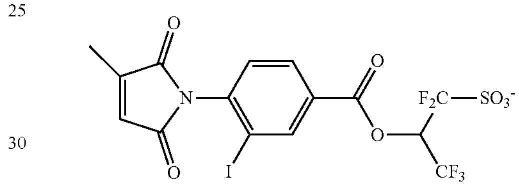
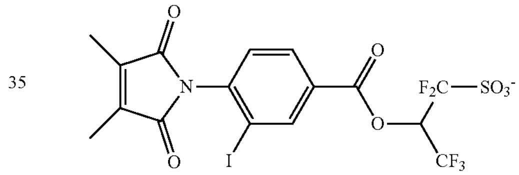
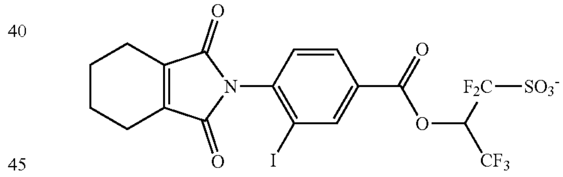
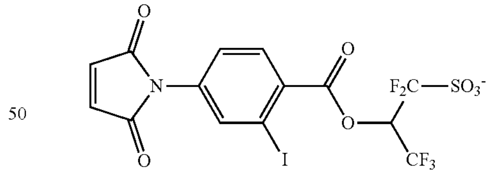
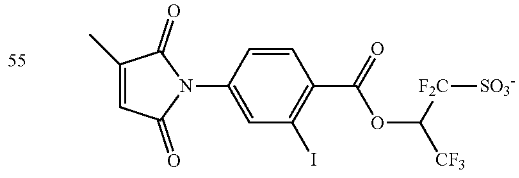
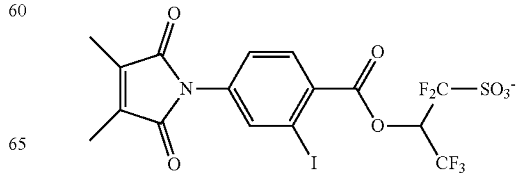

-continued
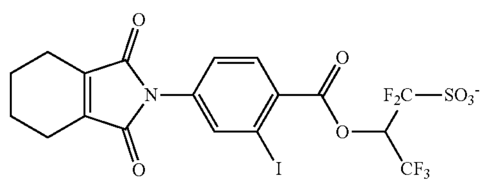
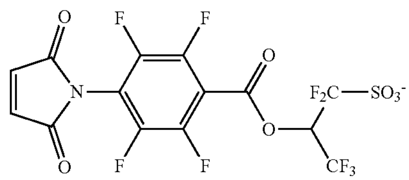
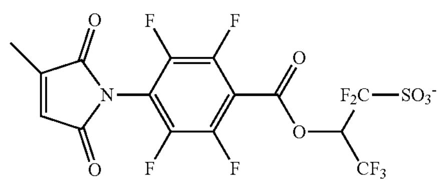
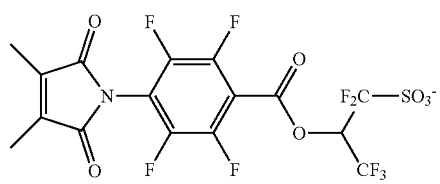
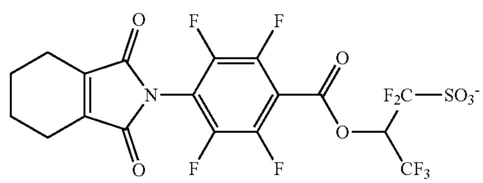
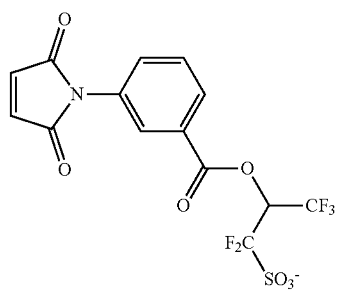
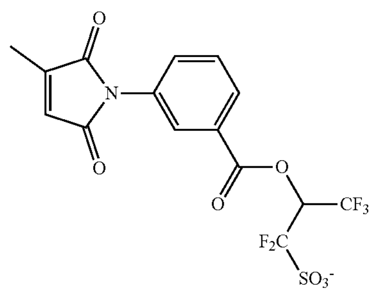
-continued
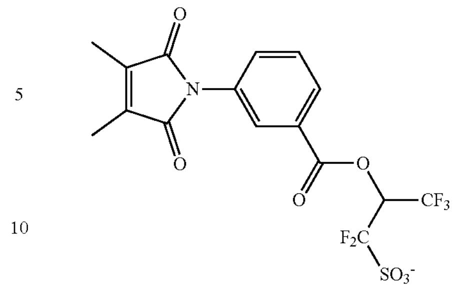
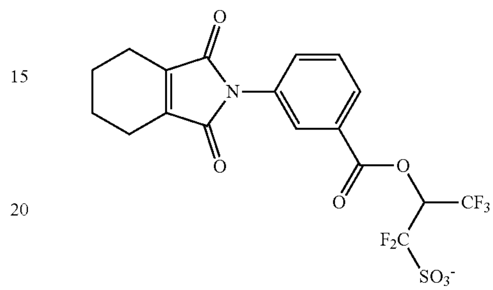
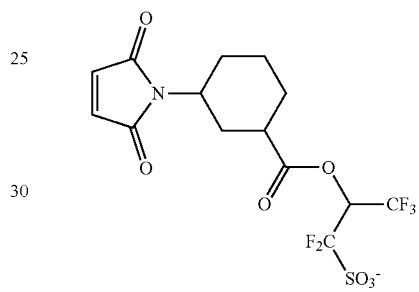
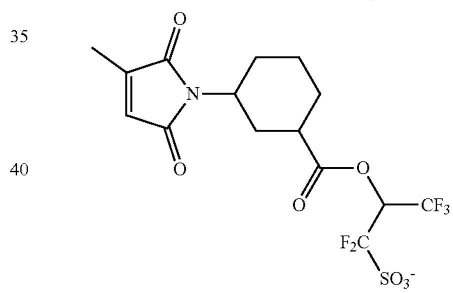
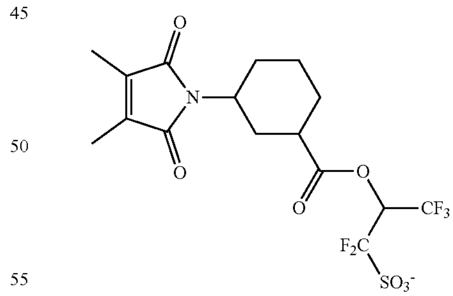
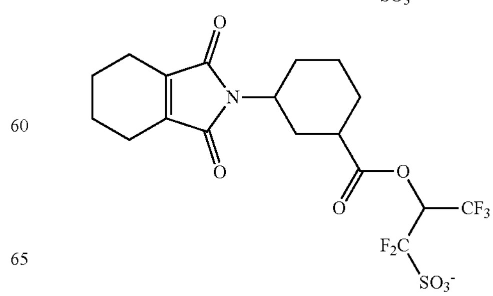

-continued
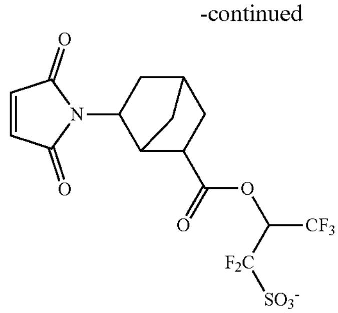
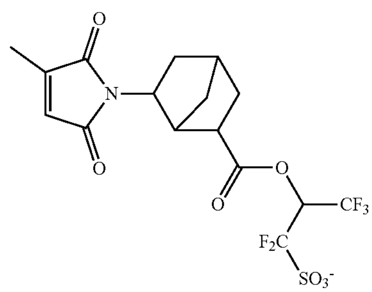
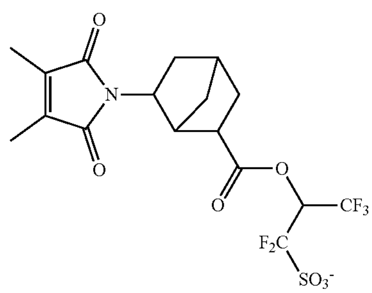
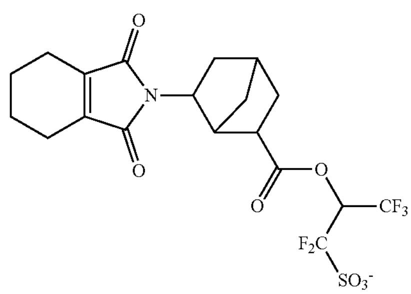
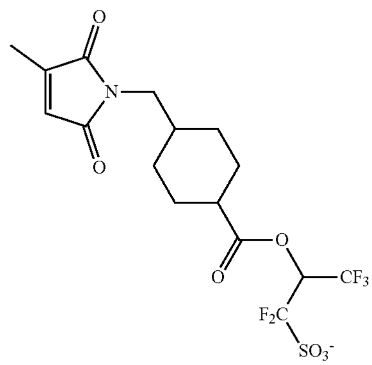
-continued
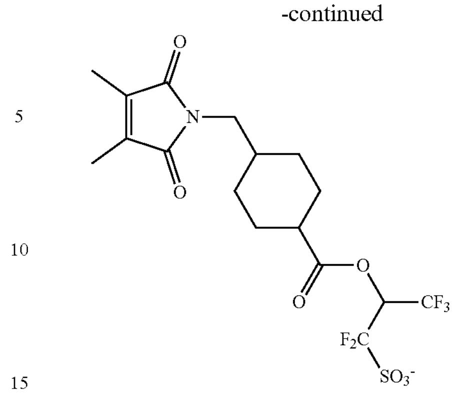
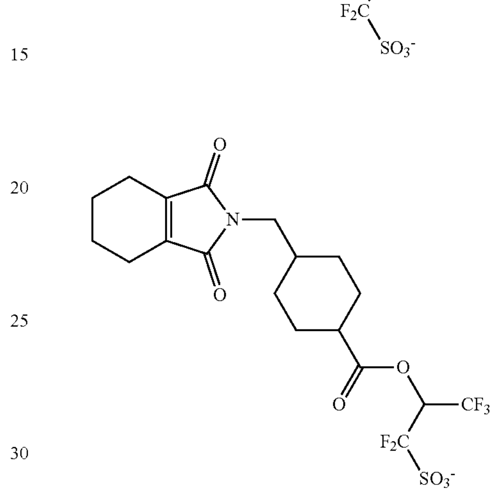
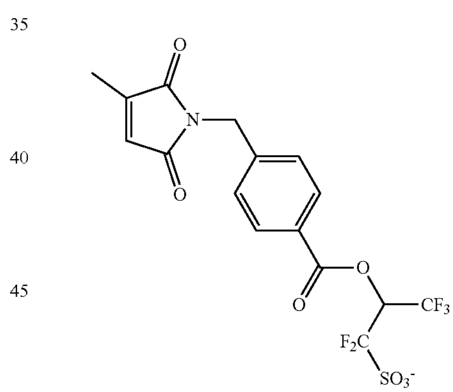
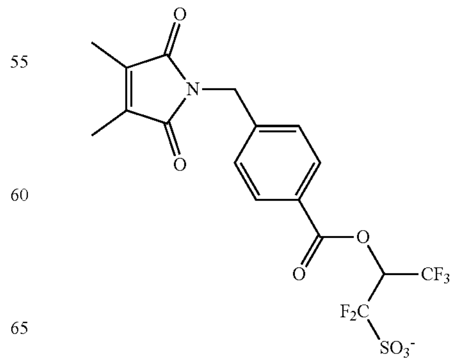

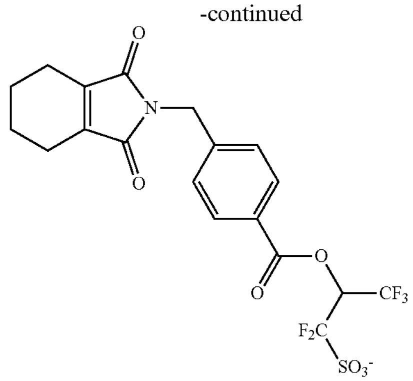
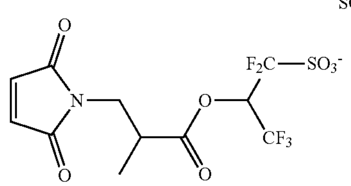
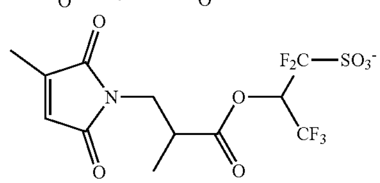
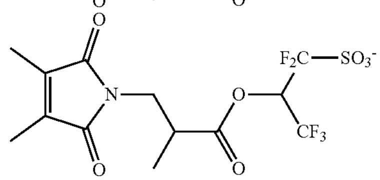
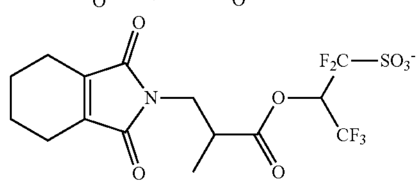
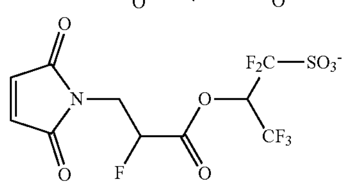
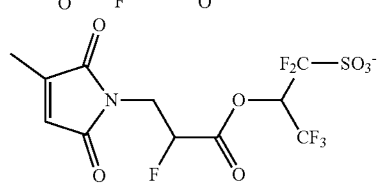
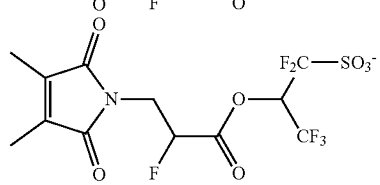
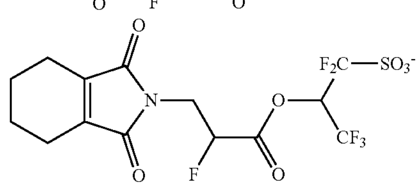
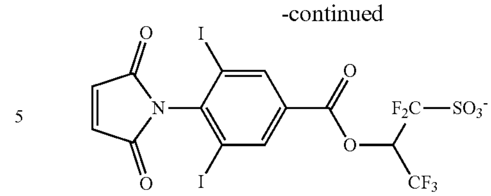
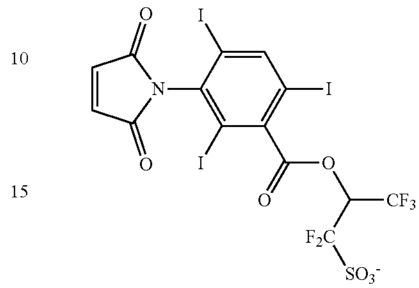
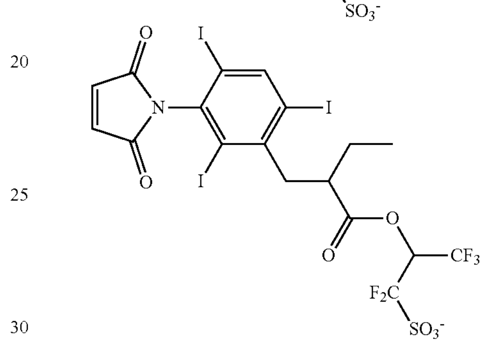
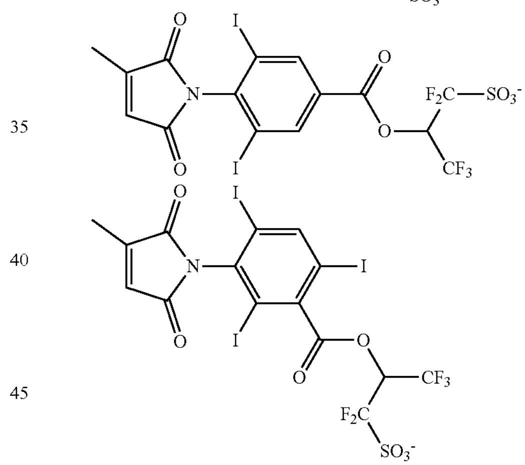
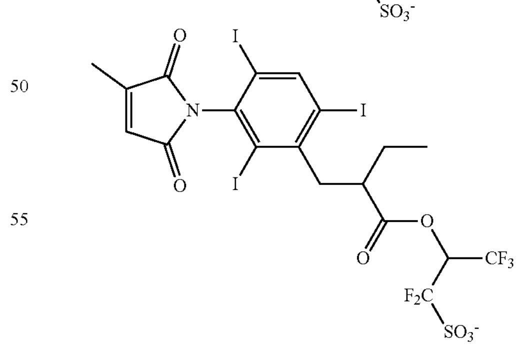
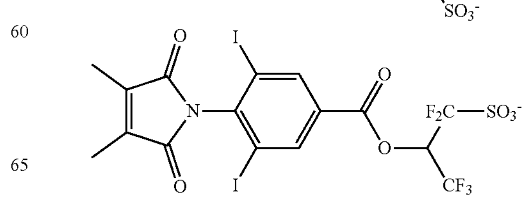

-continued
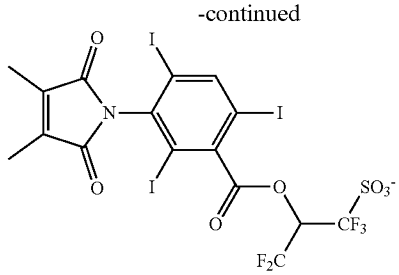
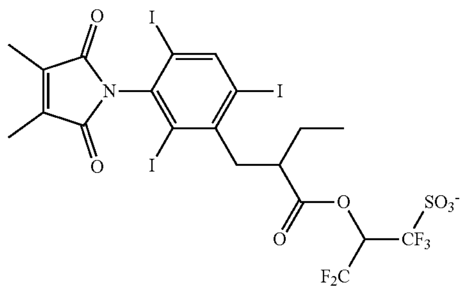
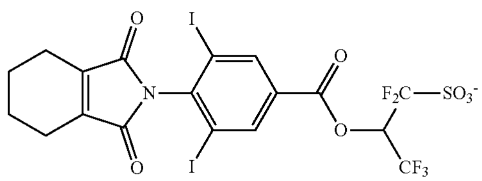
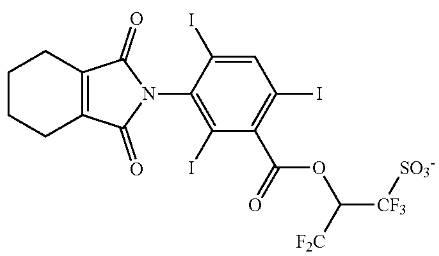
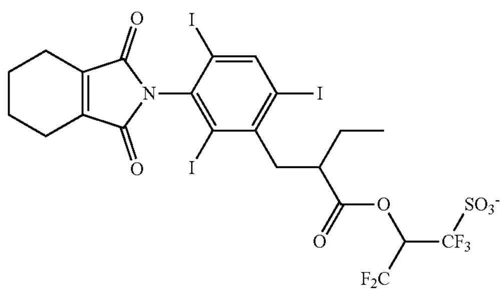
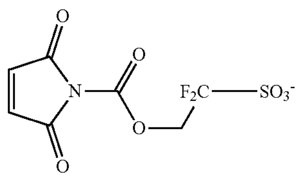
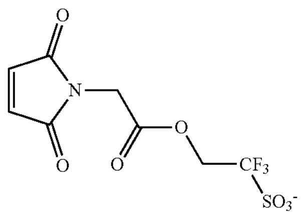
-continued
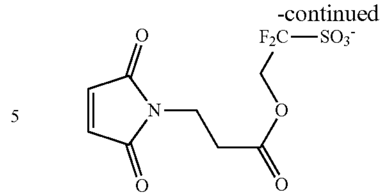
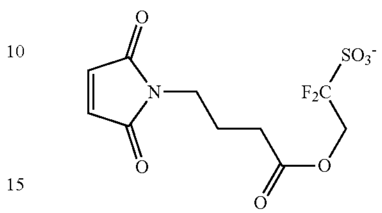
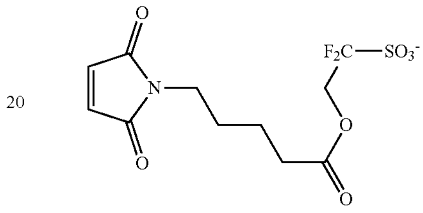
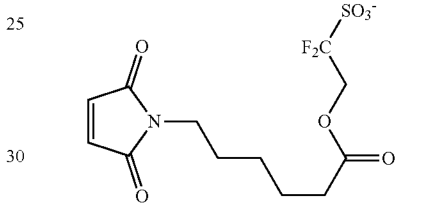
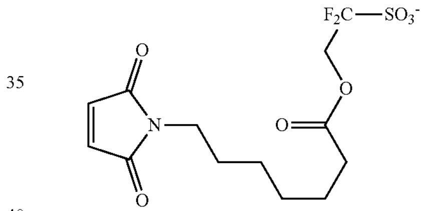
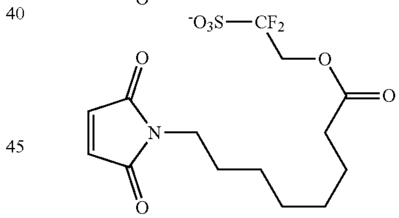
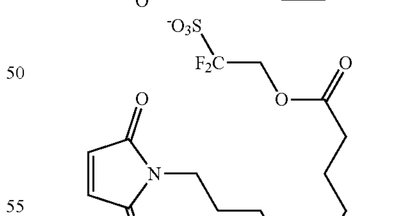
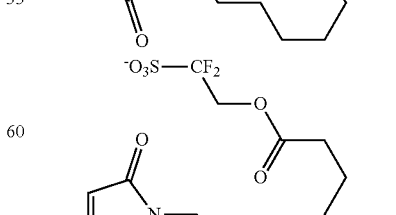
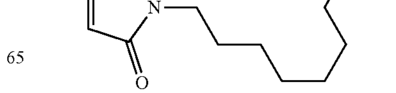

-continued
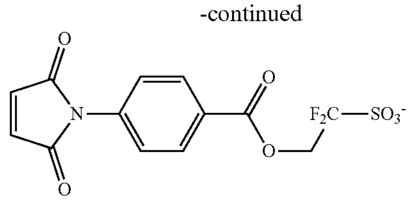
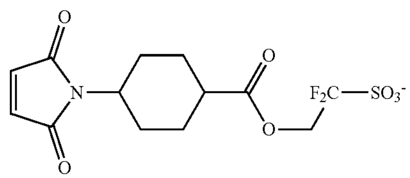
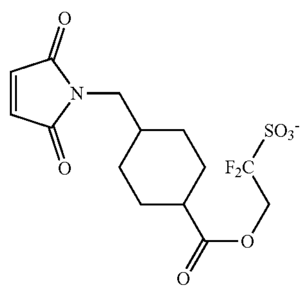
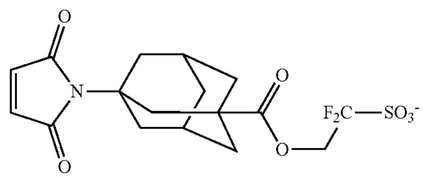
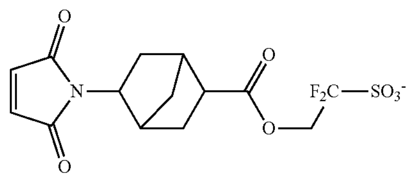
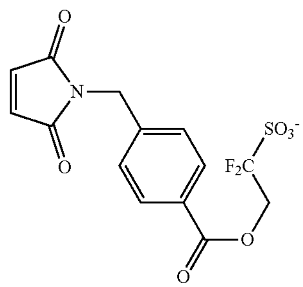
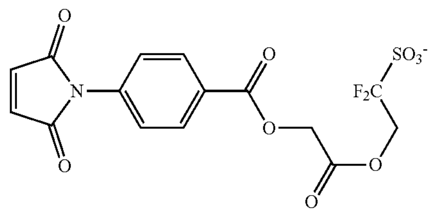
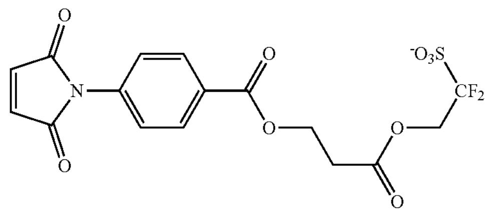
-continued
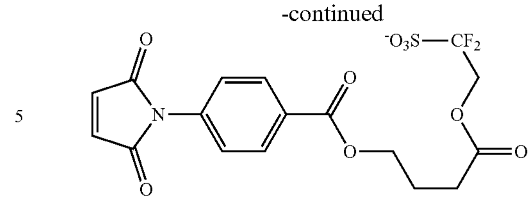
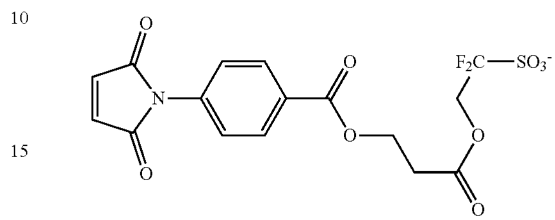
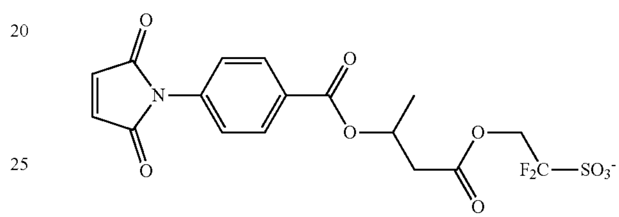
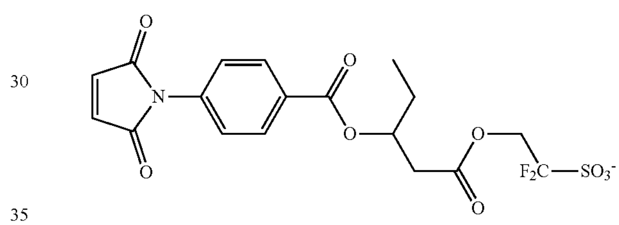
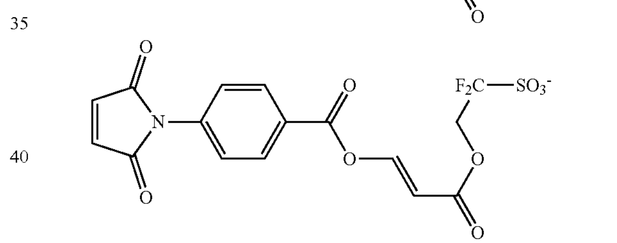
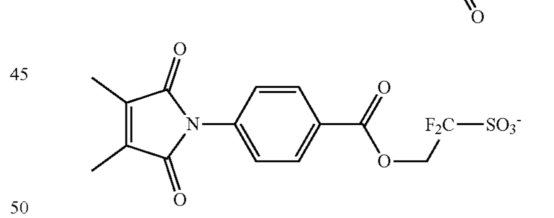
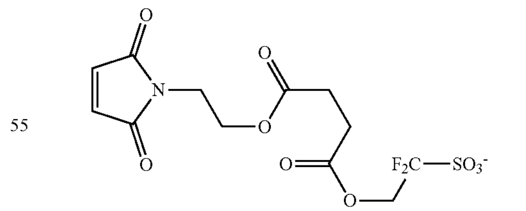
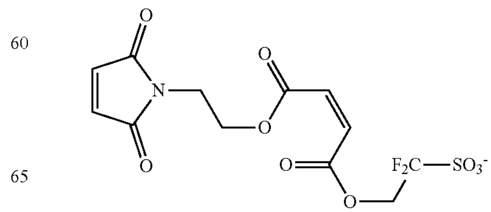

-continued
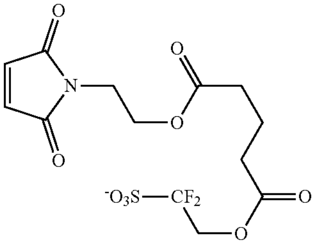
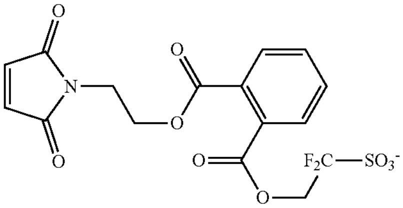
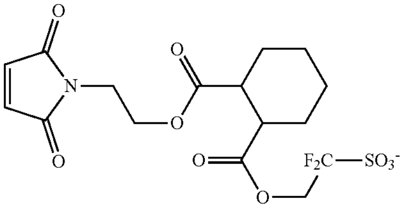
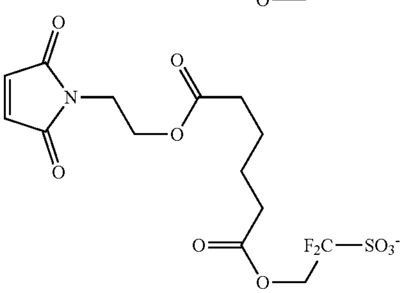
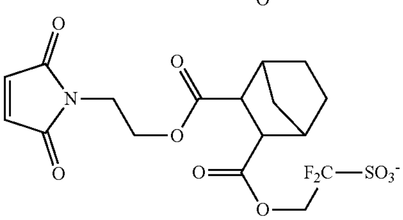
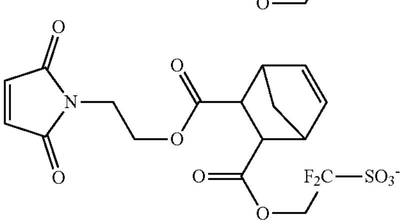
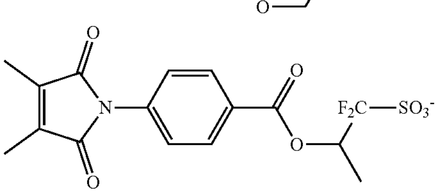
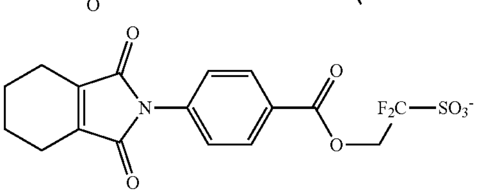
-continued
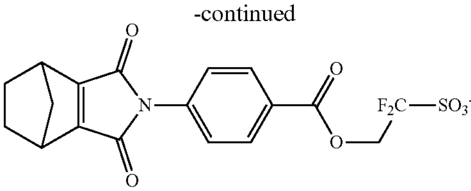
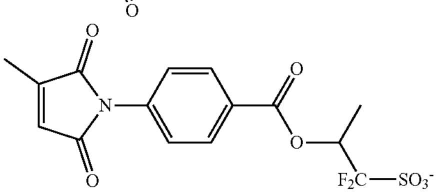
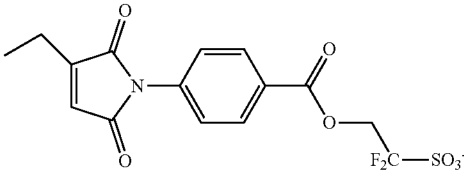
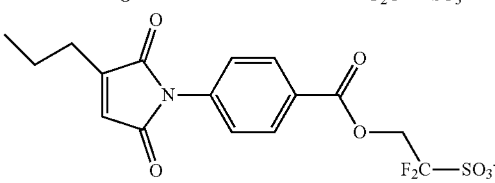
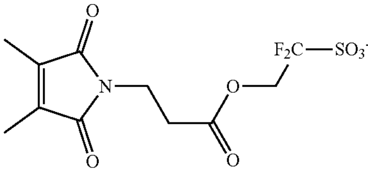
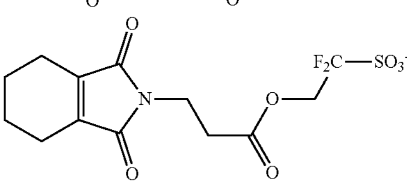
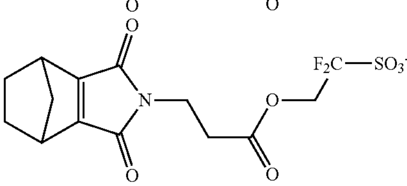
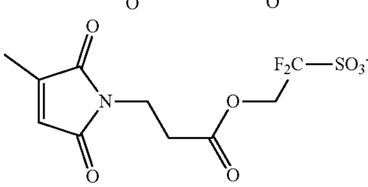
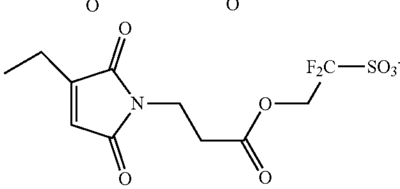
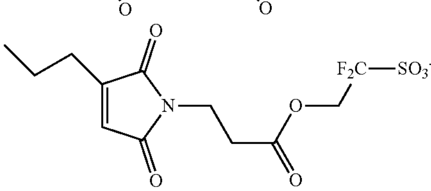

-continued
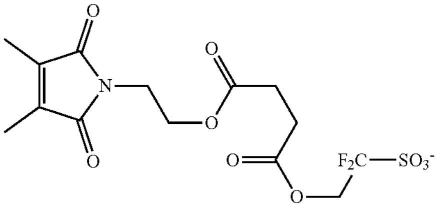
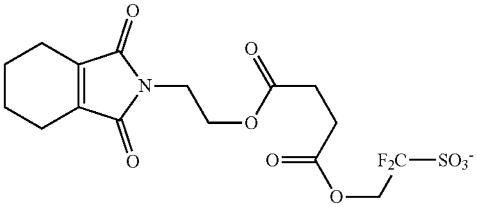
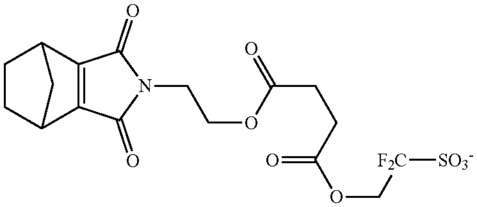
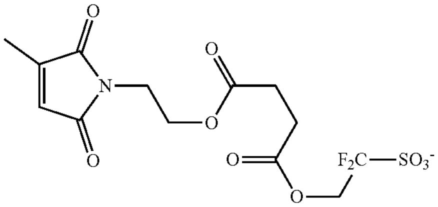
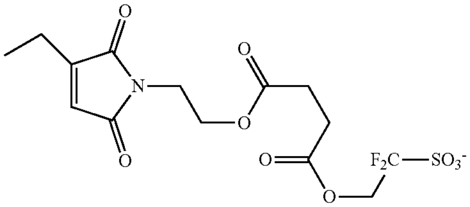
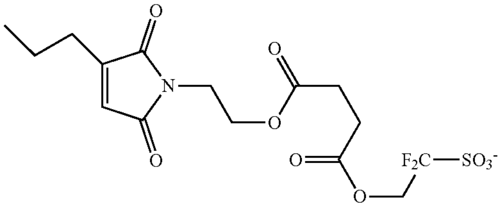
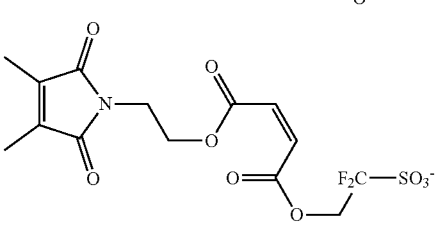
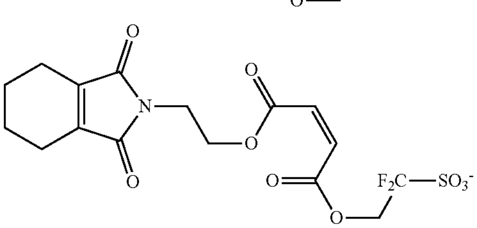
-continued
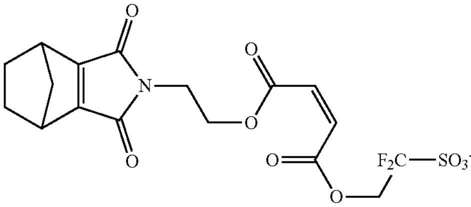
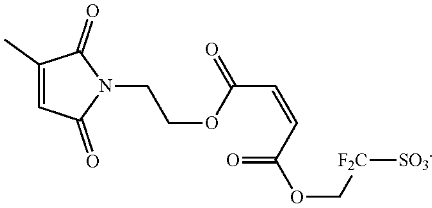
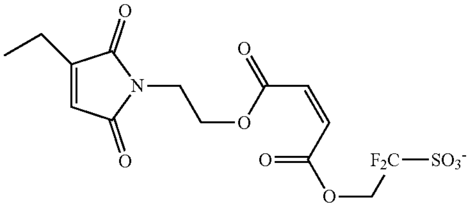
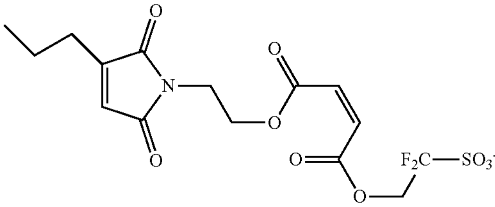
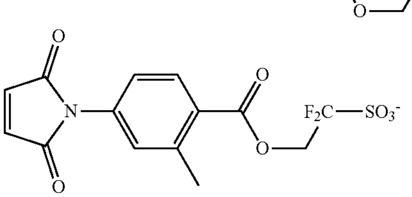
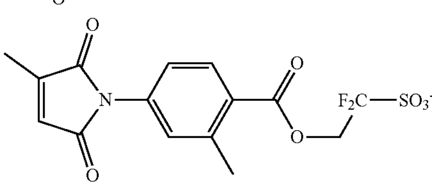
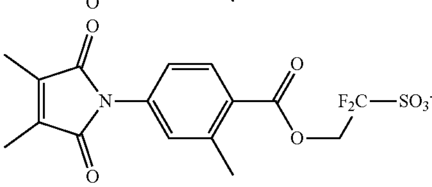
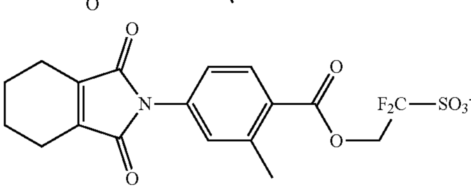
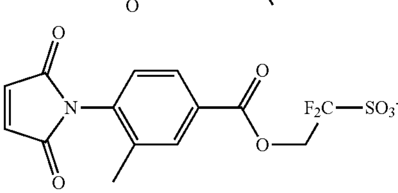

-continued
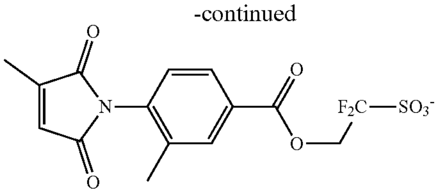
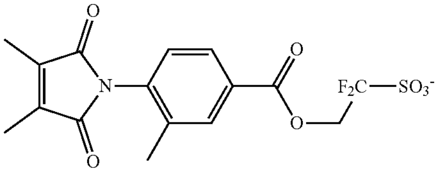
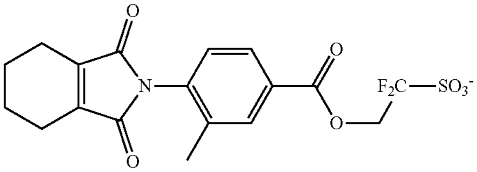
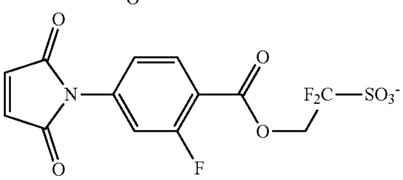
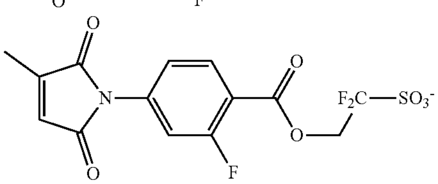
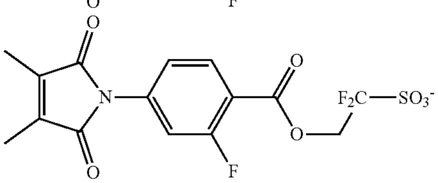
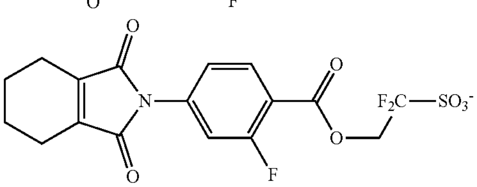
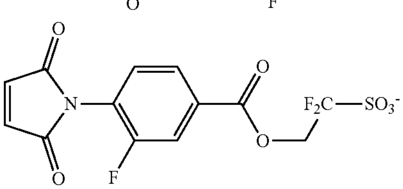
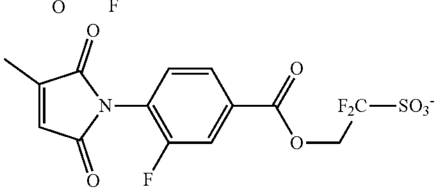
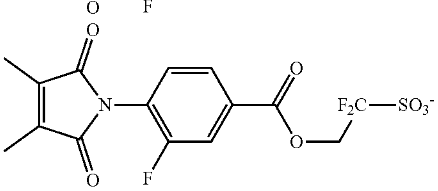
-continued
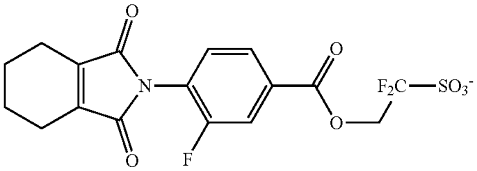
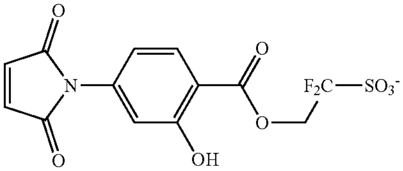
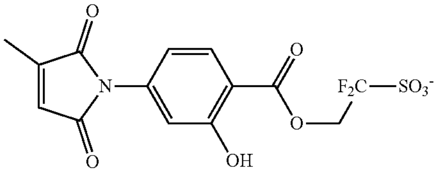
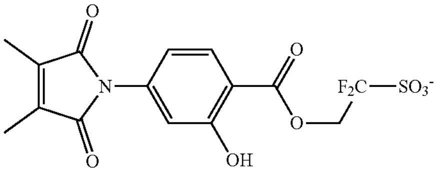
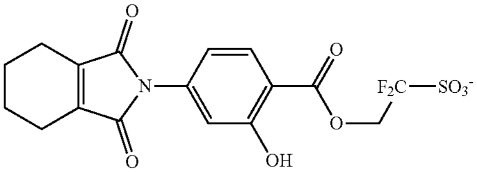
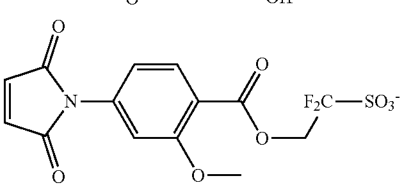
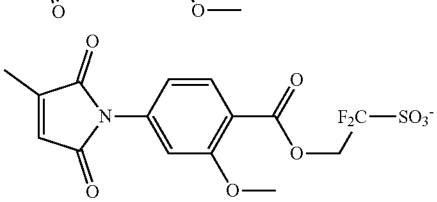
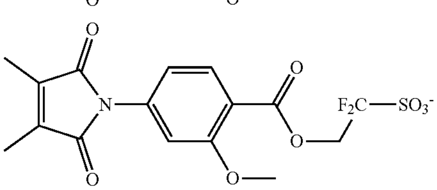
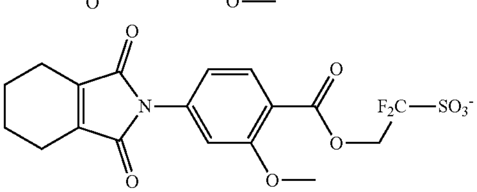

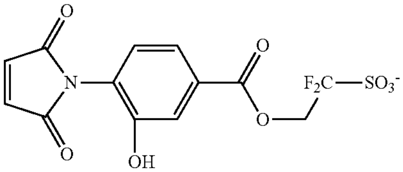
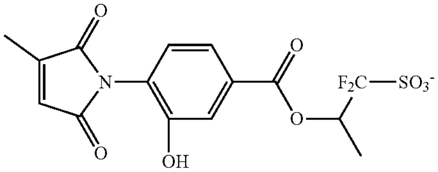
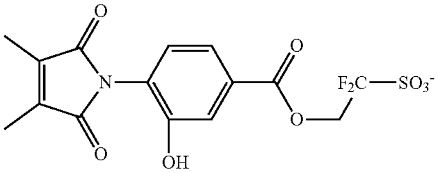
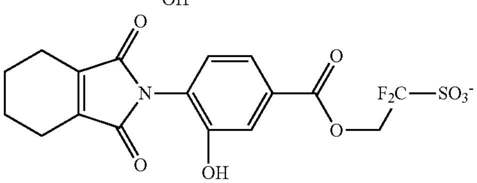
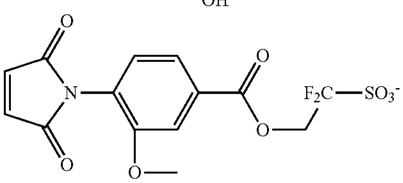
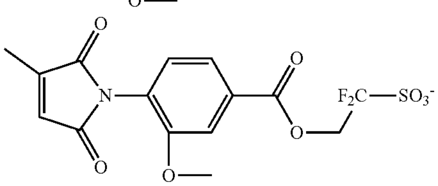
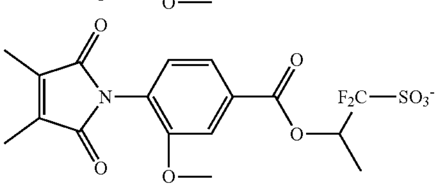
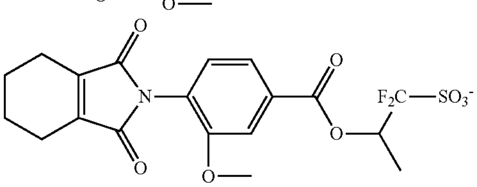
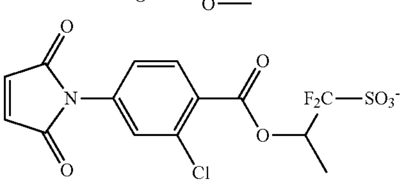
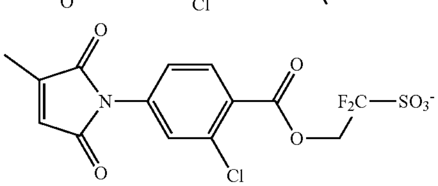
-continued
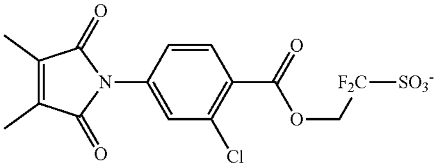
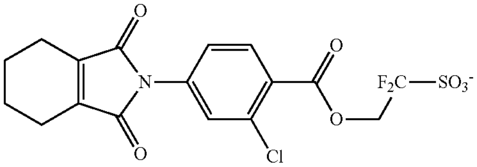
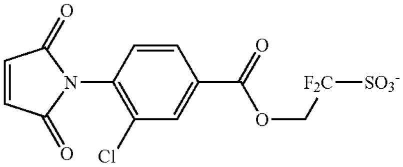
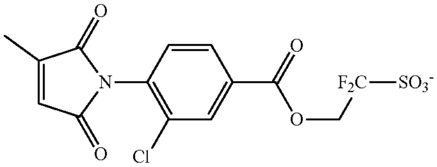
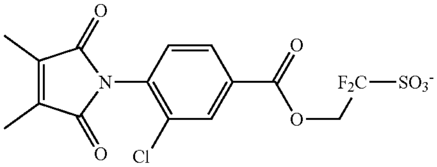
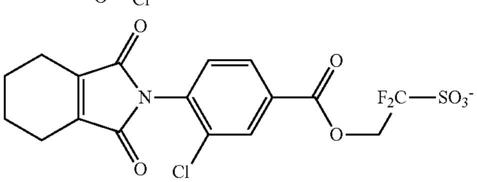
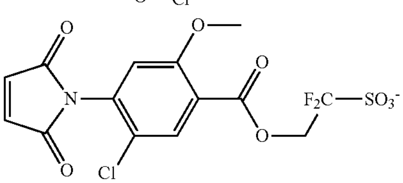
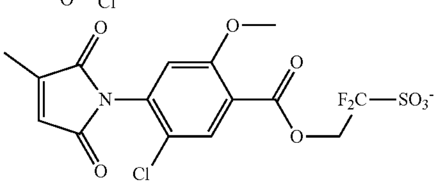
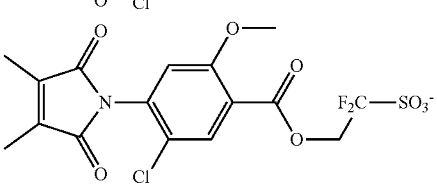
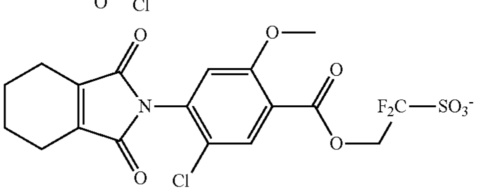

-continued
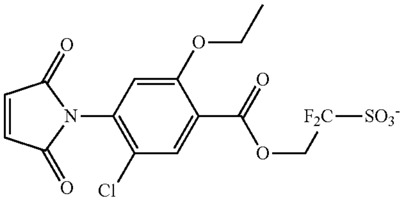
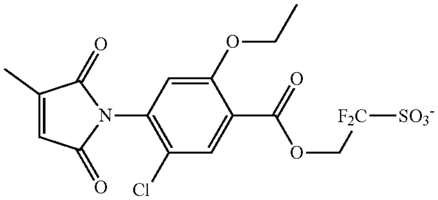
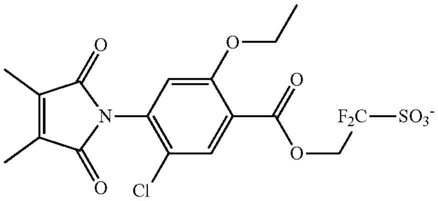
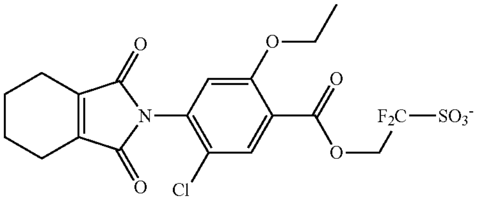
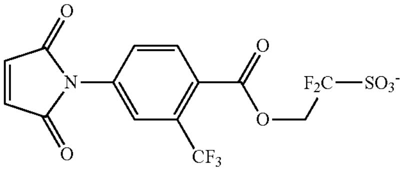
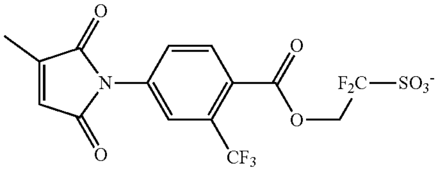
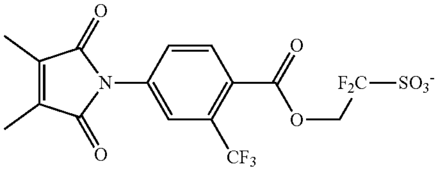
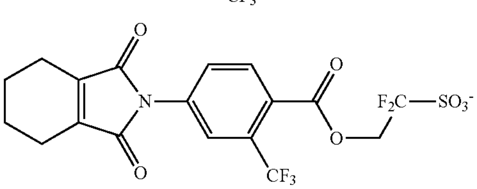
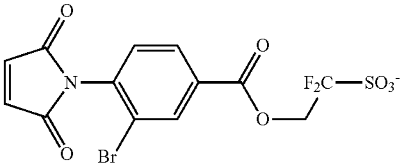
-continued
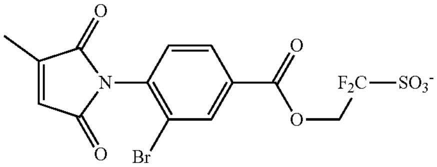
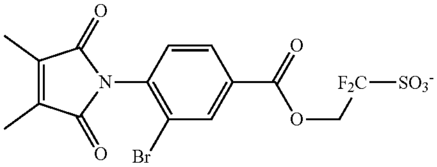
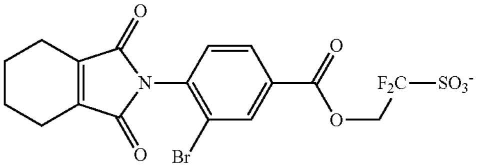
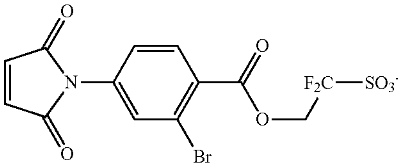
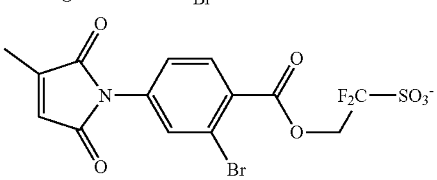
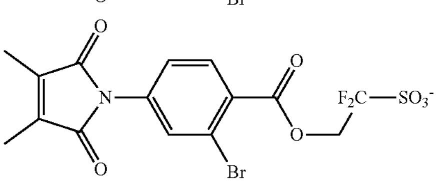
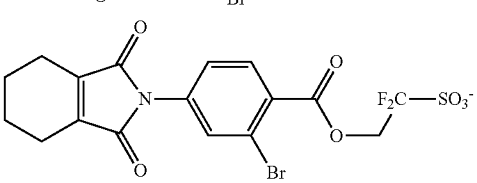
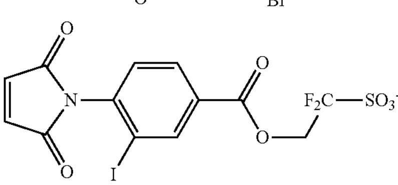
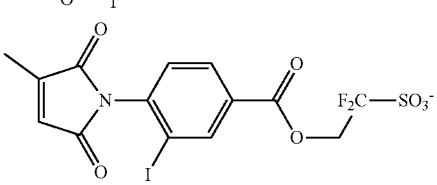
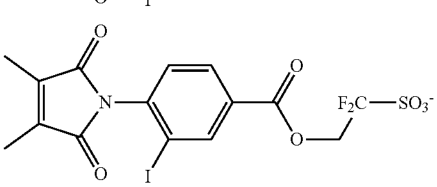

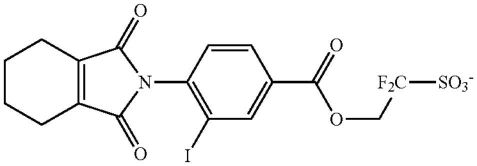
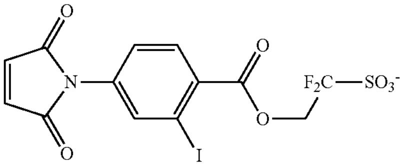
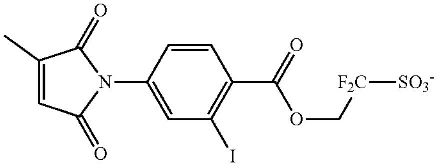
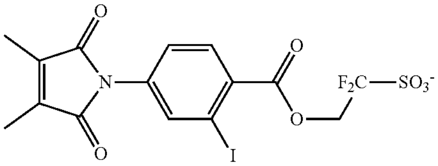
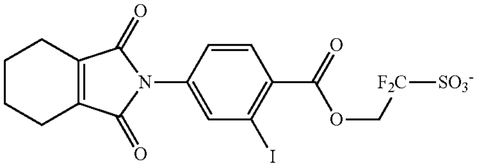
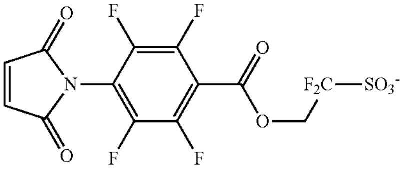
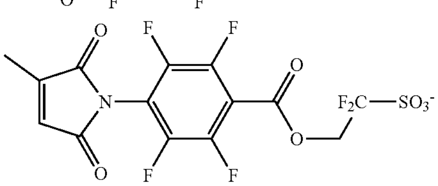
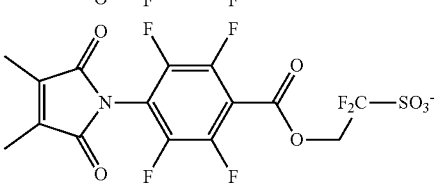
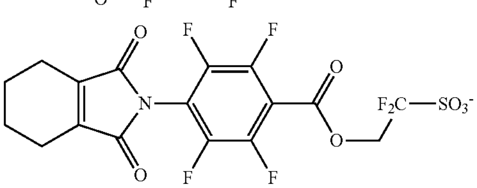
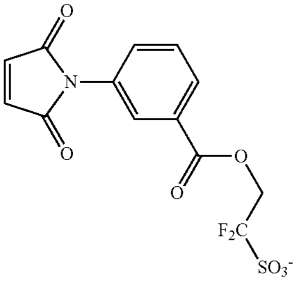
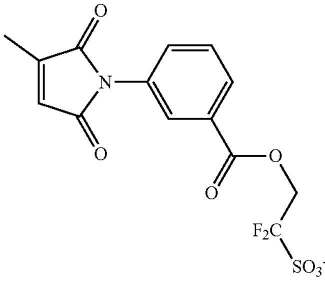
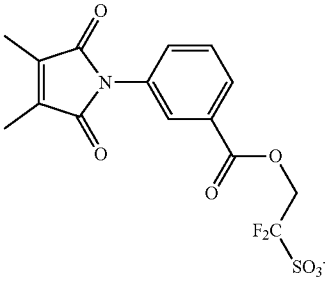
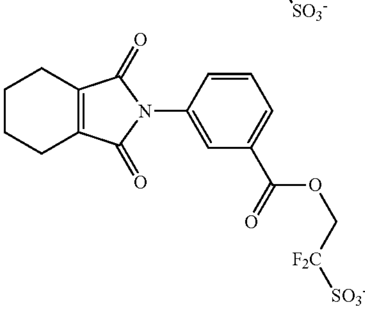
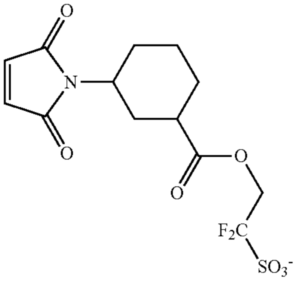
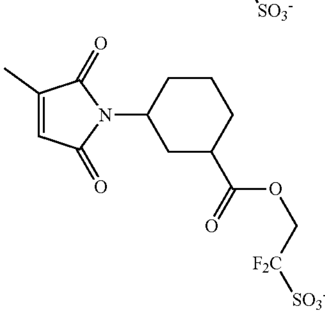

-continued
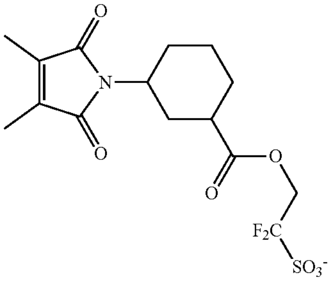
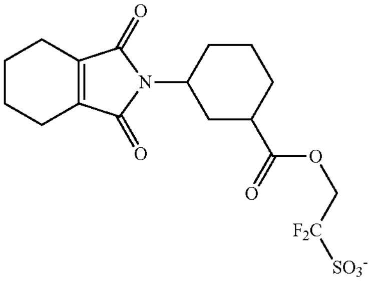
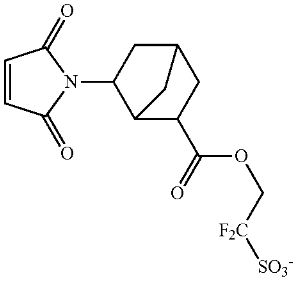
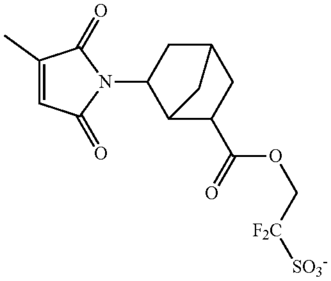
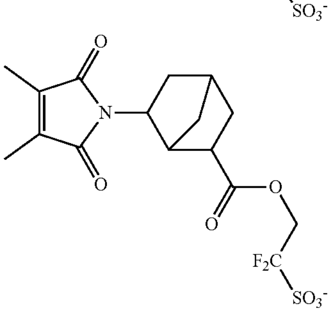
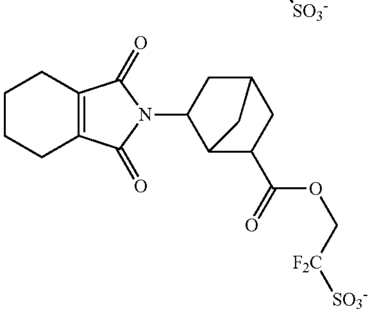
-continued
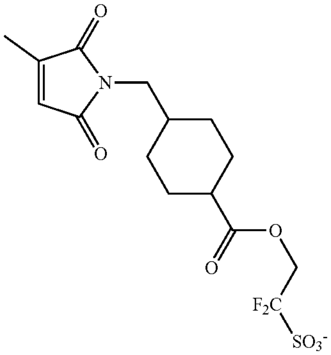
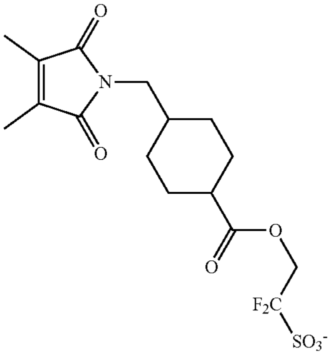
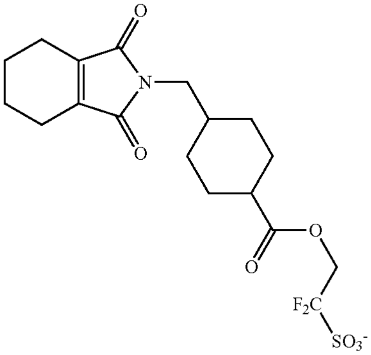
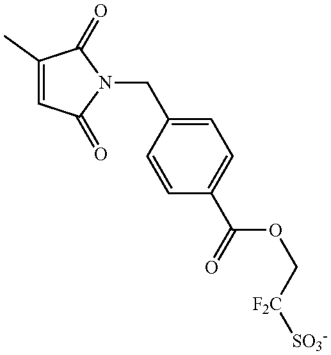

-continued
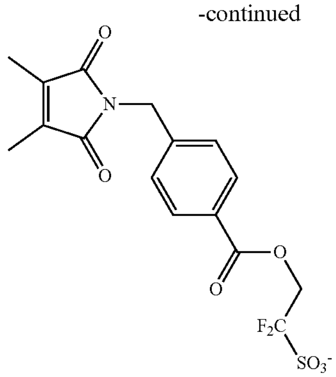
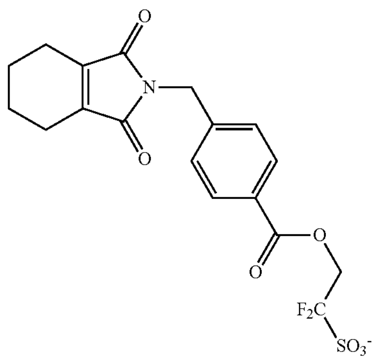
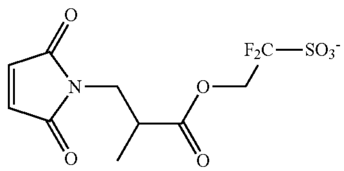
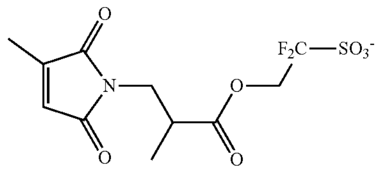
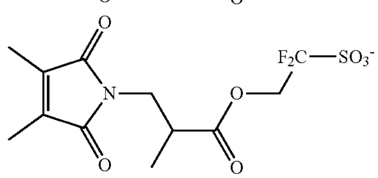
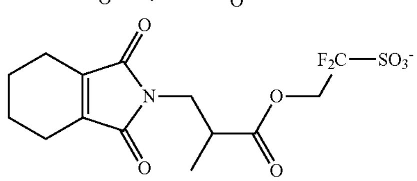
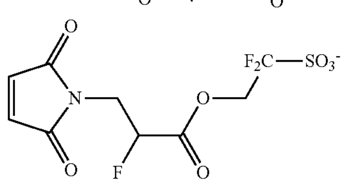
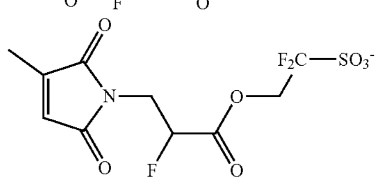
-continued
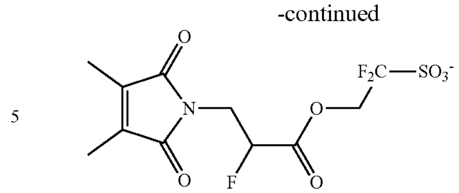
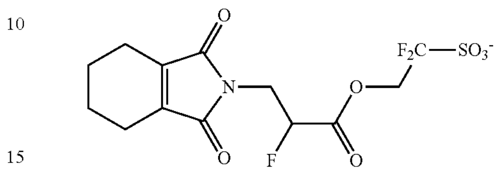
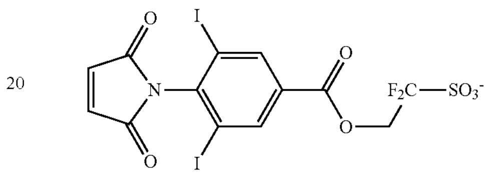
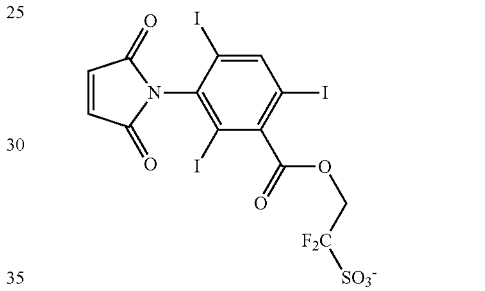
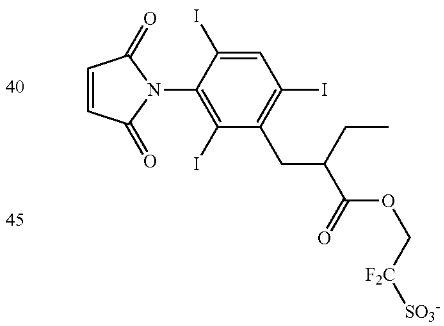
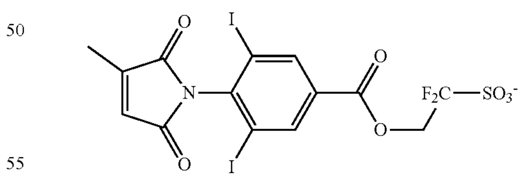
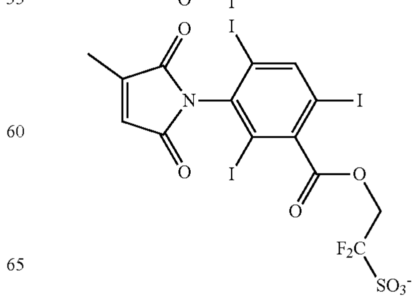

-continued
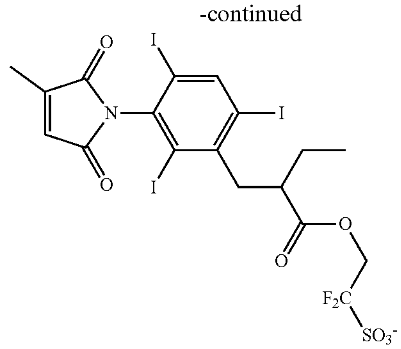
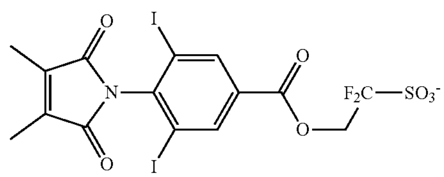
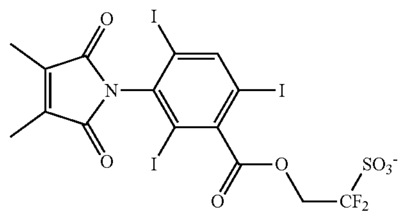
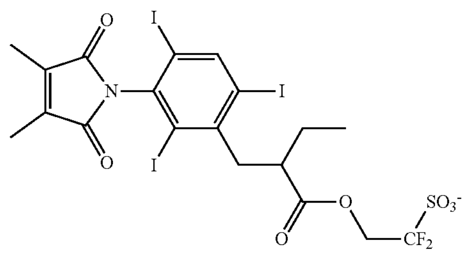
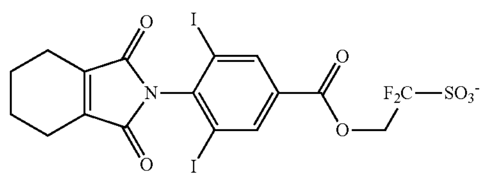
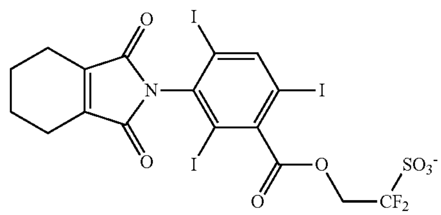
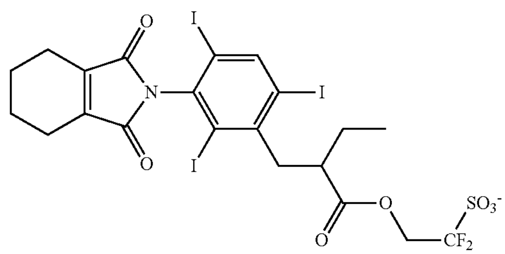
-continued
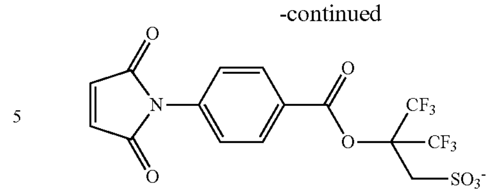
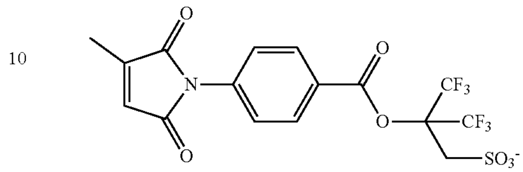
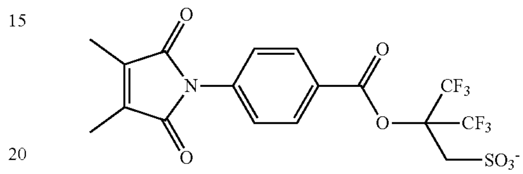
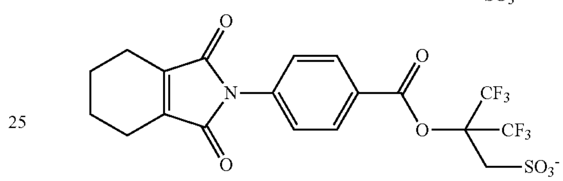
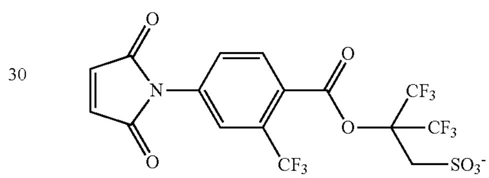
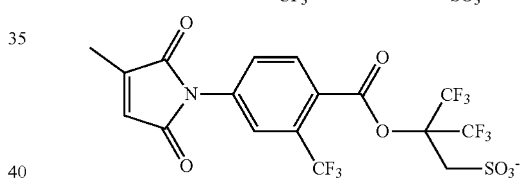
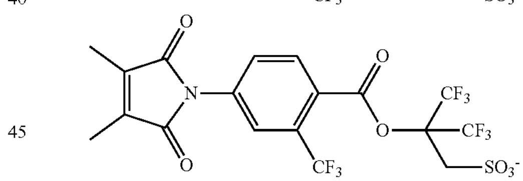
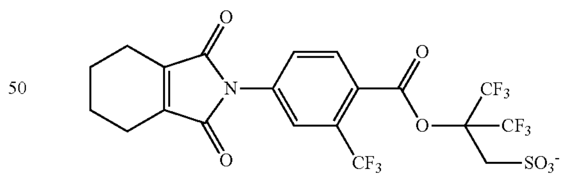
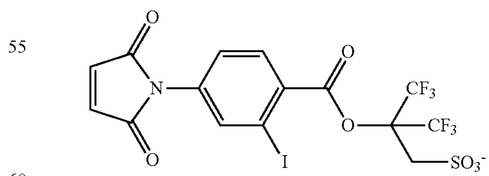
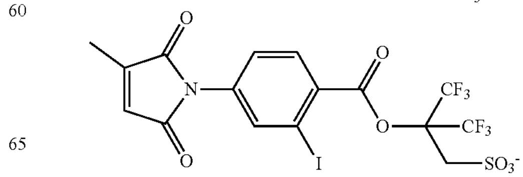

-continued
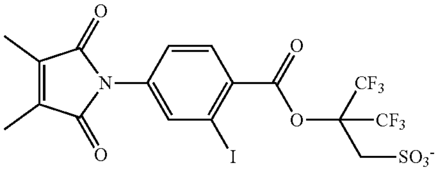
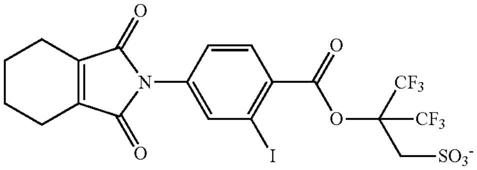
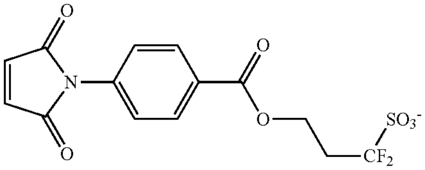
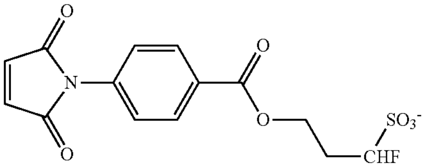
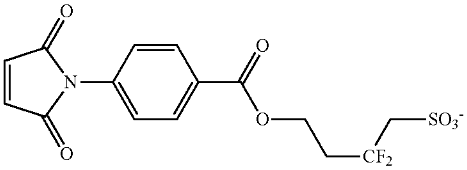
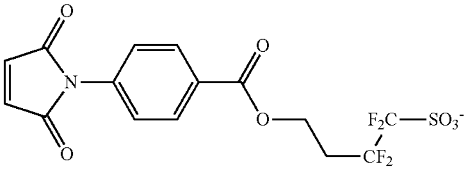
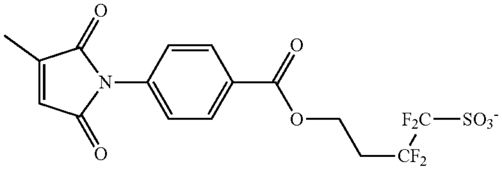
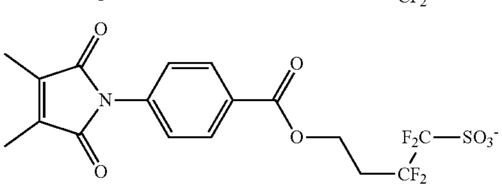
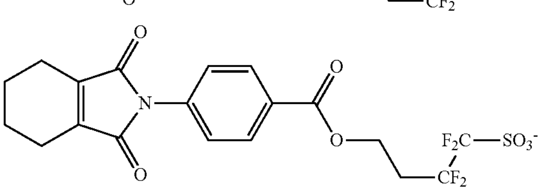
-continued
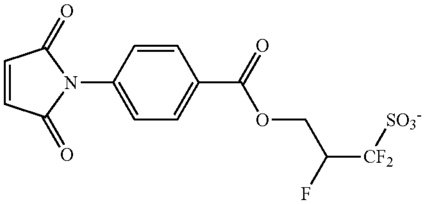
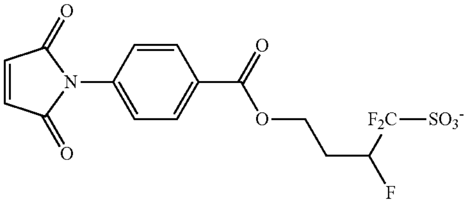
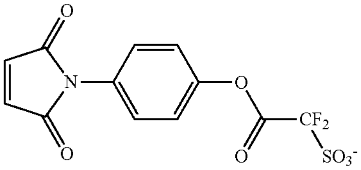
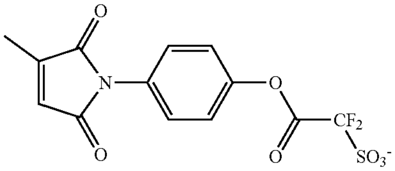
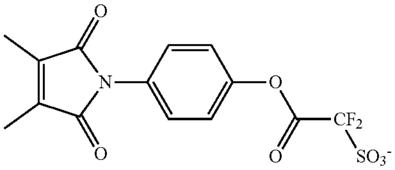
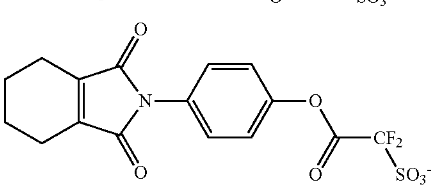
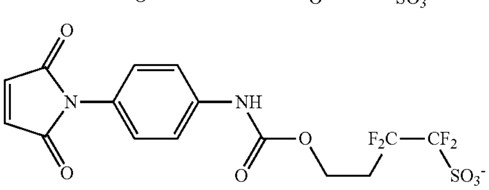
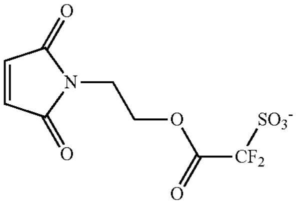
Examples of the cation in the sulfonium salt represented by the general formula (A-1) include those given below, but are not limited thereto.

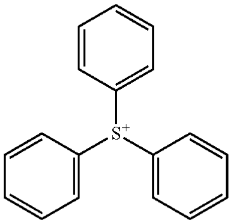
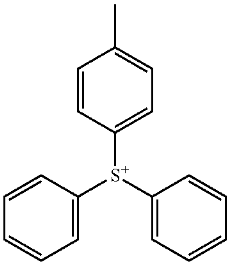
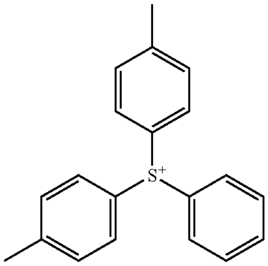
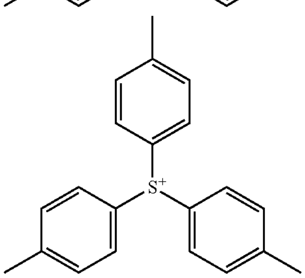
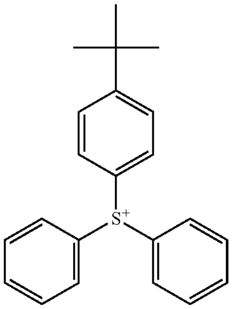
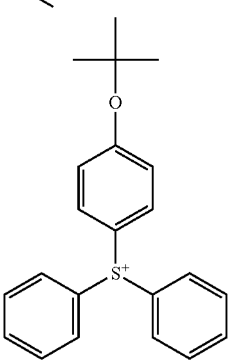
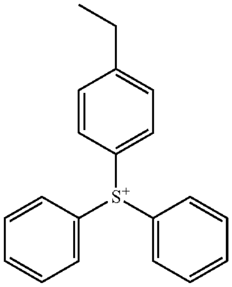
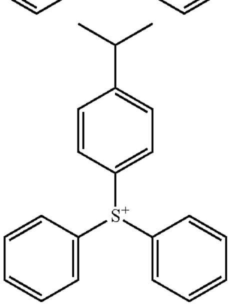
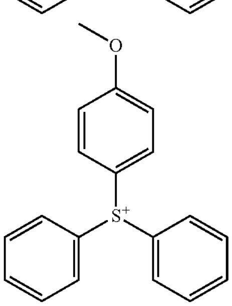
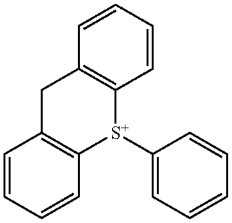
-continued
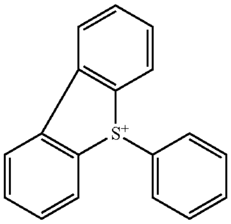
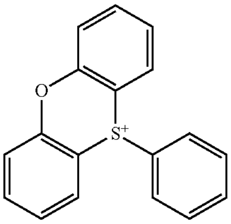
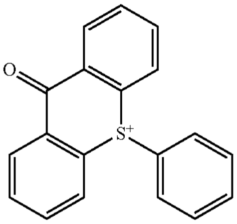
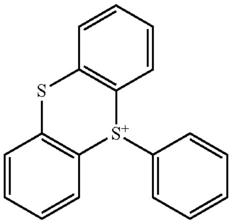
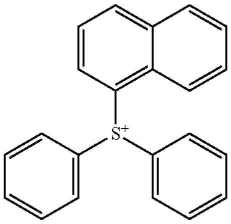
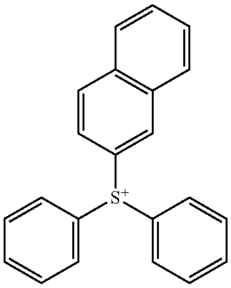
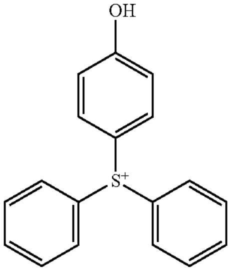
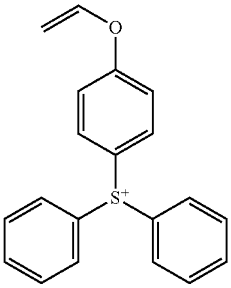
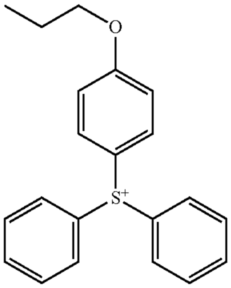
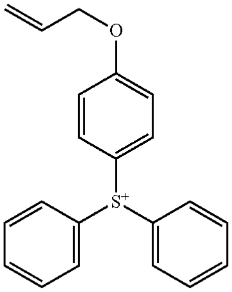
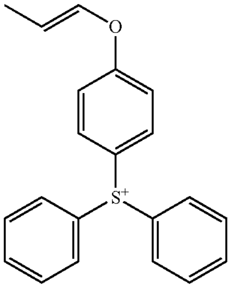
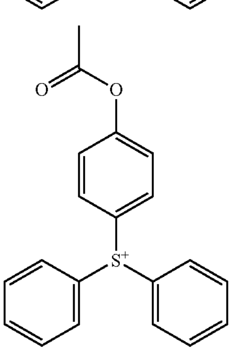

-continued
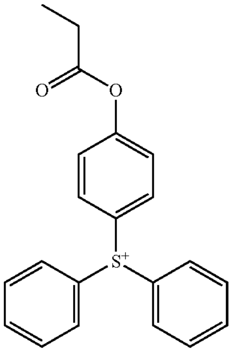
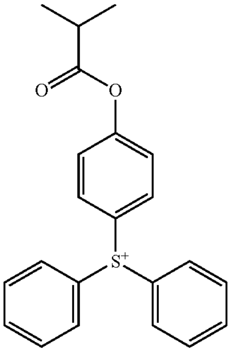
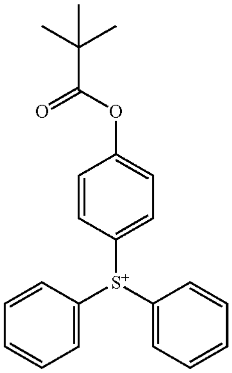
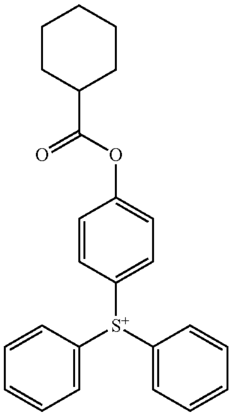
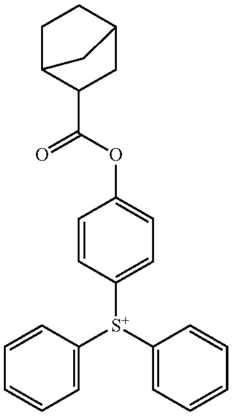
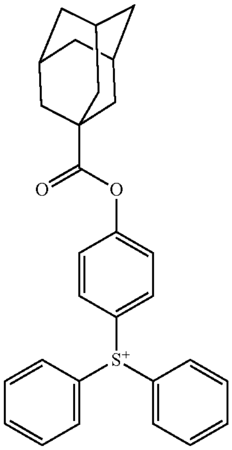
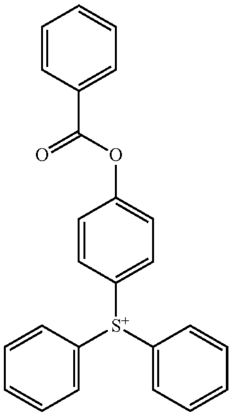
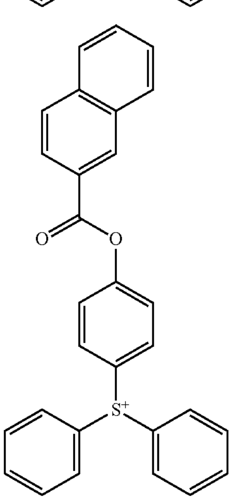
-continued
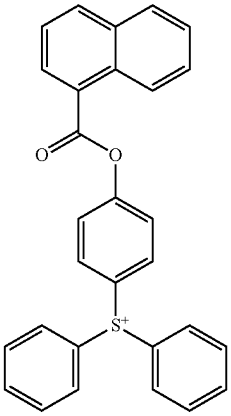
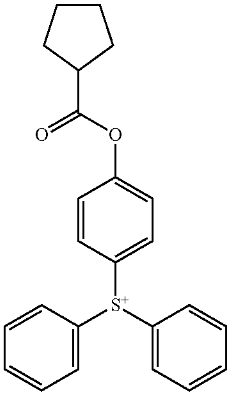
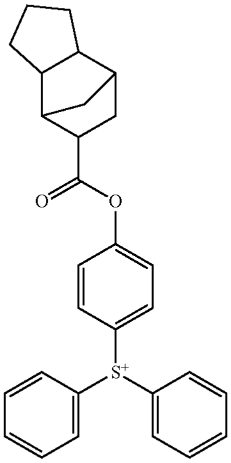
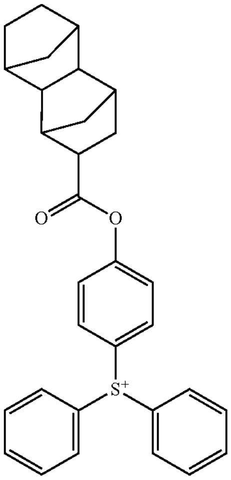
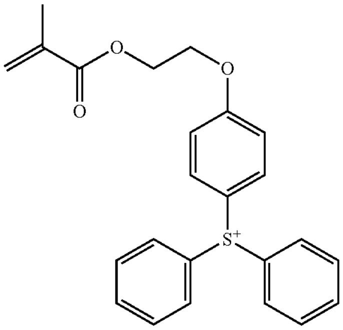
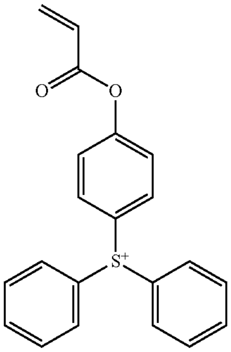
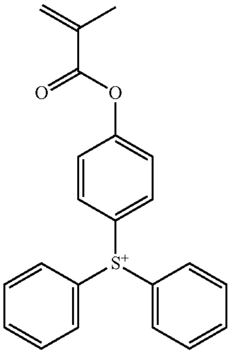

-continued
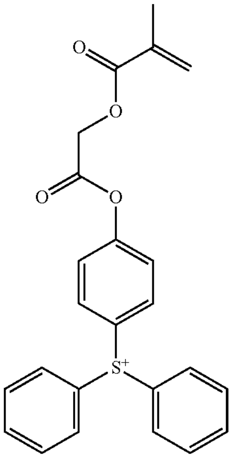
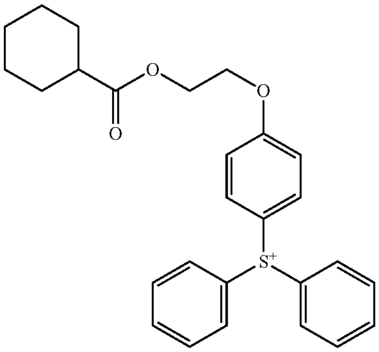
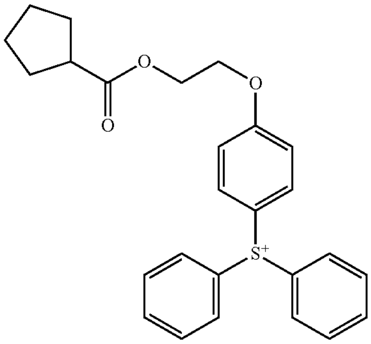
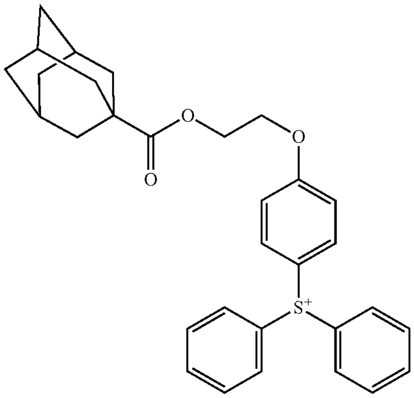
-continued
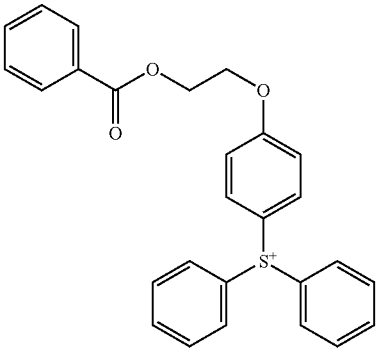
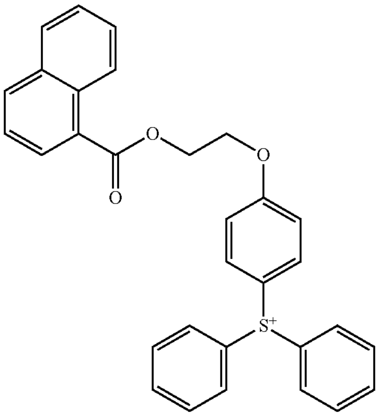
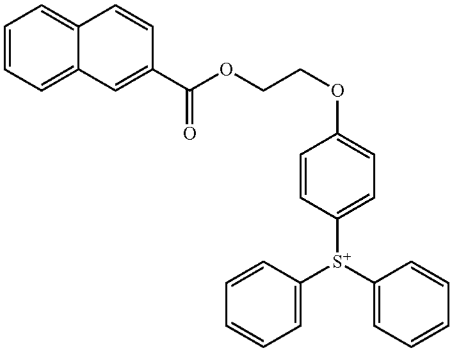
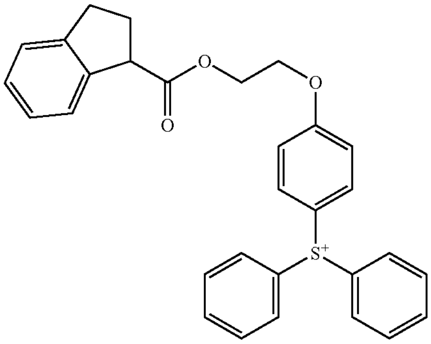

-continued
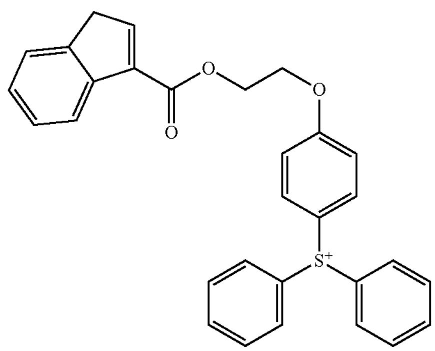
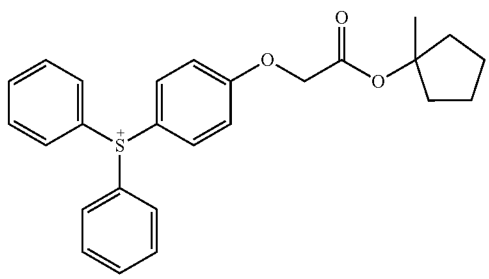
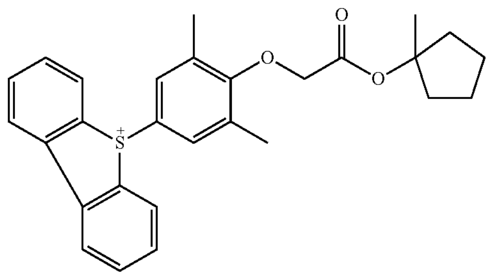
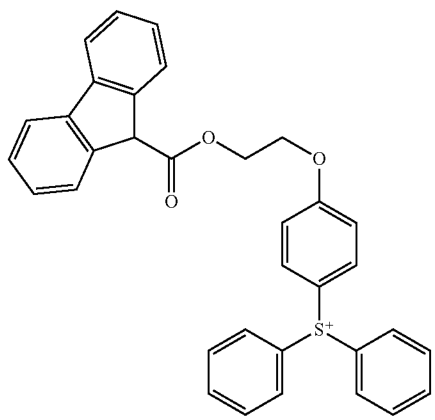
-continued
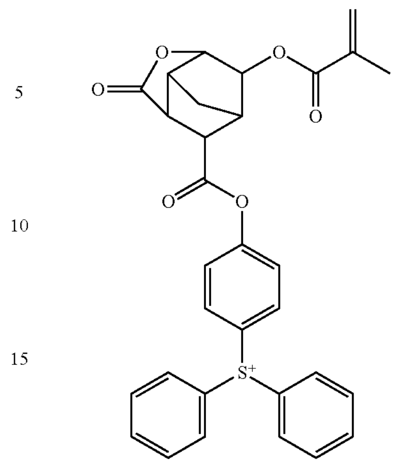
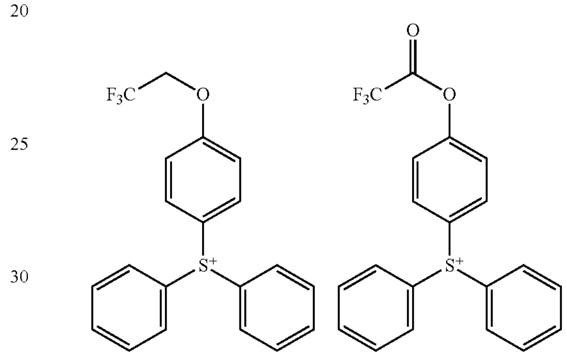
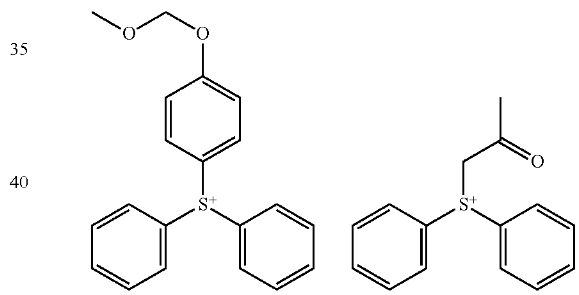
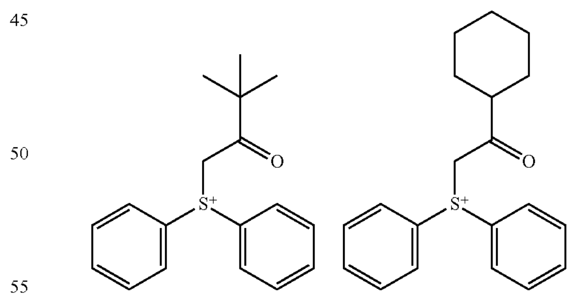
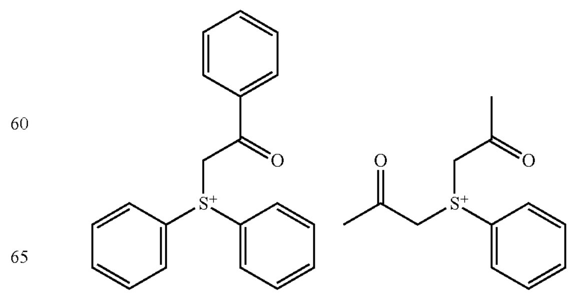

-continued
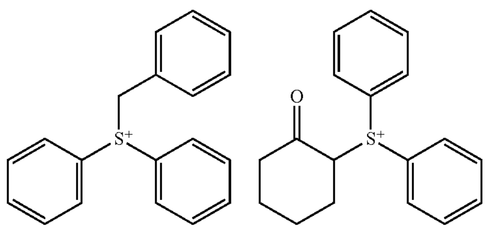
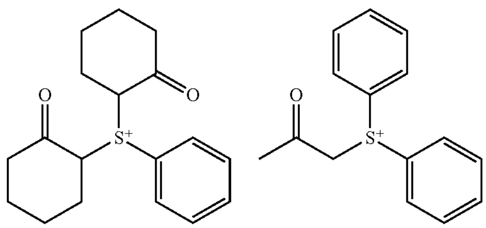
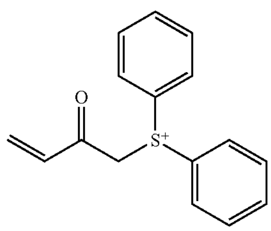
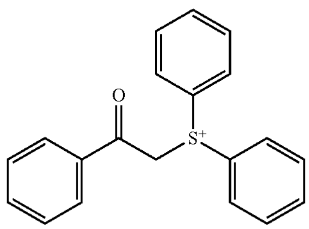
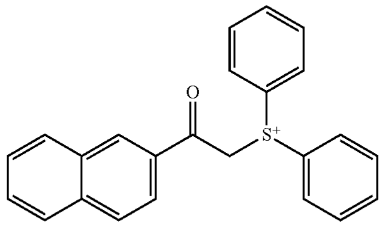
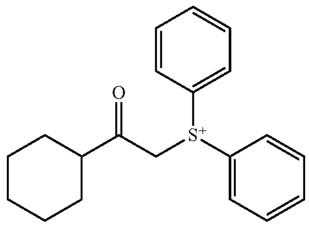
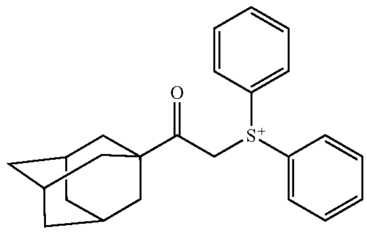
-continued
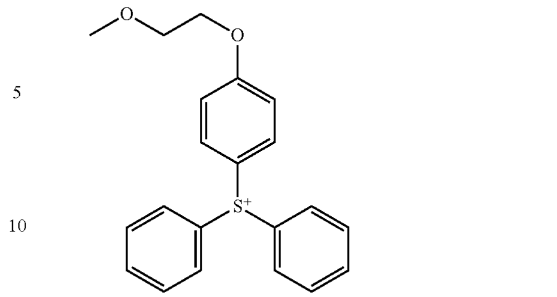
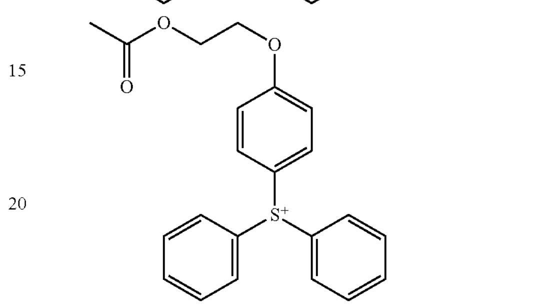
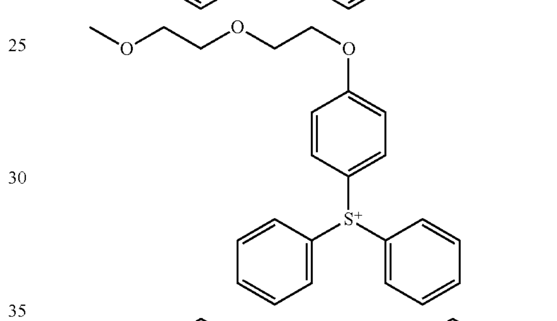
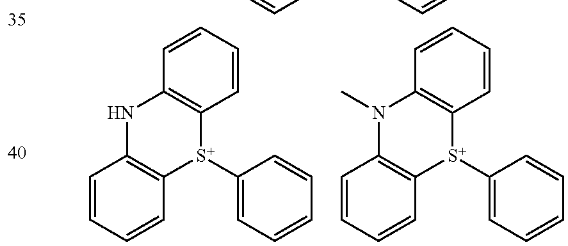
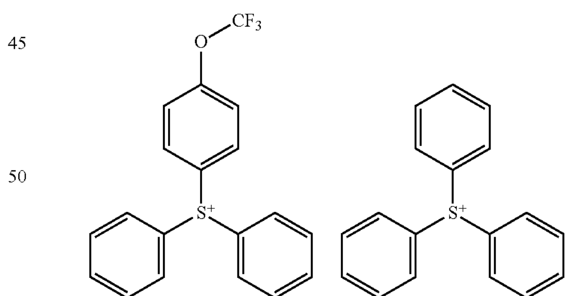
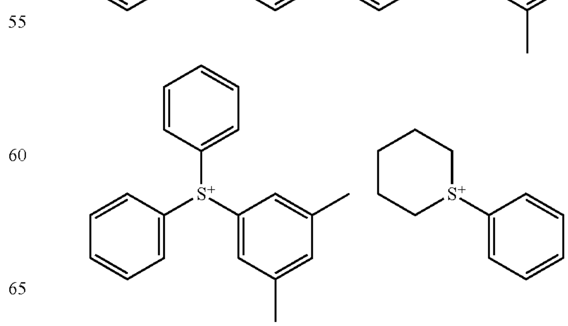

-continued
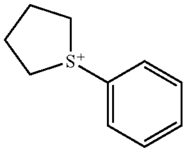
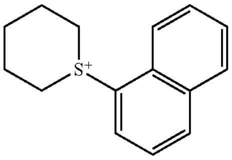
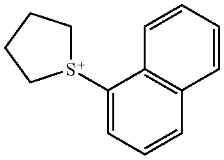
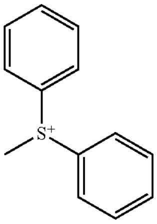
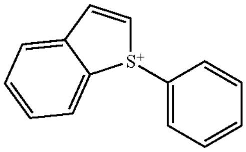
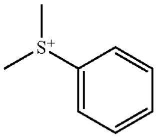
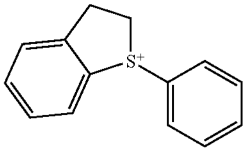
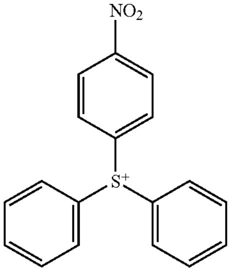
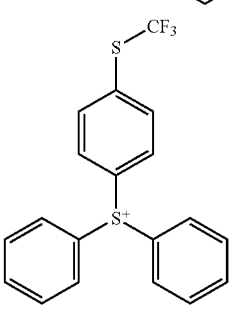
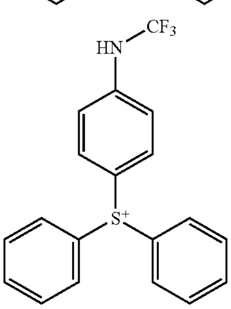
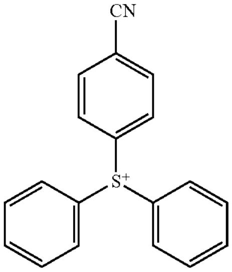
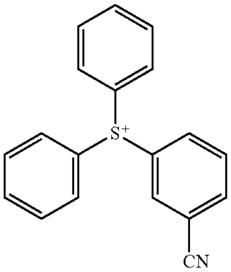
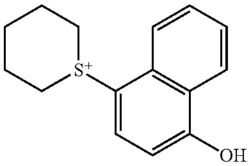
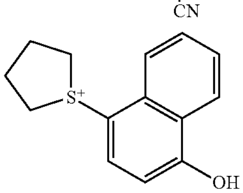
-continued
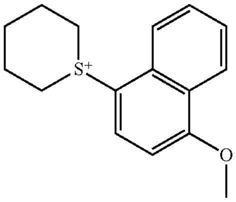
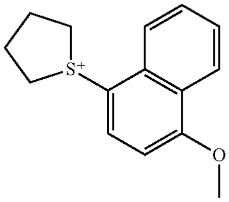
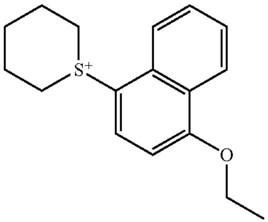
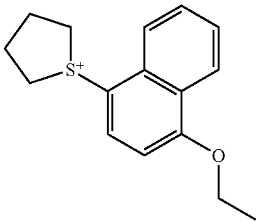
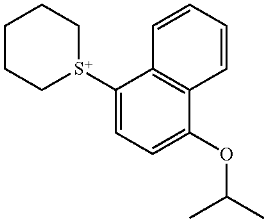
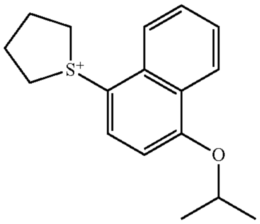
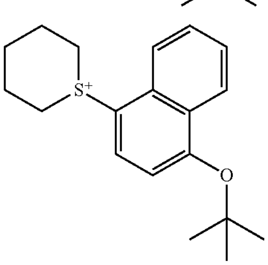
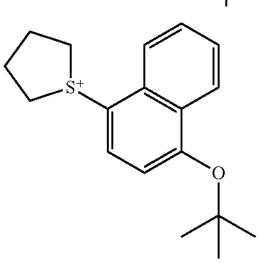

-continued
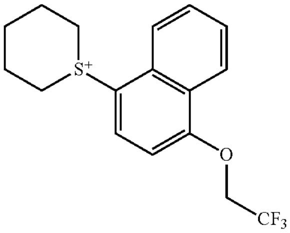
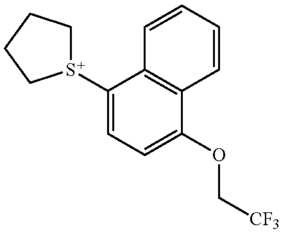
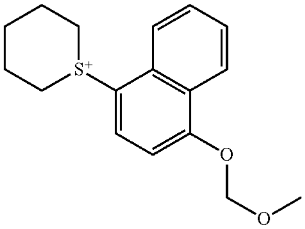
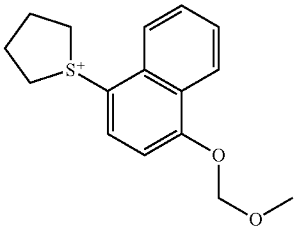
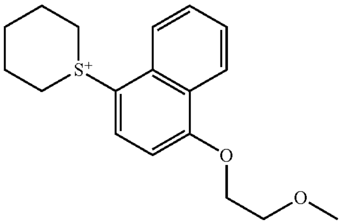
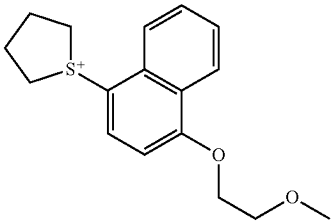
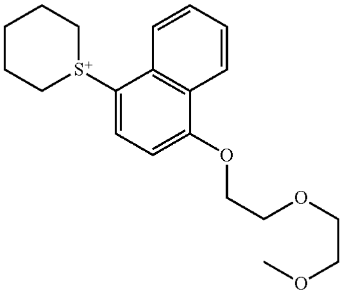
-continued
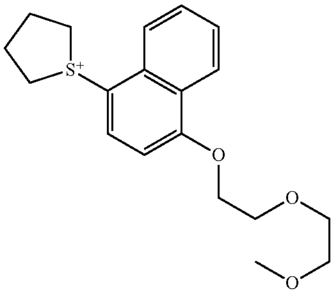
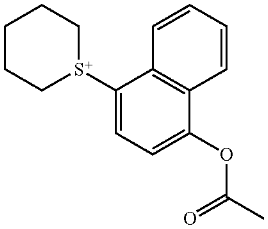
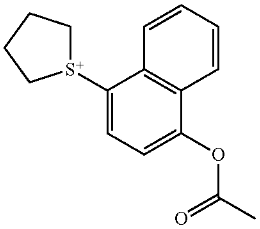
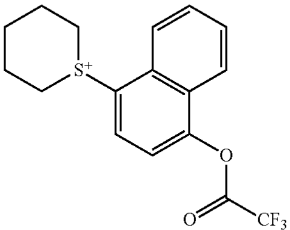
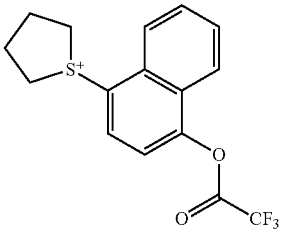
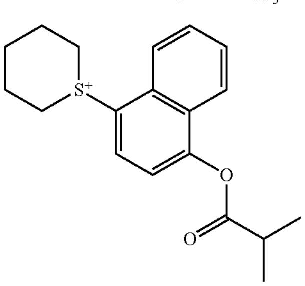

-continued
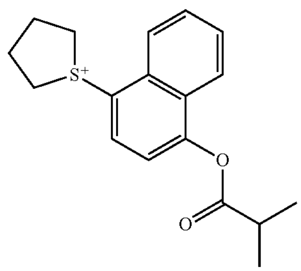
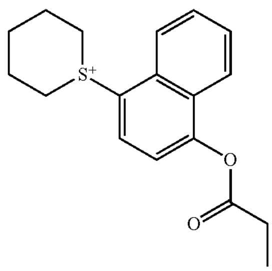
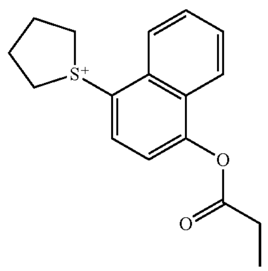
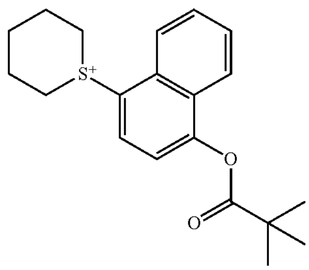
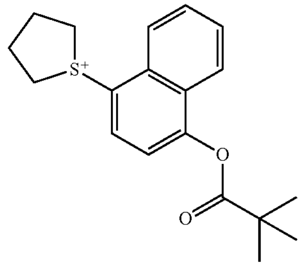
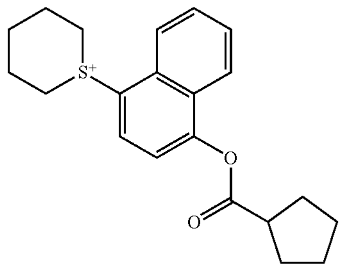
-continued
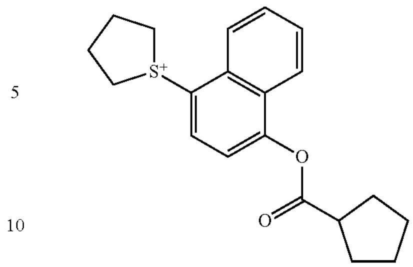
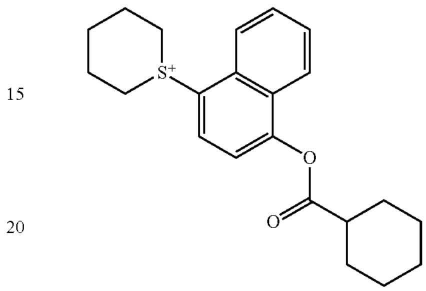
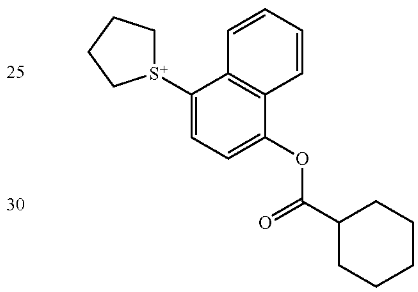
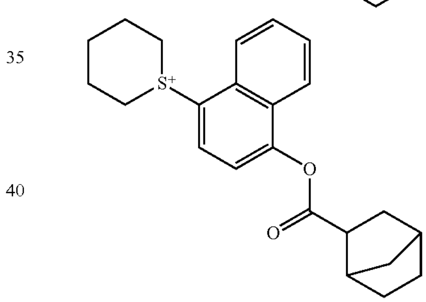
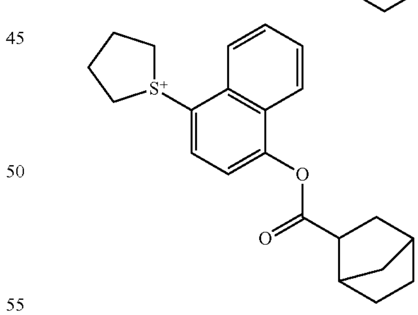
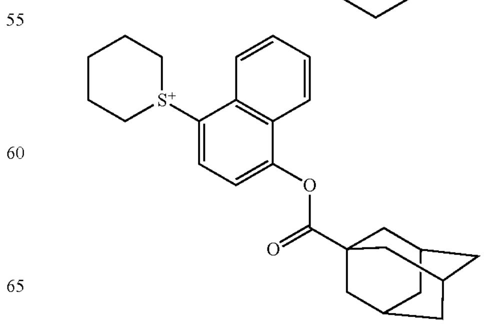

-continued
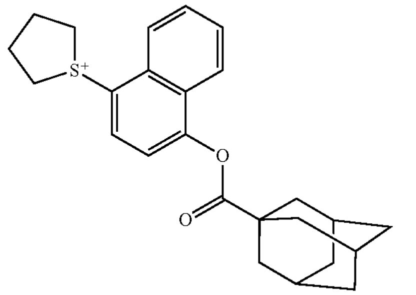
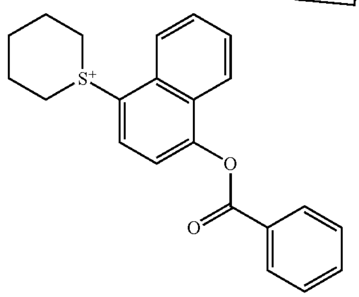
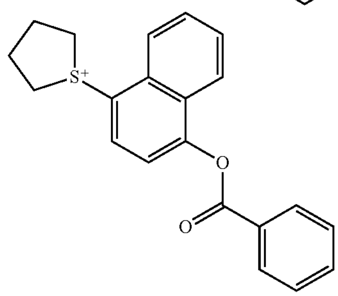
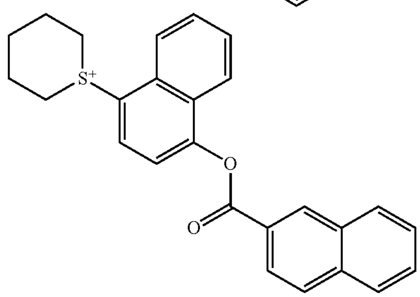
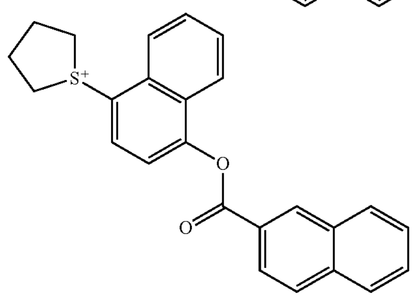
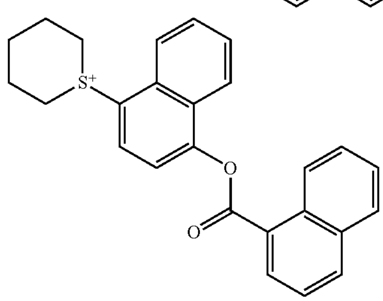
-continued
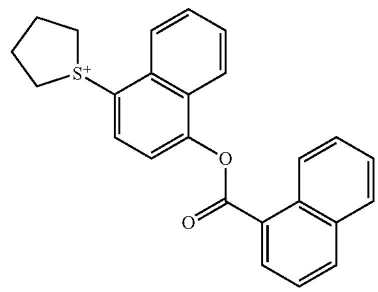
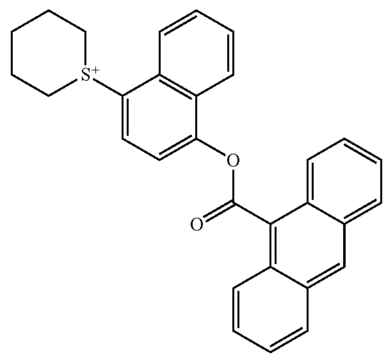
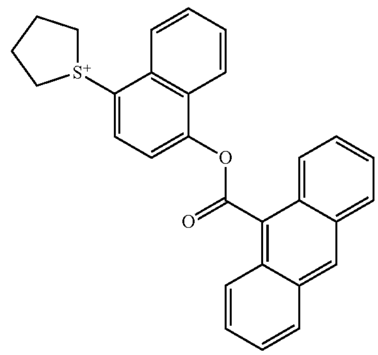
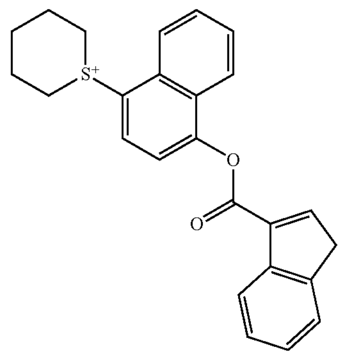
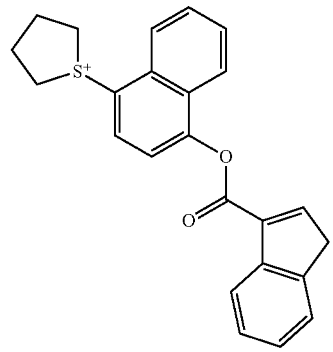

-continued
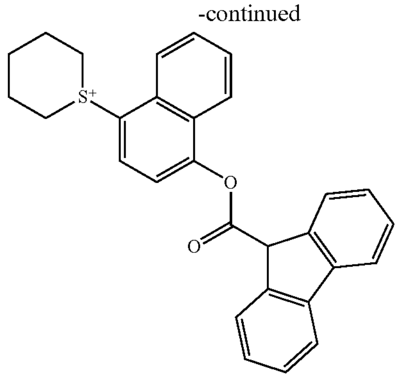
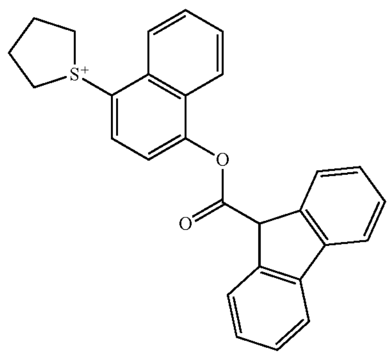
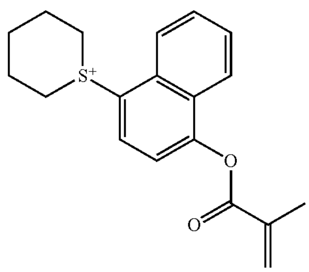
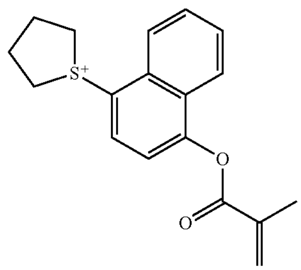
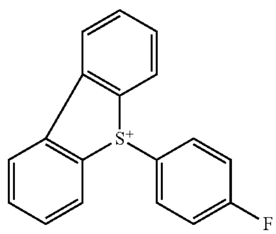
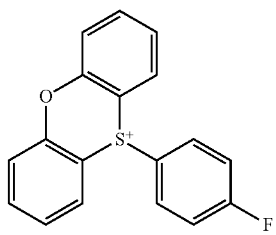
-continued
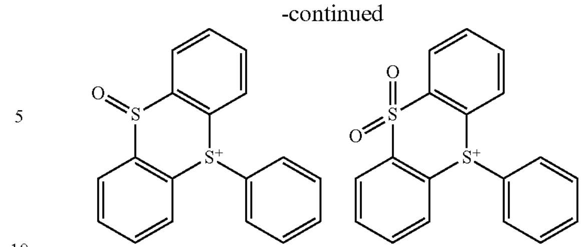
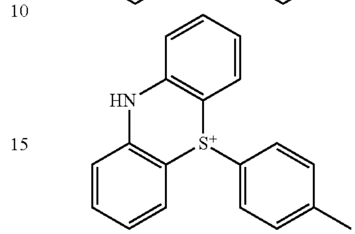
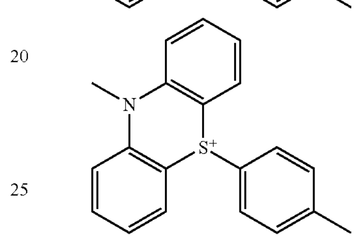
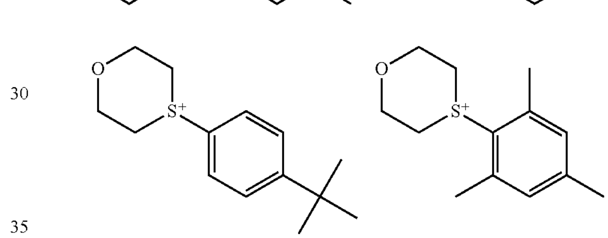
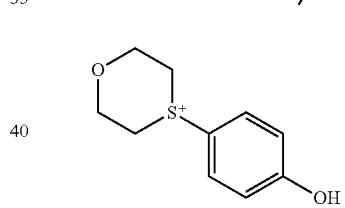
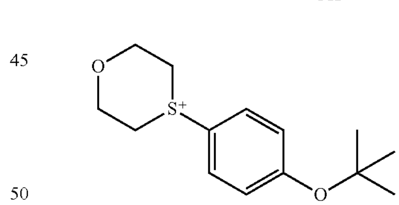
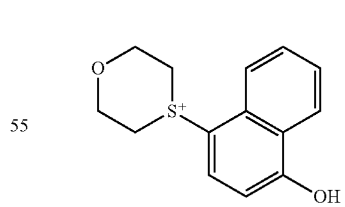
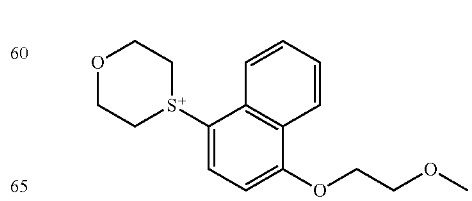

-continued
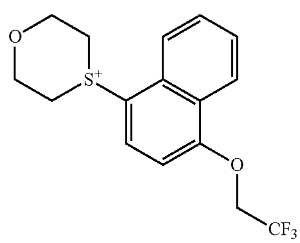
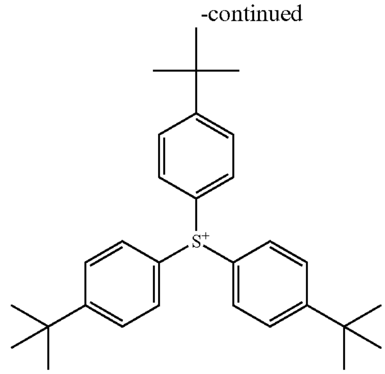
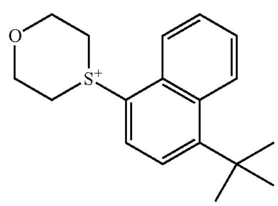
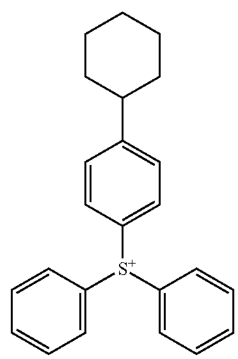
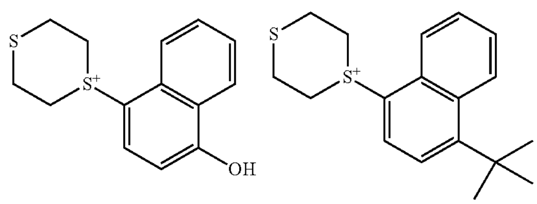
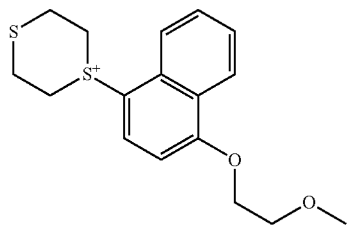
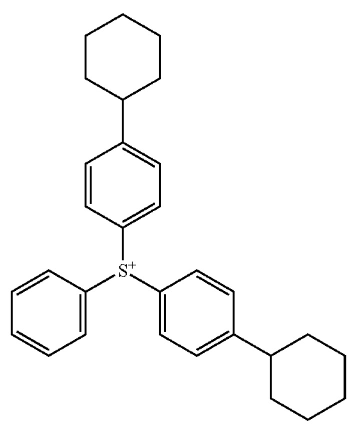
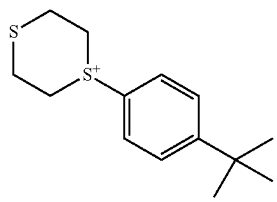
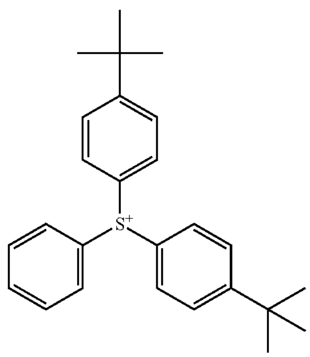
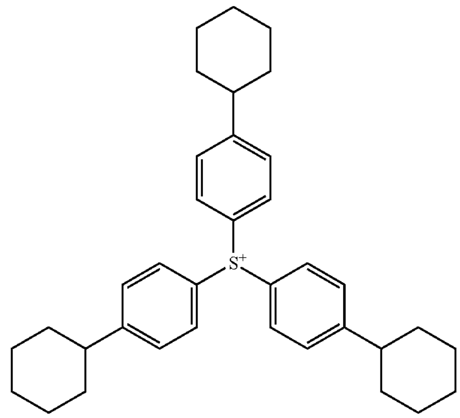

-continued
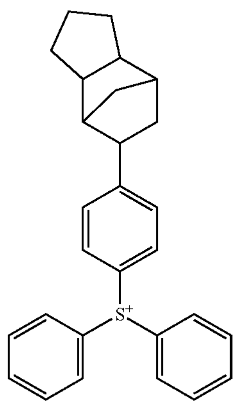
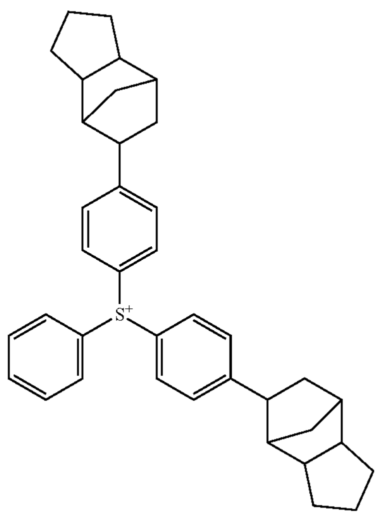
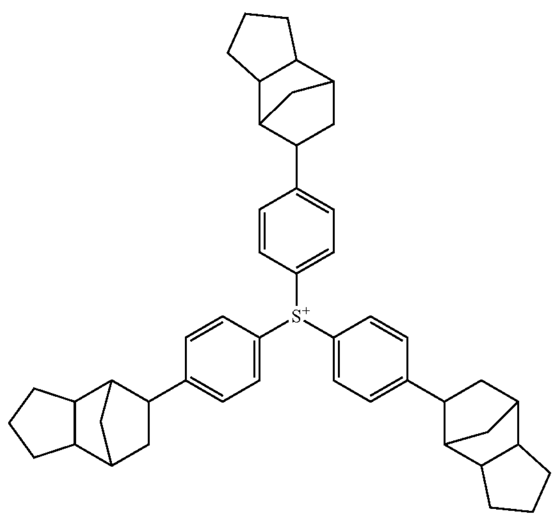
-continued
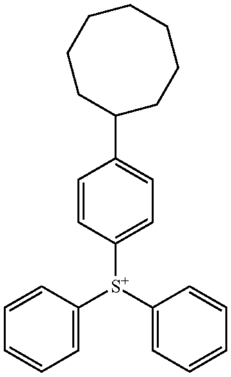
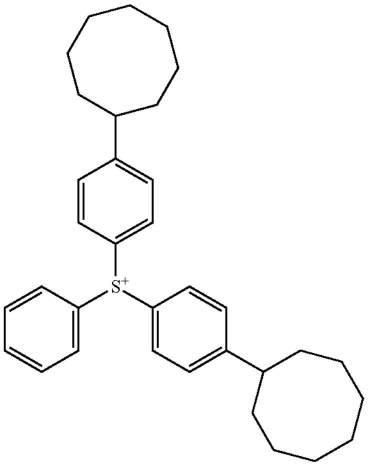
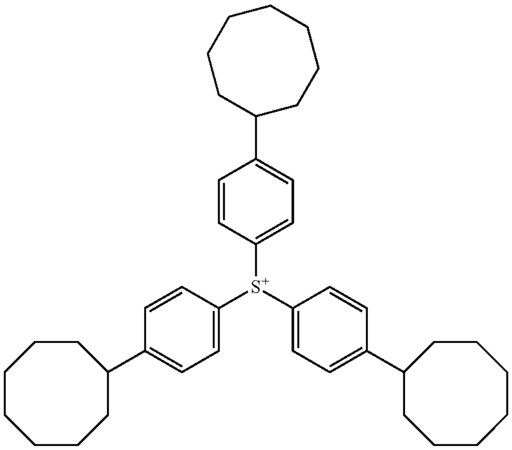
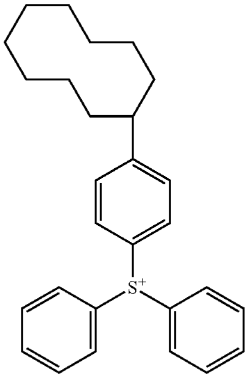

-continued
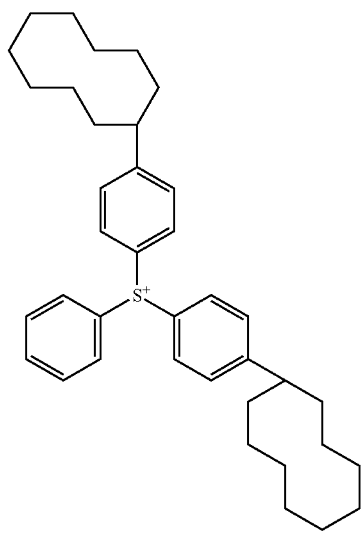
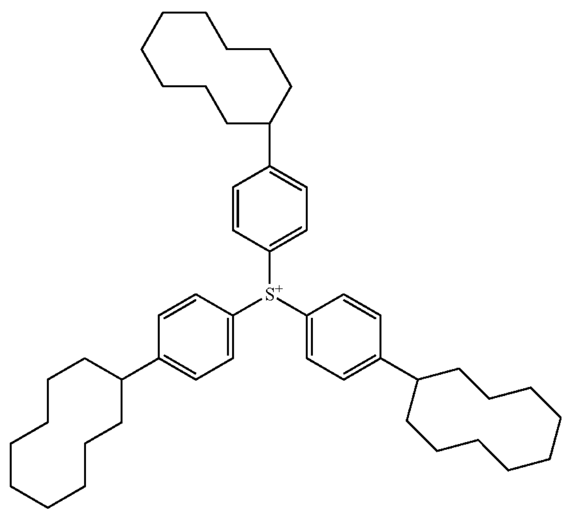
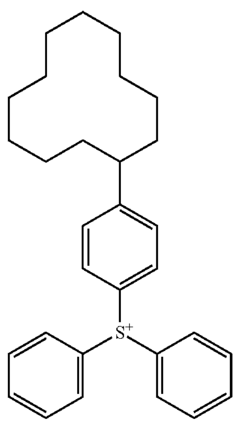
-continued
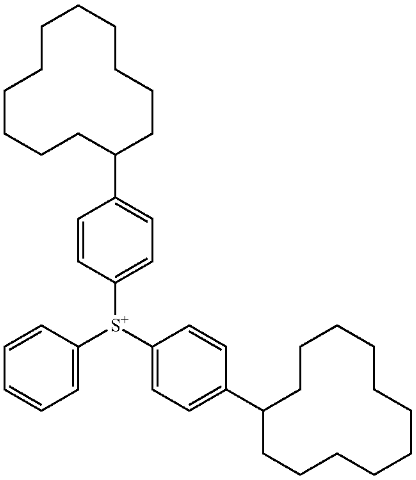
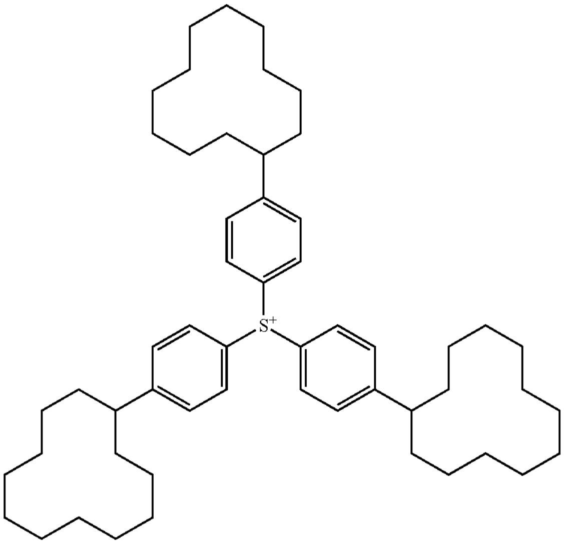
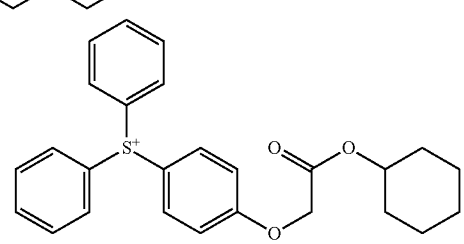
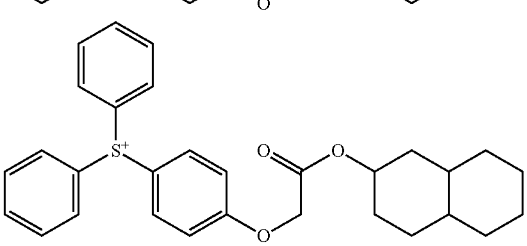
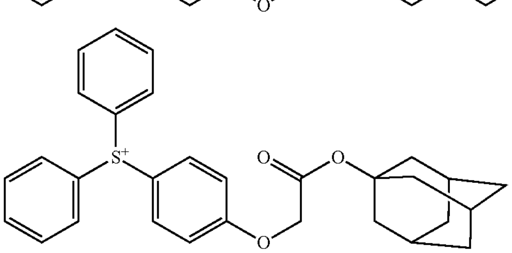

-continued
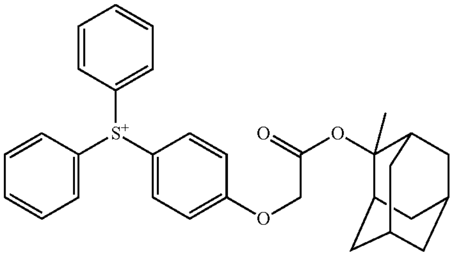
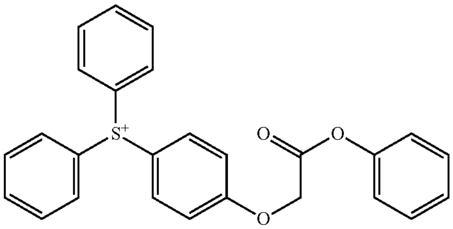
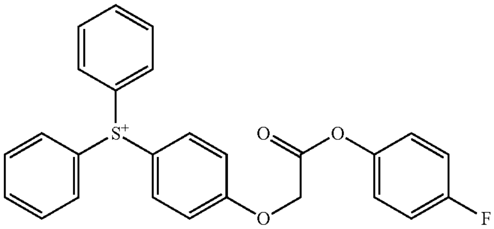
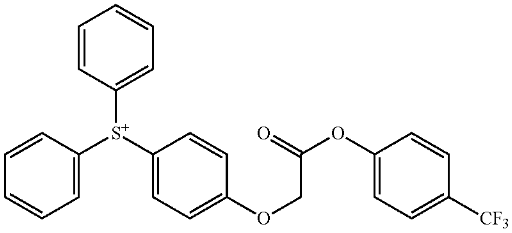
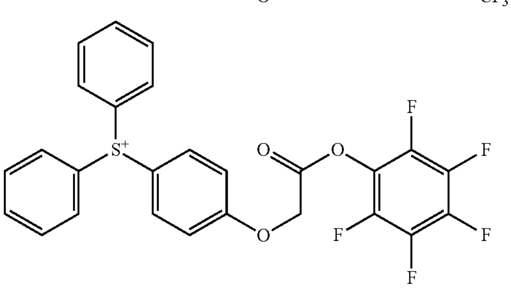
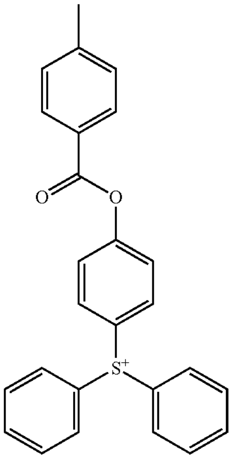
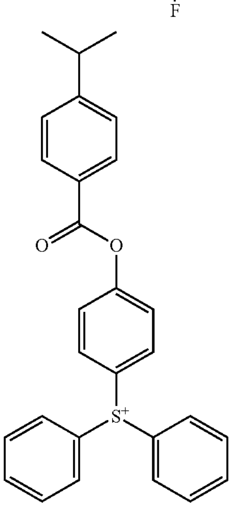
-continued
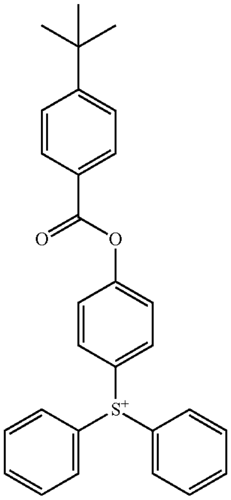
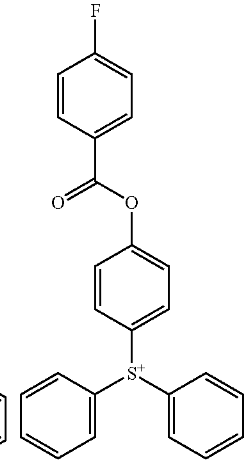
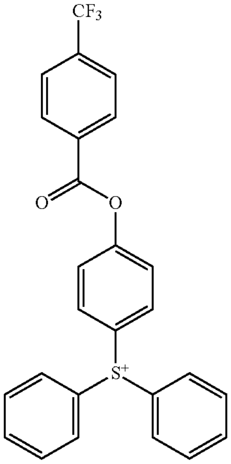
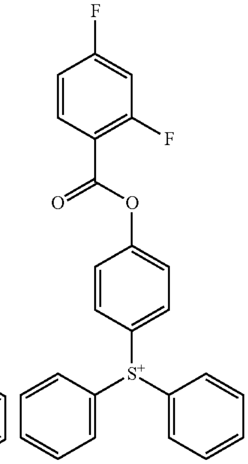
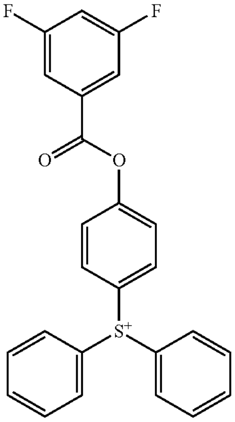
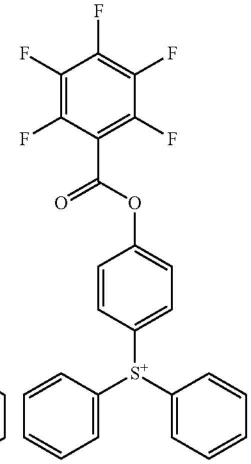
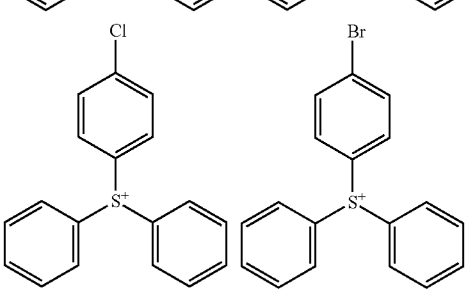

-continued
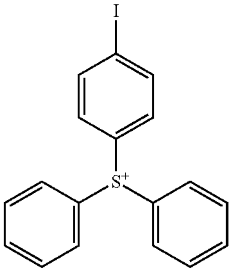
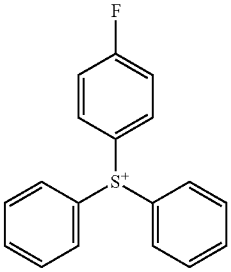
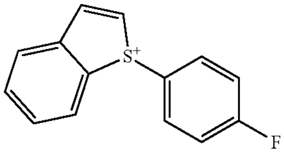
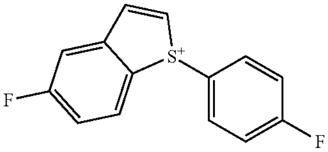
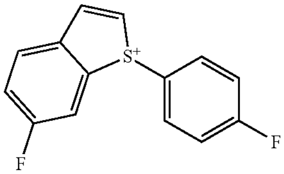
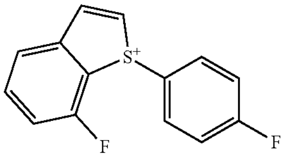
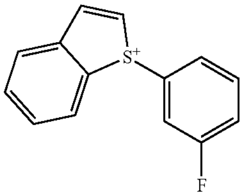
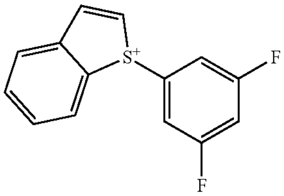
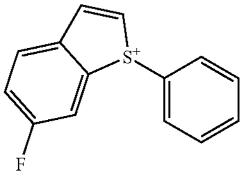
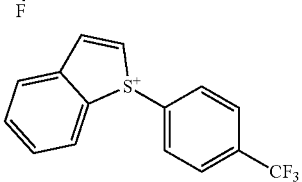
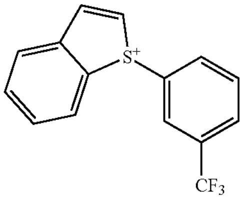
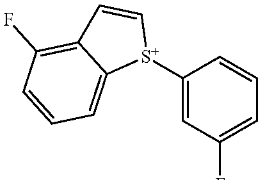
-continued
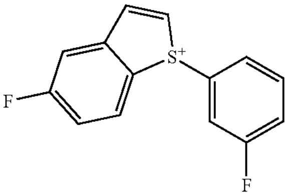
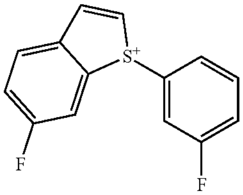
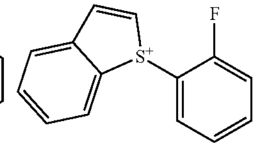
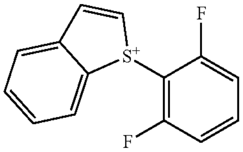
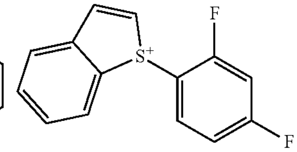
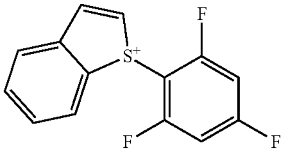
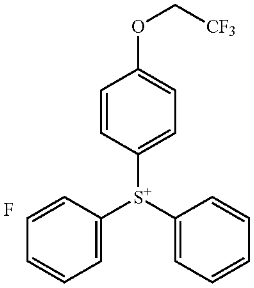
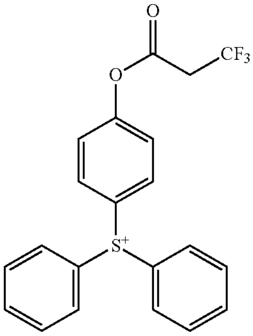
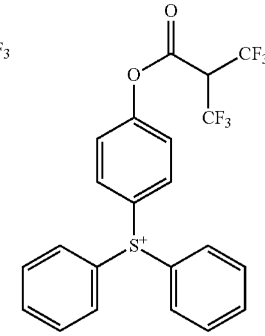
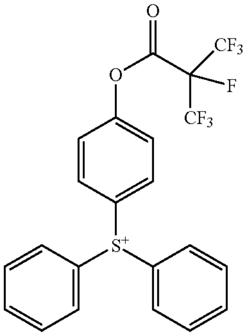
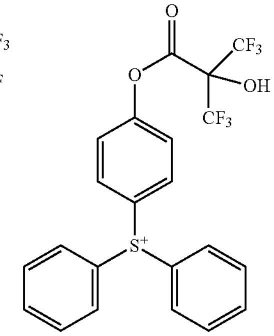

-continued
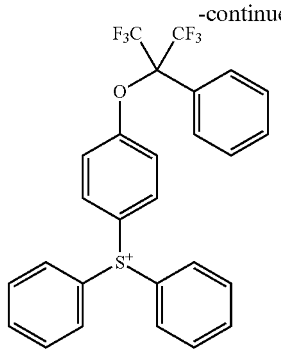
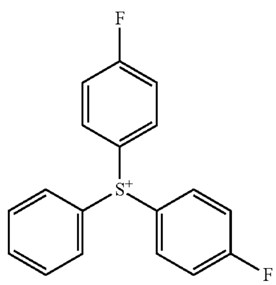
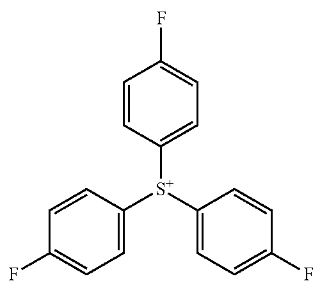
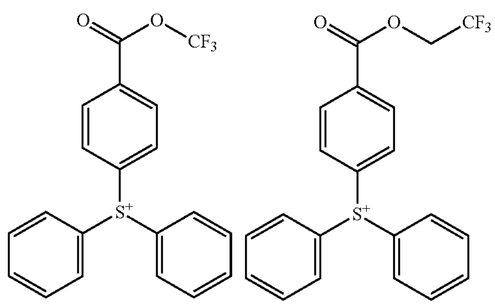
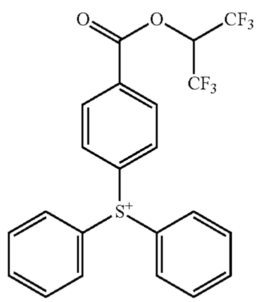
-continued
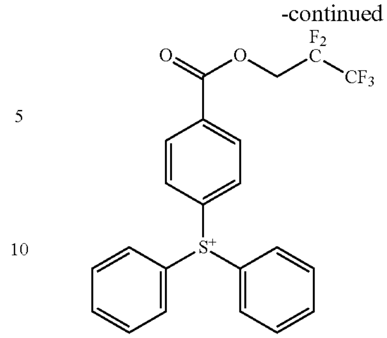
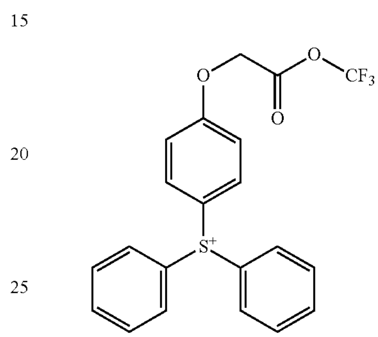
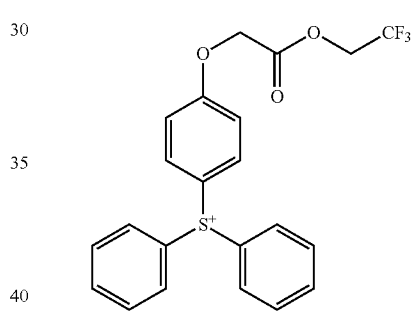
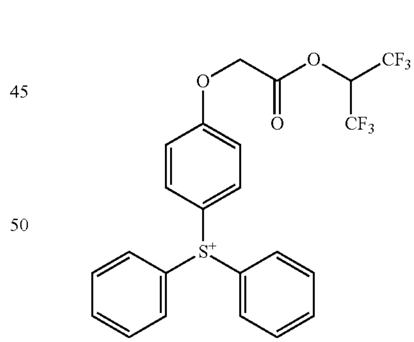
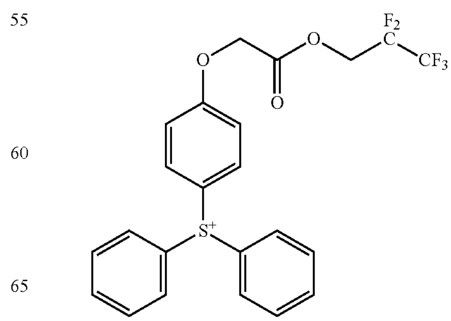

-continued
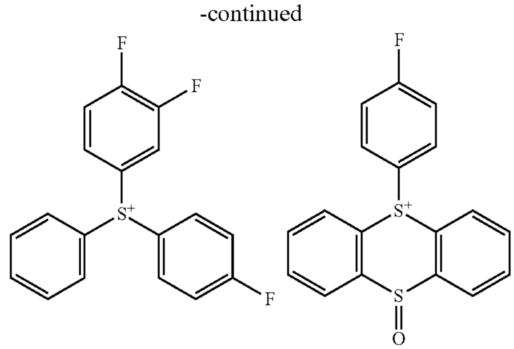
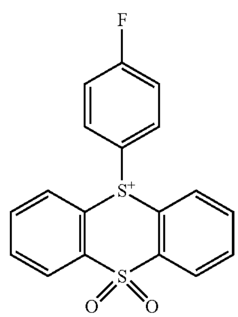
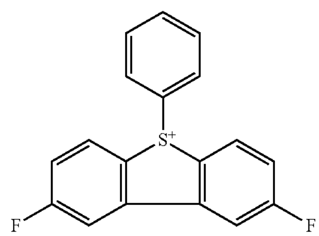
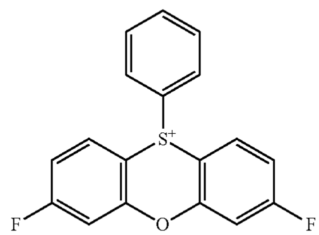
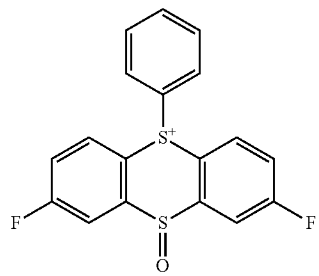
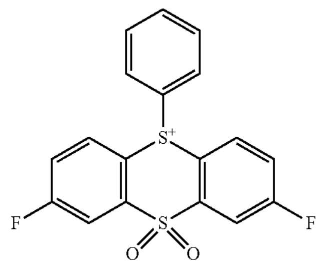
-continued
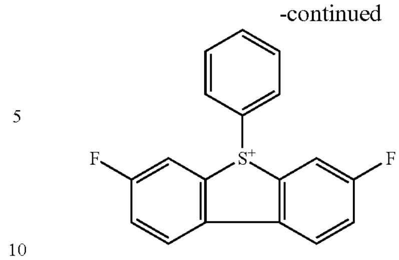
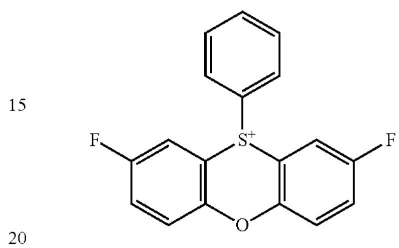
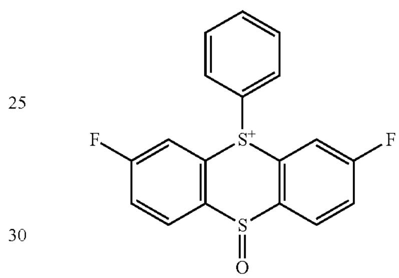
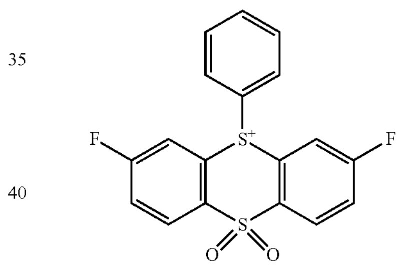
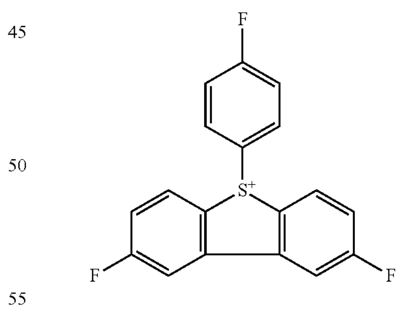
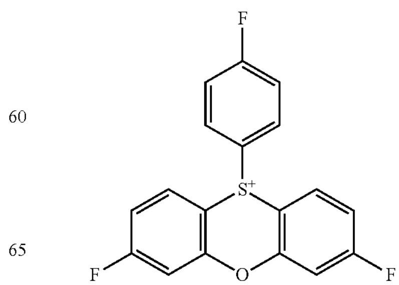

-continued
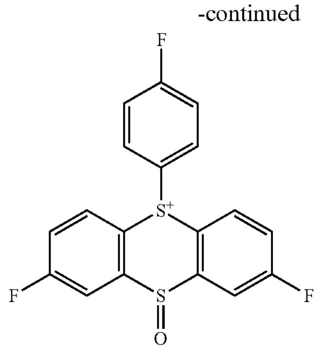
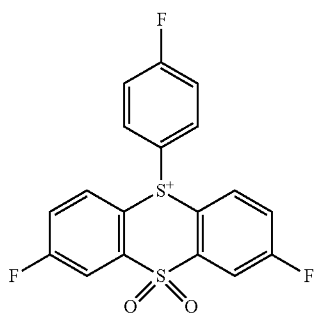
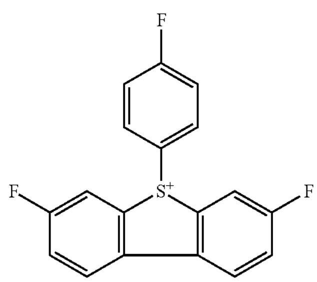
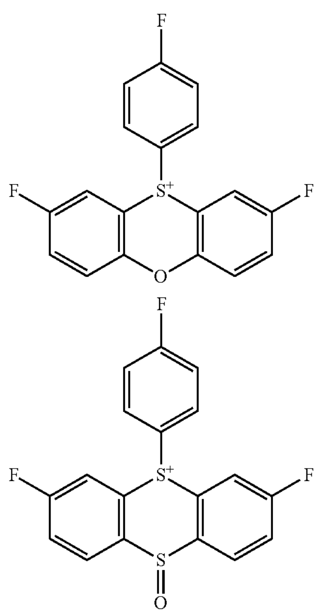
-continued
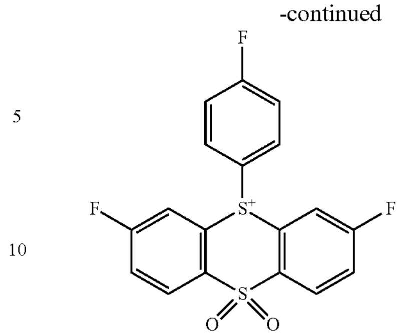
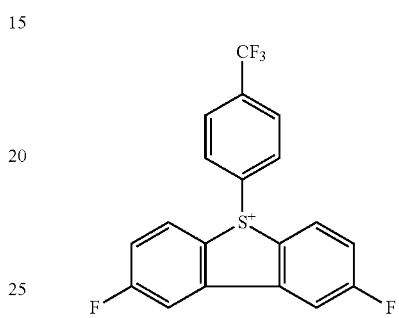
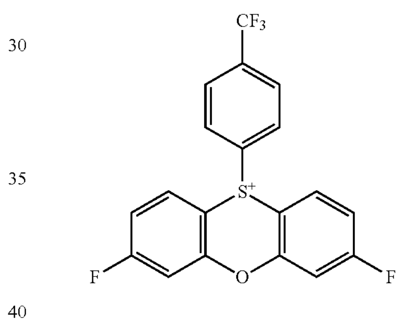
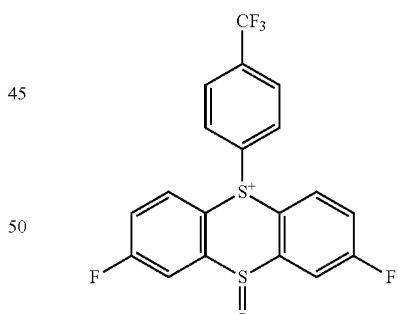
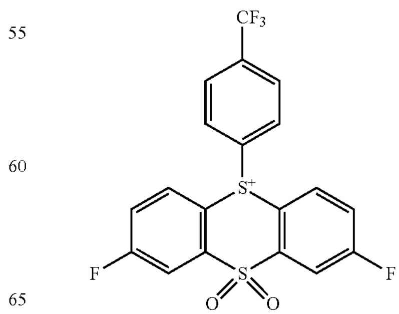

-continued
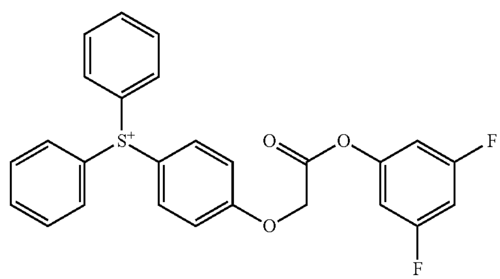
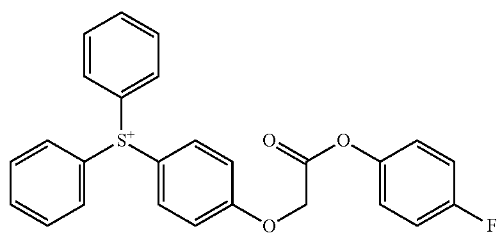
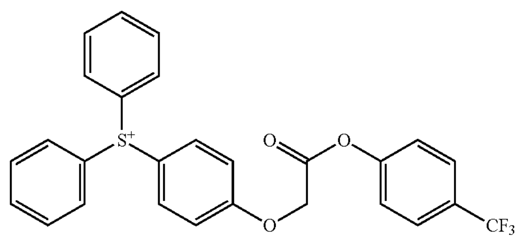
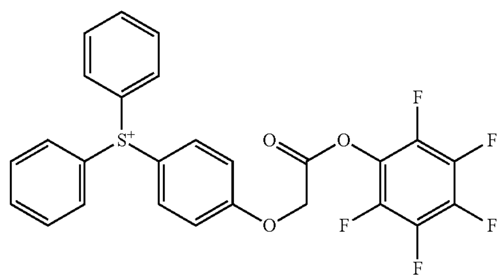
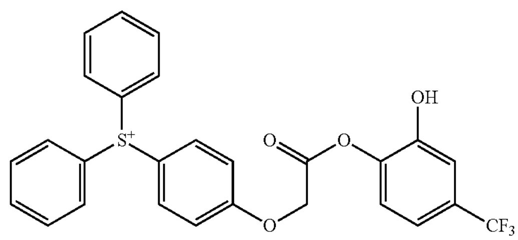
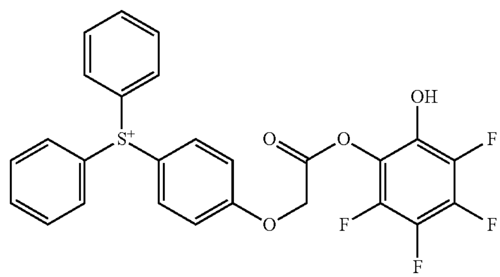
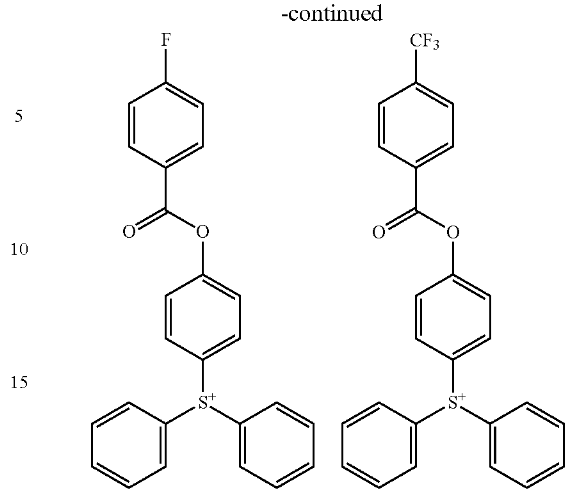
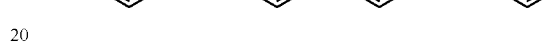
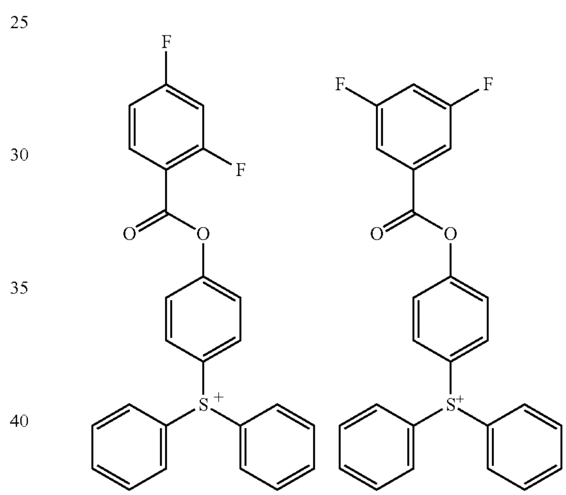
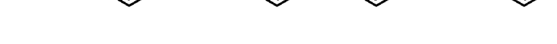
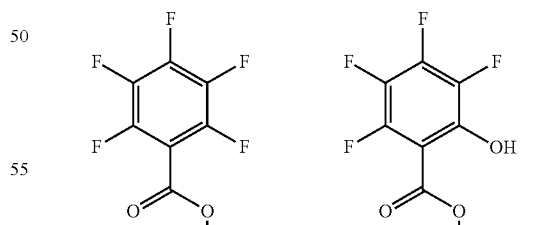
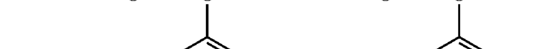
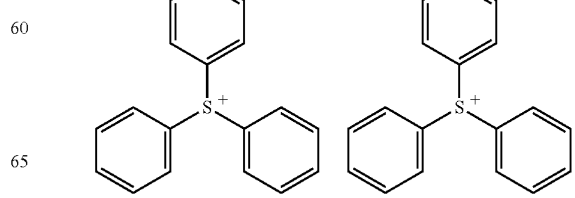

-continued
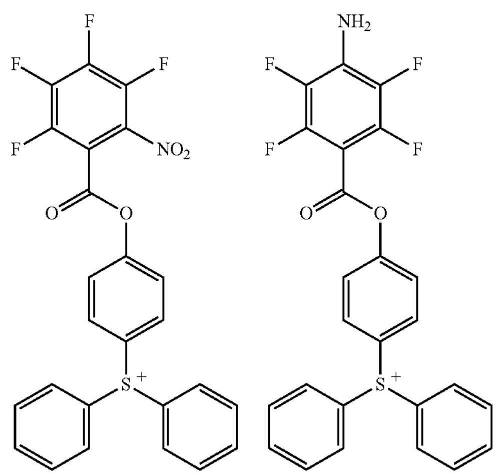
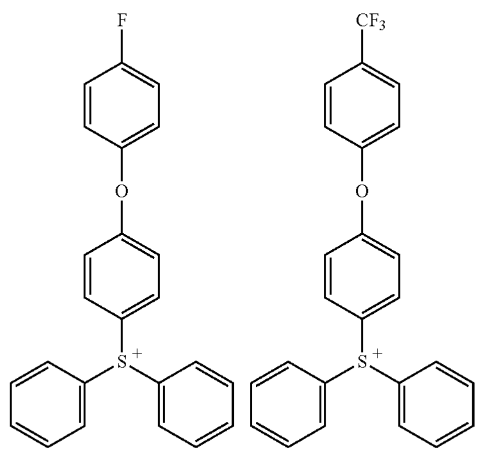
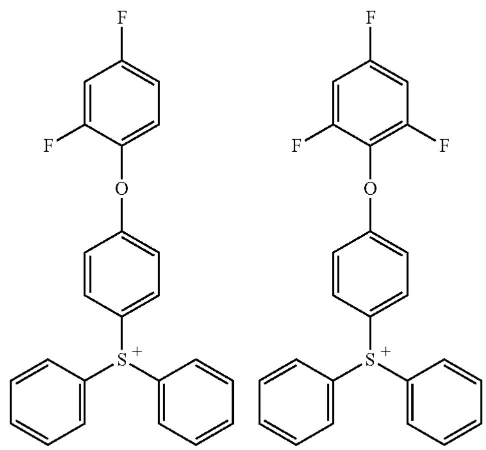
-continued
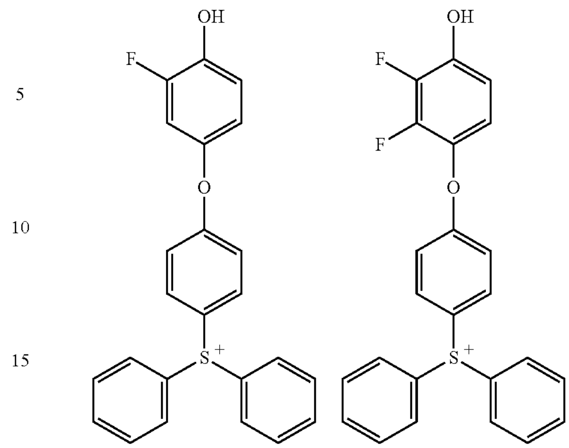
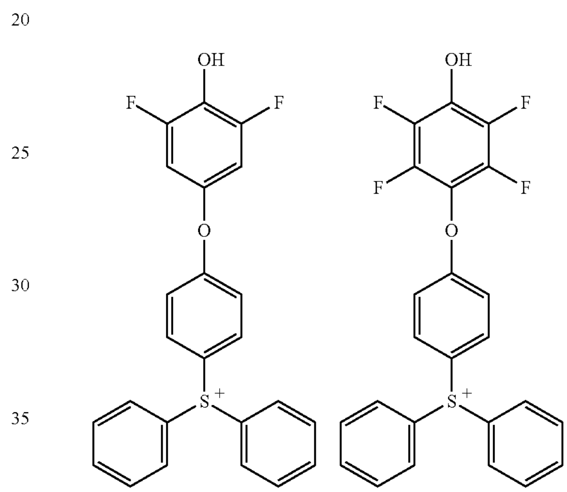
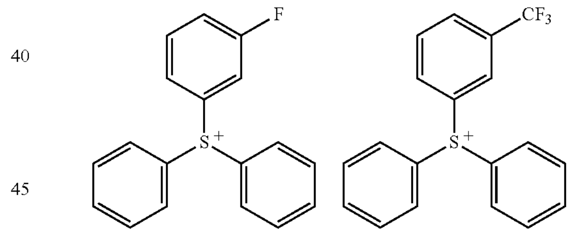
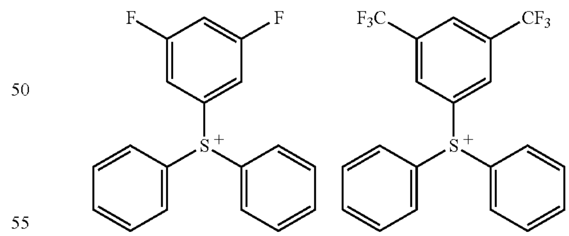
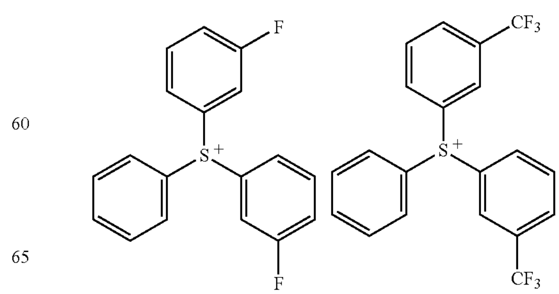

-continued
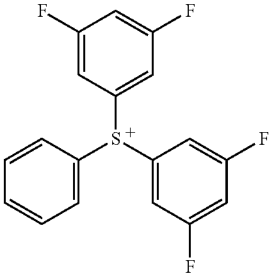
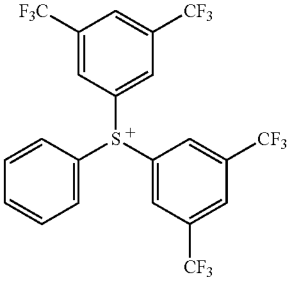
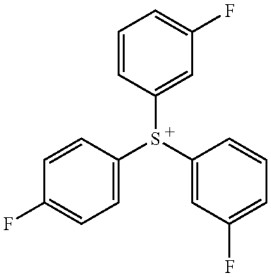
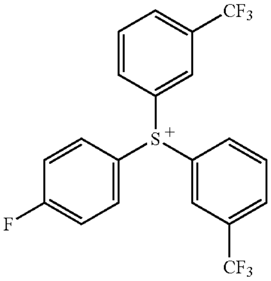
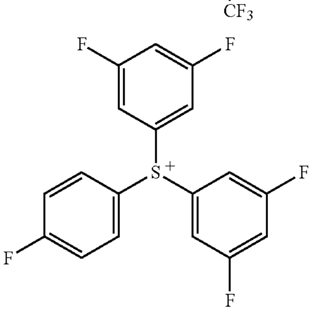
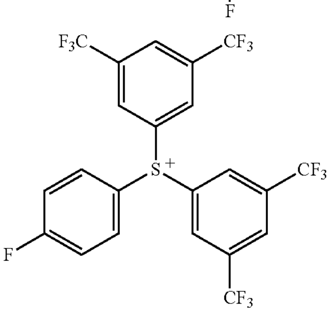
-continued
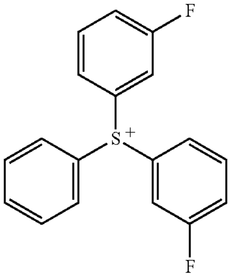
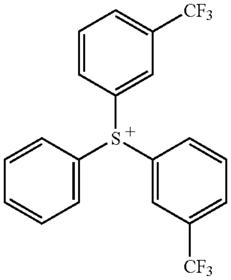
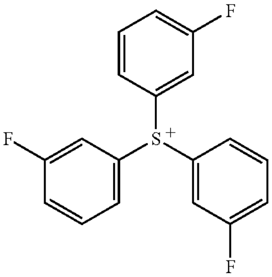
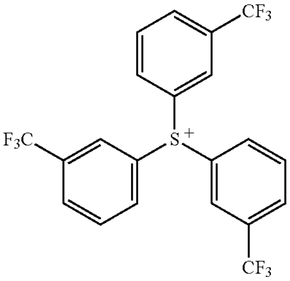
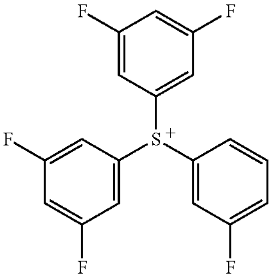
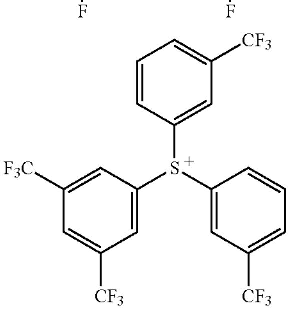
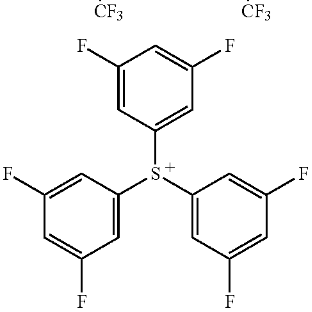

-continued
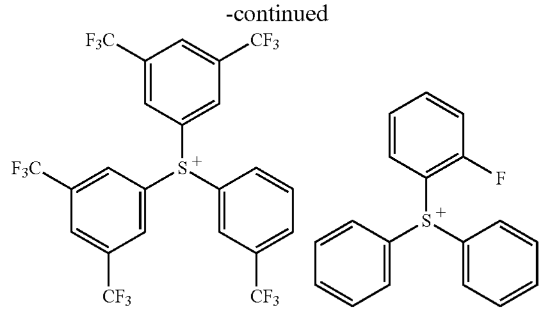
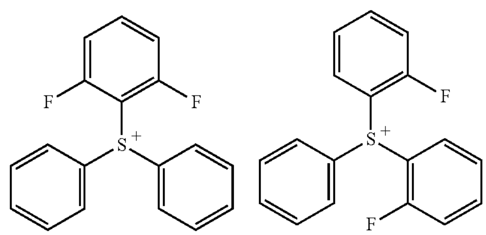
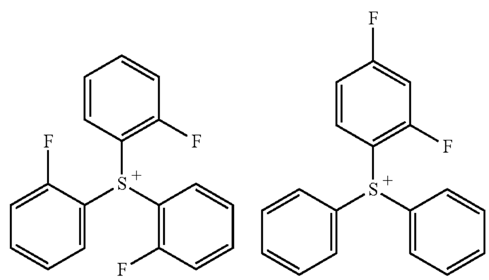
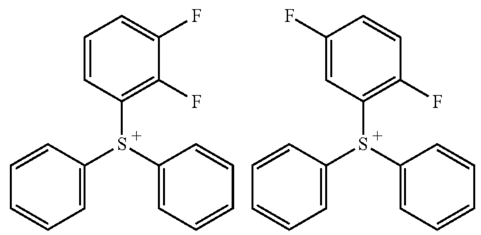
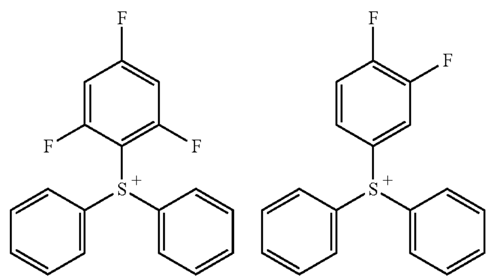
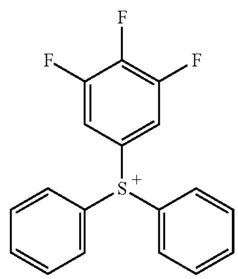
-continued
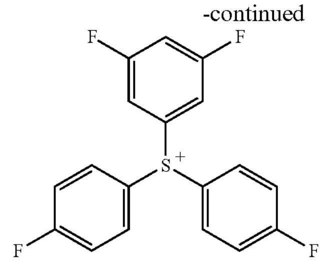
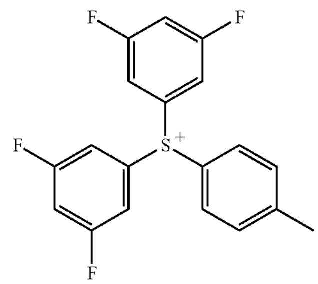
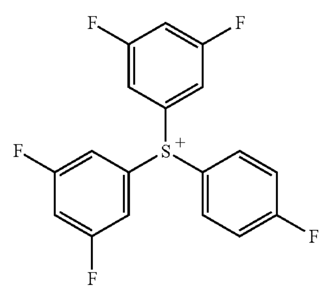
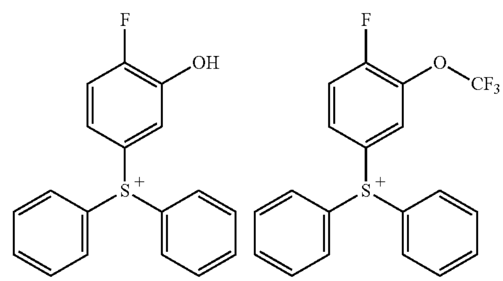
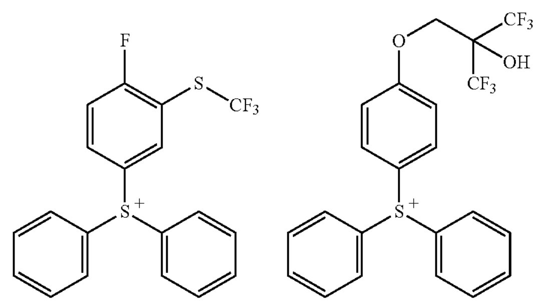

-continued
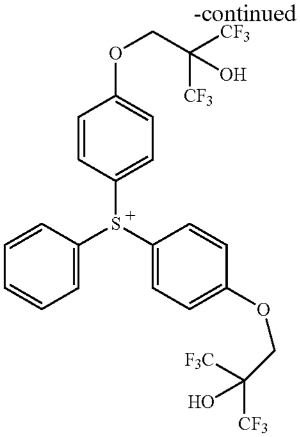
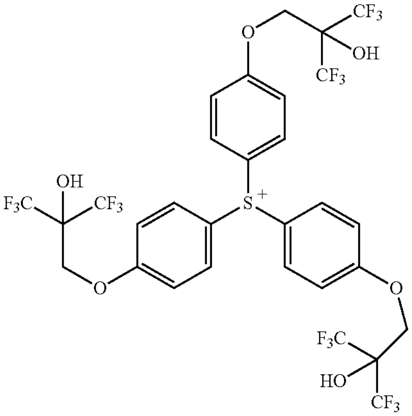
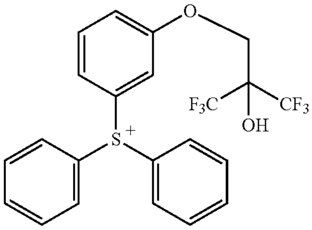
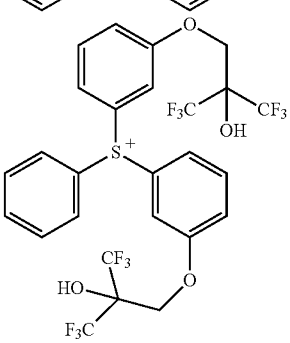
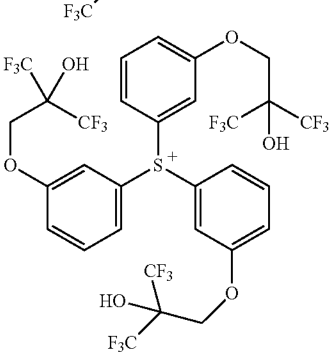
-continued
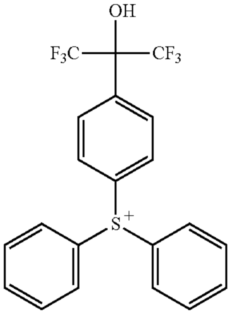
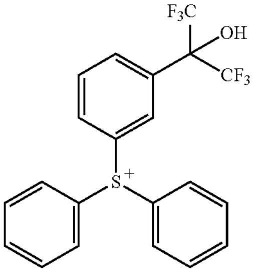
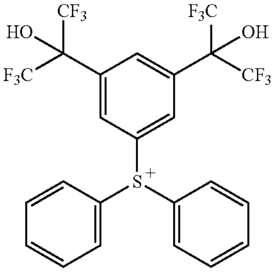
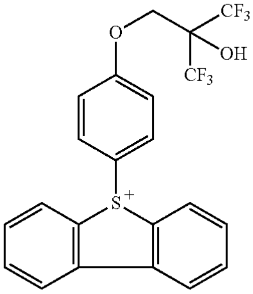
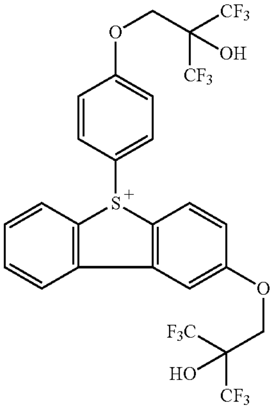
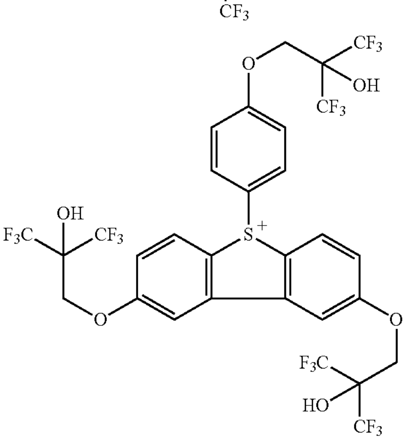

-continued
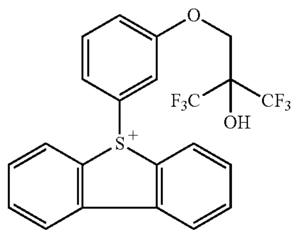
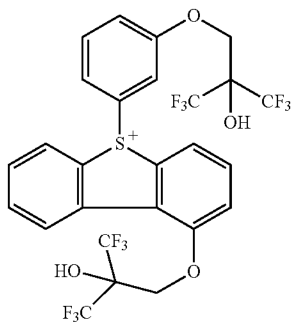
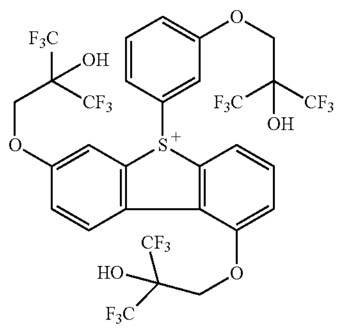
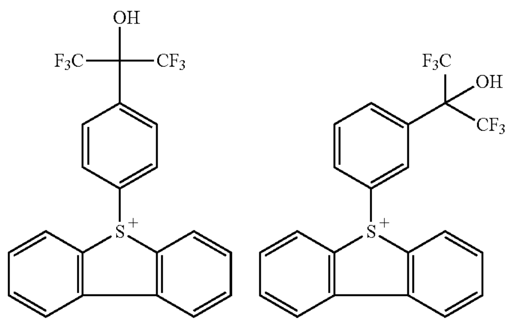
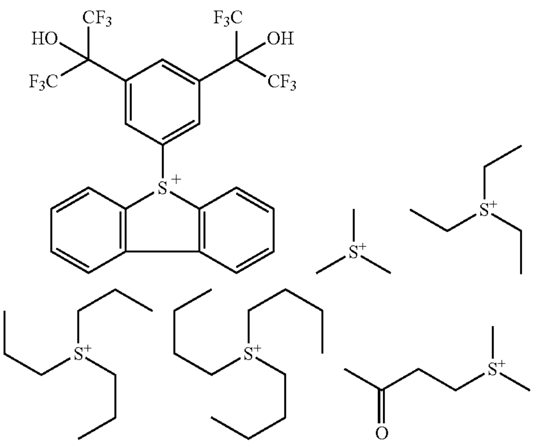
-continued
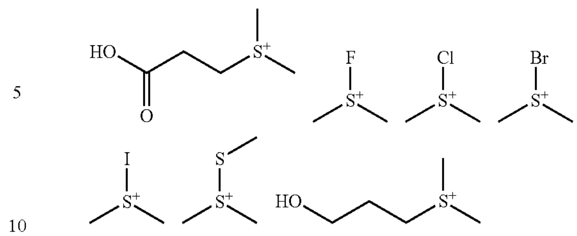
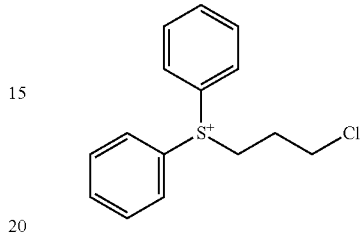
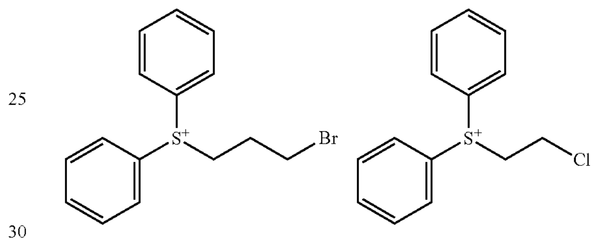
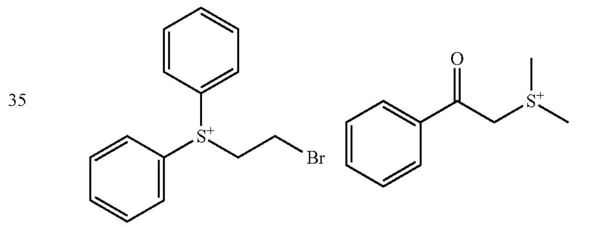
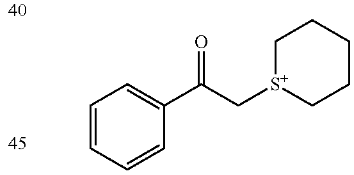
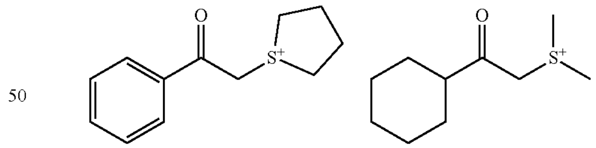
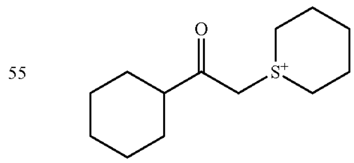
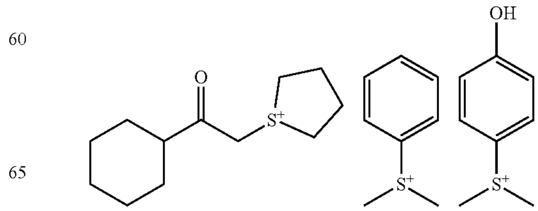

-continued
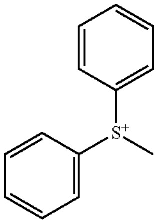
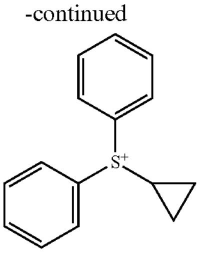
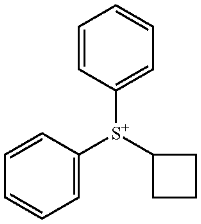
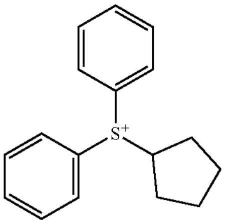
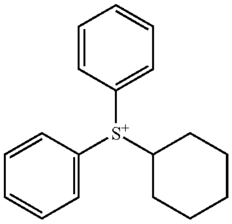
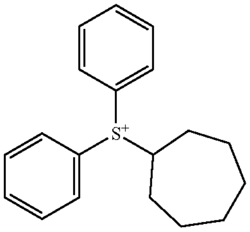
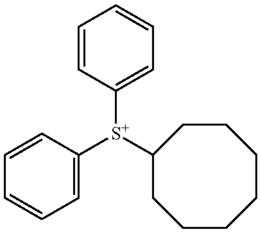
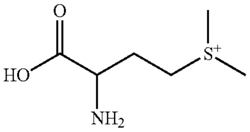
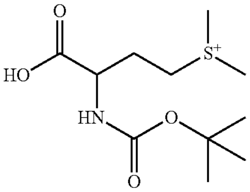
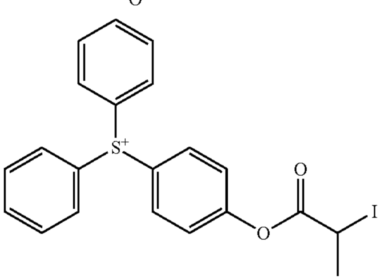
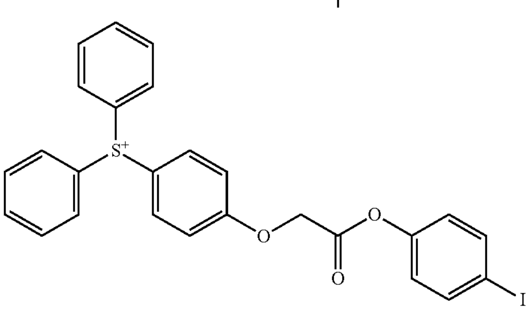
Specific examples of the cation in the iodonium salt represented by the general formula (A-2) include, the following.
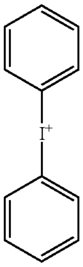
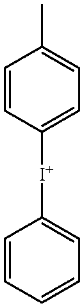
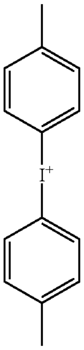
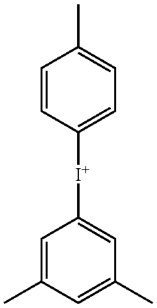
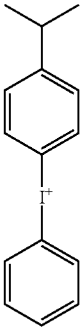
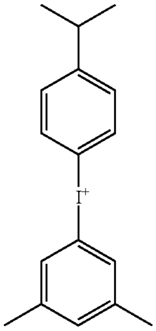
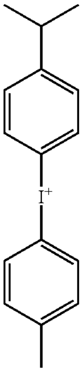
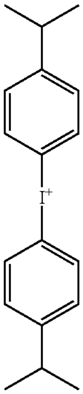
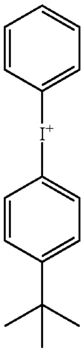
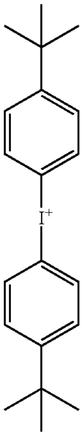
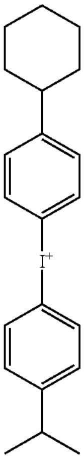

-continued
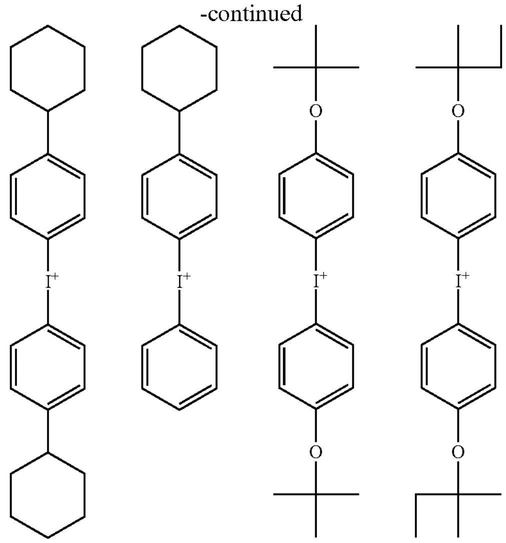
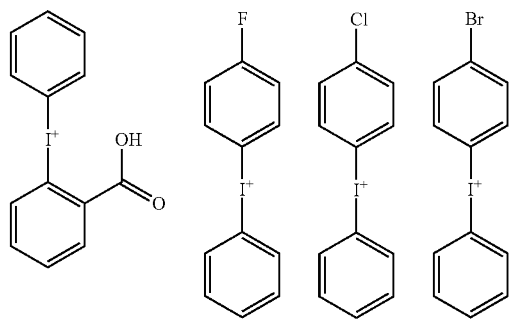
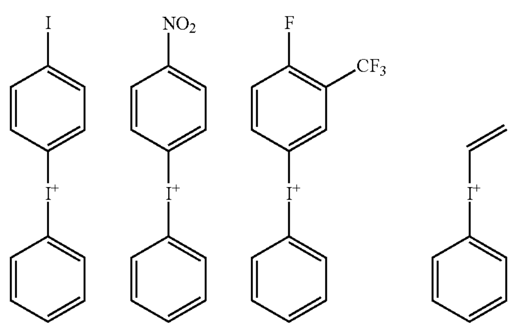
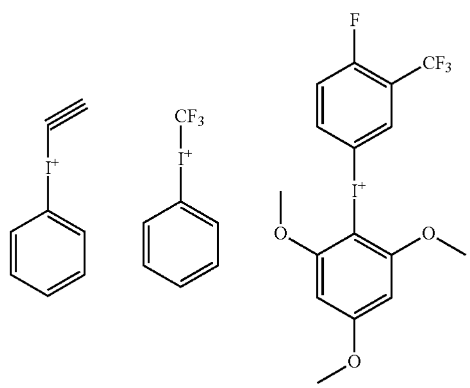
-continued
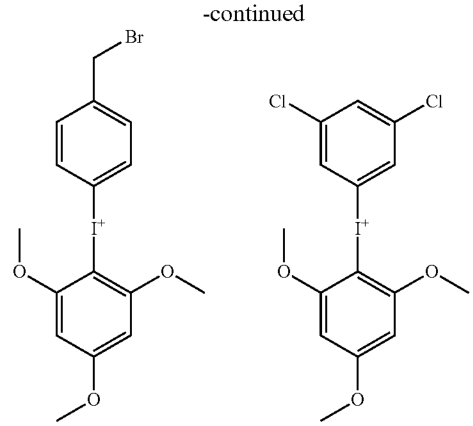
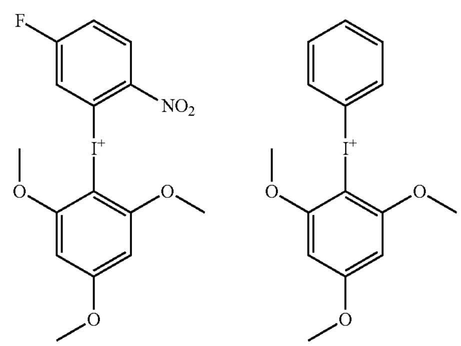
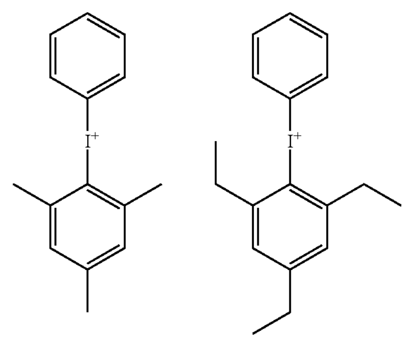
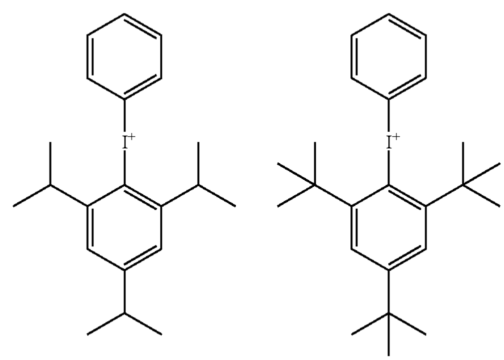

-continued

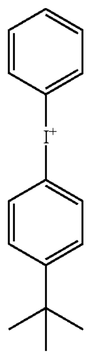

Examples of methods for synthesizing the sulfonium salt represented by the general formula (A-1) and the iodonium salt represented by the general formula (A-2) include a method of performing ion exchange with a sulfonium salt or iodonium salt of a weaker acid than the sulfonic acid bonded to the maleimide group. Examples of acids weaker than the sulfonic acid bonded to the maleimide group include carbonic acid and so forth. Alternatively, it is also possible to synthesize the sulfonium salt or iodonium salt by subjecting a sodium salt or ammonium salt of a sulfonic acid bonded to a maleimide group to ion exchange with sulfonium chloride or iodonium chloride.

In the inventive resist material, the sulfonium salt represented by the general formula (A-1) or iodonium salt represented by the general formula (A-2) is preferably contained in an amount of 0.01 to 1,000 parts by mass, more preferably 0.05 to 500 parts by mass, further preferably 0.1 to 50 parts by mass, exceedingly preferably 1 to 40 parts by mass, and particularly preferably 10 to 30 parts by mass based on 100 parts by mass of the base polymer described below in view of sensitivity and the effect of suppressing acid diffusion.

[Base Polymer]

In the case of a positive resist material, the base polymer contained in the inventive resist material contains a repeating unit containing an acid-labile group. As the repeating unit containing an acid-labile group, a repeating unit represented by the following general formula (a1) (hereinafter, also referred to as a repeating unit-a1) or a repeating unit represented by the following general formula (a2) (hereinafter, also referred to as a repeating unit-a2) is preferable.

(a1)

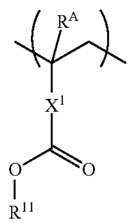

-continued (a2)

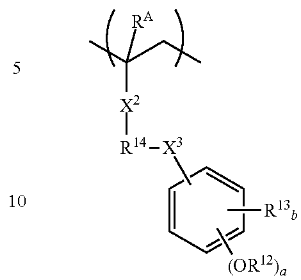

In the formulae (a1) and (a2), each $R^A$ independently represents a hydrogen atom or a methyl group. $X^1$ represents a single bond or a linking group having 1 to 12 carbon atoms containing a phenylene group, a naphthylene group, an ester bond, an ether bond, or a lactone ring. $X^2$ represents a single bond or an ester bond. $X^3$ represents a single bond, an ether bond, or an ester bond. $R^{11}$ and $R^{12}$ each represent an acid-labile group. $R^{13}$ represents a fluorine atom, a trifluoromethyl group, a cyano group, a saturated hydrocarbyl group having 1 to 6 carbon atoms, a saturated hydrocarbyloxy group having 1 to 6 carbon atoms, a saturated hydrocarbylcarbonyl group having 2 to 7 carbon atoms, a saturated hydrocarbylcarbonyloxy group having 2 to 7 carbon atoms, or a saturated hydrocarbyloxycarbonyl group having 2 to 7 carbon atoms. $R^{14}$ represents a single bond or an alkanediyl group having 1 to 6 carbon atoms, and some of the carbon atoms are optionally substituted with an ether bond or an ester bond. "a" represents 1 or 2 and "b" represents an integer of 0 to 4, provided that $1 \leq a+b \leq 5$.

Examples of a monomer to give the repeating unit-a1 include those shown below, but are not limited thereto. Incidentally, in the following formulae, $R^A$ and $R^{11}$ are the same as above.

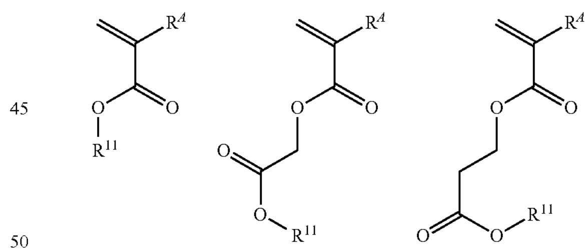

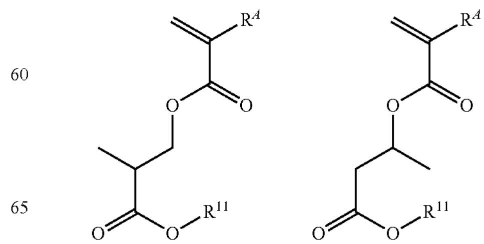

-continued
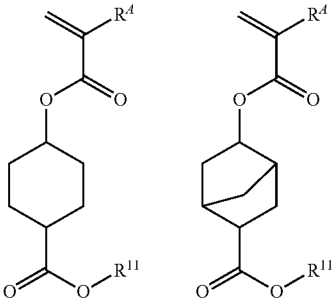
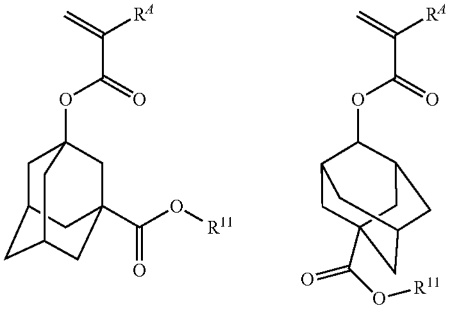
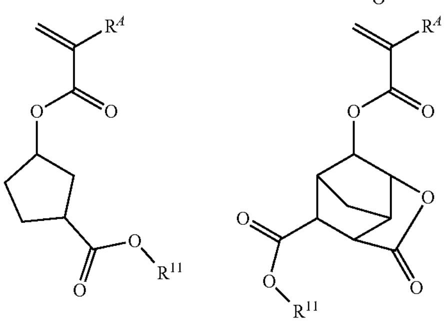
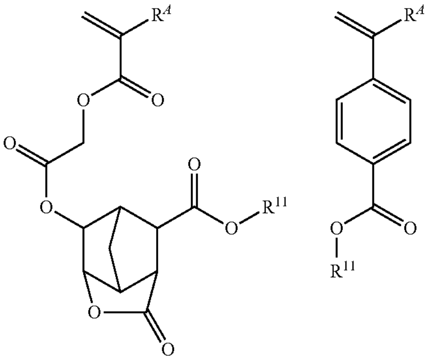
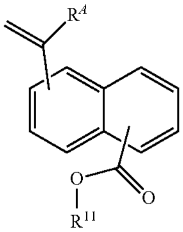
Examples of a monomer to give the repeating unit-a2 include those shown below, but are not limited thereto. Incidentally, in the following formulae, $R^A$ and $R^{12}$ are the same as above.
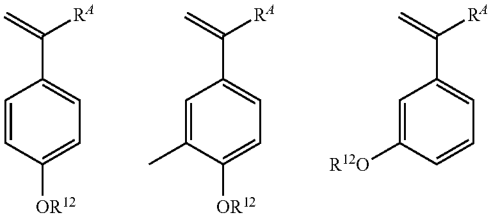
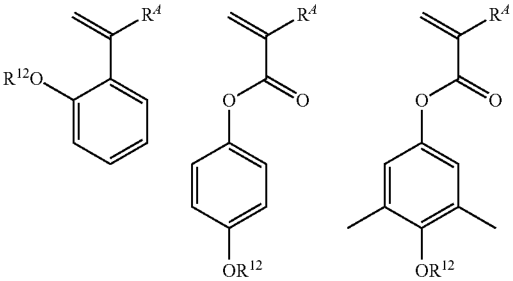
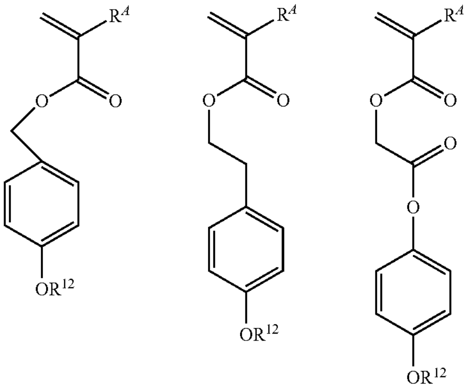
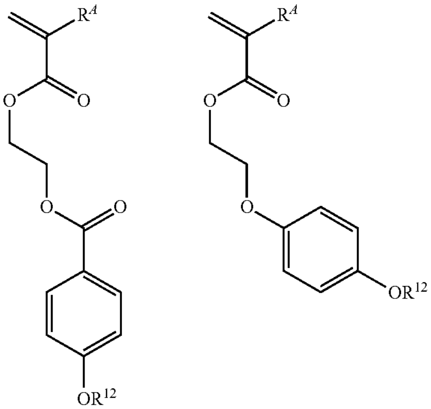
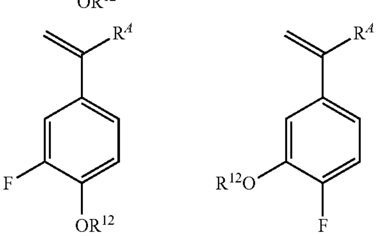

-continued

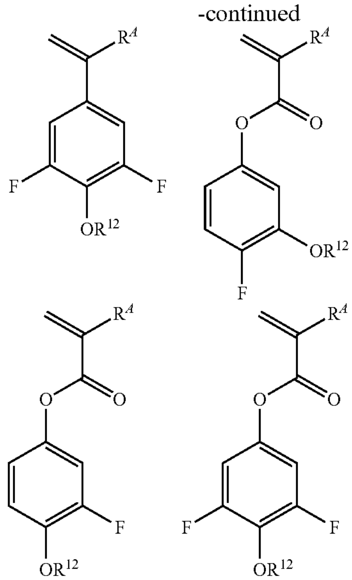

Examples of the acid-labile groups represented by $R^{11}$ and $R^{12}$ in the repeating units-a1 and -a2 include those disclosed in JP 2013-60033 A and JP 2013-83821 A.

Typical examples of the acid-labile groups include those represented by the following general formulae (AL-1) to (AL-3).

(AL-1)

(AL-2)

(AL-3)

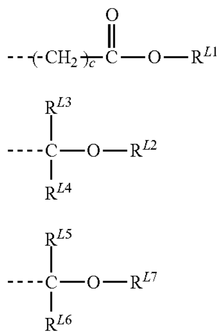

In the formulae, a broken line represents a bonding arm.

In the general formulae (AL-1) and (AL-2), $R^{L1}$ and $R^{L2}$ each independently represent a hydrocarbyl group having 1 to 40 carbon atoms, and optionally contain a heteroatom such as an oxygen atom, a sulfur atom, a nitrogen atom, or a fluoride atom. The hydrocarbyl group may be saturated or unsaturated, and may be linear, branched, or cyclic. As the hydrocarbyl group, a saturated hydrocarbyl group having 1 to 40 carbon atoms is preferable, and a saturated hydrocarbyl group having 1 to 20 carbon atoms is more preferable.

In the general formula (AL-1), "c" is preferably an integer of 0 to 10, preferably an integer of 1 to 5.

In the general formula (AL-2), $R^{L3}$ and $R^{L4}$ each independently represent a hydrogen atom or a hydrocarbyl group having 1 to 20 carbon atoms, and optionally contain a heteroatom such as an oxygen atom, a sulfur atom, a nitrogen atom, or a fluorine atom. The hydrocarbyl group may be saturated or unsaturated, and may be linear, branched, or cyclic. As the hydrocarbyl group, a saturated hydrocarbyl group having 1 to 20 carbon atoms is preferable. Furthermore, any two of $R^{L}a$, $R^{L3}$, and $R^{L4}$ may bond with each other to form a ring having 3 to 20 carbon atoms together with a carbon atom bonded therewith, or together with the carbon atom and an oxygen atom. As the ring, a ring having 4 to 16 carbon atoms is preferable, and an aliphatic ring is particularly preferable.

In the general formula (AL-3), $R^{L5}$, $R^{L6}$, and $R^{L7}$ each independently represent a hydrocarbyl group having 1 to 20 carbon atoms, and optionally contain a heteroatom such as an oxygen atom, a sulfur atom, a nitrogen atom, or a fluorine atom. The hydrocarbyl group may be saturated or unsaturated, and may be linear, branched, or cyclic. As the hydrocarbyl group, a saturated hydrocarbyl group having 1 to 20 carbon atoms is preferable. Furthermore, any two of $R^{L5}$, $R^{L6}$, and $R^{L7}$ may bond with each other to form a ring having 3 to 20 carbon atoms together with a carbon atom bonded therewith. As the ring, a ring having 4 to 16 carbon atoms is preferable, and an aliphatic ring is particularly preferable.

The base polymer may further contain, as an adhesive group, a repeating unit-b containing a phenolic hydroxy group. Examples of a monomer to give the repeating unit-b include those shown below, but are not limited thereto. Incidentally, in the following formulae, $R^A$ is as defined above.

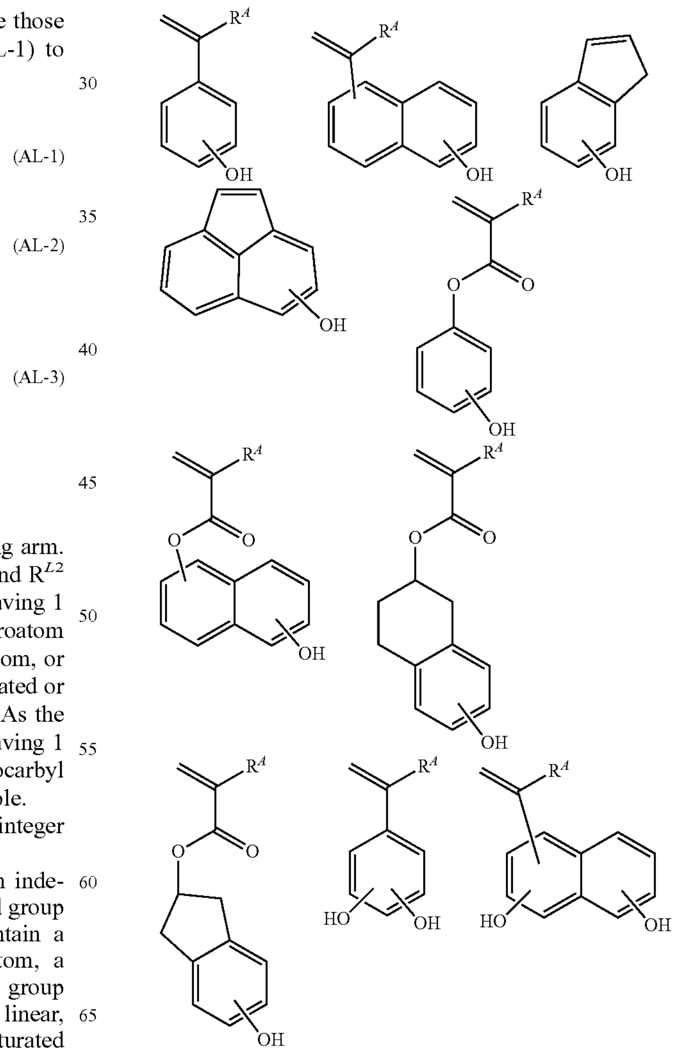

-continued

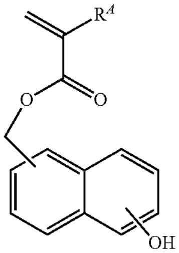
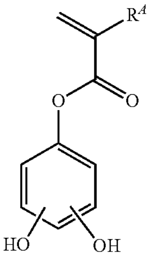
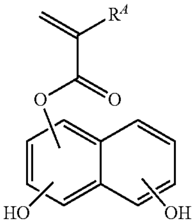
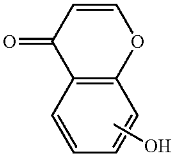
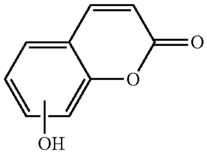
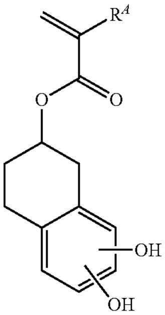
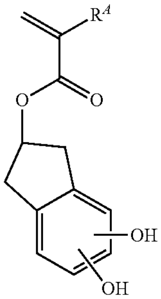

The base polymer may further contain, as a different adhesive group, a repeating unit-c containing a group other than a phenolic hydroxy group, that is, a hydroxy group, a lactone ring, an ether bond, an ester bond, a carbonyl group, or a cyano group. Examples of a monomer to give the repeating unit-c include those shown below, but are not limited thereto. Incidentally, in the following formulae, $R^A$ is as defined above.

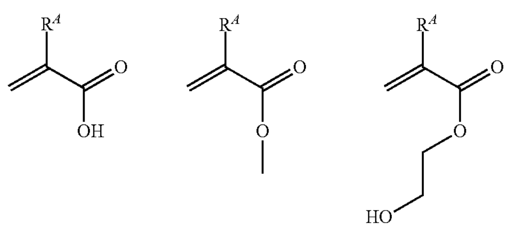

-continued

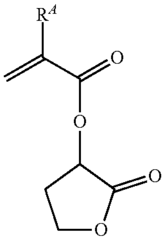
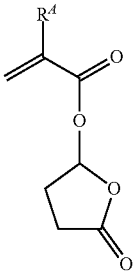
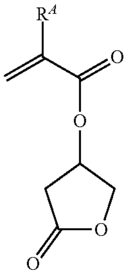
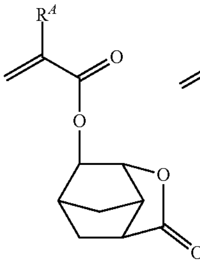
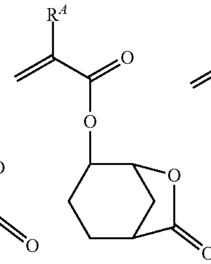
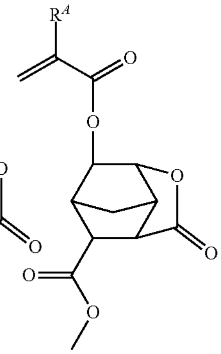
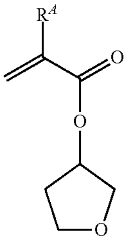
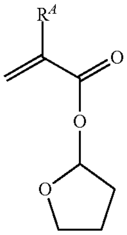
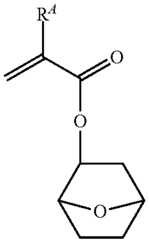
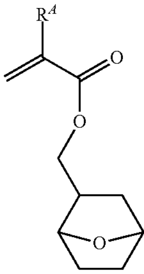
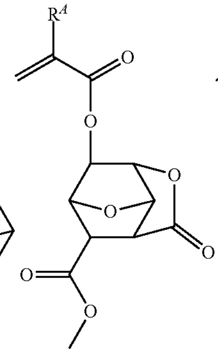
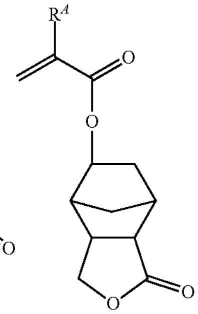
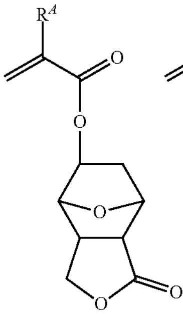
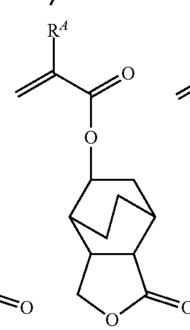
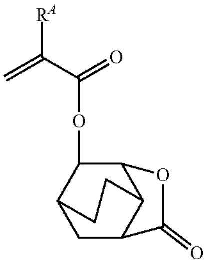

-continued
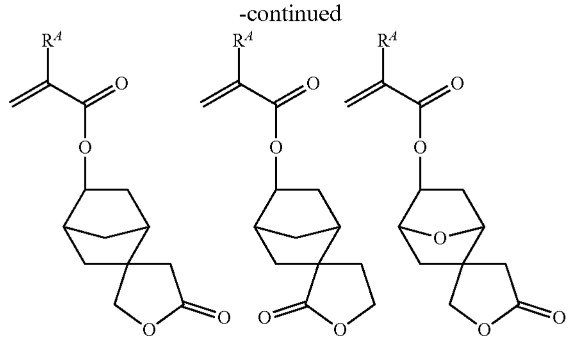
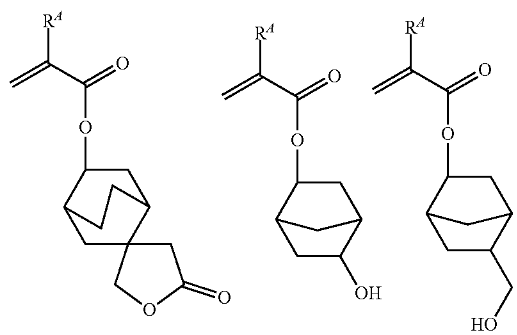
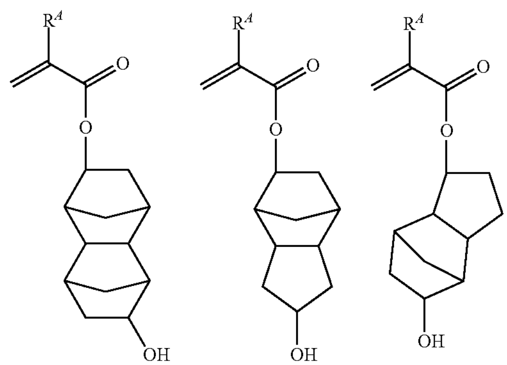
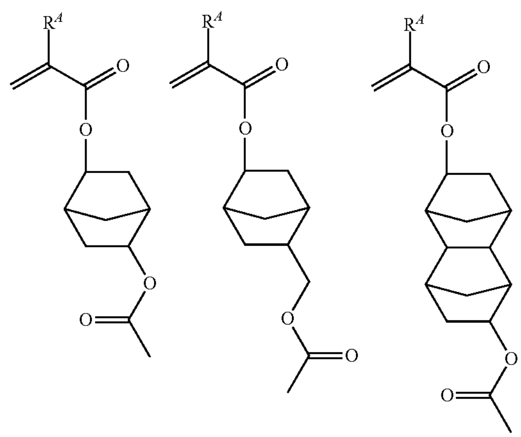
-continued
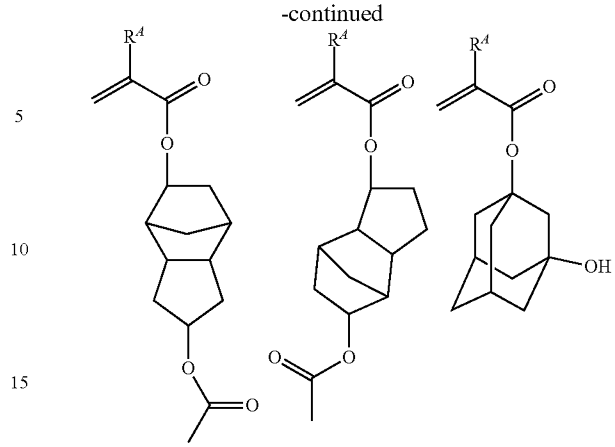
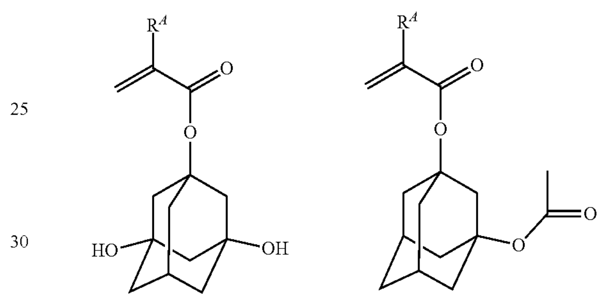
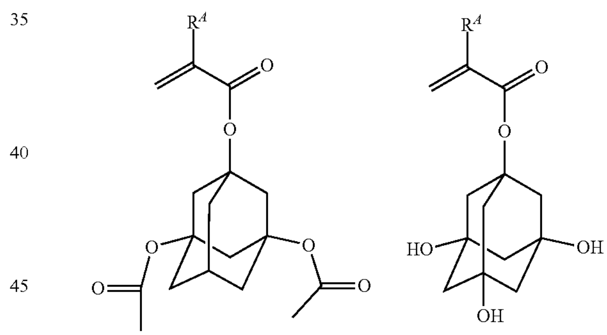
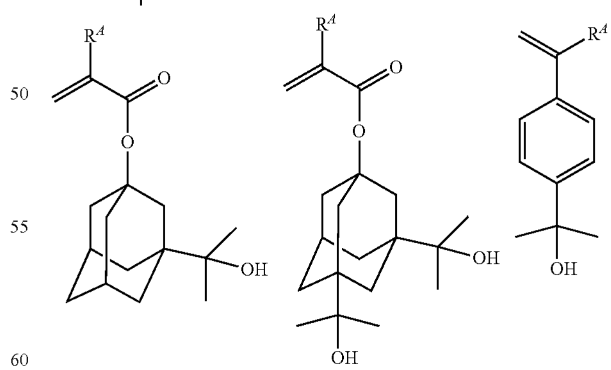
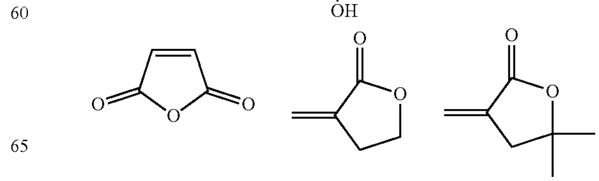

-continued
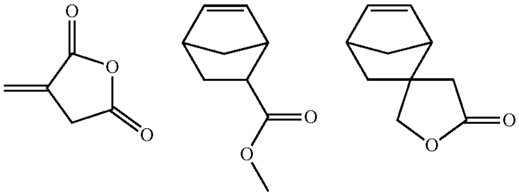
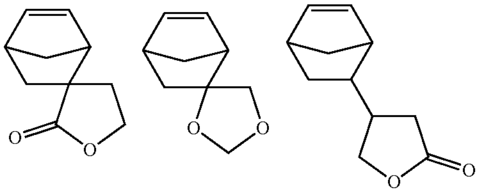
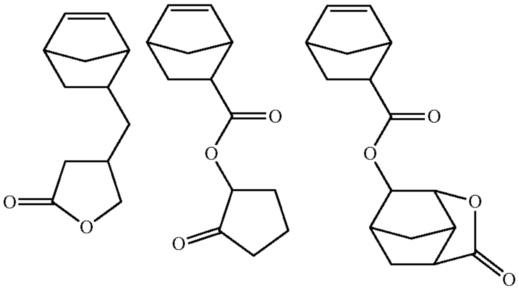
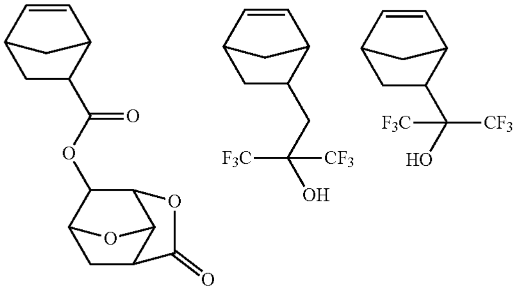
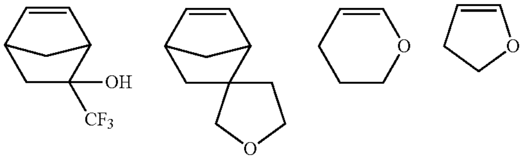
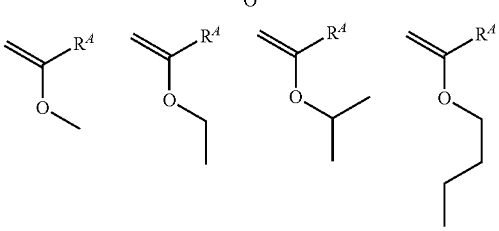
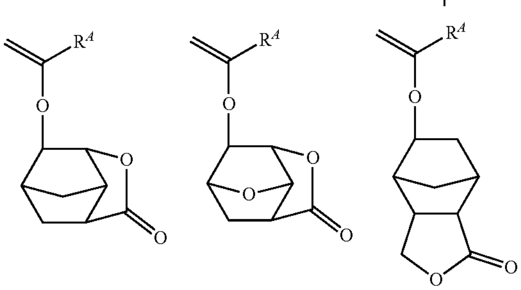
-continued
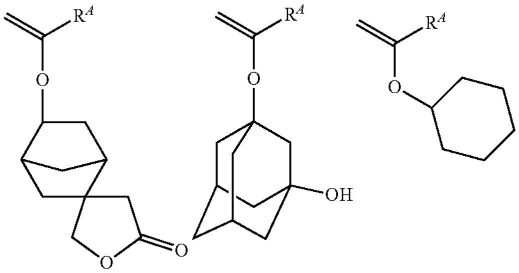
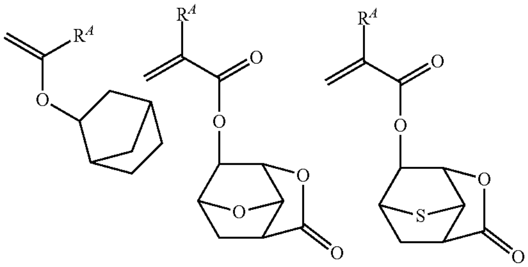
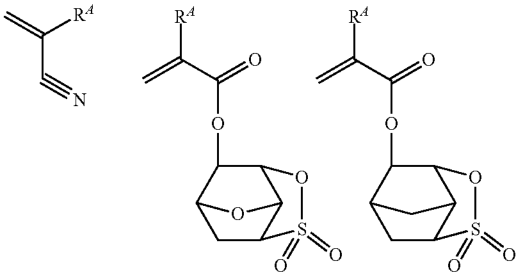
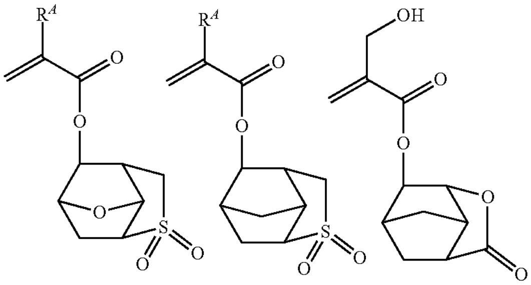
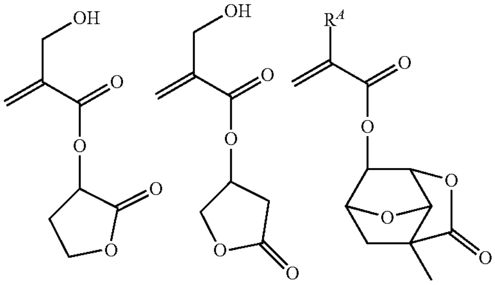

-continued
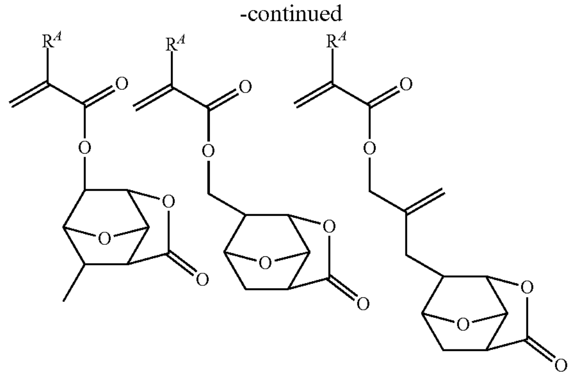
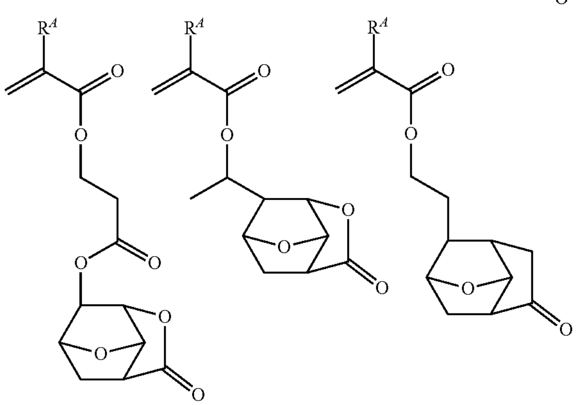
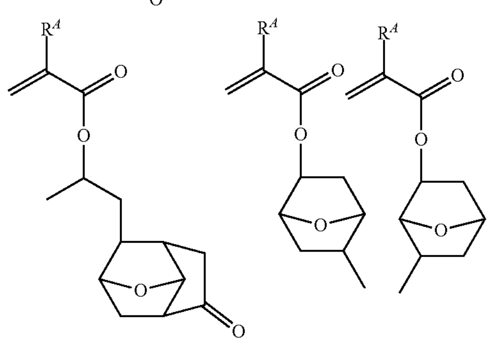
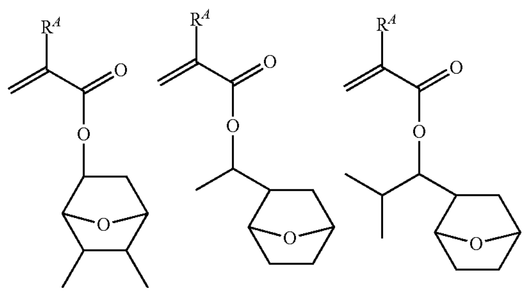
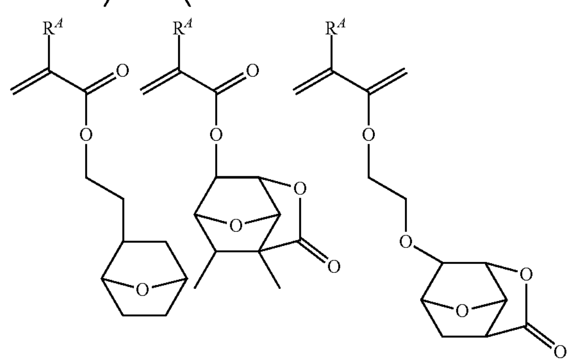
-continued
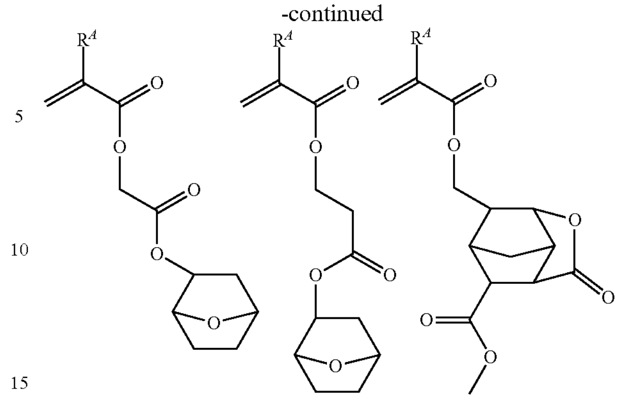
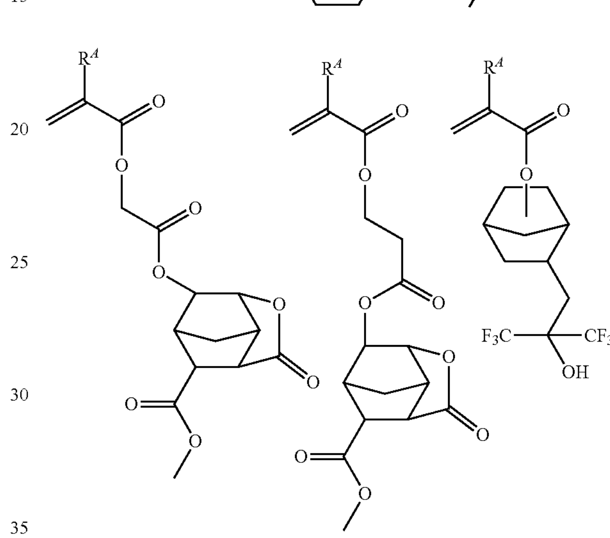
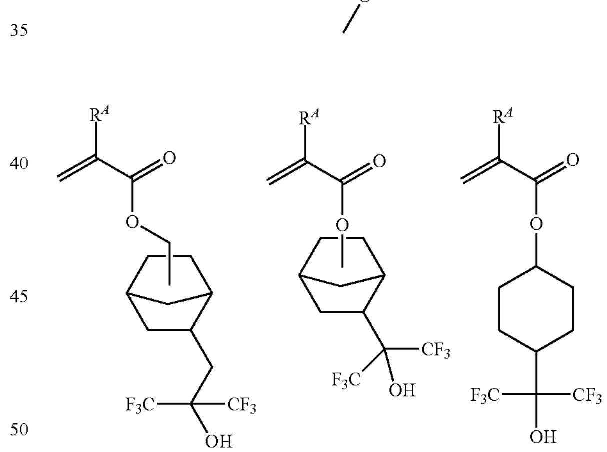
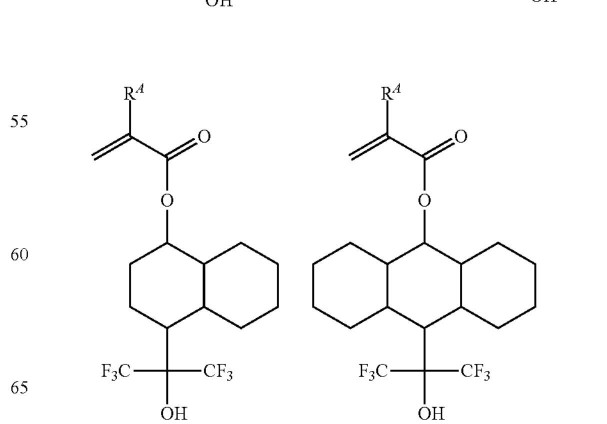

-continued
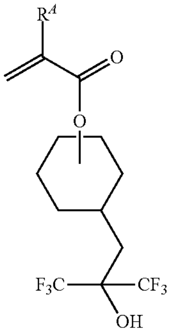
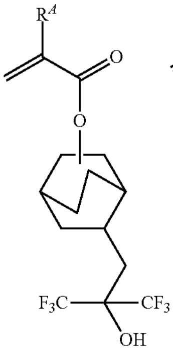
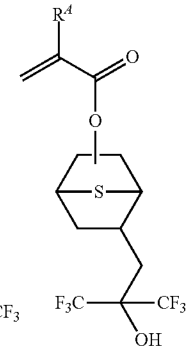
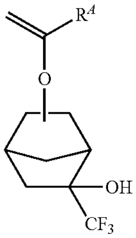
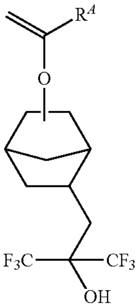
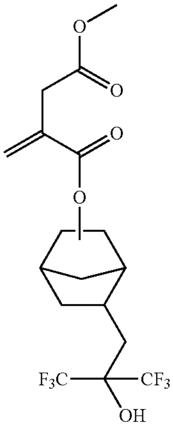
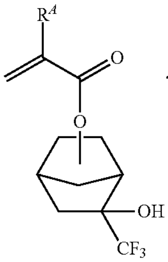
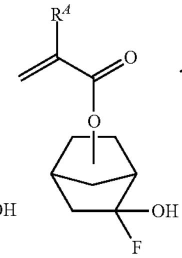
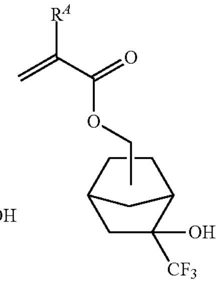
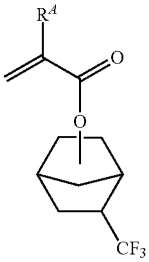
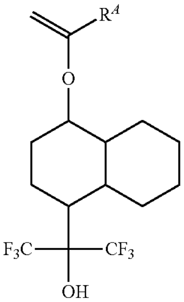
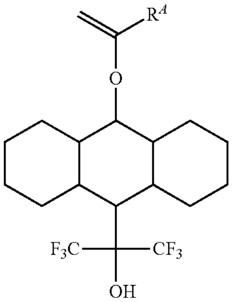
-continued
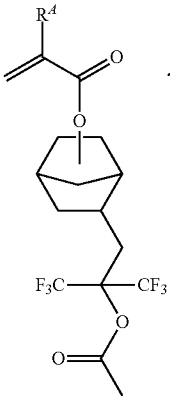
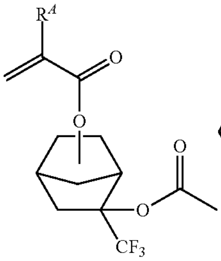
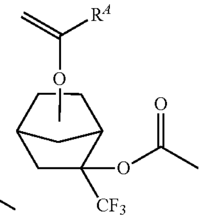
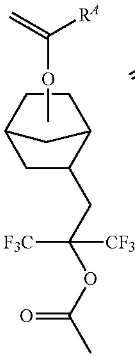
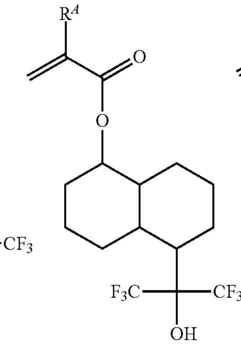
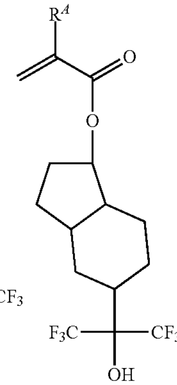
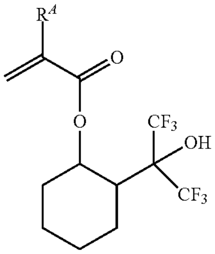
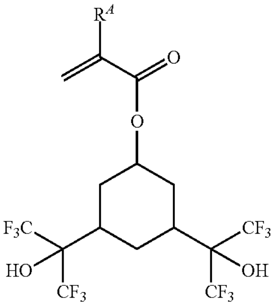
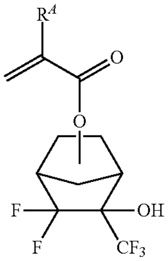
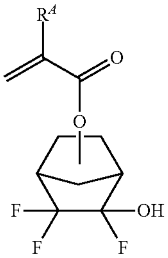
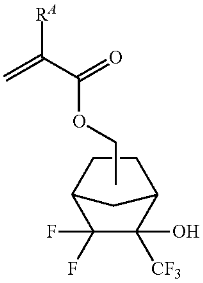
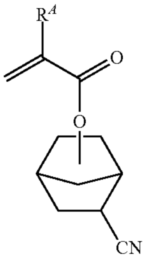
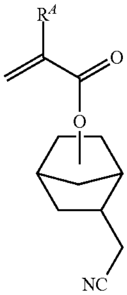
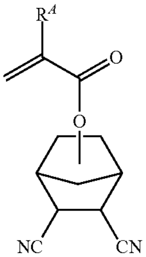

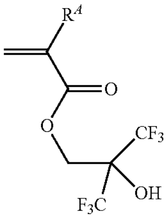
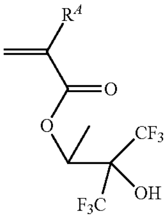
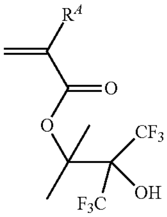
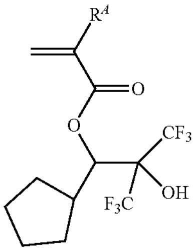
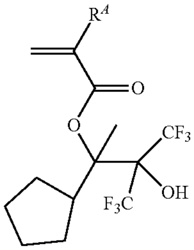
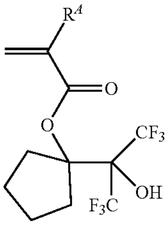
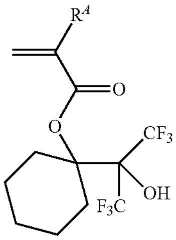
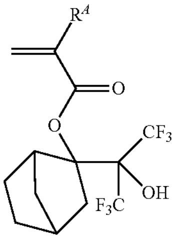
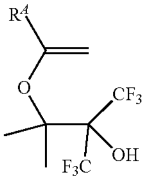
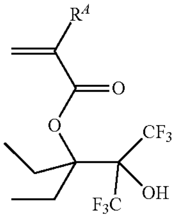
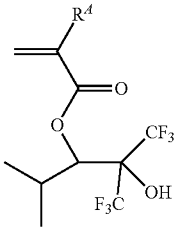
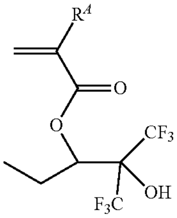
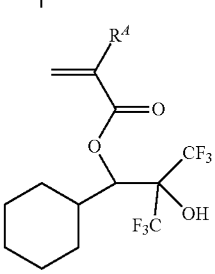
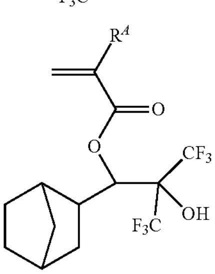
-continued
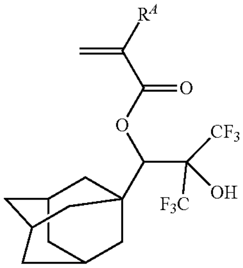
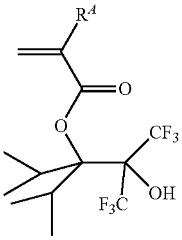
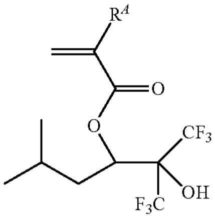
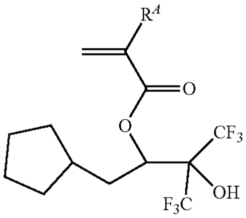
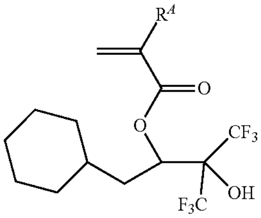
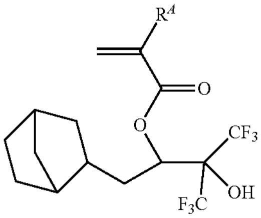
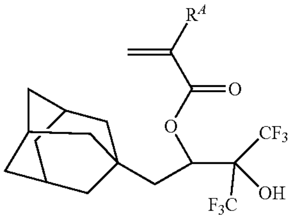
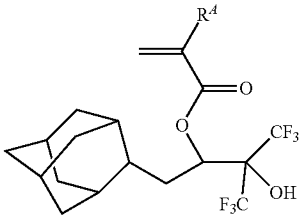
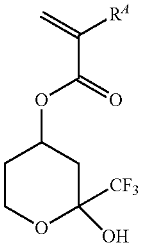
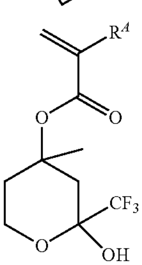
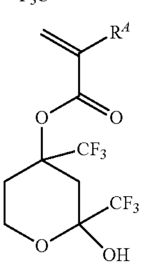

-continued
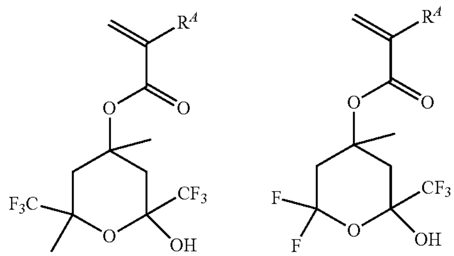
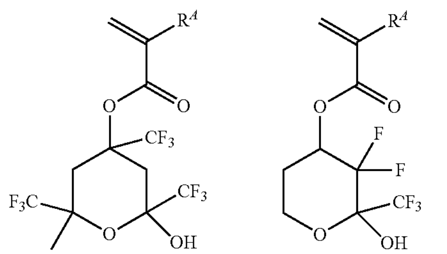
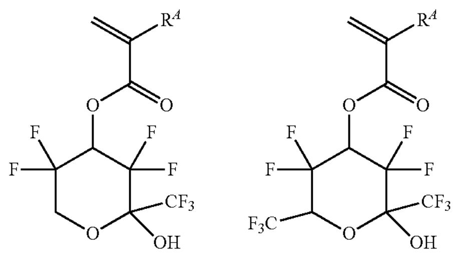
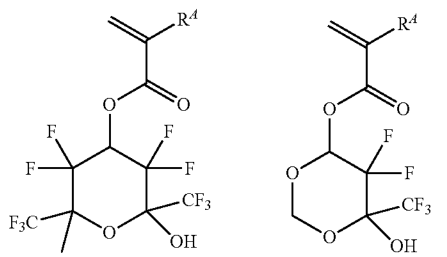
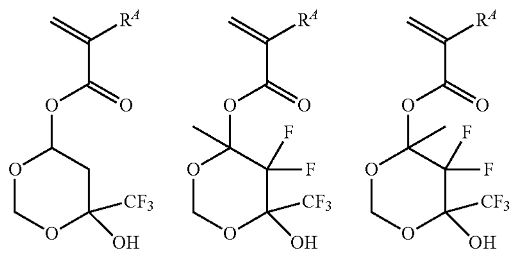
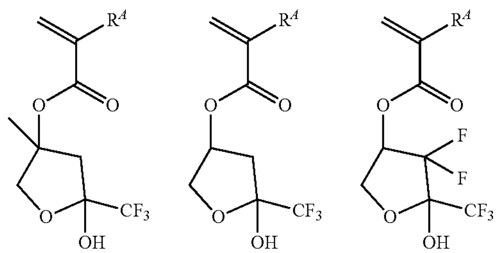
-continued
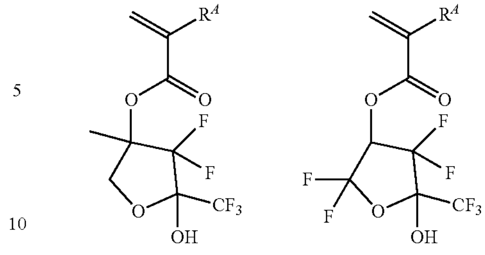
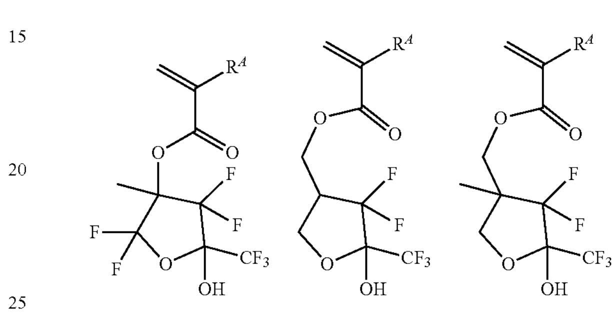
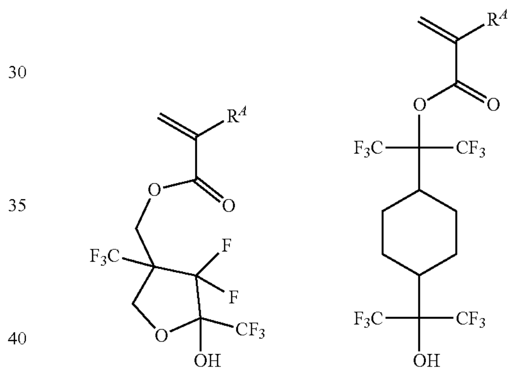
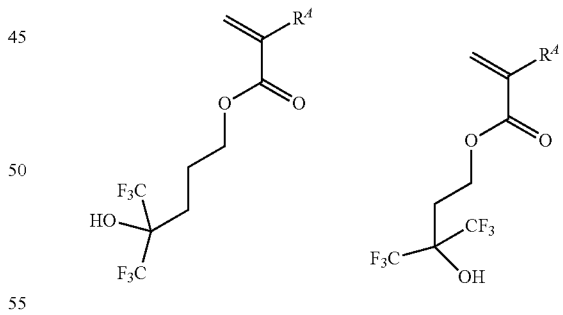
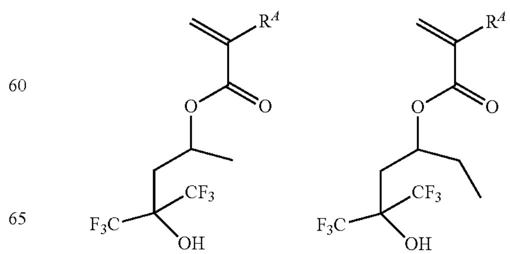

-continued
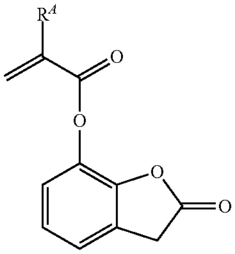
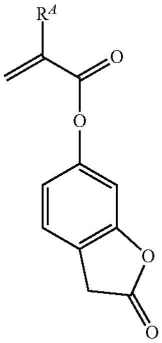
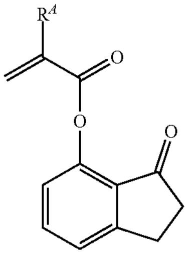
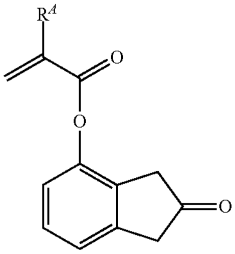
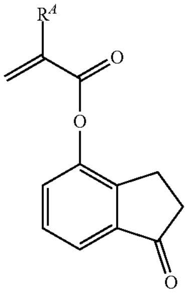
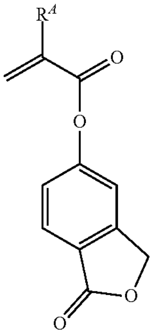
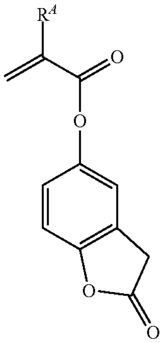
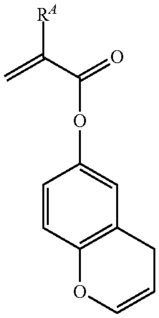
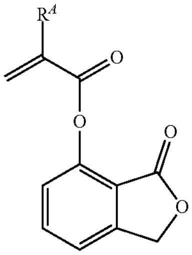
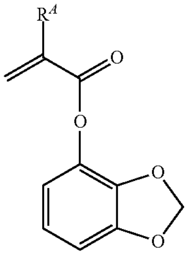
-continued
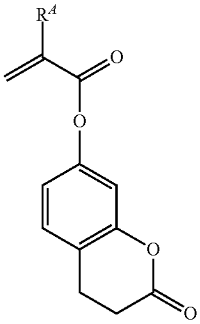
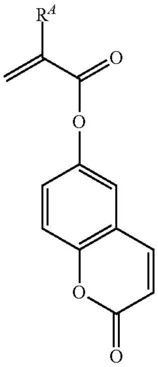
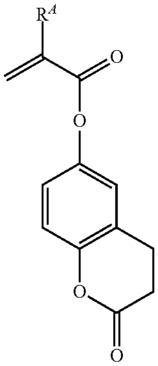
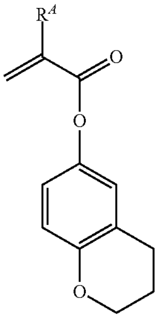
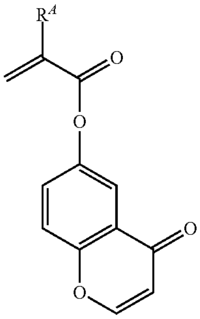
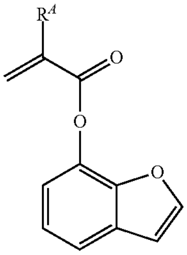
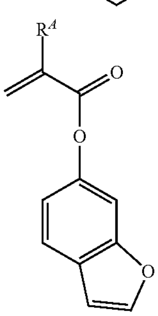
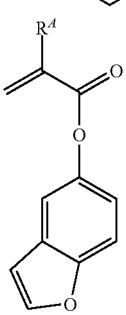
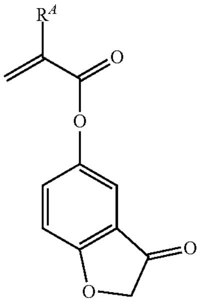
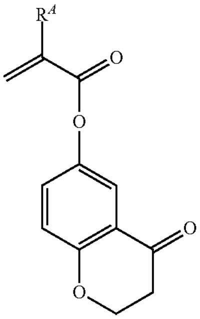

-continued
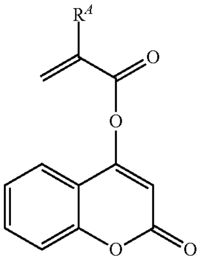
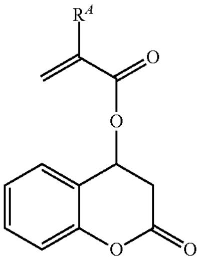
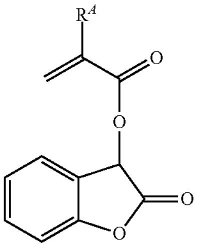
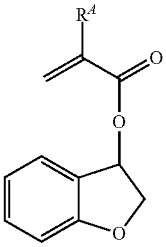
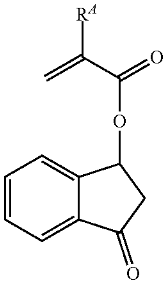
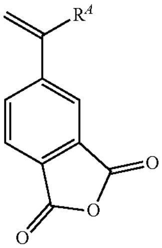
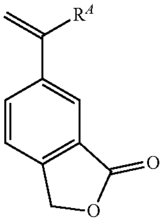
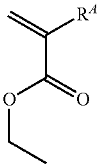
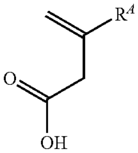
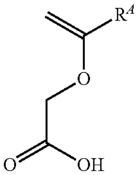
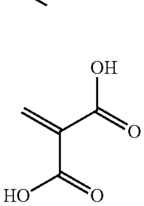
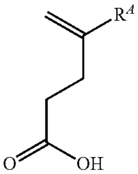
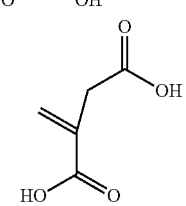
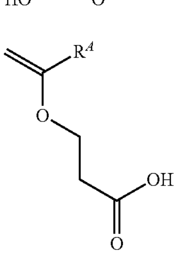
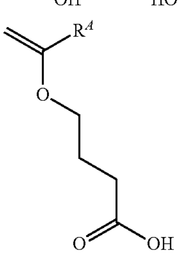
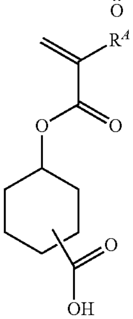
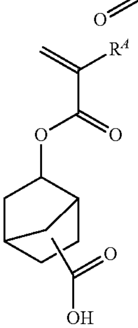
-continued
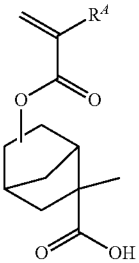
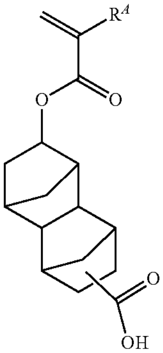
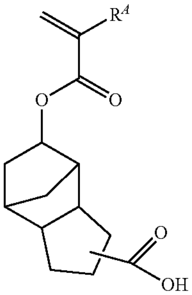
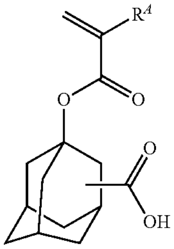
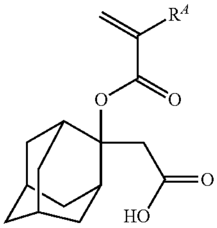
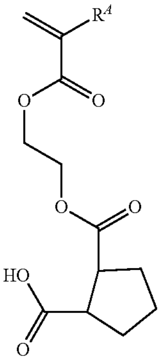
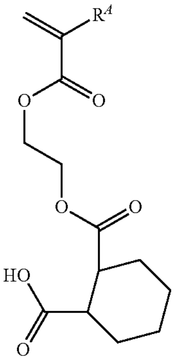
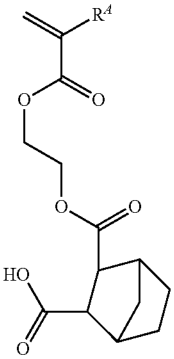
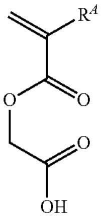
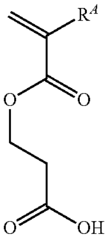
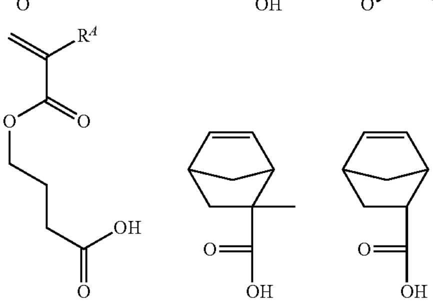

-continued

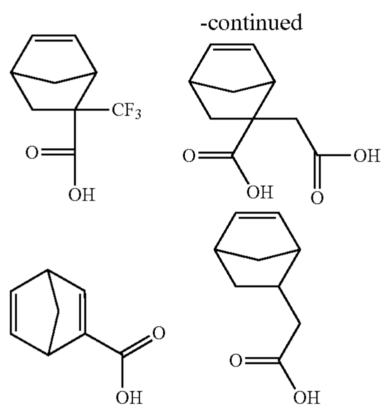

The base polymer may further contain a repeating unit-di derived, from indene, benzofuran, benzothiophene, acenaphthylene, chromone, coumarin, norbornadiene, or a derivative thereof. Examples of a monomer to give the repeating unit-d include those shown below, but are not

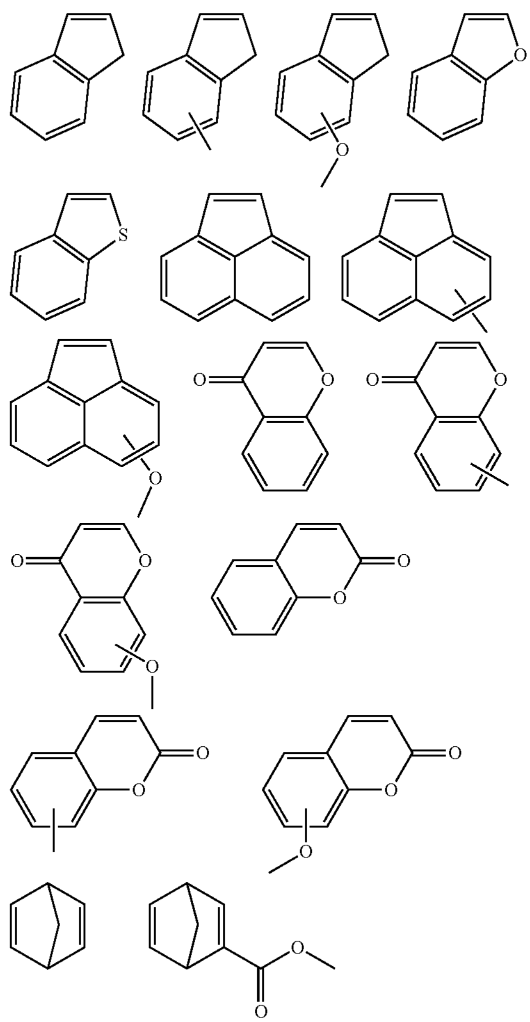

The base polymer may further contain a repeating unit-e derived from styrene, vinylnaphthalene, vinylanthracene, vinylpyrene, methyleneindane, vinylpyridine, or vinylcarbazole.

The base polymer may further contain a repeating unit-e derived from an onium salt including a polymerizable olefin. JP 2005-84365 A proposes a sulfonium salt and an iodonium salt containing a polymerizable olefin that generates a particular sulfonic acid. JP 2006-178317 A proposes a sulfonium salt having a sulfonic acid directly attached to the main chain.

Preferable examples of the repeating unit-f include a repeating unit represented by the following general formula (f1) (hereinafter, also referred to as a repeating unit-f1), a repeating unit represented by the following general formula (f2) (hereinafter, also referred to as a repeating unit-f2), and a repeating unit represented by the following general formula (f3) (hereinafter, also referred to as a repeating unit-f3). Note that one of the repeating units-f1 to -f3 may be used, or a combination of two or more kinds thereof may be used.

(f1)

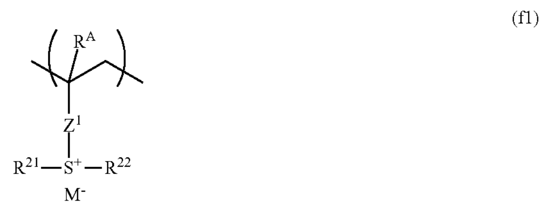

(f2)

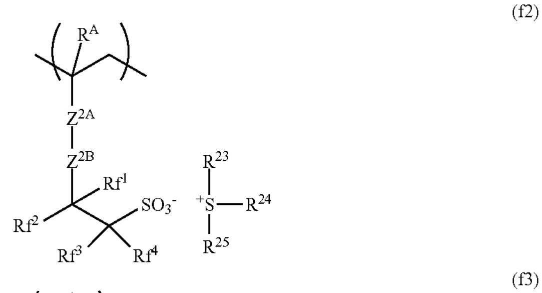

(f3)

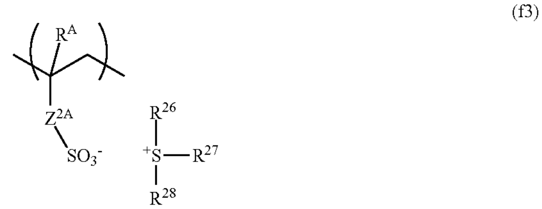

In the formulae, each $R^A$ independently represents a hydrogen atom or a methyl group. $Z^1$ represents a single bond, a phenylene group, a naphthylene group, —$Z^{11}$—, —O—$Z^{11}$—, —C(═O)—O—$Z^{11}$, or —C(═O)—NH—$Z^{11}$—. $Z^{11}$ represents an alkanediyl group having 1 to 6 carbon atoms, an alkenediyl group having 2 to 6 carbon atoms, or a hydrocarbon group having 1 to 20 carbon atoms and optionally containing a phenylene group and optionally contains a carbonyl group, an ester bond, an ether bond, or a hydroxy group. $Z^{2A}$ represents a single bond or an ester bond. $Z^{2B}$ represents a single bond or a divalent group having 1 to 18 carbon atoms and optionally contains an ester bond, an ether bond, a lactone ring, a bromine atom, or an iodine atom. $Z^3$ represents a single bond, a methylene group, an ethylene group, a phenylene group, a fluorinated phenylene group, a phenylene group substituted with a trifluoromethyl group, —O—$Z^{34}$, —C(═O)—O—$Z^{31}$—, or —C(═O)—NH—$Z^{31}$—, $Z^{31}$ represents an alkanediyl group having 1 to 15 carbon atoms, an alkenediyl group having 2 to 15 carbon atoms, or a group containing a phenylene group and optionally contains a carbonyl group, an ester bond, an ether bond, a hydroxy group, or a halogen atom. $Rf^1$ to $Rf^4$ each independently represent a hydrogen atom, a fluorine atom, an oxygen atom, or a trifluoromethyl group, provided that at least one is a fluorine atom, and that when $Rf^1$ and $Rf^2$ are respectively an oxygen atom, $Rf^1$ and $Rf^2$ are a single oxygen atom bonded to a single carbon atom to form a carbonyl group. $R^{21}$ to $R^{28}$ each independently represent a monovalent hydrocarbon group having 1 to 25 carbon atoms and optionally containing a heteroatom. Any two of $R^{23}$, $R^{24}$, and $R^{25}$ or any two of $R^{26}$, $R^{27}$, and $R^{28}$ are optionally bonded with each other to form a ring with a sulfur atom that is bonded thereto. $M^-$ represents a non-nucleophilic counter ion.

In the general formulae (f1) to (f3), $R^{21}$ to $R^{26}$ each independently represent a hydrocarbyl group (hydrocarbon group) having 1 to 25 carbon atoms and optionally containing a heteroatom. The hydrocarbyl group may be saturated or unsaturated, and may be linear, branched, or cyclic. Specific examples thereof include an alkyl group having 1 to 25 carbon atoms, an aryl group having 6 to 25 carbon atoms, an aralkyl group having 7 to 25 carbon atoms, and groups obtained by combining these groups. Specific examples thereof include those given as examples in the description of $R^3$, $R^4$, $R^5$, $R^6$, and $R^7$ in the general formulae (A-1) and (A-2). Furthermore, some or all of the hydrogen atoms of these groups may be substituted with a saturated hydrocarbyl group having 1 to 10 carbon atoms, a halogen atom, a trifluoromethyl group, a cyano group, a nitro group, a hydroxy group, a mercapto group, a saturated hydrocarbyloxy group having 1 to 10 carbon atoms, a saturated hydrocarbyloxycarbonyl group having 2 to 10 carbon atoms, or a saturated hydrocarbylcarbonyloxy group having 2 to 10 carbon atoms, and some of the carbon atoms of these groups may be substituted with a carbonyl group, an ether bond, or an ester bond. In addition, $R^{23}$ and $R^{24}$ or $R^{26}$ and $R^{27}$ are optionally bonded with each other to form a ring with a sulfur atom that is bonded thereto. In this event, examples of the ring include those given as examples of the ring that can be formed by $R^3$ and $R^4$ bonding with each other to form the ring with a sulfur atom that is bonded thereto in the description of the general formula (A-1).

In the general formula (f1), $M^-$ represents a non-nucleophilic counter ion. Examples of the non-nucleophilic counter ion include halide ions such as chloride ion and bromide ion; fluoroalkylsulfonate ions such as triflate ion, 1,1,1-trifluoroethanesulfonate ion, and nonafluorobutanesulfonate ion; arylsulfonate ions such as tosylate ion, benzenesulfonate ion, 4-fluorobenzenesulfonate ion, and 1,2,3,4,5-pentafluorobenzenesulfonate ion; alkylsulfonate ions such as mesylate ion and butanesulfonate ion; imide ions such as bis(trifluoromethylsulfonyl)imide ion, bis(perfluoroethylsulfonyl)imide ion, and bis(perfluorobutylsulfonyl)imide ion; and methide ions such as tris(trifluoromethylsulfonyl)methide ion and tris(perfluoroethylsulfonyl)methide ion.

Other examples of the non-nucleophilic counter ion include sulfonate ions having a fluorine atom substituted at α position as shown by the following general formula (f1-1), sulfonate ions having a fluorine atom substituted at α position and having a trifluoromethyl group substituted at β position as shown by the following general formula (f1-2), etc.

(f1-1)

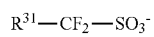

-continued (f1-2)

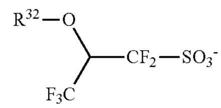

In the general formula (f1-1), $R^{31}$ represents a hydrogen atom or a hydrocarbyl group having 1 to 20 carbon atoms, and optionally contains an ether bond, an ester bond, a carbonyl group, a lactone ring, or a fluorine atom.

In the general formula (f1-2), $R^{32}$ represents a hydrogen atom, a hydrocarbyl group having 1 to 30 carbon atoms, or a hydrocarbylcarbonyl group having 2 to 30 carbon atoms, and optionally contains an ether bond, an ester bond, a carbonyl group, or a lactone ring.

The hydrocarbyl moiety of the hydrocarbyl group and hydrocarbylcarbonyl group represented by $R^{31}$ or $R^{32}$ may be saturated or unsaturated, and may be linear, branched, or cyclic. Specific examples thereof include alkyl groups such as a methyl group, an ethyl group, a propyl group, an isopropyl group, a butyl group, an isobutyl group, a sec-butyl group, a tert-butyl group, a pentyl group, a neopentyl group, a hexyl group, a heptyl group, a 2-ethylhexyl group, a nonyl group, an undecyl group, a tridecyl group, a pentadecyl group, a heptadecyl group, and an icosanyl group; cyclic saturated hydrocarbyl groups such as a cyclopentyl group, a cyclohexyl group, a 1-adamantyl group, a 2-adamantyl group, a 1-adamantylmethyl group, a norbornyl group, a norbornylmethyl group, a tricyclodecanyl group, a tetracyclododecanyl group, a tetracyclododecanylmethyl group, and a dicyclohexylmethyl group; alkenyl groups such as an allyl group; cyclic unsaturated hydrocarbyl groups such as a 3-cyclohexenyl group; aryl groups such as a phenyl group, a 1-naphthyl group, and a 2-naphthyl group; aralkyl groups such as a benzyl group and a diphenylmethyl group; etc.

Furthermore, some or all of the hydrogen atoms of these groups may be substituted with a group containing a heteroatom such as an oxygen atom, a sulfur atom, a nitrogen atom, or a halogen atom, and some of the carbon atoms of these groups may be substituted with a group containing a heteroatom such as an oxygen atom, a sulfur atom, or a nitrogen atom. As a result, a hydroxy group, a cyano group, a carbonyl group, an ether bond, an ester bond, a sulfonic acid ester group, a carbonate group, a lactone ring, a sultone ring, carboxylic anhydride, a haloalkyle group, or the like may be contained. Examples of the hydrocarbyl group containing a heteroatom include a tetrahydrofuryl group, a methoxymethyl group, an ethoxymethyl group, a methylthiomethyl group, an acetamidomethyl group, a trifluoroethyl group, a (2-methoxyethoxy)methyl group, an acetoxymethyl group, a 2-carboxy-1-cyclohexyl group, a 2-oxopropyl group, a 4-oxo-1-adamantyl group, a 3-oxocyclohexyl group, etc.

Examples of a cation of a monomer to give the repeating unit-f1 include those shown below, but are not limited thereto. Note that in the following formulae, $R^A$ is as defined above.

-continued
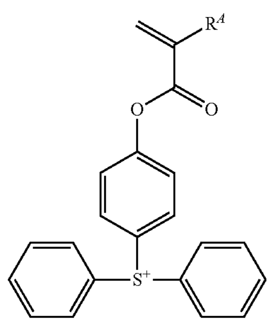
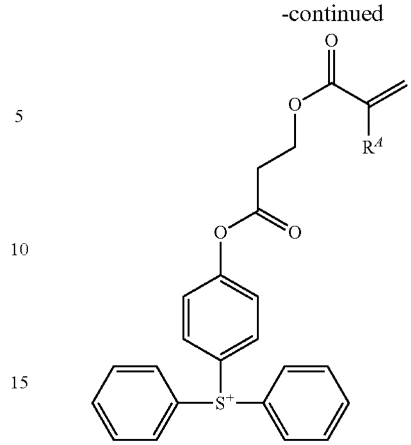
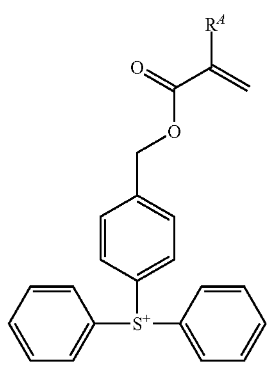
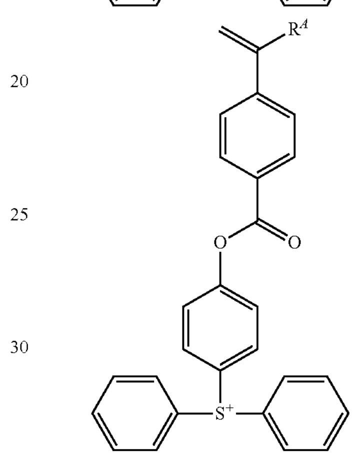
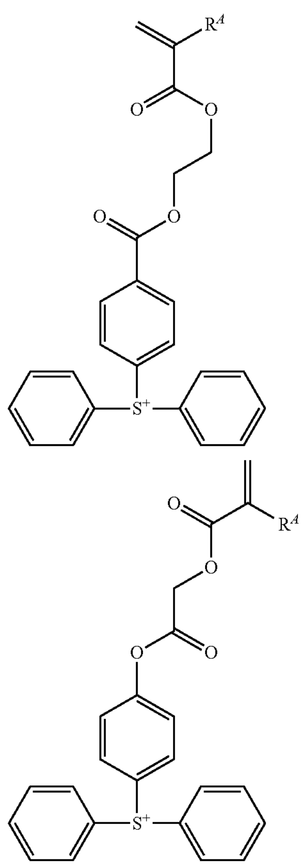
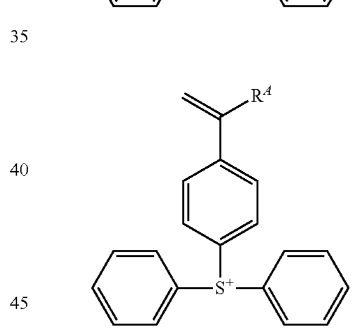
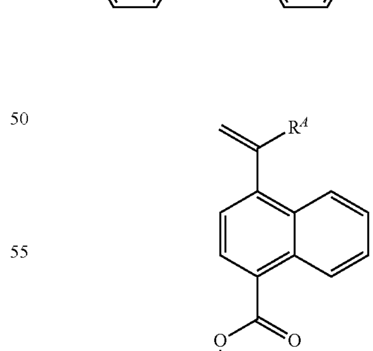
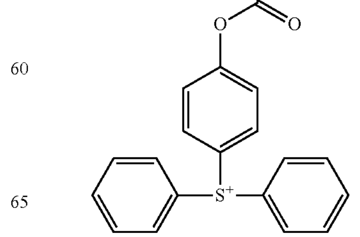

-continued
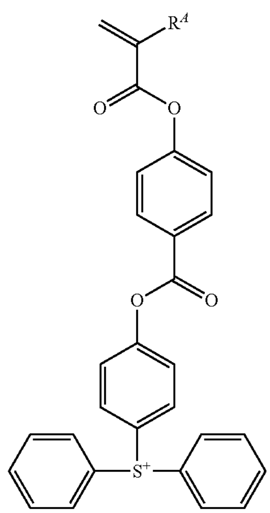
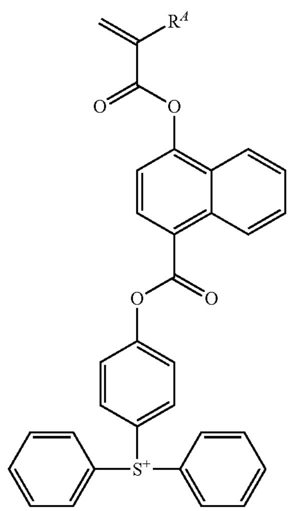
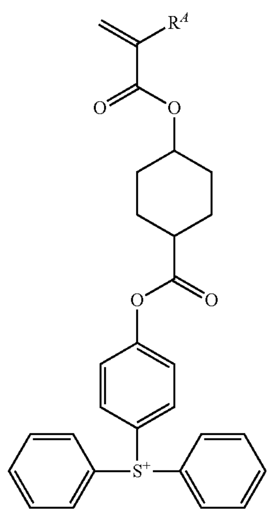
-continued
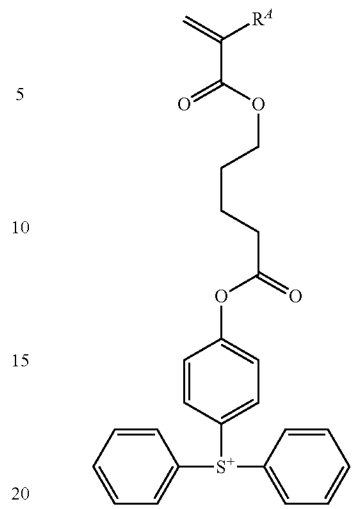
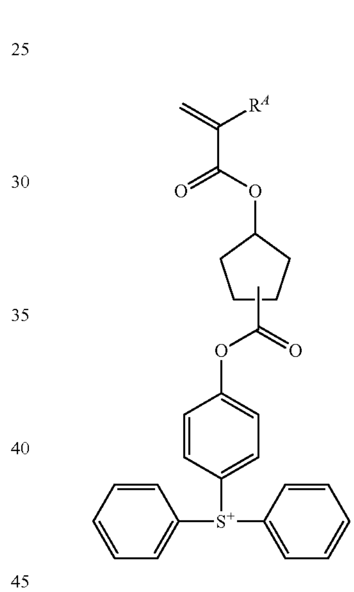
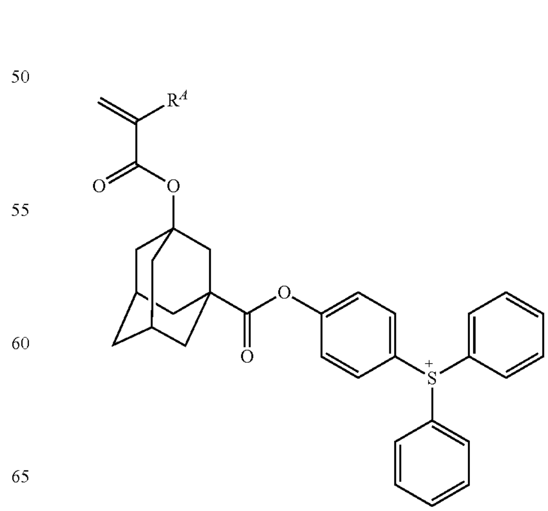

-continued
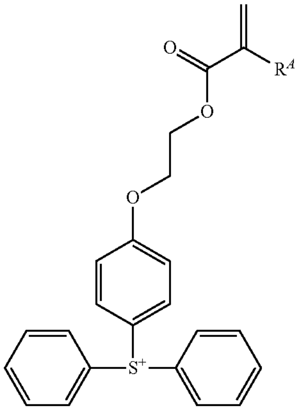
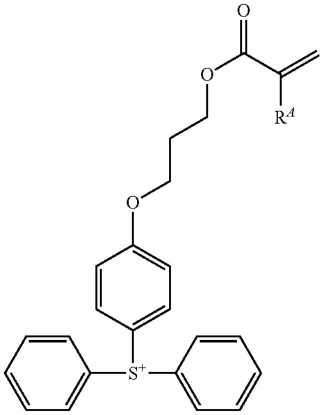
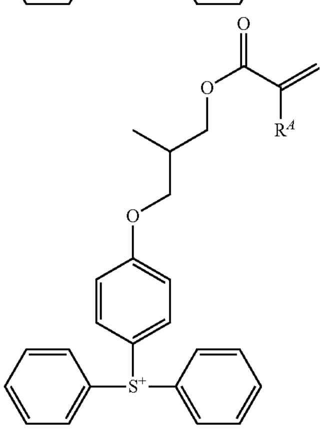
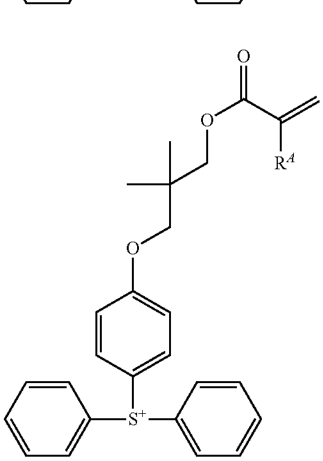
Specific examples of a cation of a nonamer to give the repeating unit-f1 or -f3 Include those given as examples of the cation of the sulfonium salt represented by the general formula (A-1).
Examples of a monomer to give the repeating unit-f2 include those shown below, but are not limited thereto. Note that in the following formulae, $R^A$ is as defined above.
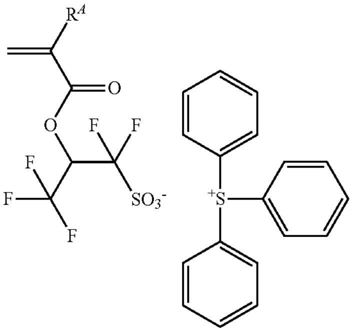
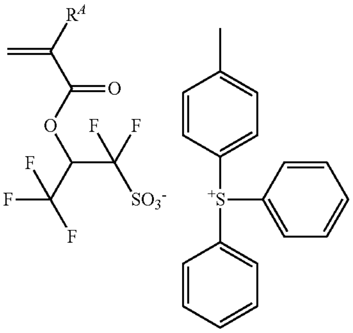
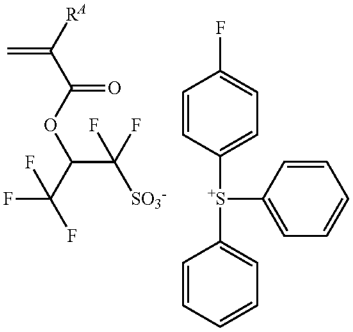
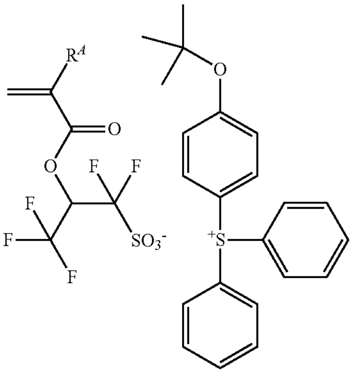

-continued
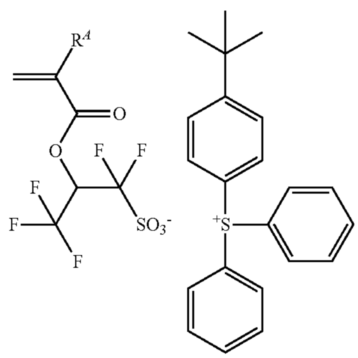
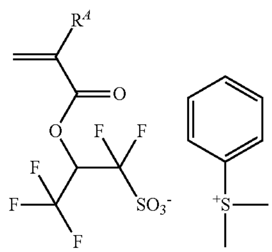
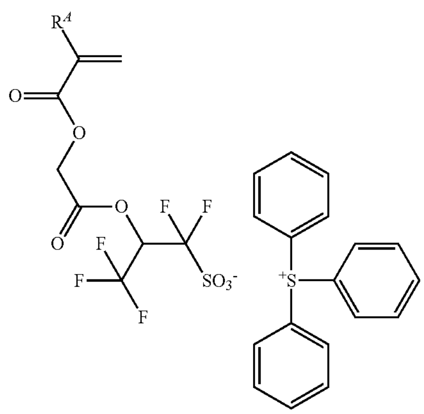
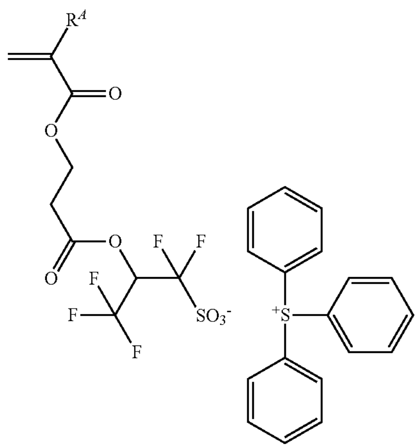
-continued
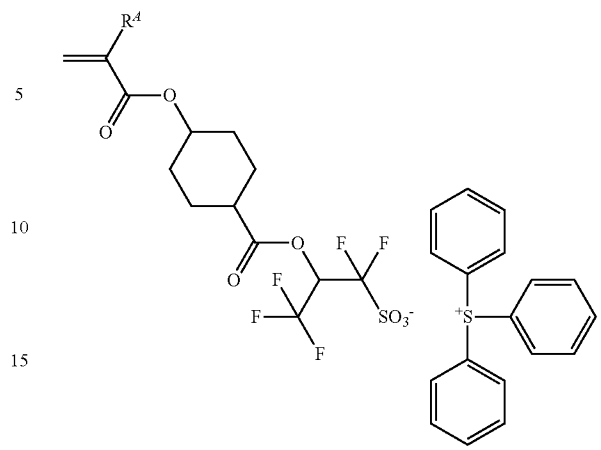
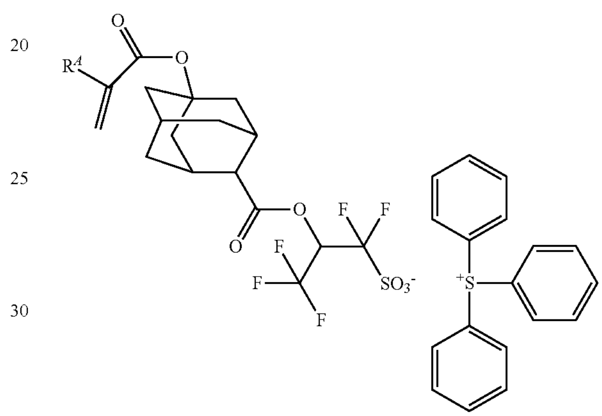
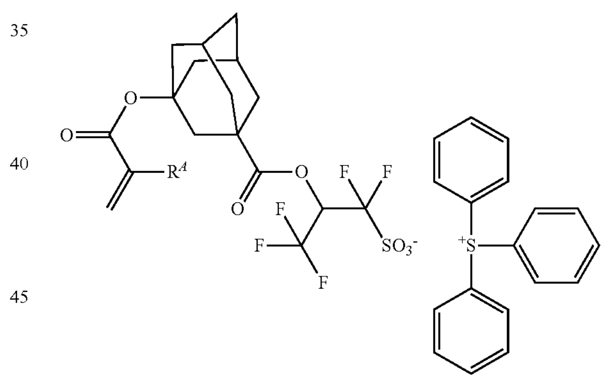
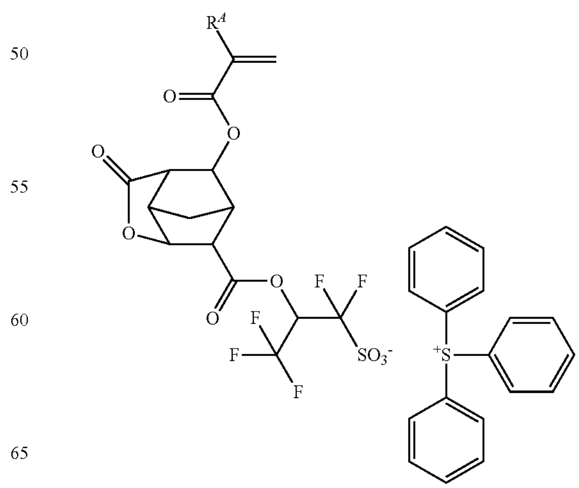

-continued
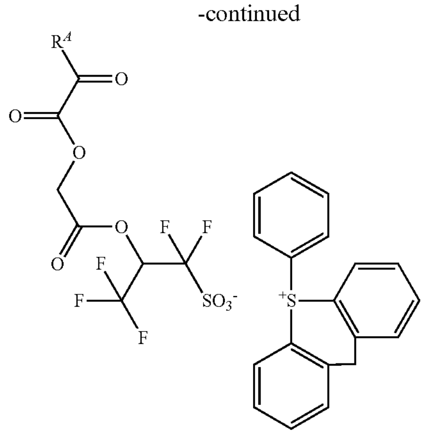
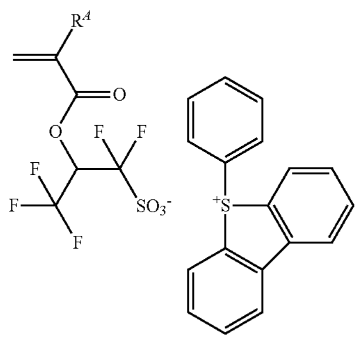
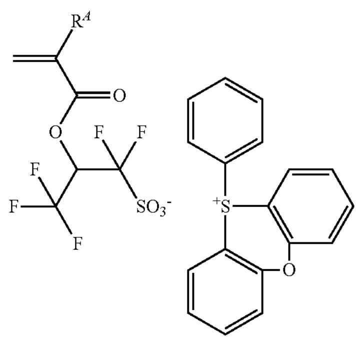
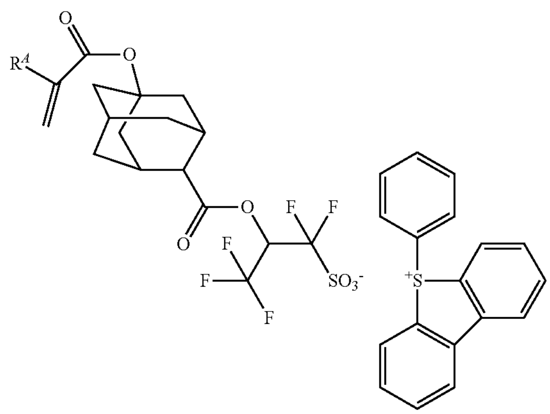
-continued
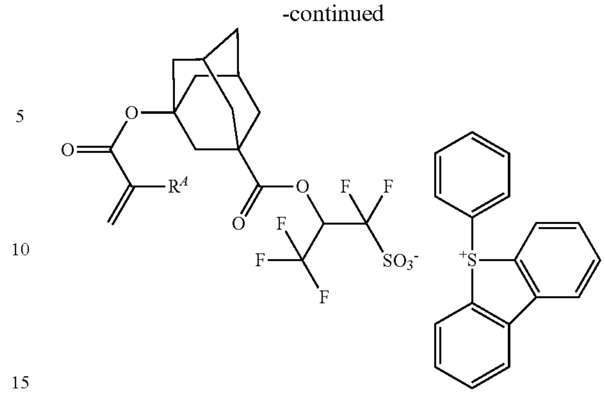
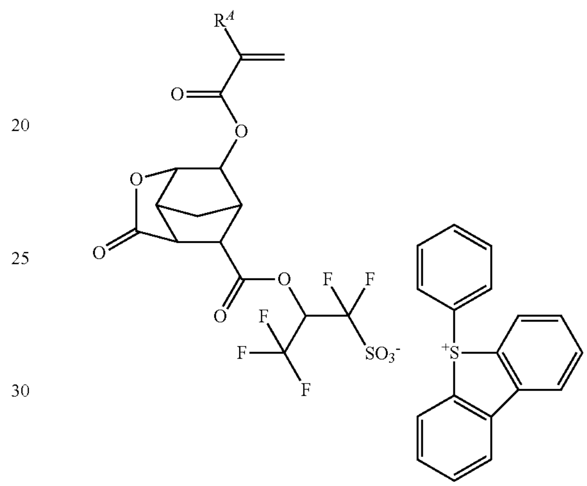
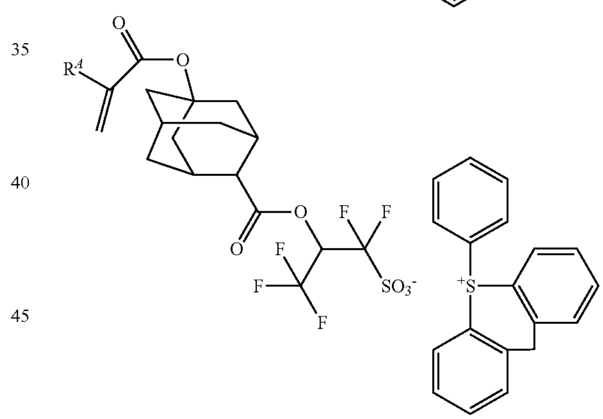
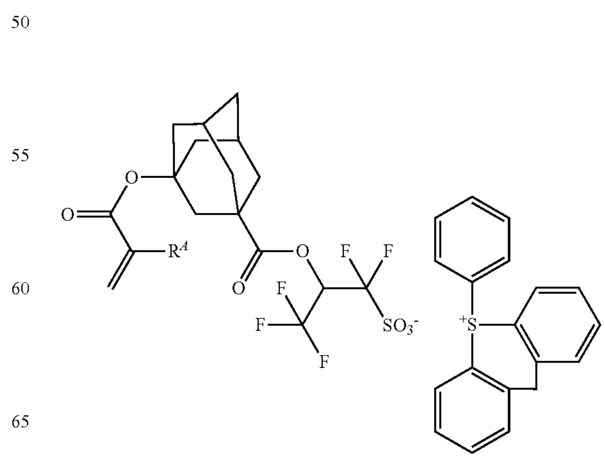

-continued
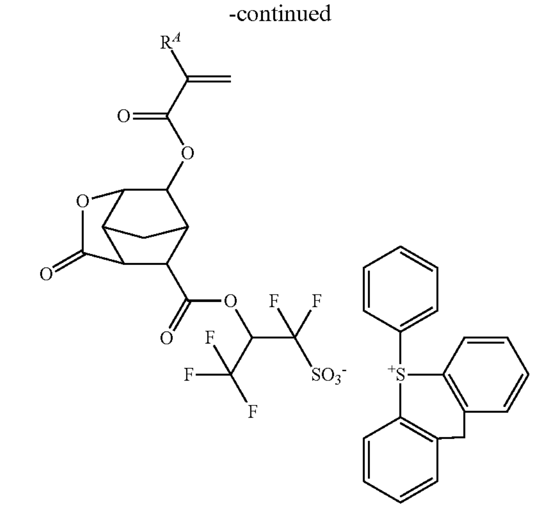
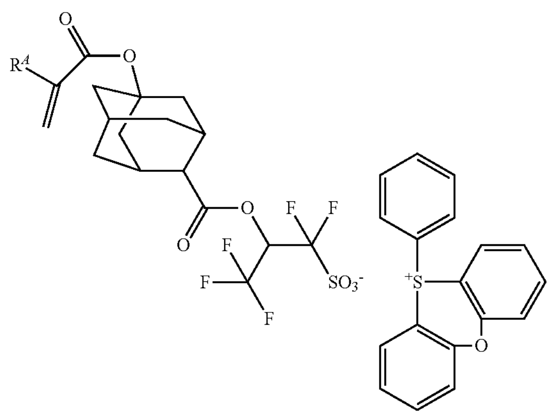
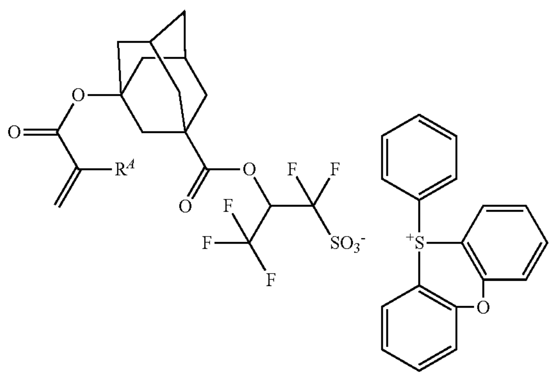
-continued
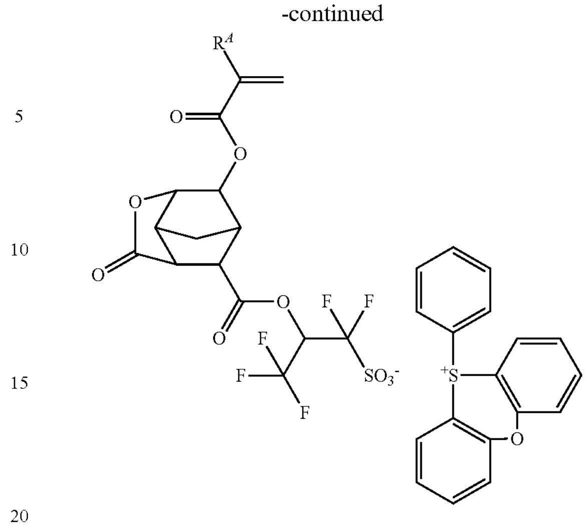
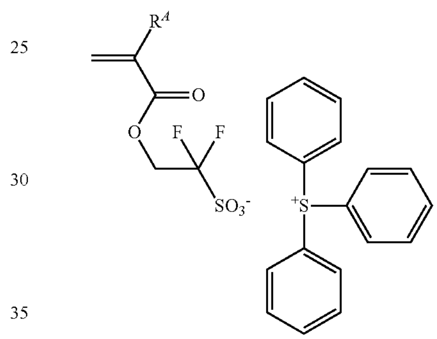
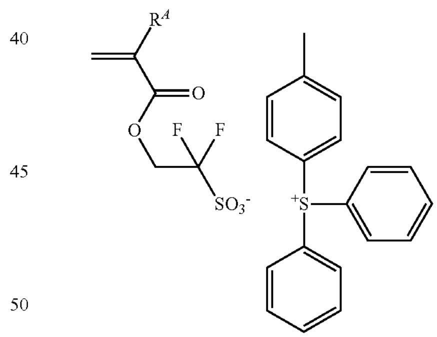
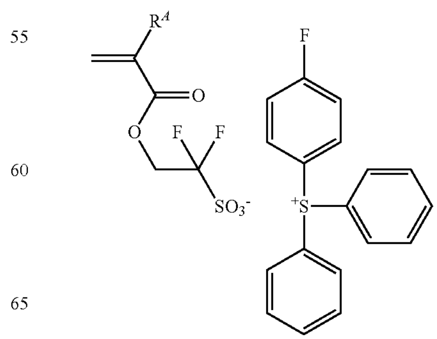

-continued
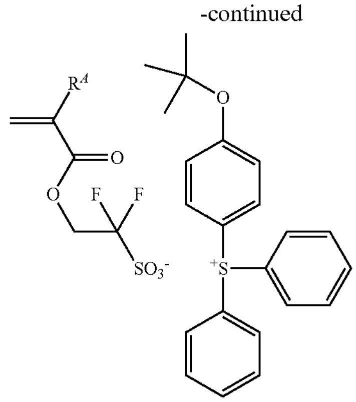
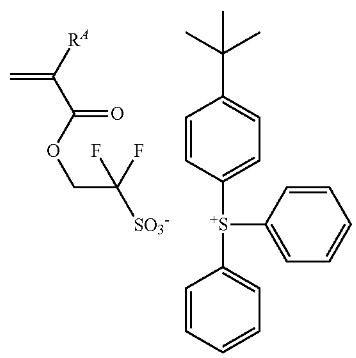
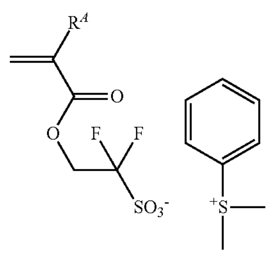
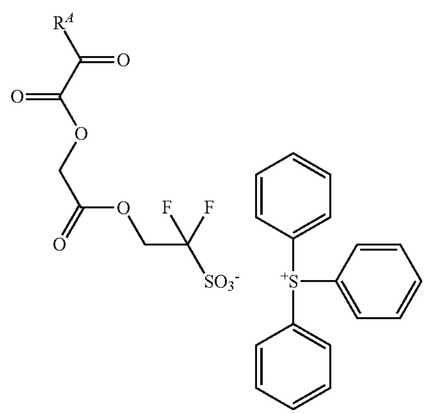
-continued
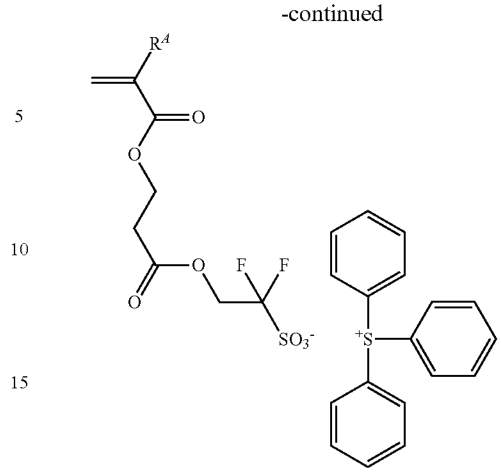
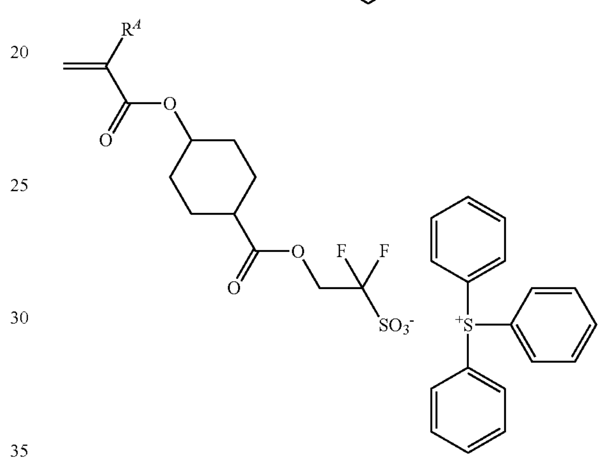
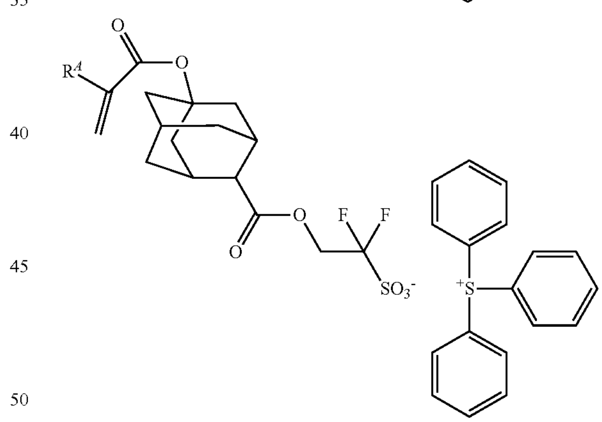
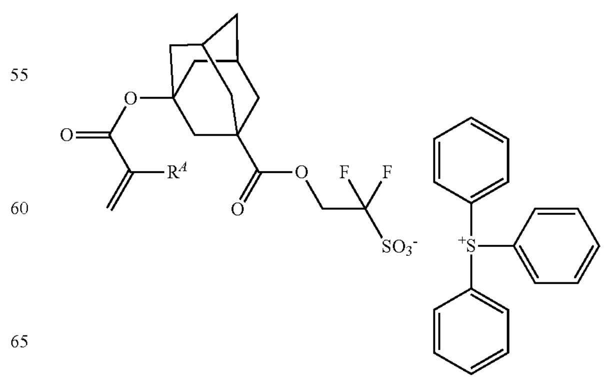

-continued
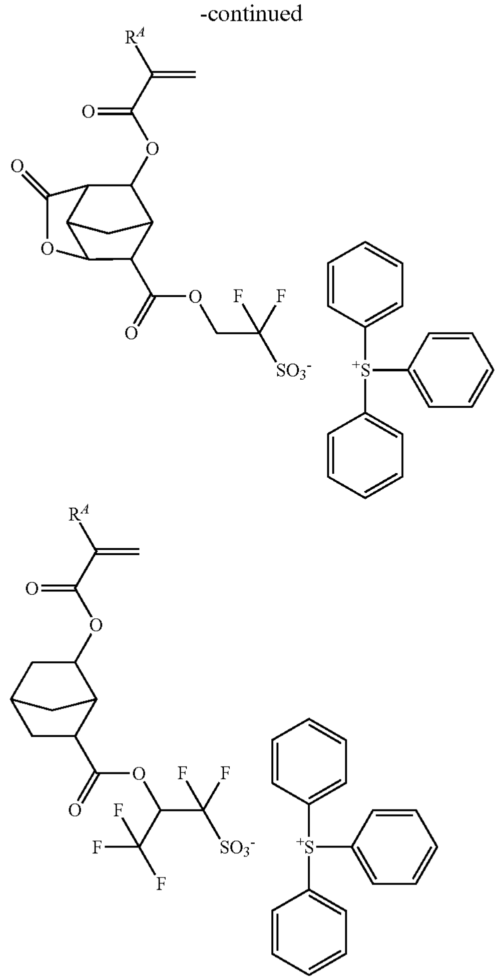
In addition, the anion moiety of the monomer to give the repeating unit-f2 may have a structure represented by a formula shown below. Note that in the following formulae, $R^A$ is as defined above.
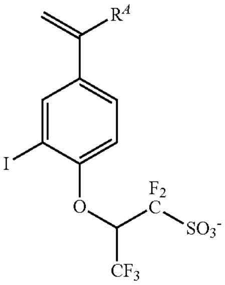
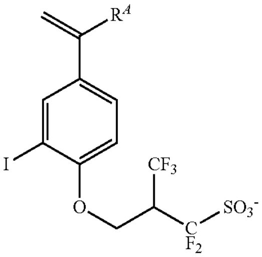
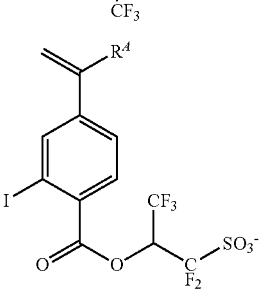
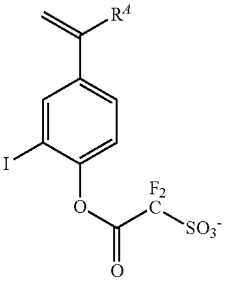
-continued
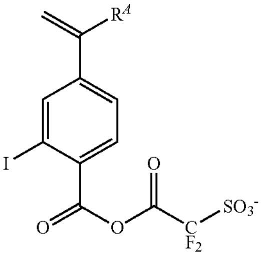
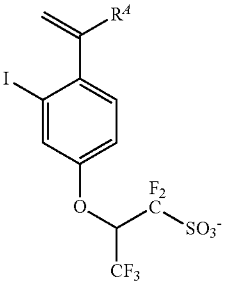
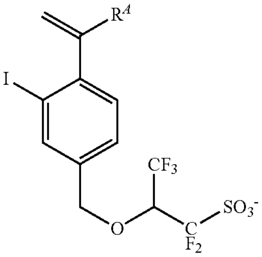
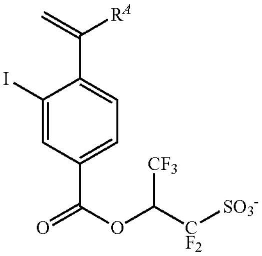
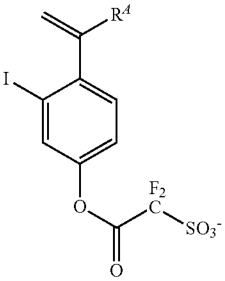
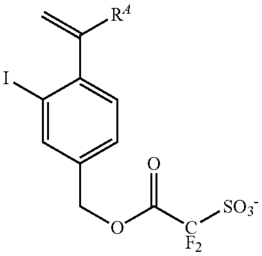
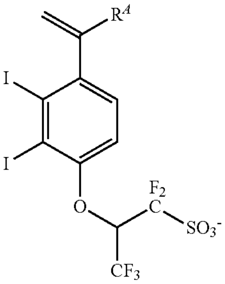
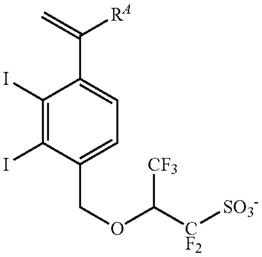
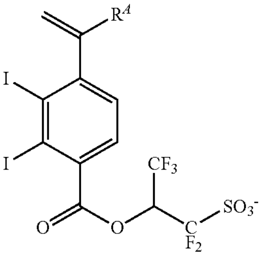
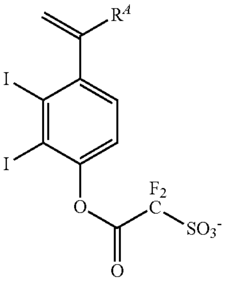

-continued
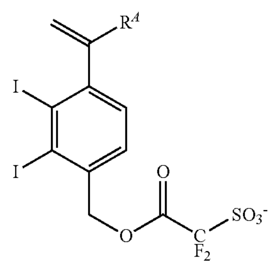
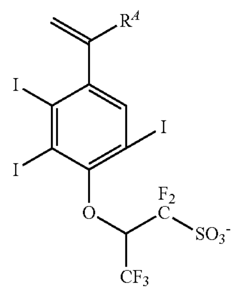
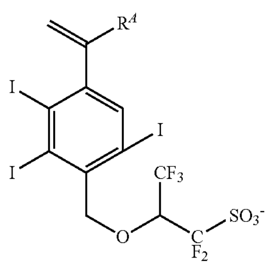
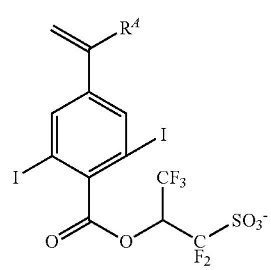
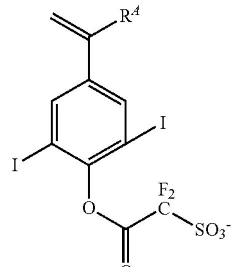
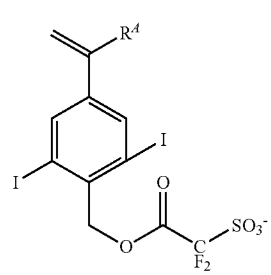
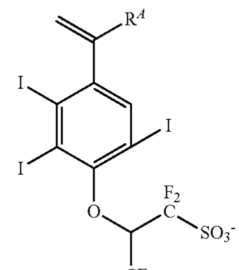
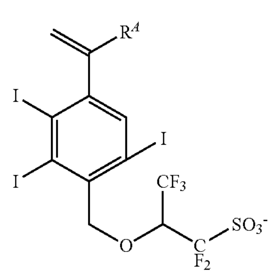
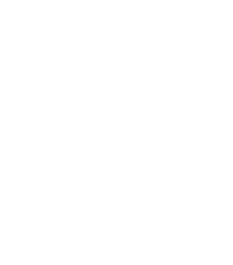
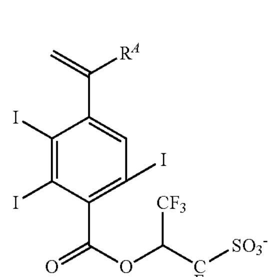
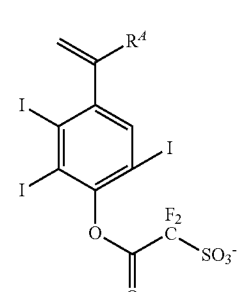
-continued
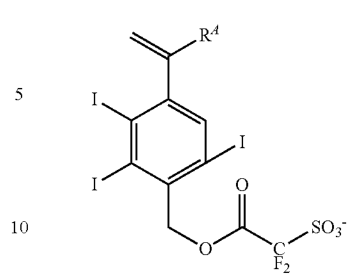
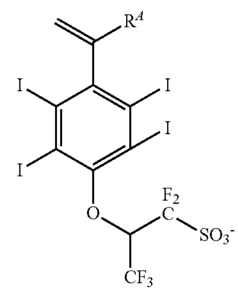
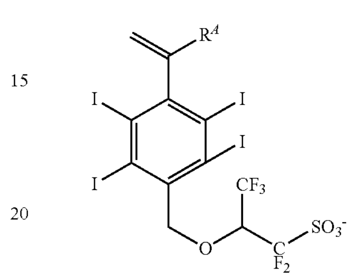
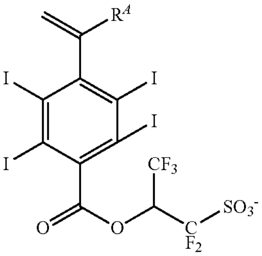
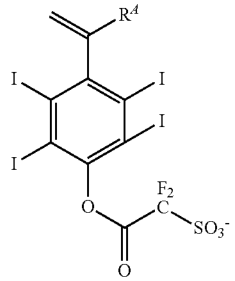
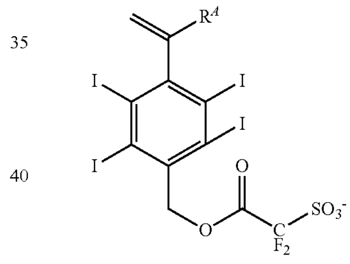
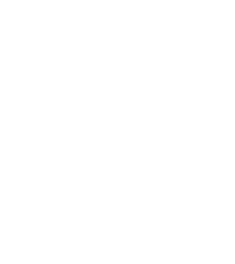
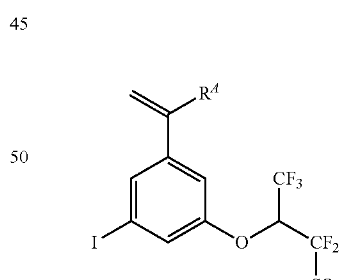
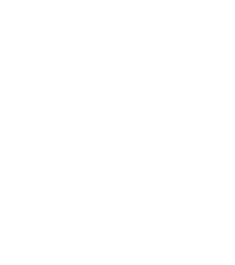
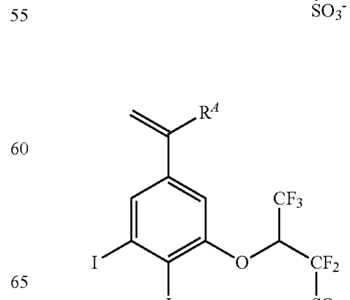
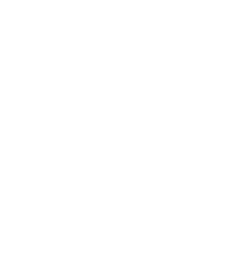

-continued
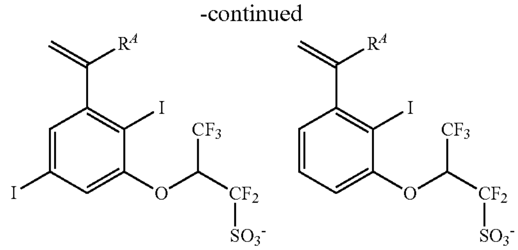
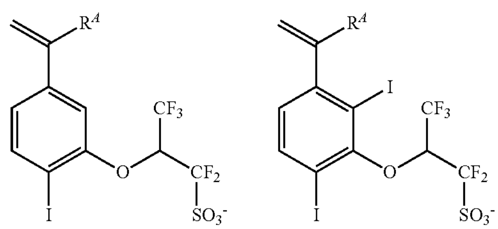
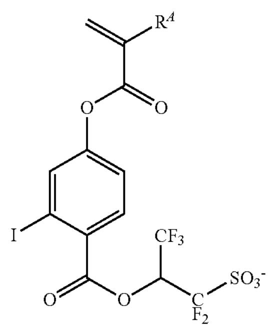
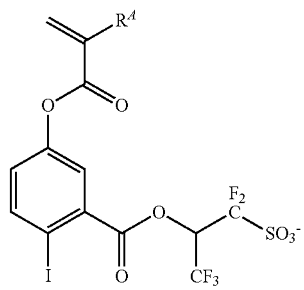
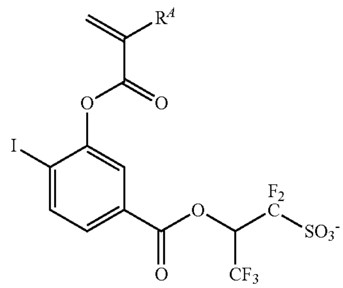
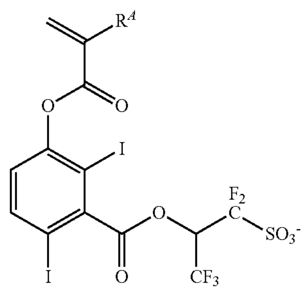
-continued
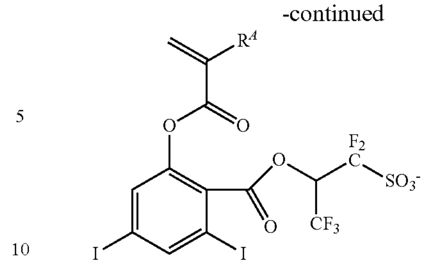
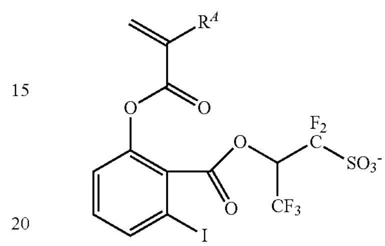
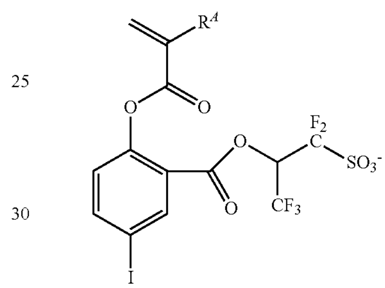
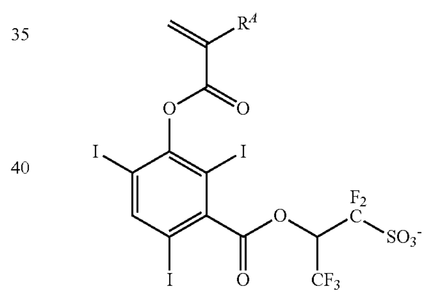
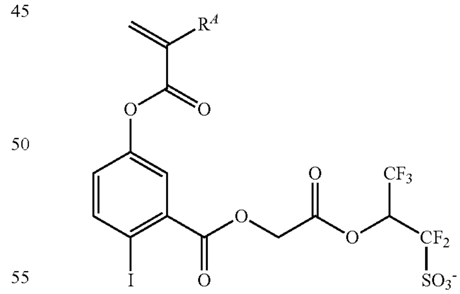
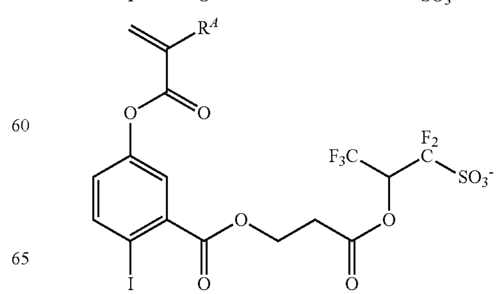

-continued
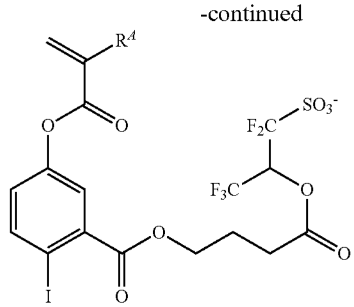
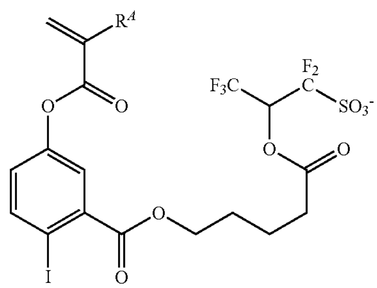
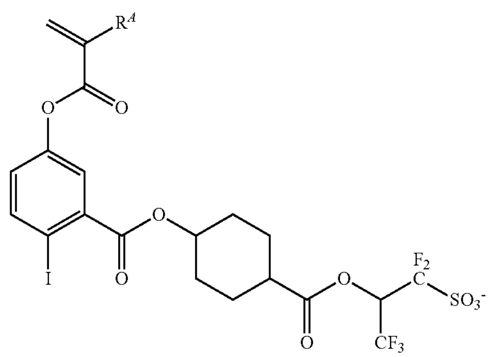
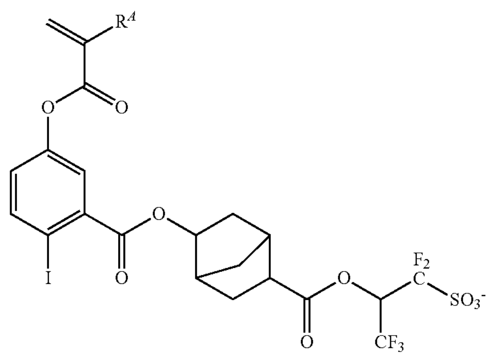
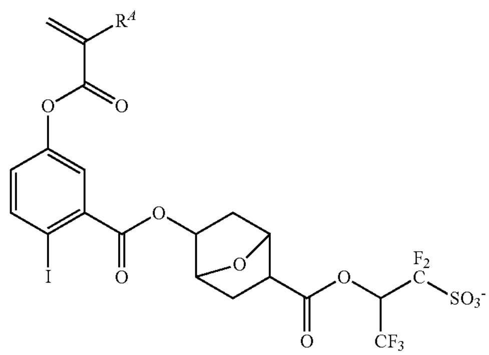
-continued
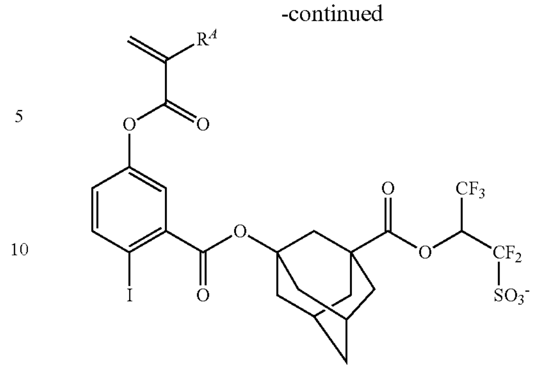
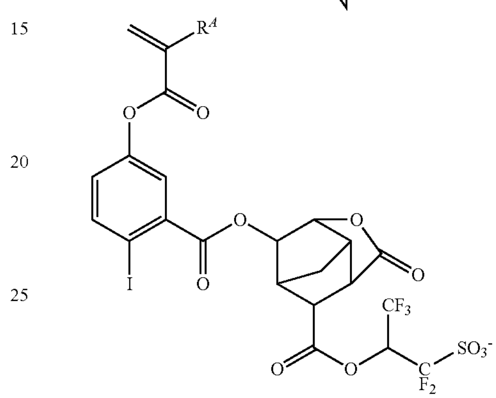
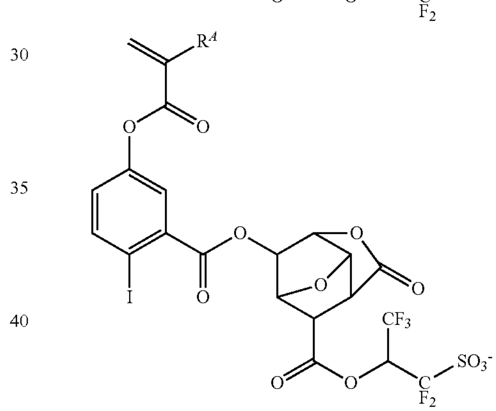
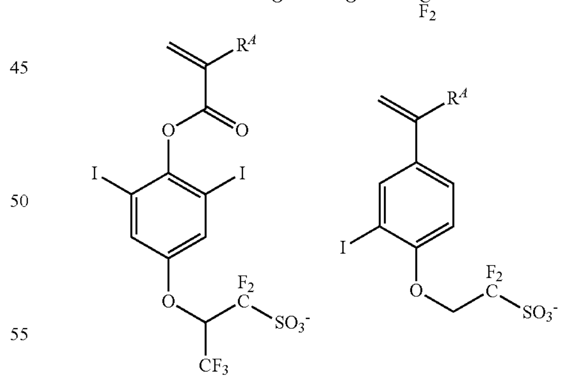
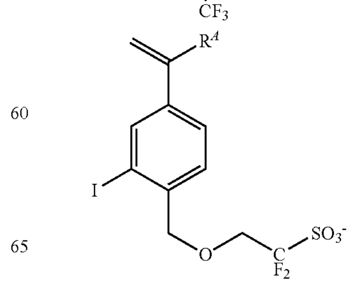

-continued
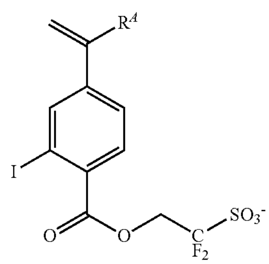
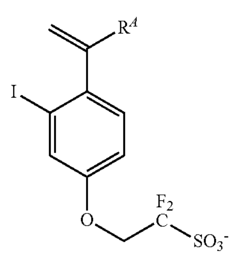
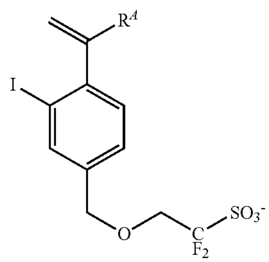
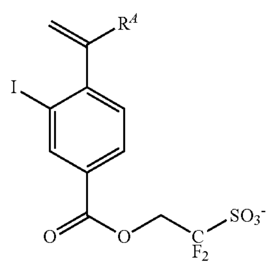
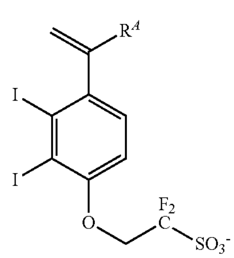
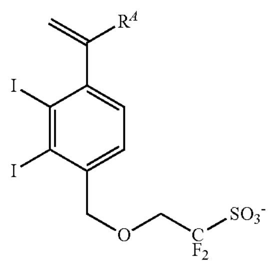
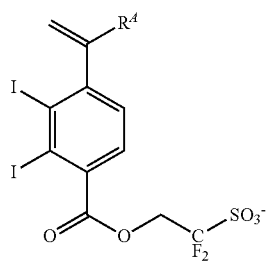
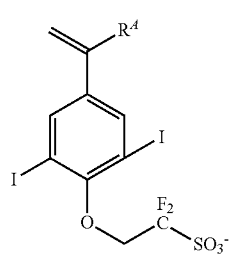
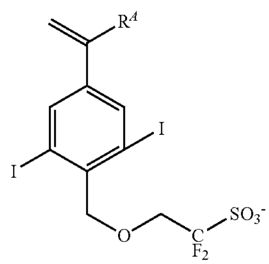
-continued
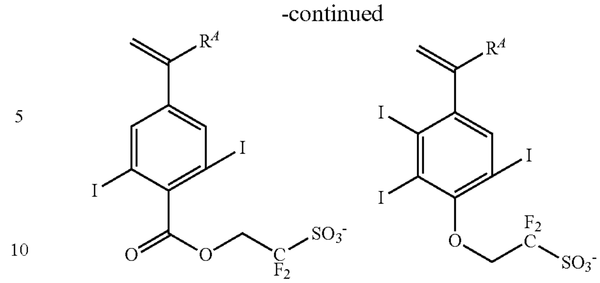
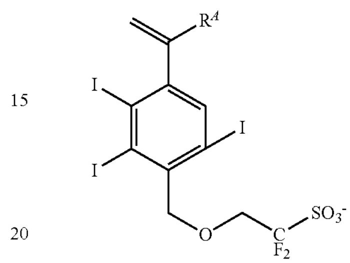
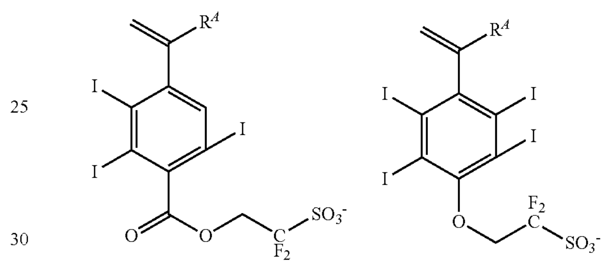
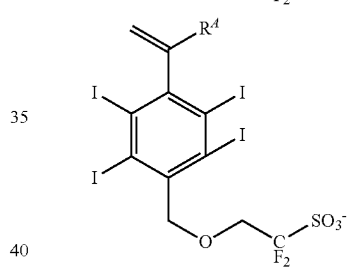
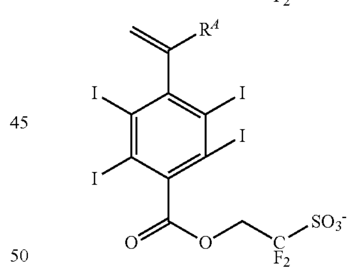
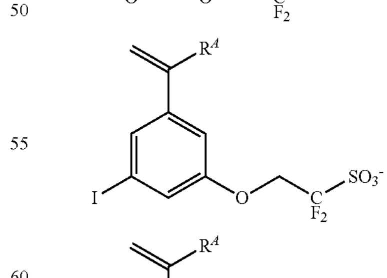
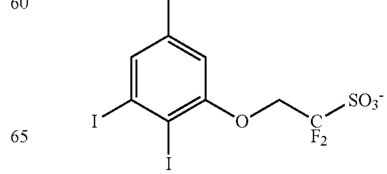

-continued
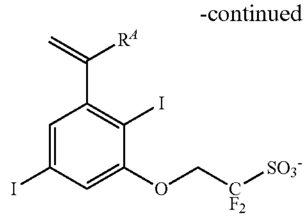
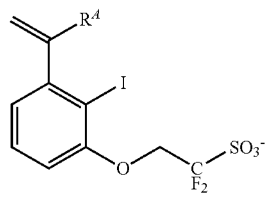
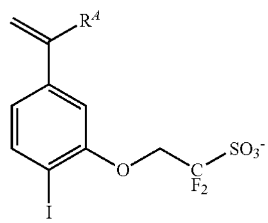
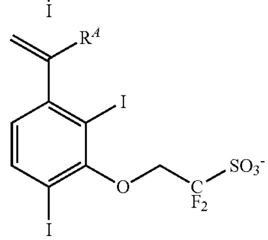
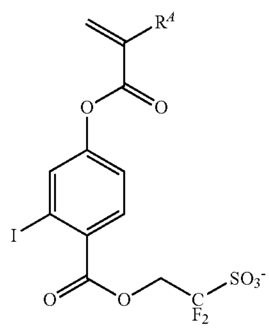
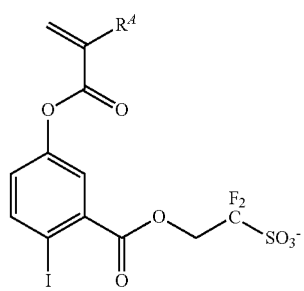
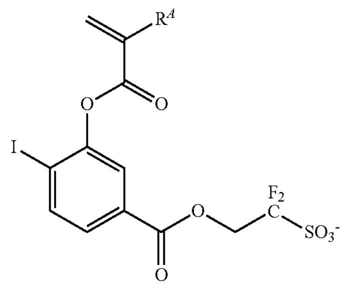
-continued
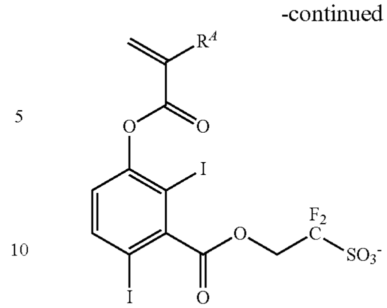
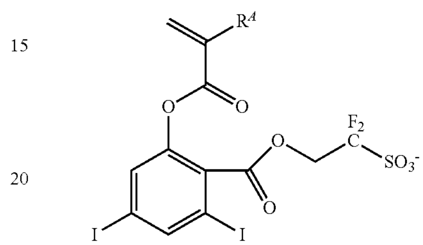
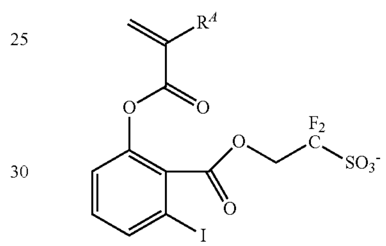
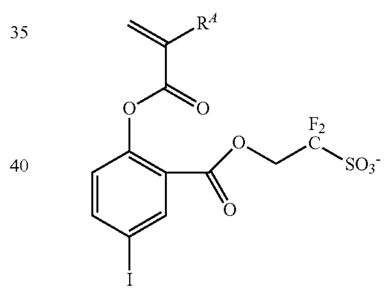
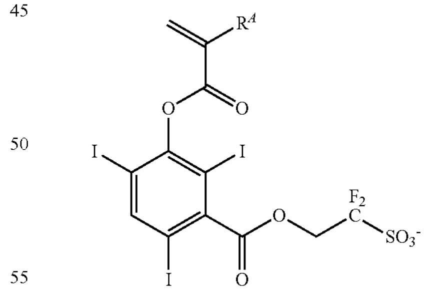
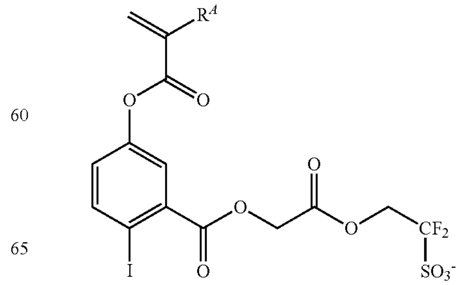

-continued
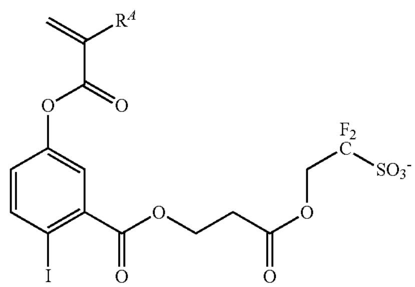
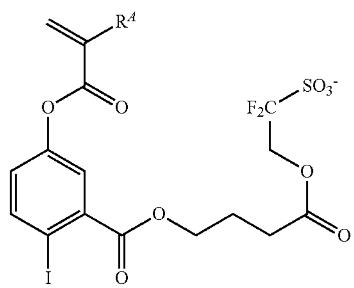
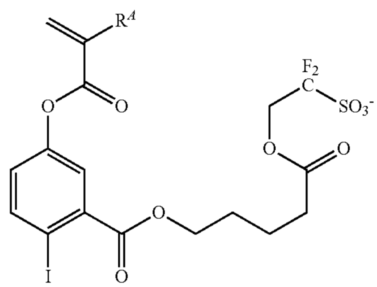
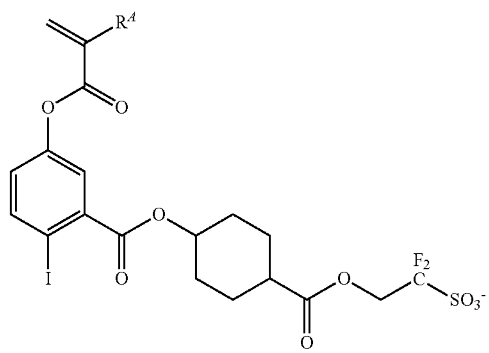
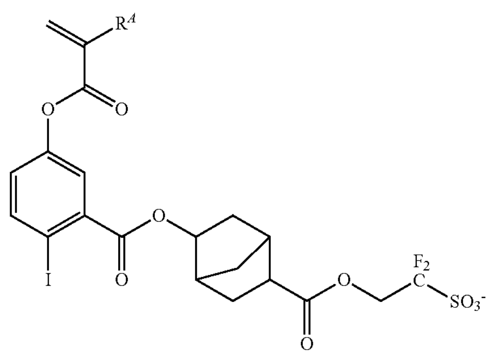
-continued
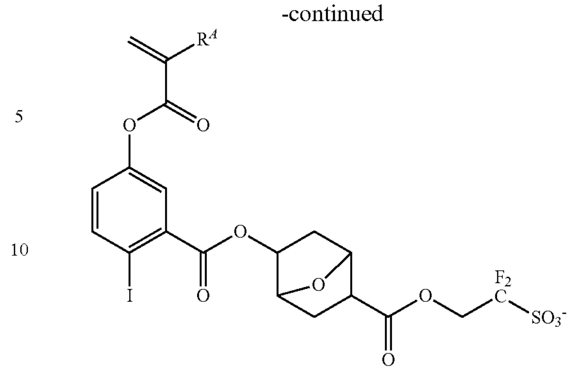
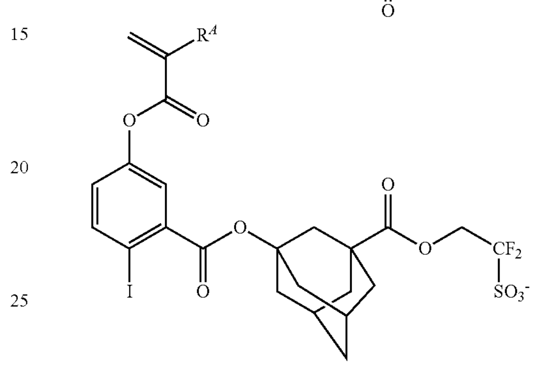
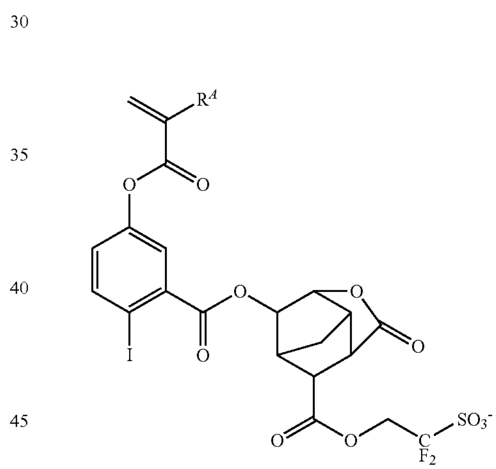
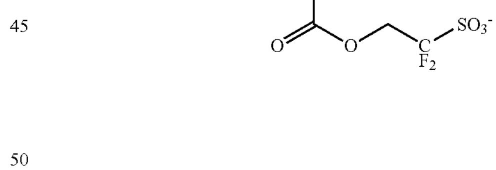
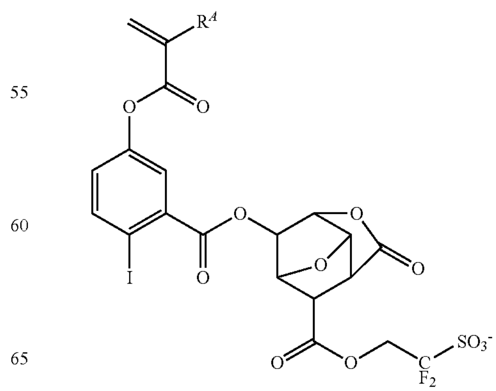

-continued
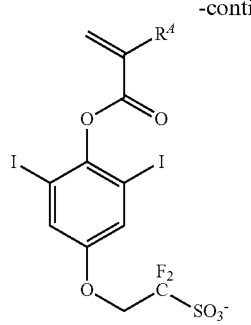
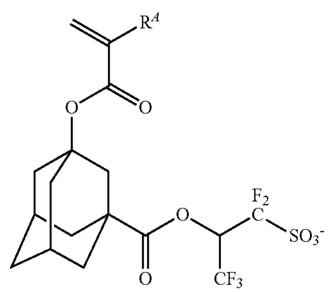
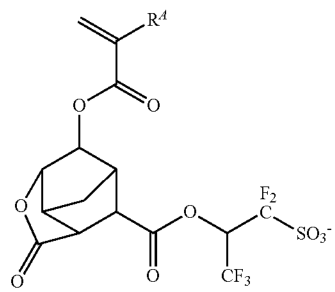
Examples of a monomer to give the repeating unit-f3 include those shown below, but are not limited thereto. Note that in the following formulae, $R^A$ is as defined above.
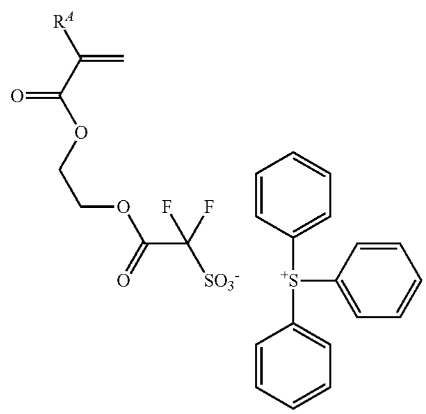
-continued
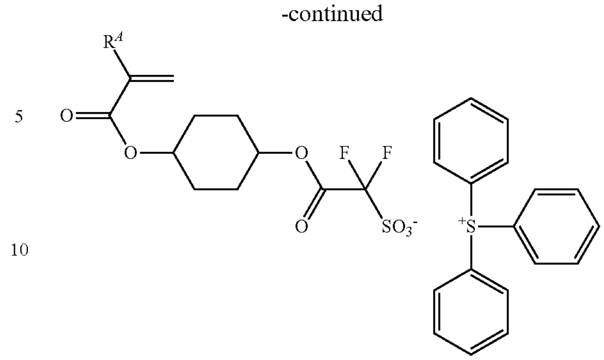
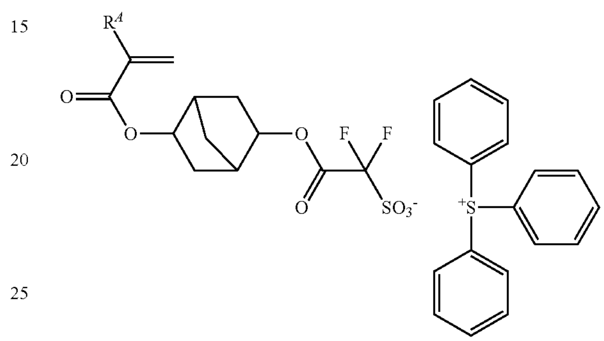
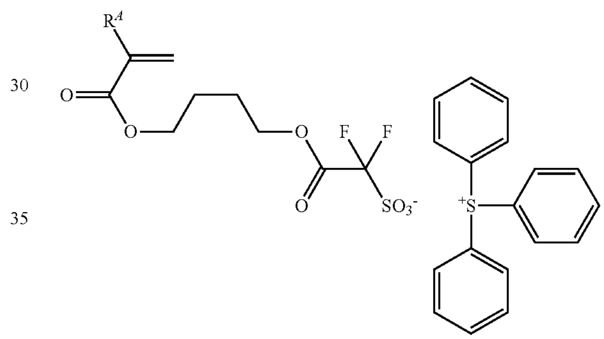
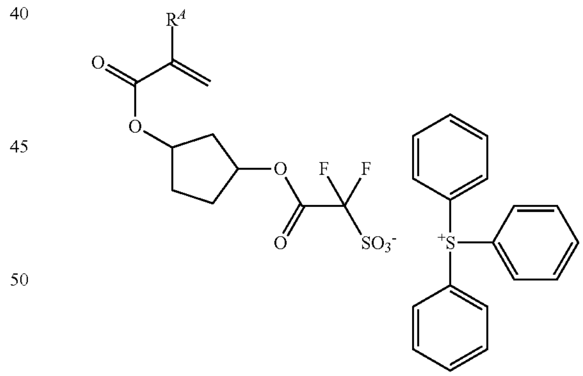
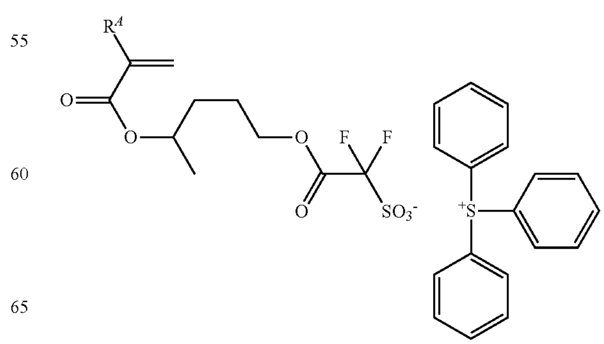

-continued
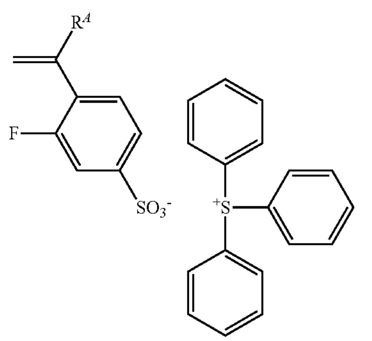
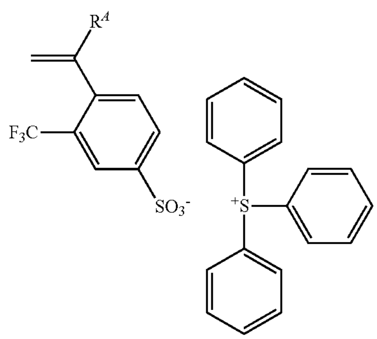
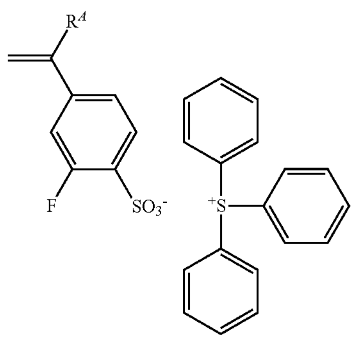
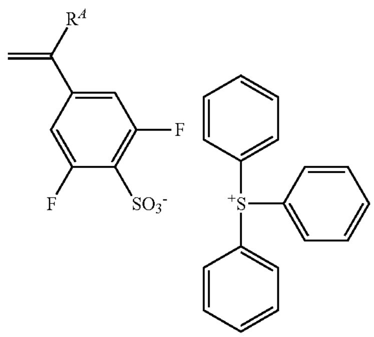
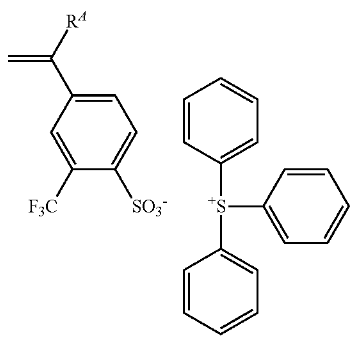
-continued
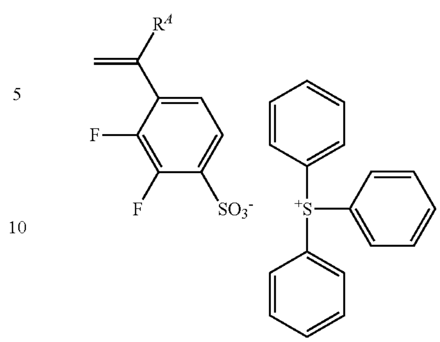
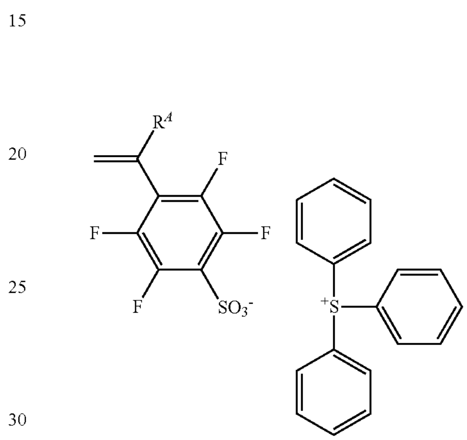
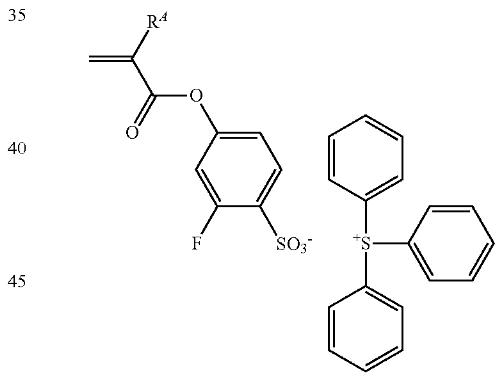
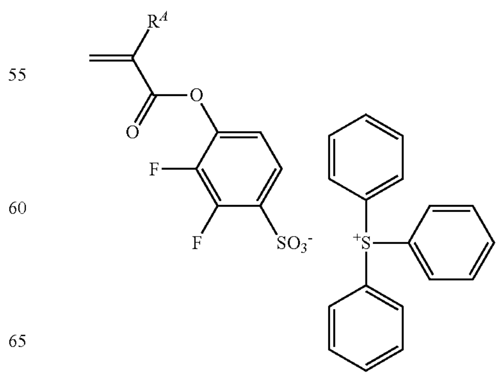

-continued

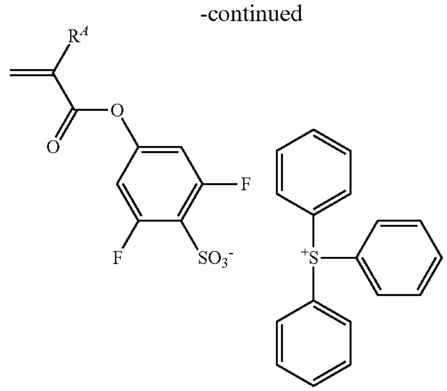

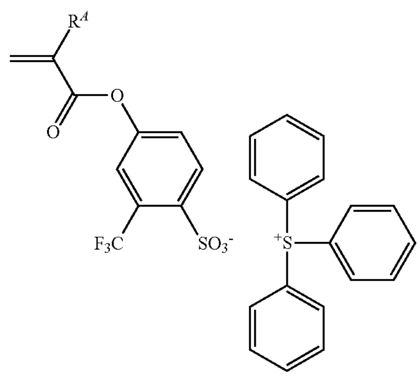

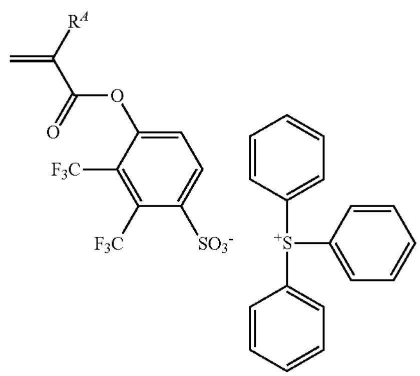

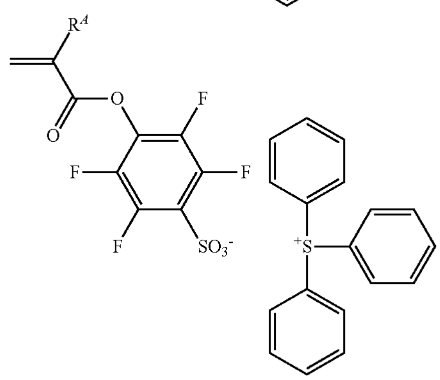

-continued

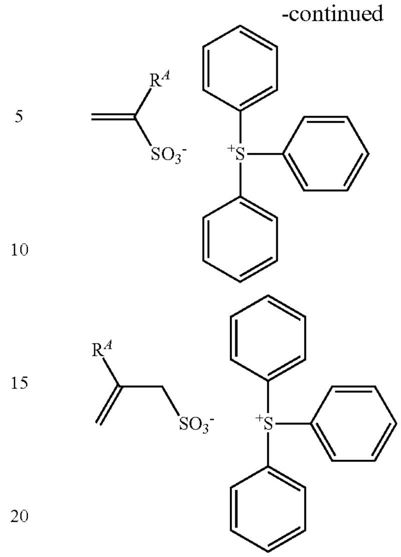

By making an acid generator bond to a polymer main chain, acid diffusion can be reduced. Thus, degradation of resolution due to blurring by acid diffusion can be prevented. In addition, LWR can be improved by the uniform dispersion of the acid generator.

In a base polymer for a positive resist material, a repeating unit-a1 or -a2 containing an acid-labile group is essential. In this case, the content ratios of the repeating units-a1, -a2, -b, -c, -d, -e, and -f are preferably $0 \le a1 < 1.0$, $0 \le a2 < 1.0$, $0 < a1+a2 < 1.0$, $0 \le b \le 0.9$, $0 \le c \le 0.9$, $0 \le d \le 0.8$, $0 \le e \le 0.8$, and $0 \le f \le 0.5$; more preferably $0 \le a1 \le 0.9$, $0 \le a2 \le 0.9$, $0.1 \le a1+a2 \le 0.9$, $0 \le b \le 0.8$, $0 \le c \le 0.8$, $0 \le d \le 0.7$, $0 \le e \le 0.7$, and $0 \le f \le 0.4$; further preferably $0 \le a1 \le 0.8$, $0 \le a2 \le 0.8$, $0.1 \le a1+a2 \le 0.8$, $0 \le b \le 0.75$, $0 \le c \le 0.75$, $0 \le d \le 0.6$, $0 \le e \le 0.6$, and $0 \le f \le 0.3$. Note that when the repeating unit-f is at least one selected from the repeating units-f1 to -f3, $f=f1+f2+f3$. In addition, $a1+a2+b+c+d+e+f=1.0$.

On the other hand, in a base polymer for a negative resist material, an acid-labile group is not necessarily needed. Examples of such a base polymer include a base polymer containing the repeating unit-b and further containing the repeating unit-c, -d, -e, and/or -f as necessary. The content ratios of these repeating units are preferably $0 < b \le 1.0$, $0 \le c \le 0.9$, $0 \le d \le 0.8$, $0 \le e \le 0.8$, and $0 \le f \le 0.5$; more preferably $0.2 \le b \le 1.0$, $0 \le c \le 0.8$, $0 \le d \le 0.7$, $0 \le e \le 0.7$, and $0 \le f \le 0.4$; further preferably $0.3 \le b \le 1.0$, $0 \le c \le 0.7$, $0 \le d \le 0.6$, $0 \le e \le 0.6$, and $0 \le f \le 0.3$. Note that when the repeating unit-f is at least one selected from the repeating units-f1 to -f3, $f=f1+f2+f3$. In addition, $b+c+d+e+f=1.0$.

The base polymer may be synthesized, for example, by subjecting the monomers to give the repeating units described above to heat polymerization in an organic solvent to which a radical polymerization initiator has been added.

Examples of the organic solvent used in the polymerization include toluene, benzene, tetrahydrofuran (THF), diethyl ether, dioxane, etc. Examples of the polymerization initiator include 2,2'-azobisisobutyronitrile (AIBN), 2,2'-azobis(2,4-dimethylvaleronitrile), dimethyl-2,2-azobis(2-methylpropionate), benzoyl peroxide, lauroyl peroxide, etc. The temperature during the polymerization is preferably 50 to 80° C. The reaction time is preferably 2 to 100 hours, more preferably 5 to 20 hours.

In the case where the monomer containing a hydroxy group is copolymerized, the process may include: substituting the hydroxy group with an acetal group susceptible to deprotection with acid, such as an ethoxyethoxy group, prior to the polymerization; and performing the deprotection with weak acid and water after the polymerization. Alternatively, the process may include: substituting the hydroxy group with an acetyl group, a formyl group, a pivaloyl group, or the like; and performing alkaline hydrolysis after the polymerization.

In a case where hydroxystyrene or hydroxyvinylnaphthalene is copolymerized, at first, acetoxystyrene or acetoxyvinylnaphthalene may be used in place of hydroxystyrene or hydroxyvinylnaphthalene; after the polymerization, the acetoxy group may be deprotected by the alkaline hydrolysis as described above to convert the acetoxystyrene or acetoxyvinyinaphthalene to hydroxystyrene or hydroxyvinylnaphthalene.

In the alkaline hydrolysis, a base such as ammonia water or triethylamine is usable. The reaction temperature is preferably −20 to 100° C., more preferably 0 to 60° C. The reaction time is preferably 0.2 to 100 hours, more preferably 0.5 to 20 hours.

The base polymer has a polystyrene-based weight-average molecular weight. (Mw) of preferably 1,000 to 500,000, more preferably 2,000 to 30,000, further preferably 3,000 to 10,000, determined by gel permeation chromatography (GPC) using THF as an eluent. When the Mw is 1,000 or more, the resist material has excellent heat resistance. When the Mw is 500,000 or less, alkali solubility is excellent, so that a footing phenomenon after pattern formation hardly occurs.

Further, when the base polymer has a narrow molecular weight distribution (Mw/Mn), there is no low-molecular-weight or high-molecular-weight polymer. Accordingly, foreign matters are not observed on the pattern after the exposure, and there is no risk of the pattern profile being degraded. The finer the pattern rule, the stronger the influences of Mw and Mw/Mn. Hence, in order to obtain a resist material suitably used for finer pattern dimension, the base polymer preferably has a narrow dispersity Mw/Mn of 1.0 to 2.0, particularly preferably 1.0 to 1.5.

The base polymer may contain two or more kinds of polymers that differ in composition ratio, Mw, and Mw/Mn.

[Other Components]

In addition to the above-described components, acid generators other than the sulfonium salt represented by the general formula (A-1) or the iodonium salt represented by the general formula (A-2) (hereinafter, referred to as other acid generators), an organic solvent, a surfactant, a dissolution inhibitor, a crosslinking agent, and so forth can be blended in appropriate combination depending on the purpose to formulate a positive resist material and a negative resist material. Thereby, in an exposed area of the base polymer in a positive resist material and in an unexposed area of the base polymer in a negative resist material, the dissolution rate to a developer is accelerated by the catalytic reaction, so that the positive resist material and negative resist material have extremely high sensitivity.

In this case, the resist film has high dissolution contrast and resolution, exposure latitude, excellent process adaptability, and favorable pattern profile after exposure. Particularly, the positive resist material and negative resist material are capable of suppressing acid diffusion, resulting in a small difference in profile between isolated and nested. Because of these advantages, the inventive resist material is highly practical and is a very effective resist material for VLSI. Particularly, when an acid catalytic reaction is employed in a chemically amplified positive resist material, the chemically amplified positive resist material can be provided with higher sensitivity. In addition, such a resist material has further improved properties, and is extremely useful.

Examples of the other acid generators include compounds that generate acids in response to actinic light or radiation (photo-acid generators). Components of the photo-acid generator can be any compound as long as the compound generates an acid upon high-energy beam irradiation. Preferably, the acid generator generates a sulfonic acid, imide acid, or methide acid. Suitable photo-acid generators are sulfonium salt, iodonium salt, sulfonyldiazomethane, N-sulfonyloxyimide, oxime-O-sulfonate type acid generators, etc. Specific examples of the acid generator are disclosed in paragraphs [0122] to [0142] of JP 2008-111103 A, JP 2018-5224 A, and JP 2018-25789 A. In the inventive resist material, the other acid generators are preferably contained in an amount of 0 to 200 parts by mass, preferably 0.1 to 100 parts by mass based on 100 parts by mass of the base polymer.

Examples of the organic solvent include ones disclosed in paragraphs [0144] and [0145] of JP 2008-111103 A: ketones such as cyclohexanone, cyclopentanone, and methyl-2-n-pentyl ketone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; mixed solvents thereof; etc. The inventive resist material preferably contains the organic solvent in an amount of 100 to 10,000 parts by mass, more preferably 200 to 8,000 parts by mass based on 100 parts by mass of the base polymer.

Examples of the surfactant include ones disclosed in paragraphs (0165) and (01661 of JP 2008-111303 A. Adding a surfactant can further enhance or control the coatability of the resist material. The surfactant content in the inventive resist material is preferably 0.0001 to 10 parts by mass based on 100 parts by mass of the base polymer.

When the inventive resist material is a positive resist material, blending a dissolution inhibitor can further increase the difference in dissolution rate between exposed and unexposed areas, and further enhance the resolution. Examples of the dissolution inhibitor include compounds: the compounds each have a molecular weight of preferably 100 to 1,000, more preferably 150 to 800; and which contains two or more phenolic hydroxy groups per molecule, and in which 0 to 100 mol % of all the hydrogen atoms of the phenolic hydroxy groups are substituted with acid-labile groups; or a compound which contains a carboxy group in a molecule, and in which 50 to 1.00 mol % of all the hydrogen atoms of such carboxy groups are substituted with acid-labile groups on average. Specific examples include compounds obtained by substituting acid-labile groups for hydrogen atoms of hydroxy groups or carboxy groups of bisphenol. A, trisphenol, phenolphthalein, cresol novolak, naphthalenecarboxylic acid, adamantanecarboxylic acid, cholic acid; etc. Examples of such compounds are disclosed in paragraphs [01551] to [0178] of JP 2008-122932 A.

When the inventive resist material is a positive resist material, the dissolution inhibitor is contained in an amount of preferably 0 to 50 parts by mass, more preferably 5 to 40 parts by mass based on 100 parts by mass of the base polymer.

Meanwhile, when the inventive resist material is a negative resist material, the dissolution rate of exposed areas can be decreased by adding a crosslinking agent, and thus, a negative pattern can be obtained. Examples of the crosslinking agent include epoxy compounds, melamine compounds, guanamine compounds, glycoluryl compounds, or urea compounds substituted with at least one group selected from a methylol group, an alkoxymethyl group, and an acyloxymethyl group, isocyanate compounds, azide compounds, compounds having a double bond such as an alkenyl ether group, etc. These compounds may be used as an additive, or introduced into a polymer side chain as a pendant group. In addition, compounds containing a hydroxy group can also be used as a crosslinking agent.

Examples of the epoxy compounds include tris(2,3-epoxypropyl) isocyanurate, trimethylolethane triglycidyl ether, trimethylolpropane triglycidyl ether, trimethylolethane triglycidyl ether, and the like.

Examples of the melamine compounds include hexamethylolmelamine, hexamethoxymethylmelamine, such compounds as hexamethylolmelamine having 1 to 6 methylol groups methoxymethylated, and mixtures thereof; and hexamethoxyethylmelamine, hexaacyloxymethylmelamine, such compounds as hexamethylolmelamine having 1 to 6 methylol groups acyloxymethylated, and mixtures thereof.

Examples of the guanamine compounds include tetramethylolguanamine, tetramethoxymethylguanamine, such compounds as tetramethylolguanamine having 1 to 4 methylol groups methoxymethylated, and mixtures thereof; and tetramethoxyethylguanamine, tetraacyloxyguanamine, such compounds as tetrarmethylolguanamine having 1 to 4 methylol groups acyloxymethylated, and mixtures thereof.

Examples of the glycoluril compounds include tetramethylolglycoluril, tetramethoxyglycoluril, tetramethoxymethylglycoluril, such compounds as tetramethylolglycoluril having 1 to 4 methylol groups methoxymethylated, and mixtures thereof; and such compounds as tetramethylolglycoluril having 1 to 4 methylol groups acyloxymethylated, and mixtures thereof.

Examples of the urea compounds include tetramethylol urea, tetramethoxymethyl urea, tetramethoxyethyl urea, such compounds as tetramethylol urea having 1 to 4 methylol groups methoxymethylated, mixtures thereof, and the like.

Examples of the isocyanate compounds include tolylene diisocyanate, diphenylmethane diisocyanate, hexamethylene diisocyanate, cyclohexane diisocyanate, and the like.

Examples of the azide compounds include 1,1'-biphenyl-4,4'-bisazide, 4,4"-methylidene bisazide, 4,4'-oxybisazide, and the like.

Examples of the compounds containing an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and the like.

When the inventive resist material is a negative resist material, the crosslinking agent is preferably contained in an amount of 0.1 to 50 parts by mass, more preferably 1 to 40 parts by mass based on 100 parts by mass of the base polymer.

The inventive resist material may be blended with a quencher. Examples of the quencher include conventional, basic compounds. Examples of the conventional basic compounds include primary, secondary, and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, etc. Particularly preferable are primary, secondary, and tertiary amine compounds disclosed in paragraphs [0146] to [0164] of JP 2008-111103 A; especially, amine compounds having a hydroxy group, an ether bond, an ester bond, a lactone ring, a cyano group, or a sulfonic acid ester group; compounds having a carbamate group disclosed in JP 3790649 B; etc. Adding such a basic compound can, for example, further suppress the diffusion rate of the acid in the resist film and correct the shape.

Other examples of the quencher include onium salts such as sulfonium salts, iodonium salts, and ammonium salts of carboxylic acids and sulfonic acids which are not, fluorinated at α position as disclosed in JP 2008-158339 A. While α-fluorinated sulfonic acid, imide acid, or methide acid is necessary to deprotect the acid-labile group of carboxylic acid ester, a carboxylic acid, or sulfonic acid not fluorinated at α position is re-leased by salt exchange with the onium salt not fluorinated at α position. Such carboxylic acid and sulfonic acid not fluorinated at α position hardly induce deprotection reaction, and thus function as quenchers.

Examples of such a quencher include compounds represented by the following general formula (B) (onium salts of sulfonic acids which are not fluorinated at α position) and compounds represented by the following general formula (C) (onium salts of carboxylic acids).

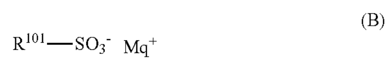

$$R^{101}—SO_3^-\ Mq^+ \quad (B)$$

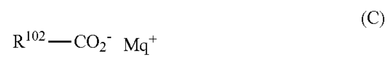

$$R^{102}—CO_2^-\ Mq^+ \quad (C)$$

In the general formula (B), $R^{101}$ represents a hydrogen atom or a hydrocarbyl group having 1 to 4l carbon atoms and optionally containing a heteroatom, but excludes groups in which a hydrogen atom bonded to the carbon atom at α position of the sulfo group is substituted with a fluorine atom or a fluoroalkyl group.

The hydrocarbyl group may be saturated or unsaturated, and may be linear, branched, or cyclic. Specific examples thereof include: alkyl groups such as a methyl group, an ethyl group, a propyl group, an isopropyl group, an n-butyl group, a sec-butyl group, a tert-butyl group, a tert-pentyl group, an n-pentyl group, an n-hexyl group, an n-octyl group, a 2-ethylhexyl group, an n-nonyl group, and an n-decyl group; cyclic saturated hydrocarbyl groups such as a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group, a norbornyl group, a tricyclo[5.2.1.0$^{2,6}$]decanyl group, an adamantyl group, and an adamantylmethyl group; alkenyl groups such as a vinyl group, an allyl group, a propenyl group, a butenyl group, and a hexenyl group; cyclic unsaturated aliphatic hydrocarbyl groups such as a cyclohexenyl group; aryl groups such as a phenyl group, a naphthyl group, alkylphenyl groups (such as a 2-methylphenyl group, a 3-methylphenyl group, a 4-methylphenyl group, a 4-ethylphenyl group, a 4-tert-butylphenyl group, and a 4 n-butylphenyl group), dialkylphenyl groups (such as a 2,4-dimethylphenyl group and a 2,4,6-triisopropylphenyl group), alkylnaphthyl groups (such as a methylnaphthyl group and an ethylnaphthyl group), and dialkylnaphthyl groups (such as a dimethylnaphthyl group and a diethylnaphthyl group); heteroaryl groups such as a thienyl group; aralkyl groups such as a benzyl group, a 1-phenylethy group, and a 2-phenylethyl group; etc.

Moreover, these groups may have some hydrogen atoms thereof substituted with a group containing a heteroatom such as an oxygen atom, a sulfur atom, a nitrogen atom, or a halogen atom, while these groups may have some carbon atoms thereof substituted with a group containing a heteroatom such as an oxygen atom, a sulfur atom, or a nitrogen atom. Thus, the resulting hydrocarbyl group may contain a hydroxy group, a cyano group, a carbonyl group, an ether bond, an ester bond, a sulfonic acid ester group, a carbonate bond, a lactone ring, a sultone ring, carboxylic anhydride, a haloalkyl group, etc. Examples of the hydrocarbyl group containing a heteroatom include: alkoxyphenyl groups such as a 4-hydroxyphenyl group, a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkoxynaphthyl groups such as a methoxynaphthyl group, an ethoxynaphthyl group, an n-propoxynaphthyl group, and an n-butoxynaphthyl group; dialkoxynaphthyl groups such as a dimethoxynaphthyl group and a diethoxynaphthyl group; aryloxoalkyl groups such as 2-aryl-2-oxoethyl groups including a 2-phenyl-2-oxoethyl group, a 2-(1-naphthyl)-2-oxoethyl group, and a 2-(2-naphthyl)-2-oxoethyl group; etc.

In the general formula (C), $R^{102}$ represents a hydrocarbyl group having 1 to 40 carbon atoms and optionally containing a heteroatom. Examples of the hydrocarbyl group represented by $R^{102}$ include those exemplified as the hydrocarbyl group represented by $R^{101}$. Other specific examples thereof include fluorine-containing alkyl groups such as a trifluoromethyl group, a trifluoroethyl group, a 2,2,2-trifluoromethyl-1-hydroxyethyl group, and a 2,2,2-trifluoro-1-(trifluoromethyl)-1-hydroxyethyl group; fluorine-containing aryl groups such as a pentafluorophenyl group and a 4-trifluoromethylphenyl group; etc.

In the general formulae (B) and (C), $Mq^+$ represents an onium cation. As the onium cation, a sulfonium cation, an iodonium cation, or an ammonium cation is preferable, and a sulfonium cation or an iodonium cation is more preferable. Examples of the sulfonium cation or iodonium cation respectively include those given as examples of the cation of the sulfonium salt represented by the general formula (A-1) and those given as examples of the cation of the iodonium salt represented by the general formula (A-2).

Other examples of the quencher further include a polymeric quencher disclosed in JP 2008-239918 A. This quencher is oriented on the resist film surface after coating, and enhances the rectangularity of the resist film after patterning. The polymeric quencher also has effects of preventing rounding of pattern top and film thickness loss of pattern when a top coat for immersion exposure is applied.

In the inventive resist material, the quencher is preferably contained in an amount of 0 to 5 parts by mass, more preferably 0 to 4 parts by mass based on 100 parts by mass of the base polymer.

The inventive resist material may be blended with a water-repellency enhancer for enhancing the water repellency on the resist surface after spin coating. The water-repellency enhancer can be employed in immersion lithography with no top coat.

The water-repellency enhancer is preferably a polymer compound containing a fluorinated alkyl group, a polymer compound containing a 1,1,1,3,3,3-hexafluoro-2-propanol residue with a particular structure, etc., preferably ones exemplified in JP 2007-297590 A, JP 2008-111103 A, etc. The water-repellency enhancer needs to be dissolved in an alkali developer or an organic solvent developer. The water-repellency enhancer having a particular 1,1,1,3,3,3-hexafluoro-2-propanol residue mentioned above has favorable solubility to developers. A polymer compound containing a repeating unit with an amino group or amine salt as a water-repellency enhancer exhibits high effects of preventing acid evaporation during PEB and opening failure of a hole pattern after development.

In the inventive resist material, the water-repellency enhancer is preferably contained in an amount of 0 to 20 parts by mass, more preferably 0.5 to 10 parts by mass based on 100 parts by mass of the base polymer. One kind of the water-repellency enhancer may be used, or two or more kinds thereof may be used in combination.

The inventive resist material can also be blended with an acetylene alcohol. Examples of the acetylene alcohol include ones disclosed in paragraphs (01791 to [0182] of JP 2008-122932 A. The inventive resist material contains the acetylene alcohol in an amount of preferably 0 to 5 parts by mass based on 100 parts by mass of the base polymer.

[Positive Resist Material and Negative Resist Material]

The inventive resist material is a chemically amplified positive resist material when an acid-labile group is contained, and is a chemically amplified negative resist material when an acid-labile group is not contained.

[Patterning Process]

When the inventive resist material is used for manufacturing various integrated circuits, known lithography techniques are applicable.

Specifically, it is possible to employ a patterning process including the steps of:

(1) forming a resist film on a substrate by using the above-described resist material;

(2) exposing the resist film to a high-energy beam; and (3) developing the exposed resist film by using a developer.

For example, the inventive resist material is applied onto a substrate (such as Si, $SiO_2$, SiN, SiON, TiN, WSi, BSPSG, SOG, organic antireflective film) for manufacturing an integrated circuit or a substrate (such as Cr, CrO, CrON, $MoSi_2$, $SiO_2$) for manufacturing a mask circuit by an appropriate coating process such as spin coating, roll coating, flow coating, dip coating, spray coating, or doctor coating so that the coating film can have a thickness of 0.01 to 2 μm. The resultant is prebaked on a hot plate preferably at 60 to 150° C. for 10 seconds to 30 minutes, more preferably at 80 to 120° C. for 30 seconds to 20 minutes. In this manner, a resist film is formed.

After the step (1) and before the step (2), (1') an entire surface of the resist film can also be exposed to light having a wavelength at which the sulfonium salt or iodonium salt of a sulfonic acid bonded to a maleimide group does not decompose. In this way, the maleimide group undergoes coupling or polymerization, so that the molecular weight of the acid generator increases. Thus, the resist material exhibits properties of lower acid diffusion. In this event, the cation moiety of the sulfonium salt or iodonium salt shown in the general formula (A-1) or (A-2) preferably does not decompose. Wavelengths at which the sulfonium salt cation or iodonium salt cation does not decompose are of light having a wavelength longer than 300 nm, more preferably an i-line (365 nm), h-line (405 nm), or g-line (436 nm) of a mercury lamp having a wavelength longer than 350 nm or light irradiated from xenon lamps or LEDs in which wavelengths of 300 nm or shorter have been eliminated. The irradiation energy is within the range of 1 $mJ/cm^2$ to 1 $J/cm^2$.

Then, the resist film is exposed using a high-energy beam. Examples of the high-energy beam include ultraviolet ray, deep ultraviolet ray, EB, extreme ultraviolet ray (EUV) at a wavelength of 3 to 15 nm, X-ray, soft X-ray, excimer laser beam, γ-ray, synchrotron radiation, etc. When ultraviolet ray, deep ultraviolet ray, EUV, X-ray, soft X-ray, excimer laser beam, γ-ray, synchrotron radiation, or the like is employed as the high-energy beam, the irradiation is performed using a mask for forming a target pattern at an exposure dose of preferably about 1 to 200 $mJ/cm^2$, more preferably about 10 to 100 $mJ/cm^2$. When EB is employed as the high-energy beam, the exposure dose is preferably about 0.1 to 300 $\mu C/cm^2$, more preferably about 0.5 to 200 $\mu C/cm^2$, and the writing is performed directly or using a mask for forming a target pattern. Note that the inventive resist material is particularly suitable for fine patterning with a KrF excimer laser beam, an ArF excimer laser beam, an EB, an EUV, X-ray, soft X-ray, γ-ray, or synchrotron radiation among the high-energy beams, and is especially suitable for fine patterning with a KrF excimer laser beam, an ArF excimer laser beam, an EB, or an EUV having a wavelength of 3 to 15 nm.

The exposure may or may not be followed by PEB on a hot plate or in an oven preferably at 30 to 150° C. for 10 seconds to 30 minutes, more preferably at 50 to 120° C. for 30 seconds to 20 minutes.

In the case of a positive resist material, after the exposure or PEB, development is performed using a developer of 0.1 to 10 mass %, preferably 2 to 5 mass % aqueous alkaline solution such as tetramethylammonium hydroxide (TMAH), tetraethylammonium hydroxide (TEAH), tetrapropylammonium hydroxide (TPAH), or tetrabutylammonium hydroxide (TBAH) for 3 seconds to 3 minutes, preferably 5 seconds to 2 minutes by a conventional technique, such as dip, puddle, or spray method. Thereby, the portion irradiated with the light is dissolved by the developer, while the unexposed portion remains undissolved. In this way, the target positive pattern is formed on the substrate. A negative resist material is the reverse of the positive resist material. That is, the portion irradiated with the light is made insoluble to the developer, while the unexposed portion dissolves.

The positive resist material containing a base polymer that contains an acid-labile group can also be used to obtain a negative pattern by organic solvent development. Examples of the developer used in this event, include 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, phenylmethyl acetate, benzyl formate, phenylethyl formate, methyl 3-phenylpropionate, benzyl propionate, phenylethyl acetate, 2-phenylethyl acetate, etc. One of these organic solvents can be used, or two or more thereof can be used in mixture.

When the development is completed, rinsing can be performed. The rinsing liquid is preferably a solvent that is miscible with the developer but does not dissolve the resist, film. As such a solvent, it is preferable to use an alcohol having 3 to 10 carbon atoms, an ether compound having 8 to 12 carbon atoms, and an alkane, alkene, alkyne and aromatic solvent, each having 6 to 12 carbon atoms.

Specific examples of the alcohol having 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclo pentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentano, 4-methyl-2-pentanol, 4-methyl-3-pentanol, cyclohexanol, 1-octanol, etc.

Examples of the ether compound having 8 to 12 carbon atoms include di-n-butyl ether, diisobutyl ether, di-sec-butyl ether, di-n-pentyl ether, diisopentyl ether, di-sec-pentyl ether, di-tert-pentyl ether, di-n-hexyl ether, etc.

Examples of the alkane having 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, cyclononane, etc. Examples of the alkene having 6 to 12 carbon atoms include hexene, heptene, octene, cyclohexene, methylcyclohexene, dimethylcyclohexene, cycloheptene, cyclooctene, etc. Examples of the alkyne having 6 to 12 carbon atoms include hexyne, heptyne, octyne, etc.

Examples of the aromatic solvent include toluene, xylene, ethylbenzene, isopropylbenzene, tert-butylbenzene, mesitylene, etc.

The rinsing can reduce resist pattern collapse and defect formation. Meanwhile, the rinsing is not necessarily essential, and the amount of the solvent used can be reduced by not performing the rinsing.

After the development, a hole pattern or: trench pattern can be shrunk by thermal flow, RELACS process, or DSA process. A shrink agent is applied onto the hole pattern, and the shrink agent undergoes crosslinking on the resist surface by diffusion of the acid catalyst from the resist layer during baking, so that the shrink agent is attached to sidewalls of: the hole pattern. The baking temperature is preferably 70 to 180° C., more preferably 80 to 170° C. The baking time is preferably 0 to 300 seconds. The extra shrink agent is removed, and thus the hole pattern is shrunk.

EXAMPLE

Hereinafter, the present invention will be described specifically with reference to Synthesis Examples, Examples, and Comparative Examples. However, the present invention is not limited to the following Examples, The structures of the acid generators PAG 1 to 17, each being a sulfonium salt or an iodonium salt, used in resist materials are shown below. PAG 1 to 17 were each synthesized by ion exchange between an ammonium salt of a fluorinated sulfonic acid to give the following anion and a sulfonium chloride or iodonium chloride to give PAG1
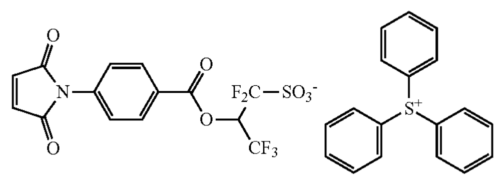
PAG2
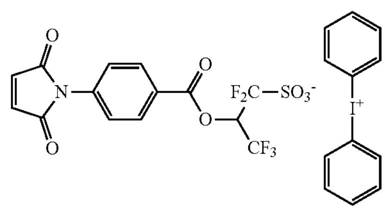
PAG3
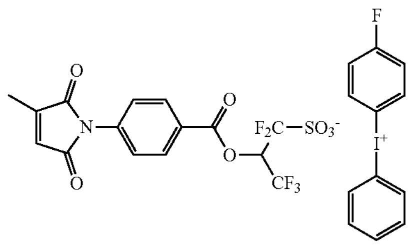
PAG4
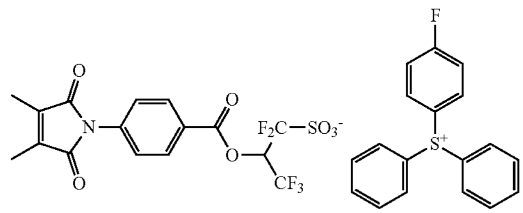
PAG5
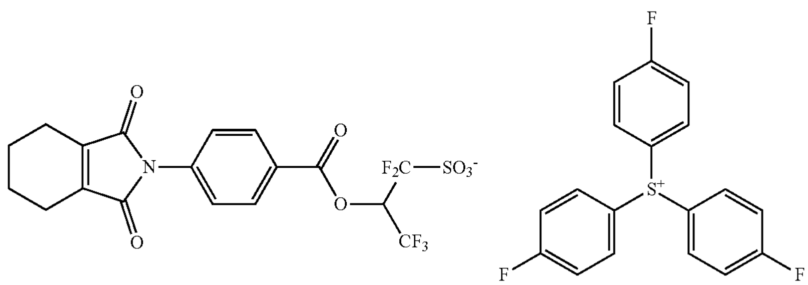
PAG6
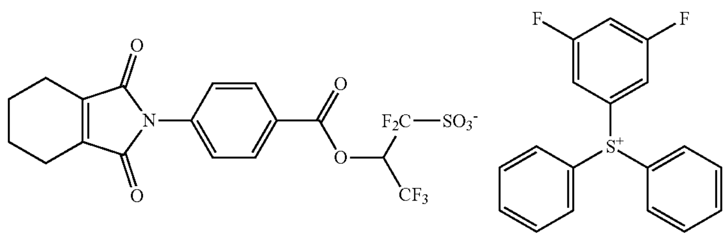
PAG7
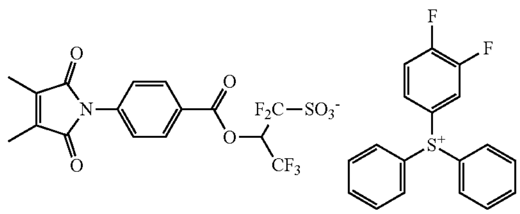
PAG8
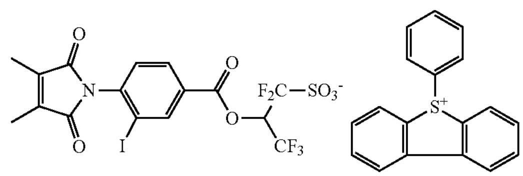
PAG9
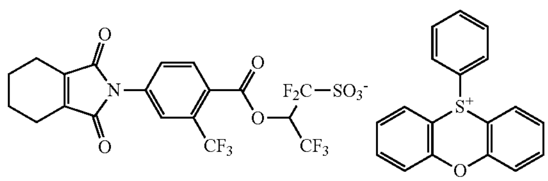
PAG10
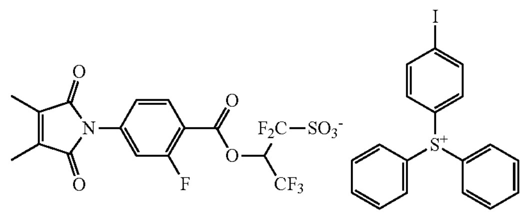

-continued
PAG11
PAG12
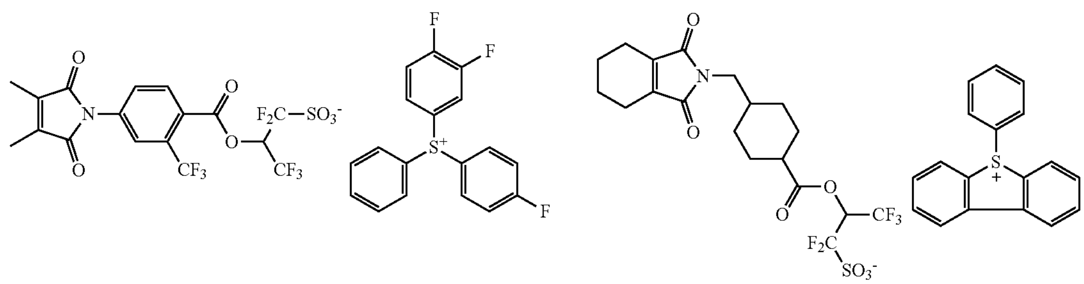
PAG13
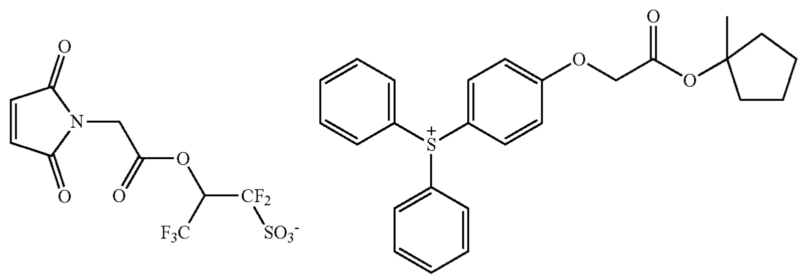
PAG14
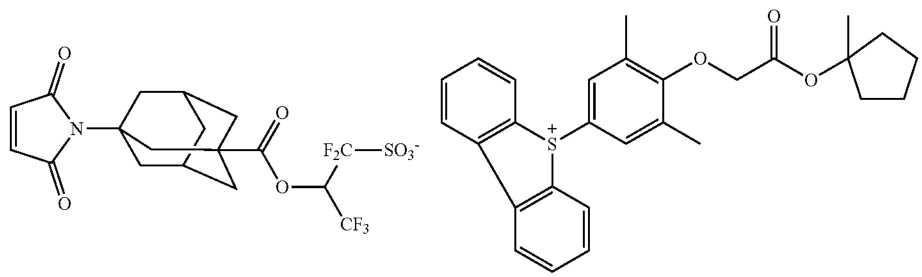
PAG15
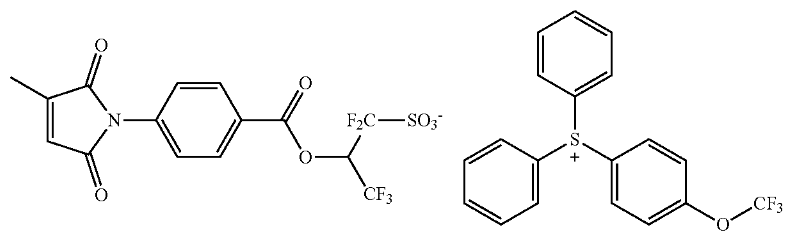
PAG16
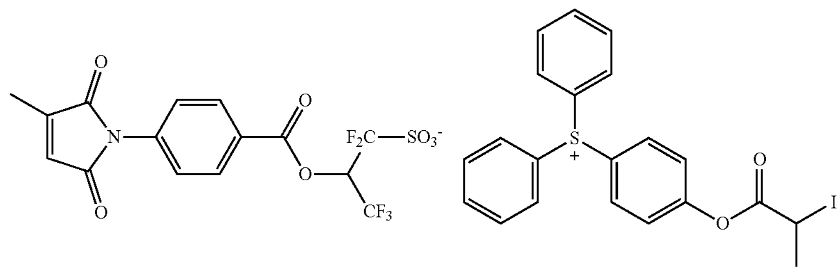

-continued

PAG17

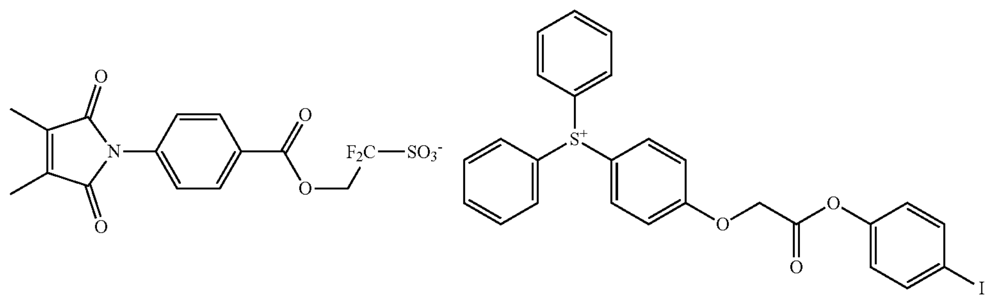

[Synthesis Example] Synthesis of Base Polymers (Polymers 1 to 4)

The monomers were combined to perform a copolymerization reaction in a solvent THF. A crystal was precipitated in methanol, furthermore, repeatedly washed with hexane, then isolated and dried to obtain a base polymer (Polymers 1 to 4) of the composition shown below. The composition of the obtained base polymer was identified by $^1$H-NMR, and the Mw and Mw/Mn were identified by GPC (eluent: THF, standard: polystyrene).

Polymer 1

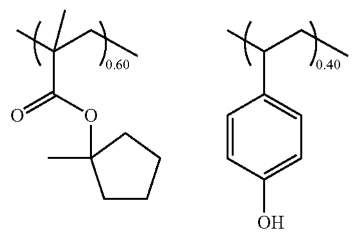

Mw = 5,200
Mw/Mn = 1.45

Polymer 2

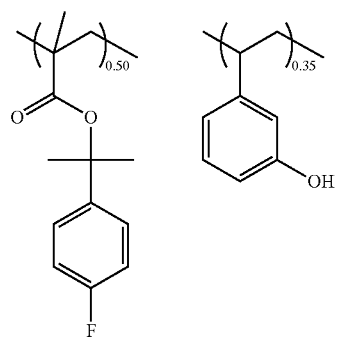

-continued

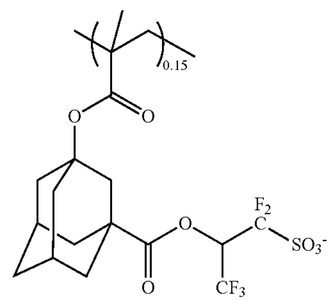

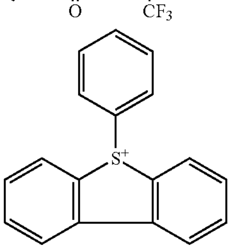

Mw = 8,800
Mw/Mn = 1.55

Polymer 3

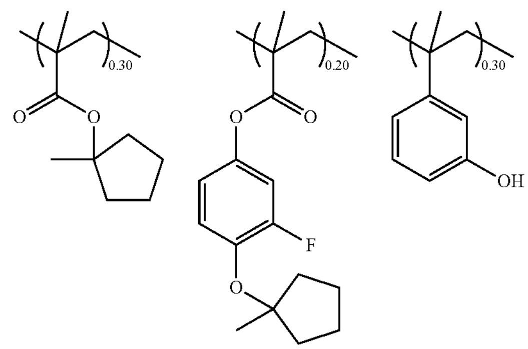

-continued

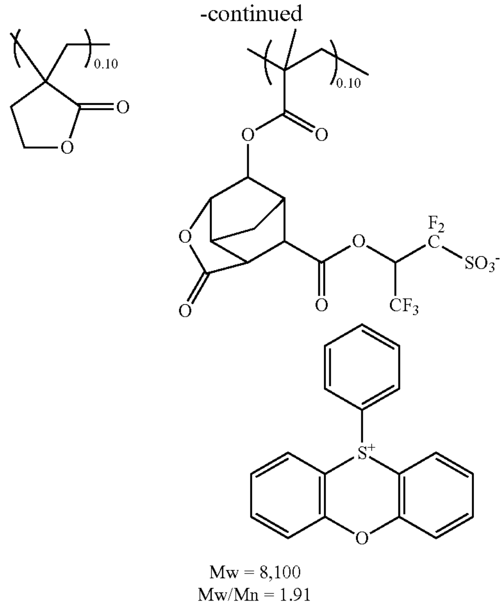

Mw = 8,100
Mw/Mn = 1.91

Polymer 4

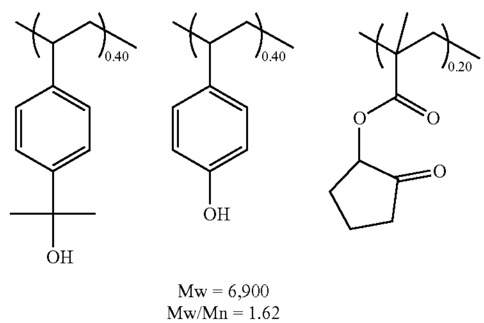

Mw = 6,900
Mw/Mn = 1.62

Examples 1 to 20, Comparative Examples 1 to 3

Preparation of Resist Materials and Evaluation Thereof (1) Preparation of Resist Material A solution was obtained by dissolving the components in accordance, with the composition shown sin Table 1 in a solvent in which 100 ppm of Polyfox PF-636 manufactured by Omnova Solutions, Inc. was dissolved as a surfactant. The solution was filtered through a filter having a pore size of 0.2 μm. Thus, resist materials were prepared. In Examples 1 to 19 and Comparative Examples 1 and 2, positive resist materials were prepared, and in Example 20 and Comparative Example 3, negative resist materials were prepared.

The components in Table 1 are as follows.

Organic Solvents:

PGMEA (propylene glycal monomethyl ether acetate)

EL (ethyl lactate)

DAA (diacetone alcohol)

Comparative Acid Generators: Comparative PAG1 and PAG2

Comparative PAG1

Comparative PAG2

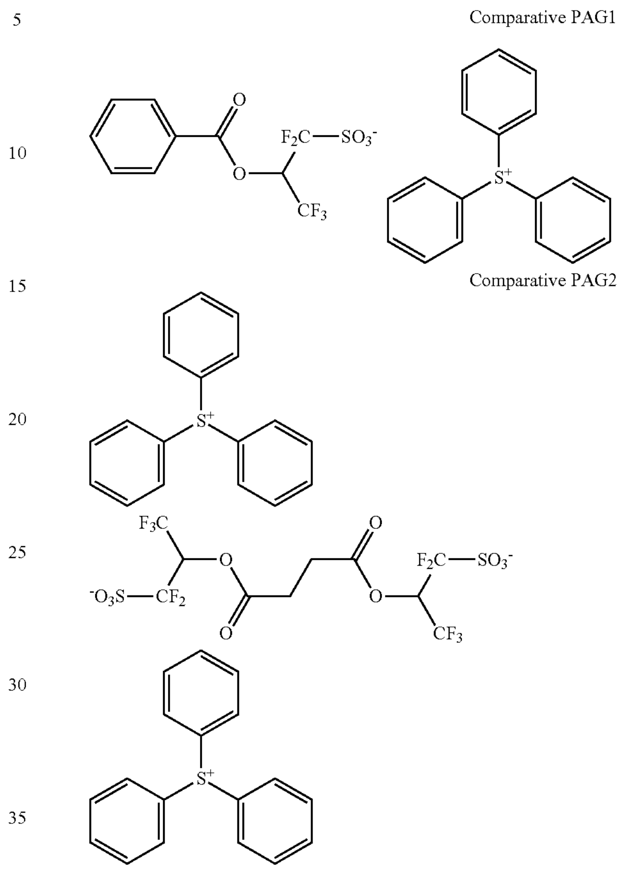

Quenchers: Quencher 1 and Quencher 2

Quencher 1

Quencher 2

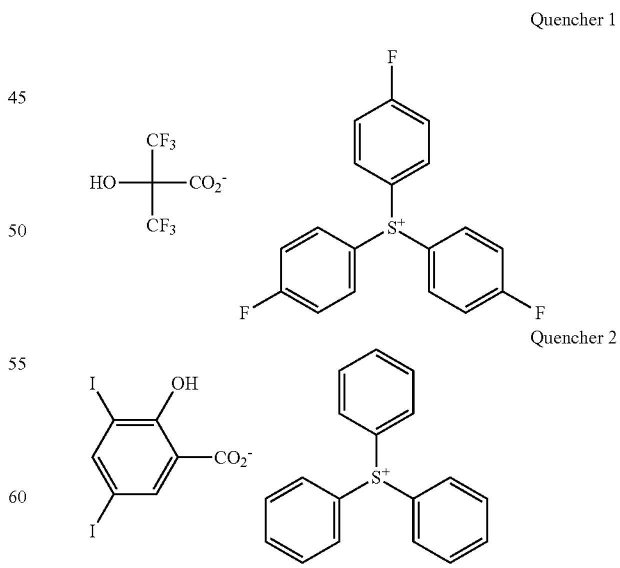

(2) EUV Exposure Evaluation

A silicon substrate with a silicon-containing spin-on hard mask SHB-A940 (silicon content: 43 mass %) manufactured by Shin-Etsu Chemical Co., Ltd. formed to have a film thickness of 20 nm was spin-coated with each resist material shown in Table 1. The resultant was prebaked using a hot plate at 105° C. for 60 seconds to prepare a resist film having a film thickness of 50 nm. The resist film was exposed using an EUV scanner NXE3400 (NA: 0.33, a: 0.9/0.6, quadrupole illumination, with a mask having a hole pattern with a pitch of 40 nm and +20% bias (on-wafer size)) manufactured by ASML, followed by PEB on the hot plate at a temperature shown in Table 1 for 60 seconds, and development with a 2.38 mass % aqueous TMAH solution for 30 seconds to obtain a hole pattern with a dimension of 20 nm in Examples 1 to 19 and Comparative Examples 1 and 2, and a dot pattern with a dimension of 20 nm in Example 20 and Comparative Example 3. Using a measurement SEM (CG6300) manufactured by Hitachi High-Technologies Corporation, an exposure dose at which the holes or dots were formed was determined as sensitivity. In addition, the dimensions of 50 holes or dots were measured, and dimensional variation (CDU, 3a) was determined. The results are shown in Table 1.

TABLE 1

| | Polymer (parts by mass) | Acid generator (parts by mass) | Quencher (parts by mass) | Organic solvent (parts by mass) | PES (° C.) | Sensitivity (mJ/cm$^2$) | CD0 (nm) |
|---|---|---|---|---|---|---|---|
| Example 1 | Polymer 1 (100) | PAG1 (20.7) | Quencher 1 (5.28) | PGMEA(500) EL(2,000) | 80 | 33 | 3.0 |
| Example 2 | Polymer 1 (100) | PAG2 (21.3) | Quencher 1 (5.28) | PGMEA(500) EL(2,000) | 80 | 29 | 3.1 |
| Example 3 | Polymer 1 (100) | PAG3 (22.2) | Quencher 1 (5.28) | PGMEA(500) EL(2,000) | 80 | 28 | 3.0 |
| Example 4 | Polymer 1 (100) | PAG4 (22.1) | Quencher 1 (5.28) | PGMEA(2,000) DAA(500) | 80 | 35 | 3.4 |
| Example 5 | Polymer 1 (100) | PAG5 (24.0) | Quencher 1 (5.28) | PGMEA(2,000) DAA(500) | 80 | 35 | 2.7 |
| Example 6 | Polymer 1 (100) | PAG6 (23.4) | Quencher 1 (5.28) | PGMEA(2,000) DAA(500) | 80 | 36 | 2.9 |
| Example 7 | Polymer 1 (100) | PAG7 (25.0) | Quencher 1 (5.28) | PGMEA(2,000) DAA(500) | 80 | 35 | 2.9 |
| Example 8 | Polymer 1 (100) | PAG8 (25.3) | Quencher 1 (5.28) | PGMEA(2,000) DAA(500) | 80 | 36 | 3.0 |
| Example 9 | Polymer 1 (100) | PAG9 (24.8) | Quencher 1 (5.28) | PGMEA(2,000) DAA(500) | 80 | 37 | 3.2 |
| Example 10 | Polymer 1 (100) | PAG10 (25.9) | Quencher 1 (5.28) | PGMEA(2,000) DAA(500) | 80 | 33 | 2.9 |
| Example 11 | Polymer 1 (100) | PAG11 (25.2) | Quencher 1 (5.28) | PGMEA(2,000) DAA(500) | 80 | 33 | 2.7 |
| Example 12 | Polymer 1 (100) | PAG12 (22.9) | Quencher 1 (5.28) | PGMEA(2,000) DAA(500) | 80 | 31 | 3.0 |
| Example 13 | Polymer 1 (100) | PAG13 (23.6) | Quencher 1 (5.28) | PGMEA(2,000) DAA(500) | 80 | 34 | 3.2 |
| Example 14 | Polymer 1 (100) | PAG14 (27.9) | Quencher 1 (5.28) | PGMEA(2,000) DAA(500) | 80 | 36 | 3.0 |
| Example 15 | Polymer 1 (100) | PAG15 (23.7) | Quencher 1 (6.52) | PGMEA(2,000) DAA(500) | 80 | 32 | 2.7 |
| Example 16 | Polymer 1 (100) | PAG16 (27.1) | Quencher 1 (5.28) | PGMEA(2,000) DAA(500) | 80 | 35 | 2.9 |
| Example 17 | Polymer 1 (100) | PAG17 (27.8) | Quencher 1 (5.28) | PGMEA(2,000) DAA(500) | 80 | 33 | 3.0 |
| Example 18 | Polymer 2 (100) | PAG8 (16.9) | Quencher 1 (5.28) | PGMEA(2,000) DAA(500) | 80 | 29 | 3.2 |
| Example 19 | Polymer 3 (100) | PAG7 (16.5) | Quencher 1 (5.28) | PGMEA(2,000) DAA(500) | 80 | 28 | 3.0 |
| Example 20 | Polymer 4 (100) | PAG15 (15.8) | Quencher 1 (5.28) | PGMEA(2,000) DAA(500) | 130 | 42 | 3.7 |
| Comparative Example 1 | Polymer 1 (100) | Comparative PAG1 (17.9) | Quencher 1 (5.28) | PGMEA(2,000) DAA(500) | 80 | 34 | 4.9 |
| Comparative Example 2 | Polymer 1 (100) | Comparative PAG2 (16.0) | Quencher 1 (5.28) | PGMEA(2,000) DAA(500) | 80 | 38 | 4.2 |
| Comparative Example 3 | Polymer 4 (100) | Comparative PAG1 (11.9) | Quencher 1 (5.28) | PGMEA(2,000) DAA(500) | 130 | 58 | 5.2 |

From the results shown in Table 1, it was shown that the inventive resist materials, containing, as an acid generator, a sulfonium salt or iodonium salt of a sulfonic acid bonded to a maleimide group, had high sensitivity and excellent CDU. It was also shown that on the contrary, the resist materials in Comparative Examples 1 to 3, containing no sulfonium salt or iodonium salt of a sulfonic acid bonded to a maleimide group as an acid generator, had a large CDT) value. Thus, it was revealed that the inventive resist materials, curtaining a sulfonium salt or iodonium salt of a sulfonic acid bonded to a maleimide group, can be used suitably as a resist material.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A resist material comprising a base polymer and an acid generator, wherein the resist material contains, as the acid generator, a sulfonium salt or iodonium salt of a sulfonic acid bonded to a maleimide group represented by the following general formula (A-1) or (A-2), (A-1)

(A-2)

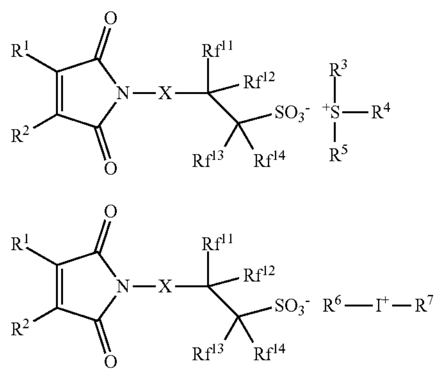

wherein $R^1$ and $R^2$ each represent a hydrogen atom, a linear alkyl group having 1 to 10 carbon atoms, or a branched, or cyclic alkyl group having 3 to 10 carbon atoms, $R^1$ and $R^2$ optionally being bonded to each other to form a ring; X represents a divalent linking group containing an ester bond and having 1 to 20 carbon atoms, the linking group optionally containing an oxygen atom, a sulfur atom, a nitrogen atom, or a halogen atom; $Rf^{11}$ to $Rf^{14}$ each independently represent a hydrogen atom, a fluorine atom, an oxygen atom, a methyl group, or a trifluoromethyl group, provided that at least one of $Rf^{11}$ to $Rf^{14}$ is a fluorine atom or a trifluoromethyl group, and that when $Rf^{11}$ and $Rf^{12}$ are respectively an oxygen atom, $Rf^{11}$ and $Rf^{12}$ are a single oxygen atom bonded to a single carbon atom to form a carbonyl group; $R^3$, $R^4$, $R^5$, $R^6$, and $R^7$ each independently represent a fluorine atom, a chlorine atom, a bromine atom, an iodine atom, or a hydrocarbyl group having 1 to 25 carbon atoms and optionally containing a heteroatom, wherein the hydrocarbyl group is saturated or unsaturated and is linear, branched, or cyclic, some or all hydrogen atoms of these groups are optionally substituted with a hydroxy group, a carboxy group, a halogen atom, a cyano group, a nitro group, a mercapto group, a sultone group, a sulfonic group, or a sulfonium salt-containing group, and some carbon atoms of these groups are optionally substituted with an ether bond, an ester bond, a carbonyl group, an amide bond, a carbonate group, or a sulfonic acid ester group; and $R^3$ and $R^4$ are optionally bonded with each other to form a ring with a sulfur atom that is bonded thereto.

2. The resist material according to claim 1, further comprising one or more selected from an organic solvent and a surfactant.

3. The resist material according to claim 1, wherein the base polymer further contains at least one repeating unit selected from repeating units represented by the following general formulae (f1) to (f3), (f1)

(f2)

(f3)

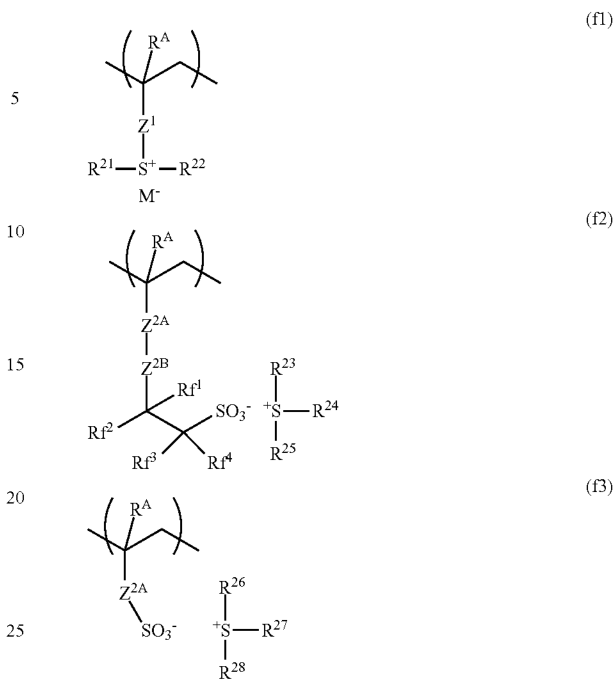

wherein each $R^A$ independently represents a hydrogen atom or a methyl group; $Z^1$ represents a single bond, a phenylene group, a naphthylene group, $—Z^{11}—$, $—O—Z^{11}—$, $—C(=O)—O—Z^{11}—$, or $—C(=O)—NH—Z^{11}—$; $Z^{11}$ represents an alkanediyl group having 1 to 6 carbon atoms, an alkenediyl group having 2 to 6 carbon atoms, or a hydrocarbon group having 1 to 20 carbon atoms and optionally containing a phenylene group and optionally contains a carbonyl group, an ester bond, an ether bond, or a hydroxy group; $Z^{2A}$ represents a single bond or an ester bond; $Z^{2B}$ represents a single bond or a divalent group having 1 to 18 carbon atoms and optionally contains an ester bond, an ether bond, a lactone ring, a bromine atom, or an iodine atom; $Z^3$ represents a single bond, a methylene group, an ethylene group, a phenylene group, a fluorinated phenylene group, a phenylene group substituted with a trifluoromethyl group, $—O—Z^{31}—$, $—C(=O)—O—Z^{31}—$, or $—C(=O)—NH—Z^{31}—$; $Z^{31}$ represents an alkanediyl group having 1 to 15 carbon atoms, an alkenediyl group having 2 to 15 carbon atoms, or a group containing a phenylene group and optionally contains a carbonyl group, an ester bond, an ether bond, a hydroxy group, or a halogen atom; $Rf^1$ to $Rf^4$ each independently represent a hydrogen atom, a fluorine atom, an oxygen atom, or a trifluoromethyl group, provided that at least one is a fluorine atom, and that when Rf and $Rf^2$ are respectively an oxygen atom, $Rf^1$ and $Rf^2$ are a single oxygen atom bonded to a single carbon atom to form a carbonyl group; $R^{21}$ to $R^{28}$ each independently represent a monovalent hydrocarbon group having 1 to 25 carbon atoms and optionally containing a heteroatom; any two of $R^{23}$, $R^{24}$, and $R^{25}$ or any two of $R^{26}$, $R^{27}$, and $R^{28}$ are optionally bonded with each other to form a ring with a sulfur atom that is bonded thereto; and $M^-$ represents a non-nucleophilic counter ion.

4. The resist material according to claim 2, wherein the base polymer further contains at least one repeating unit selected from repeating units represented by the following general formulae (f1) to (f3), (f1)

(f2)

(f3)

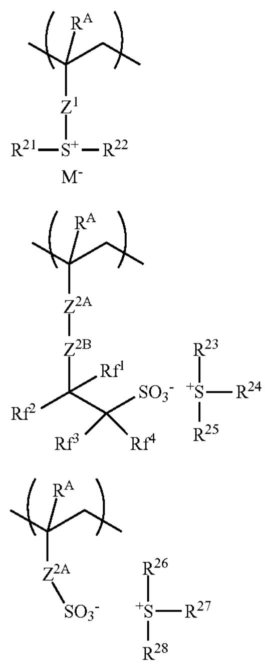

wherein each $R^A$ independently represents a hydrogen atom or a methyl group; $Z^1$ represents a single bond, a phenylene group, a naphthylene group, —$Z^{11}$—, —O—$Z^{11}$—, —C(=O)—O—$Z^{11}$—, or —C(=O)—NH—$Z^{11}$—; $Z^{11}$ represents an alkanediyl group having 1 to 6 carbon atoms, an alkenediyl group having 2 to 6 carbon atoms, or a hydrocarbon group having 1 to 20 carbon atoms and optionally containing a phenylene group and optionally contains a carbonyl group, an ester bond, an ether bond, or a hydroxy group; $Z^{2A}$ represents a single bond or an ester bond; $Z^{2B}$ represents a single bond or a divalent group having 1 to 18 carbon atoms and optionally contains an ester bond, an ether bond, a lactone ring, a bromine atom, or an iodine atom; $Z^3$ represents a single bond, a methylene group, an ethylene group, a phenylene group, a fluorinated phenylene group, a phenylene group substituted with a trifluoromethyl group, —O—$Z^{31}$—, —C(=O)—O—$Z^{31}$—, or —C(=O)—NH—$Z^{31}$—; $Z^{31}$ represents an alkanediyl group having 1 to 15 carbon atoms, an alkenediyl group having 2 to 15 carbon atoms, or a group containing a phenylene group and optionally contains a carbonyl group, an ester bond, an ether bond, a hydroxy group, or a halogen atom; $Rf^1$ to $Rf^4$ each independently represent a hydrogen atom, a fluorine atom, an oxygen atom, or a trifluoromethyl group, provided that at least one is a fluorine atom, and that when Rf and $Rf^2$ are respectively an oxygen atom, $Rf^1$ and $Rf^2$ are a single oxygen atom bonded to a single carbon atom to form a carbonyl group; $R^{21}$ to $R^{28}$ each independently represent a monovalent hydrocarbon group having 1 to 25 carbon atoms and optionally containing a heteroatom; any two of $R^{23}$, $R^{24}$, and $R^{25}$ or any two of $R^{26}$, $R^{27}$, and $R^{28}$ are optionally bonded with each other to form a ring with a sulfur atom that is bonded thereto; and $M^-$ represents a non-nucleophilic counter ion.

5. The resist material according to claim 1, wherein the base polymer contains a repeating unit represented by the following general formula (a1) or a repeating unit represented by the following general formula (a2), (a1)

(a2)

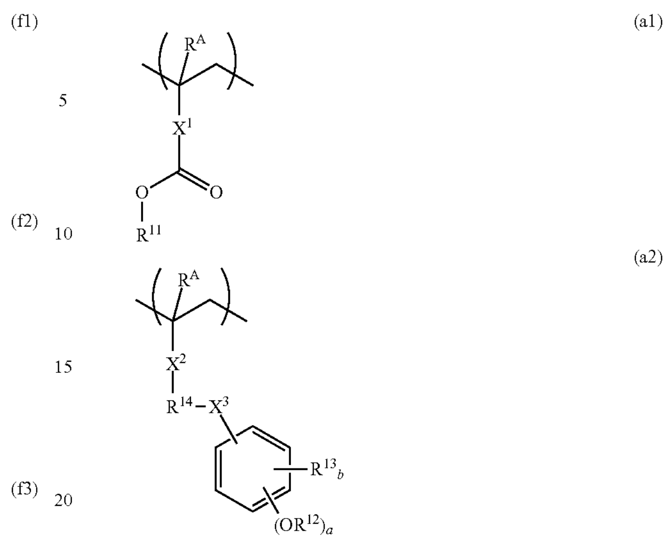

wherein each $R^A$ independently represents a hydrogen atom or a methyl group; $X^1$ represents a single bond or a linking group having 1 to 12 carbon atoms containing a phenylene group, a naphthylene group, an ester bond, an ether bond, or a lactone ring; $X^2$ represents a single bond or an ester bond; $X^3$ represents a single bond, an ether bond, or an ester bond; $R^{11}$ and $R^{12}$ each represent an acid-labile group; $R^{13}$ represents a fluorine atom, a trifluoromethyl group, a cyano group, a saturated hydrocarbyl group having 1 to 6 carbon atoms, a saturated hydrocarbyloxy group having 1 to 6 carbon atoms, a saturated hydrocarbylcarbonyl group having 2 to 7 carbon atoms, a saturated hydrocarbylcarbonyloxy group having 2 to 7 carbon atoms, or a saturated hydrocarbyloxycarbonyl group having 2 to 7 carbon atoms; $R^{14}$ represents a single bond or an alkanediyl group having 1 to 6 carbon atoms, and some of the carbon atoms are optionally substituted with an ether bond or an ester bond; and "a" represents 1 or 2 and "b" represents an integer of 0 to 4, provided that $1 \leq a+b \leq 5$.

6. The resist material according to claim 5, further comprising a dissolution inhibitor.

7. The resist material according to claim 5, being a chemically amplified positive resist material.

8. The resist material according to claim 1, wherein the base polymer does not contain an acid-labile group.

9. The resist material according to claim 8, further comprising a crosslinking agent.

10. The resist material according to claim 8, being a chemically amplified negative resist material.

11. A patterning process comprising the steps of:

(1) forming a resist film on a substrate by using the resist material according to claim 1;

(2) exposing the resist film to a high-energy beam; and (3) developing the exposed resist film by using a developer.

12. The patterning process according to claim 11, wherein after the step (1) and before the step (2), (1') an entire surface of the resist film is exposed to light having a wavelength at which the sulfonium salt or iodonium salt of the sulfonic acid bonded to the maleimide group does not decompose.

13. The patterning process according to claim 12, wherein the wavelength at which the sulfonium salt or iodonium salt does not decompose is longer than a wavelength of 300 nm.

14. The patterning process according to claim 11, wherein the high-energy beam is a KrF excimer laser beam, an ArF excimer laser beam, an electron beam, or an extreme ultraviolet ray having a wavelength of 3 to 15 nm.

* * * * *